(12) United States Patent
Atanackovic

(10) Patent No.: US 7,807,917 B2
(45) Date of Patent: Oct. 5, 2010

(54) THERMOELECTRIC AND PYROELECTRIC ENERGY CONVERSION DEVICES

(75) Inventor: Petar B. Atanackovic, Palo Alto, CA (US)

(73) Assignee: Translucent, Inc., Palo Alto, CA (US)

(*) Notice: Subject to any disclaimer, the term of this patent is extended or adjusted under 35 U.S.C. 154(b) by 367 days.

(21) Appl. No.: 11/828,964

(22) Filed: Jul. 26, 2007

(65) Prior Publication Data
US 2008/0295879 A1 Dec. 4, 2008

Related U.S. Application Data

(60) Provisional application No. 60/820,438, filed on Jul. 26, 2006.

(51) Int. Cl.
| | |
|---|---|
| H01L 35/12 | (2006.01) |
| H01L 35/30 | (2006.01) |
| H01L 35/16 | (2006.01) |
| H01L 35/22 | (2006.01) |
| H01L 35/14 | (2006.01) |
| H01L 35/20 | (2006.01) |
| H01L 37/00 | (2006.01) |
| H01L 41/00 | (2006.01) |
| G01J 5/00 | (2006.01) |
| H02N 2/00 | (2006.01) |

(52) U.S. Cl. ............... 136/236.1; 136/205; 136/238; 136/239; 136/240; 136/241; 250/338.2; 250/338.3; 310/346

(58) Field of Classification Search ............ 136/205, 136/238, 239, 240, 241, 236.1
See application file for complete search history.

(56) References Cited

U.S. PATENT DOCUMENTS 4,946,511 A * 8/1990 Shiloh et al. ............ 136/212

(Continued)

OTHER PUBLICATIONS

Takagi et al. "Preparation and properties of rare-earth system thermoelectric material," Aichi Engineering institute research report, p. 53-58, Mar. 31, 2006.*

(Continued)

Primary Examiner—Jeffrey T Barton
Assistant Examiner—Allison Bourke
(74) Attorney, Agent, or Firm—Fernandez & Associates, LLP

(57) ABSTRACT

New thermoelectric materials and devices are disclosed for application to high efficiency thermoelectric power generation. New functional materials based on oxides, rare-earth-oxides, rare-earth-nitrides, rare-earth phosphides, copper-rare-earth oxides, silicon-rare-earth-oxides, germanium-rare-earth-oxides and bismuth rare-earth-oxides are disclosed. Addition of nitrogen and phosphorus are disclosed to optimize the oxide material properties for thermoelectric conversion efficiency. New devices based on bulk and multilayer thermoelectric materials are described. New devices based on bulk and multilayer thermoelectric materials using combinations of at least one of thermoelectric and pyroelectric and ferroelectric materials are described. Thermoelectric devices based on vertical pillar and planar architectures are disclosed. The advantage of the planar thermoelectric effect allows utility for large area applications and is scalable for large scale power generation plants.

2 Claims, 105 Drawing Sheets

U.S. PATENT DOCUMENTS

Figure 2:
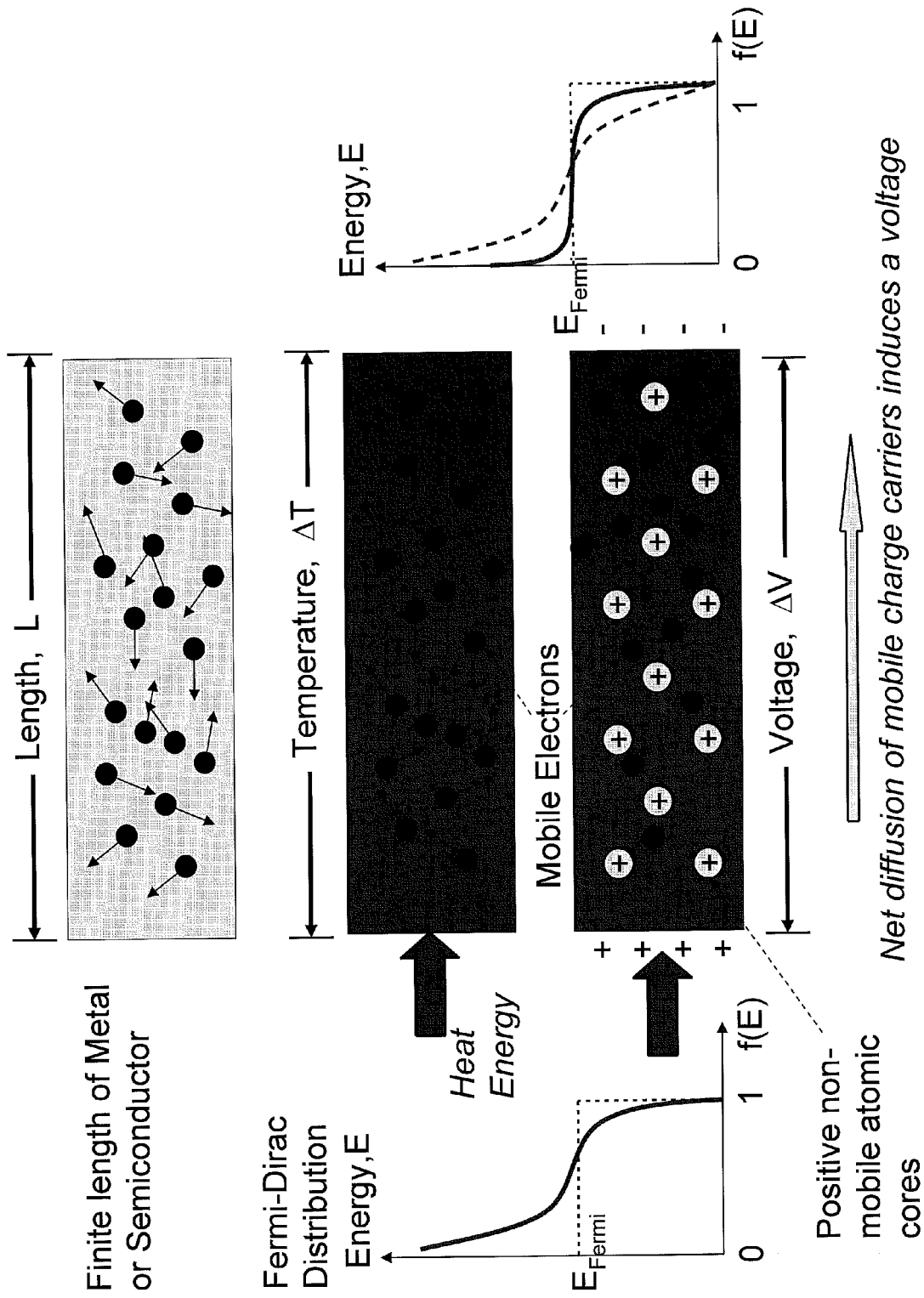

| | | | |
|---|---|---|---|
| 6,069,312 A * | 5/2000 | Fleurial et al. | 136/236.1 |
| 6,734,453 B2 | 5/2004 | Atanackovic | |
| 6,858,864 B2 | 2/2005 | Atanackovic | |
| 6,943,385 B2 | 9/2005 | Usuda | |
| 7,018,484 B1 | 3/2006 | Atanackovic | |
| 7,023,011 B2 | 4/2006 | Atanackovic | |
| 7,037,806 B1 | 5/2006 | Atanackovic | |
| 7,135,699 B1 | 11/2006 | Atanackovic | |
| 7,199,015 B2 | 4/2007 | Atanackovic | |
| 7,199,451 B2 | 4/2007 | Kelman | |
| 7,211,821 B2 | 5/2007 | Atanackovic | |
| 7,217,636 B1 | 5/2007 | Atanackovic | |
| 7,253,080 B1 | 8/2007 | Atanackovic | |
| 7,273,657 B2 | 9/2007 | Atanackovic | |
| 7,351,993 B2 | 4/2008 | Atanackovic | |
| 7,384,481 B2 | 6/2008 | Atanackovic | |
| 7,416,959 B2 | 8/2008 | Atanackovic | |
| 2005/0161773 A1 | 7/2005 | Atanackovic | |
| 2005/0163692 A1 | 7/2005 | Atanackovic | |
| 2006/0060826 A1 | 3/2006 | Atanackovic | |
| 2008/0217695 A1 | 9/2008 | Atanackovic | |
| 2008/0241519 A1 | 10/2008 | Shroeder | |
| 2008/0286949 A1 | 11/2008 | Atanackovic | |
| 2008/0308143 A1 | 12/2008 | Atanackovic | |
| 2009/0001329 A1 | 1/2009 | Atanackovic | |

OTHER PUBLICATIONS

English translation of Takagi et al. "Preparation and properties of rare-earth system thermoelectric material," pub. Mar. 31, 2006.*
U.S. Appl. No. 11/788,153, Atanackovic, Petar B.
U.S. Appl. No. 11/828,964, Atanackovic, Petar B.
U.S. Appl. No. 11/858,838, Atanackovic, Petar B.
U.S. Appl. No. 11/873,387, Atanackovic, Petar B.
U.S. Appl. No. 12/171,200, Atanackovic, Petar B.
U.S. Appl. No. 12/408,297, Clark, Andrew.
U.S. Appl. No. 12/510,977, Clark, Andrew.

* cited by examiner

Disclosed Types

- Diffusion based process
- Dual Electric Field / Piezoelectric Devices
- High Seebeck Voltage Materials via Carrier Confinement
- Planar Devices / Area Scalable
- Multilayer Planar Thermoelectric Device
- Multilayer Oxide & NBG ($E_g \sim \gamma k_B T$) structures
- New Thermoelectric Materials
- Uranium-Oxide/Plutonium-Oxide Heat source modulated with Rare-earth Oxide
- Crystalline Radioisotope Thermoelectric Devices

Figure 1

Implications on Thermionic Semiconductor Band Structure

- Conventional thermoelectric semiconductors are narrow bandgap (NBG), with band gap energy Eg~0.5eV
- *Direct band structure* materials exhibit radiative electron-hole recombination loss and phonon relaxation loss.
- *Indirect band structure* materials exhibit non-radiative loss via phonon coupling.
- NBG materials typically have small lattice phonon energies and therefore electrons and or holes couple to the lattice easily emitting and absorbing multiple phonons. This leads to efficient carrier energy loss to lattice as heat, reducing thermoelectric efficiency.
- Diffusion of charge carriers compete with phonons in transfer of energy

Figure 3

- Radiative recombination (RR) between conduction and valence bands involves k>0 wavevectors.
- RR is less probable in p-type due to large E-k curvature in valence band (holes have heavier effective mass).

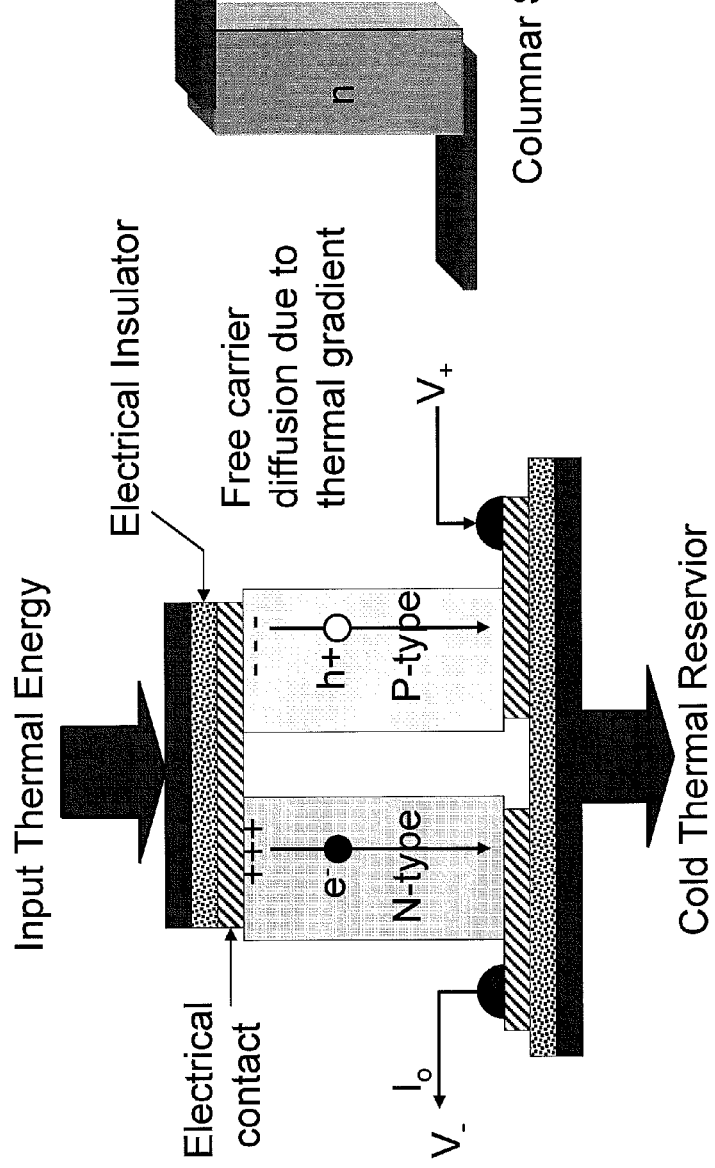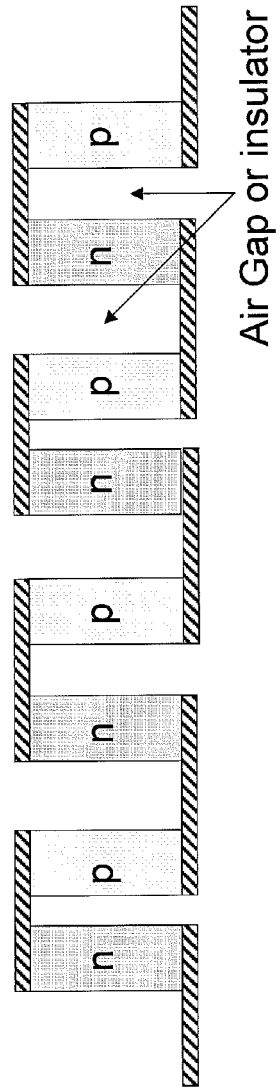
Figure 9

Thermoelectric Material Requirements

- Low Thermal Conductivity, $k_{th}$
- High Electrical Conductance, $\rho$
- High Seebeck co-efficient $S = \Delta V / \Delta T$
- Thermoelectric Figure-of-merit: $Z = S^2 \rho / k_{th}$
- ZxTemperature (=ZT) has typically been limited to ~1
- For useful power generation require ZT >>1
- To increase Z require new technique : $S\uparrow$, $\rho\uparrow$, $k_{th}\downarrow$
- However, all prior art techniques can not overcome the coupled problem of:
  - Increasing $S\uparrow$ typically reduces $\rho\downarrow$
  - Increasing $\rho\uparrow$ typically also increases $k_{th}\uparrow$
  - Net result has been static ZT~1 performance
- The present invention solves this fundamental limitation of prior art:
  - Novel oxides and multilayer structures are used to simultaneously increase $\rho$ and decrease $k_{th}$.
  - Use high thermal impedance oxides (and composite multilayers) with good electrical conduction {e.g. rare-earth oxides (REOx), indium-tin-oxide (ITO)}.
  - *Free carriers can be engineered in oxides to exhibit n-type and p-type properties*
  - *Large S can be engineered using bulk oxide and multilayers*

Figure 10

Fundamental Problem

- Bulk thermoelectric semiconductors suffer problem of bandgap narrowing with increased temperature
- Energy barrier due to increasing band gap toward cooler region reduces / inhibits carrier diffusion.
- Narrow band gap materials are typically good thermal conductors
- Single crystal or polycrystal materials required
  - Conventional thermoelectric semiconductors (e.g. BiTe, PbTe) typically not epitaxial on cheap or Silicon substrates
  - Amorphous glasses not typically usefull
  - Poly-Crystal materials increase phonon scatter relative to single crystal and increase thermal impedance
  - Heterogenous Multilayer thermoelectric stacks increase phonon scatter at interface, thereby increasing thermal impedance

Figure 11

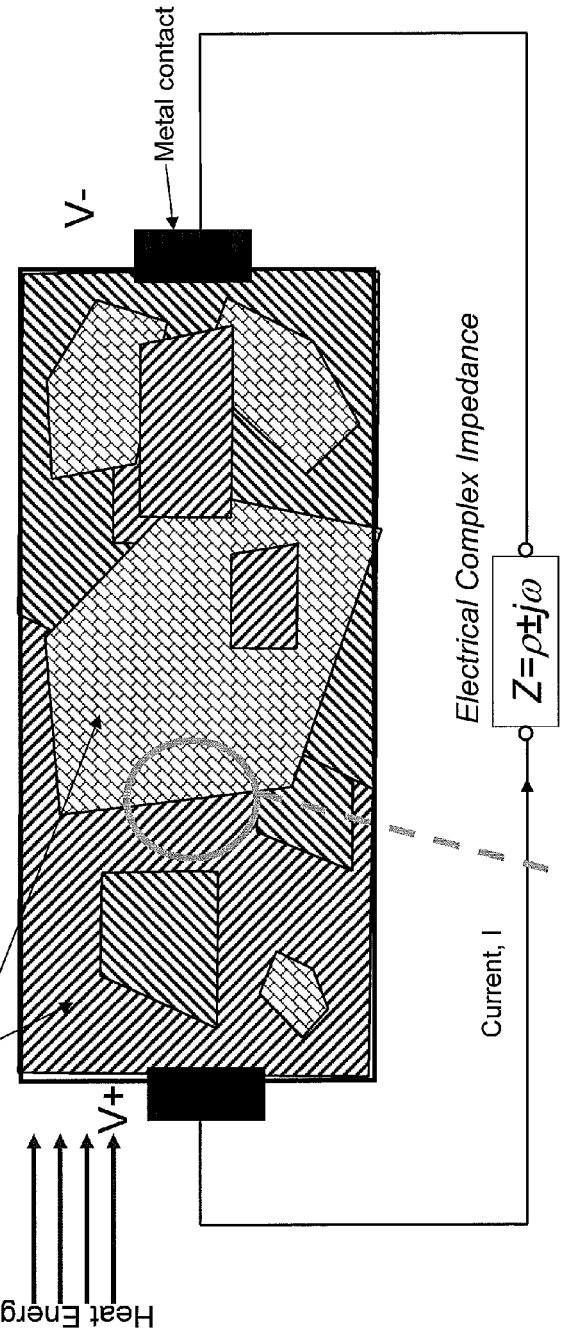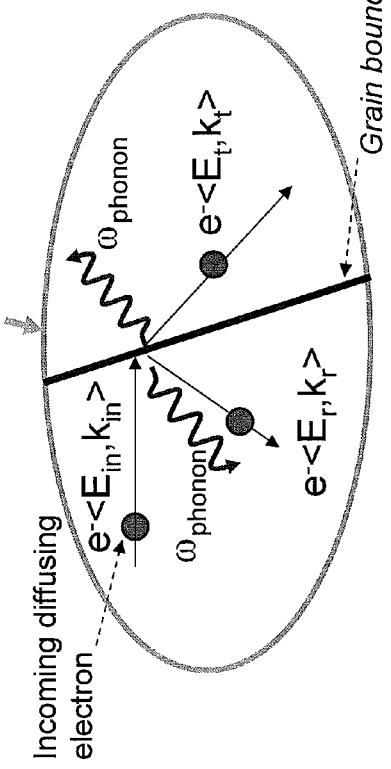
Figure 12

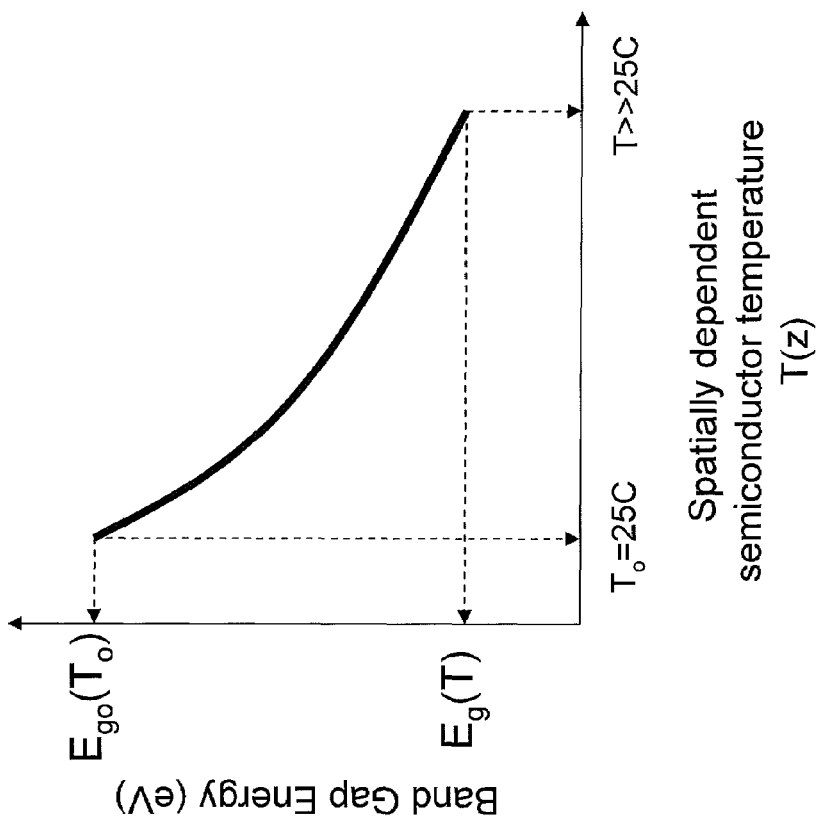
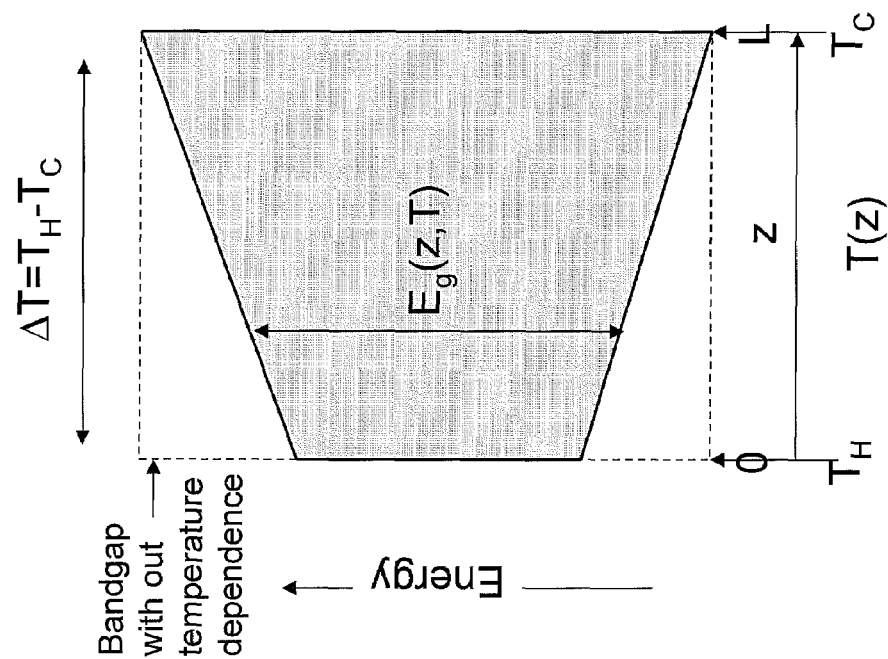
Figure 16

\* Band gap narrowing impedes the diffusion of free carriers along the temperature gradient along the length of the semiconductor due to the potential barrier $\Delta E$ developed by the temperature dependent band gap Eg(z,T).

Graded bandgap thermoelectric layer does not inhibit carrier diffusion

Solution: Rare-earth Oxides

- Rare-earth oxides can be engineered to exhibit:
  - High electrical conductivity
  - Large phonon energy
  - Low thermal conductivity
  - Thick crystalline layers on single crystal and amorphous substrates
  - High thermoelectric efficiency
  - High temperature operation

Figure 24

Low Thermal Conductance & High Electrical Conductance Oxides

- Rare-earth Oxides engineered to exhibit low thermal conduction and high electrical conductance
- N-type (excess electron charge carrier) via stoichiometry control of RE/Oxygen ratio
- P-type (excess hole charge carrier) via nitrogen/phosphorus doping/substitution of RE-Oxide

Figure 25

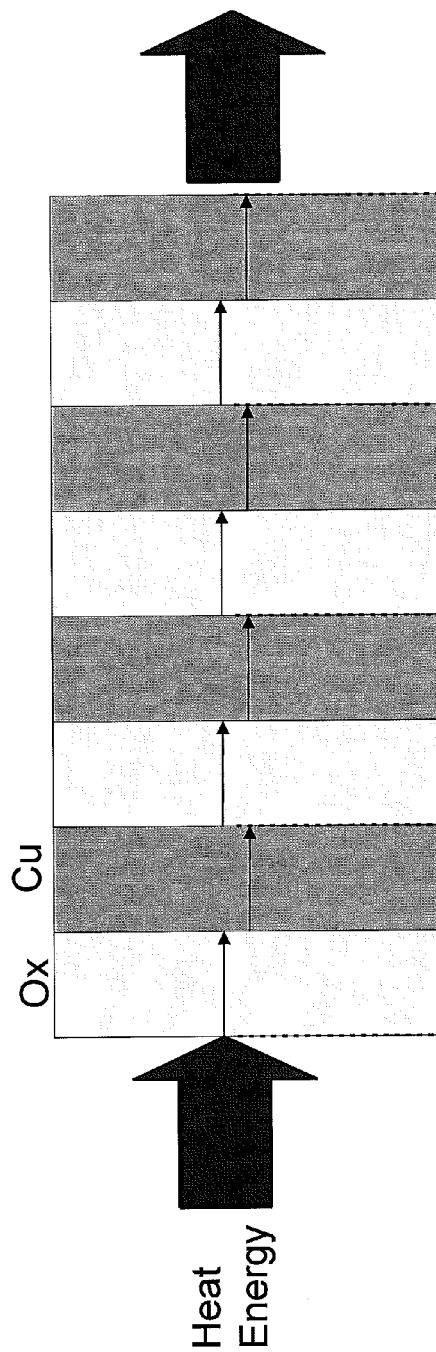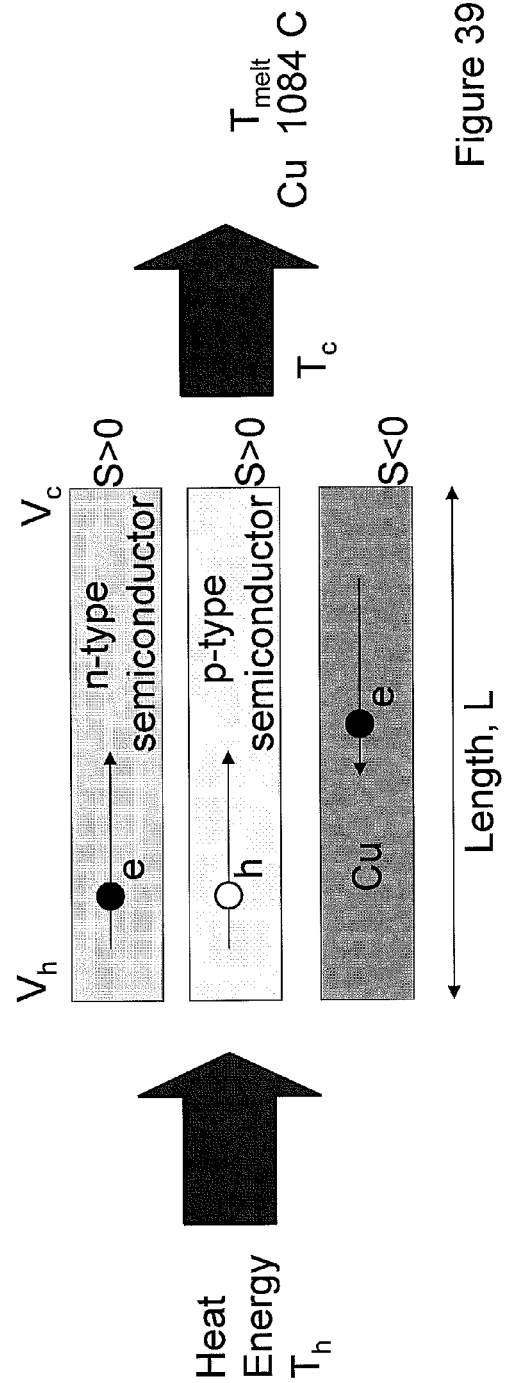
Figure 39

Rare-Earth-Copper–Oxides
$RE_xCu_yO_z$

- Bulk
  - $(CuO_y)_z(REO_x)_{1-z}$
  - $(Cu)_z(REO_x)_{1-z}$
  - $(CuO_y)_z(REO_xN_w)_{1-z}$
  - $(CuO_y)_z(REP_x)_{1-z}$
  - $(CuO_y)_z(REN_x)_{1-z}$

- Superlattice
  - {n x monolayers of $(CuO_y)$} / {m x monolayers of $(REO_xN_w)$}
  - {n x monolayers of $(Cu_yRE_{1-y})$} / {m x monolayers of $(REO_xN_w)$}
  - {n x monolayers of $(Cu_yN_{1-y})$} / {m x monolayers of $(REO_xN_w)$}
  - {n x monolayers of Cu} / {m x monolayers of $(REO_xN_w)$}

Figure 40

Rare-Earth-Bismuth-Oxides
$RE_xBi_yO_z$

- Bulk
  - $(BiO_y)_z(REO_x)_{1-z}$
  - $(Bi)_z(REO_x)_{1-z}$
  - $(BiO_y)_z(REO_xN_w)_{1-z}$
  - $(BiO_y)_z(REP_x)_{1-z}$
  - $(BiO_y)_z(REN_x)_{1-z}$
  - Bi-doped: $REN_xO_z$

- Superlattice
  - {n x monolayers of $(BiO_y)$} / {m x monolayers of $(REO_xN_w)$}
  - {n x monolayers of $(Bi_yRE_{1-y})$} / {m x monolayers of $(REO_xN_w)$}
  - {n x monolayers of $(Bi_yN_{1-y})$} / {m x monolayers of $(REO_xN_w)$}
  - {n x monolayers of Bi} / {m x monolayers of $(REO_xN_w)$}
  - {n x monolayers of $(Bi_yP_{1-y})$} / {m x monolayers of $(REO_xP_w)$}
  - {n x monolayers of $Bi_y(N_sP_r)_{1-y})$} / {m x monolayers of $(REO_xN_w)$}
  - {n x monolayers of Bi} / {m x monolayers of $(REO_xN_wP_s)$}
  - {n x monolayers of Bi-doped: $(REN_sO_wP_r)$} / {m x monolayers of $(REO_xN_wP_y)$}

Figure 41

Rare-Earth–Silicon–Oxide–Carbide
$REO_xSi_yC_z$

- Bulk
  - $(SiC_y)_z(REO_x)_{1-z}$
  - C-doped: $REN_xO_z$
  - C-doped: $RESiN_xO_z$

- Superlattice
  - {n x monolayers of $(SiC_y)$} / {m x monolayers of $(REO_xN_w)$}
  - {n x monolayers of $(C)$} / {m x monolayers of $(REO_xN_w)$}
  - {n x monolayers of $(C:Si)$} / {m x monolayers of $(REO_xN_w)$}
  - {n x monolayers of $Si:C$} / {m x monolayers of $(REO_xN_w)$}
  - {n x monolayers of $(Si_yC_{1-y})$} / {m x monolayers of $(REO_xP_w)$}
  - {n x monolayers of $SiC$} / {m x monolayers of $(REO_xN_w)$}
  - {n x monolayers of $C$} / {m x monolayers of $(REO_xN_wP_s)$}
  - {n x monolayers of C-doped: $(REN_sO_wP_r)$} / {m x monolayers of $(REO_xN_wP_y)$}

Figure 43

Rare-Earth-Silicon–Germanium
$RE_xSi_yGe_z$

- Rare-earth addition to SiGe allows increased thermoelectric efficiency.

Figure 44

Rare-Earth–Silicon–Germanium–Bismuth $RE_xSi_yGe_zBi_s$

- Rare-earth addition to BiSiGe allows increased thermoelectric efficiency.
- Bismuth addition to RESiGe allows increased thermoelectric efficiency.

Figure 45

Impact of RE co-ordination number

- RE-oxides can form several other compounds derived from the fluorite structure:

$$RE_nO_{2n-2} \quad n \geq 4$$

$n=4 \rightarrow RE^{3+}_2O_3$ "Bixbyite"

$n=7 \rightarrow RE_7O_{12}$

Number and position of oxygen vacancies determines

» *A-type Hexagonal,*
» *C-type Cubic,*
» *B-type Monoclinic*

Anion Vacancy ordered Flourite crystal of type $RE^{3+}_2O_3$

*If have two oxygen vacancies per flourite unit cell, then cause the unit cell to increase 2 x. This is how lattice match to Si.*

The vacancy ordered structure is called bixbyite.

Bixbyite Oxygen Vacancy Ordering Techniques

- Preferential growth orientation using substrate template
  (e.g.; miscut substrates)

- Anion ordering via short period superlattice
  SL [mx ($ErO_{1.5-x}$) / nx ($ErO_{1.5+x}$)],
  *where m,n are integers, 0<x<1*

- Oxide / Nitride compensation techniques
  SL [Er(O,N) / ErOx],
  N doped :ErOx,
  "zinc-blende" $Er^{3+}N^{3-}$

- Erbium / Ytterbium compensation techniques
  YbO/ErOx multilayers using Yb-monoxide,
  ($Er_xYb_{1-x})_2O_3$,
  Pervoskite  $Er_1Yb_1O_3$

Figure 79

Raman Active Modes
in c-ErOx
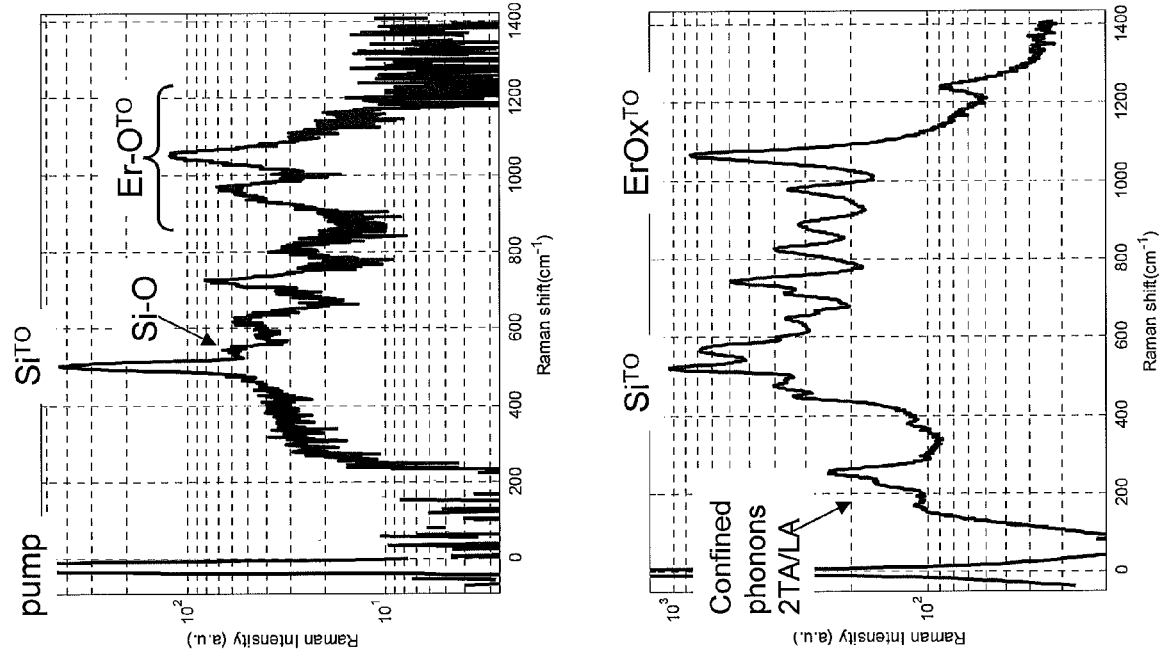
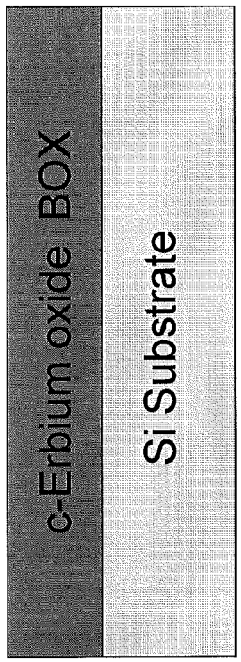
Figure 91
c-ErOx has large phonon energies
→ eliminates thermal quenching of $Er^{3+}$

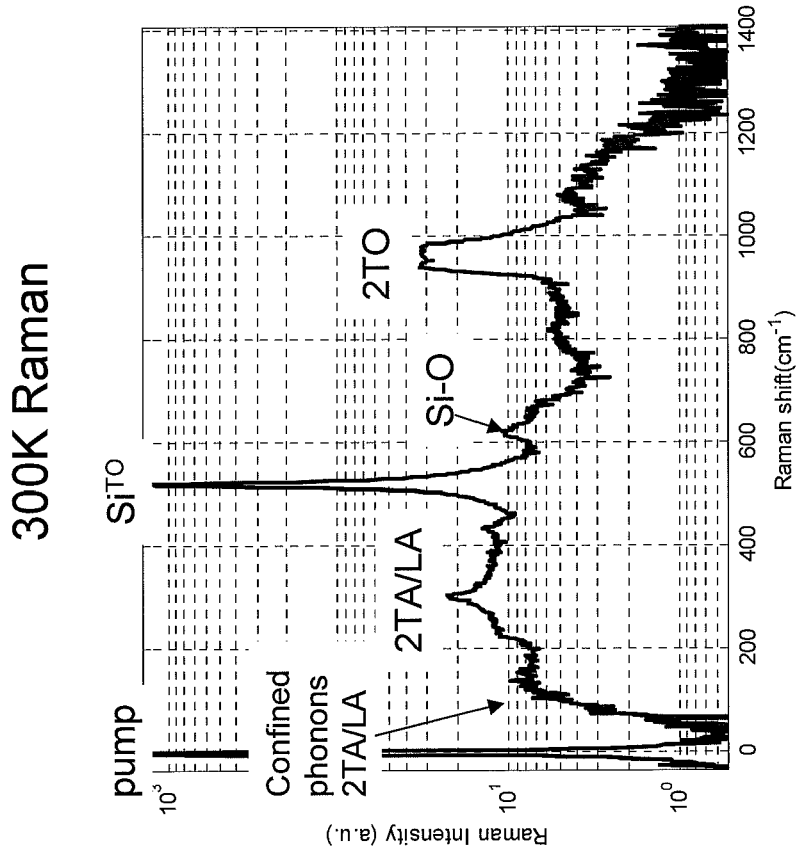
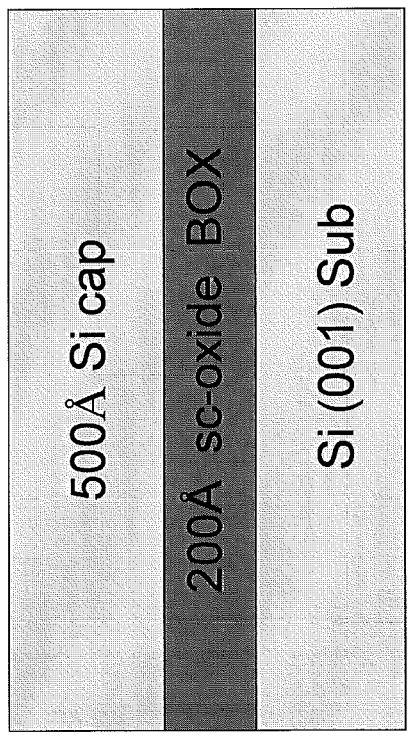
Figure 92
- Si cap exhibits Raman spectra similar to bulk Si
- Phonon mode coupling between Si/ErOx possible
- Large discontinuity in phonon energies → phonon filtering SLs High Resolution TEM images
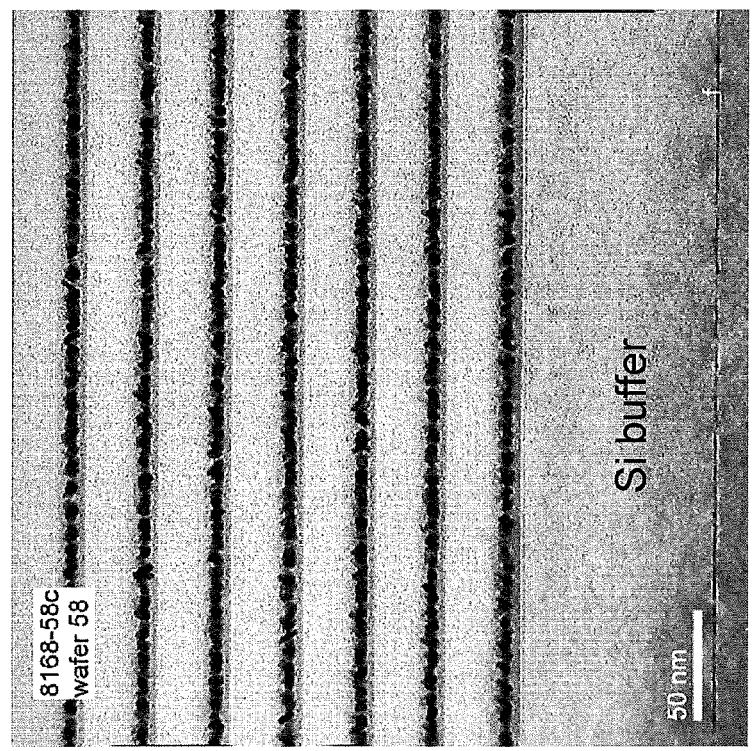
[Si/Si$_{1-z}$Ge$_z$/Si$_{1-x-y}$Ge$_x$Er$_y$/Si$_{1-z}$Ge$_z$]SL //Si(001)
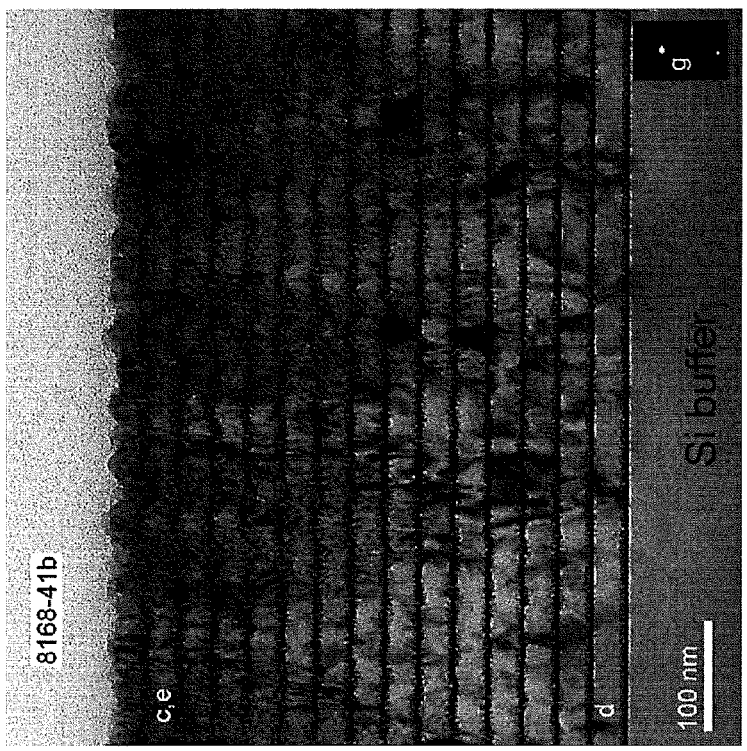
[Si/Si$_x$Er$_{1-x}$]SL //Si(001)
Figure 95

Multilayer structures*

- Multiple Quantum Wells: ErOx/Si/ErOx
  - 2.4eV confinement potentials
- Superlattices
  - CF splitting
  - miniband conduction (direct injection)
    - ErOx/Si/ErOx & ErOx/Ge/ErOx
- Bandgap and CF engineered ternary alloys:
  - Mixed RE's
  - RE-(O,N,P) and RE(O,N,P)Si

*Discussed further in sidebar

EPIC-DARPA    Monterey Nov 2005

Figure 100

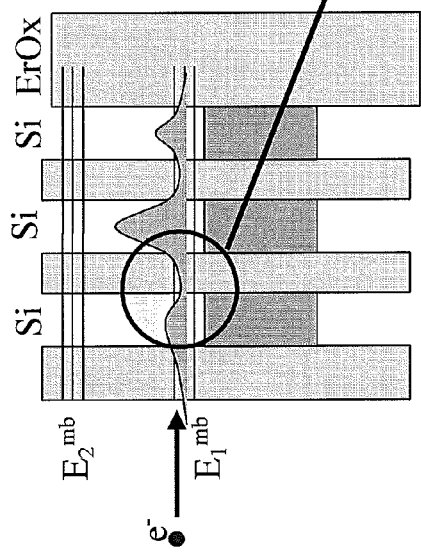
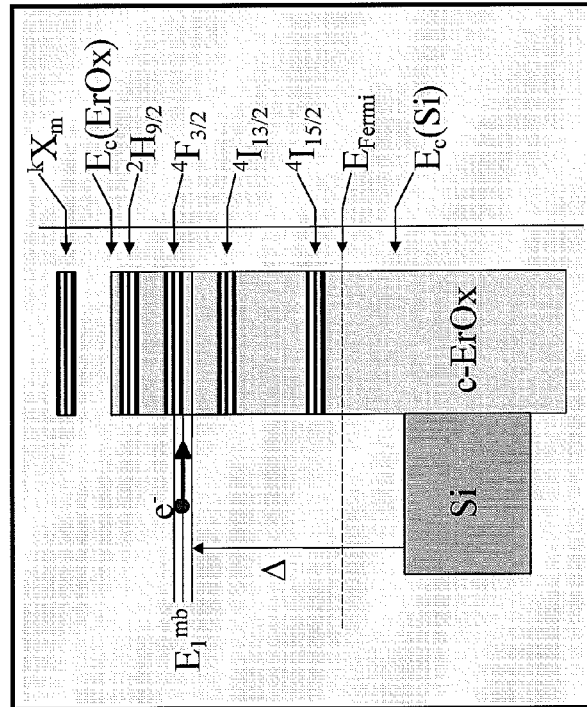
Figure 104

Thermoelectric Power Scenarios
a) Conventional Thermal Power Plant
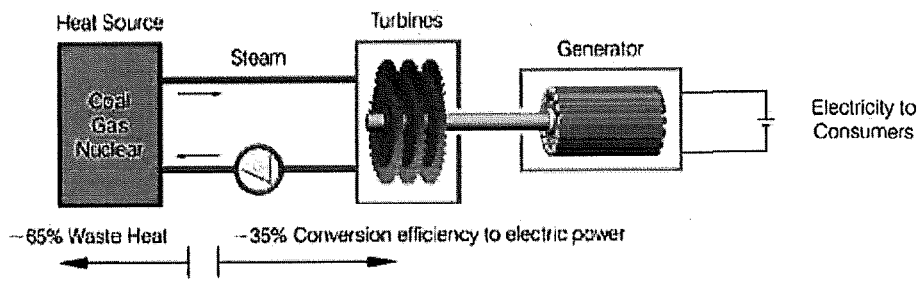
b) Complimentary Thermal / Thermoelectric Power Generation
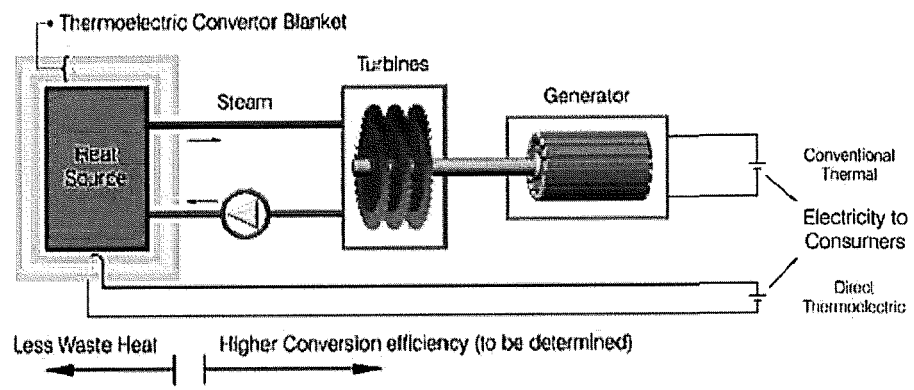
c) Direct Thermoelectric Power Generation
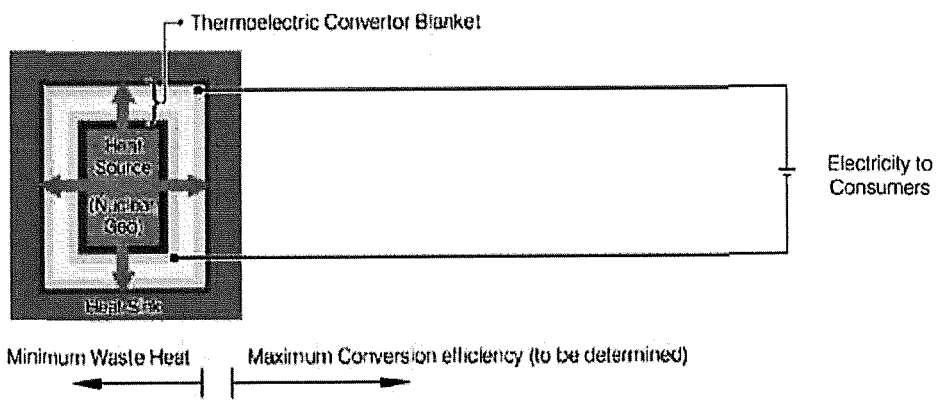
Figure 105

THERMOELECTRIC AND PYROELECTRIC ENERGY CONVERSION DEVICES

Applicant claims priority from U.S. Provisional application 60/820,438, filed on Jul. 26, 2006,

STATEMENT REGARDING FEDERALLY SPONSORED RESEARCH OR DEVELOPMENT

This work was supported by a technology investment grant by DARPA/MTO Electronic and Photonic Integrated Circuit (EPIC) program contract No. W911NF-05-3-0001.

CROSS-REFERENCE TO RELATED APPLICATIONS.

Applications and patent Ser. Nos. 09/924,392, 10/666,897, 10/746,957, 10/799,549, 10/825,912, 10/825,974, 11/022,078, 11/025,363, 11/025,680, 11/025,681, 11/025,692, 11/025,693, 11/084,486, 11/121,737, 11/187,213, U.S. 20050166834, U.S. 20050161773, U.S. 20050163692, Ser. Nos. 11/053,775, 11/053,785, 11/054,573, 11/054,579, 11/054,627, 11/068,222, 11/188,081, 11/253,525, 11/254,031, 11/257,517, 11/257,597, 11/393,629, 11/398,910, 11/472,087, 11/788,153, 60/533,378, 60/820,438, 60/811,311, 60/944,369 U.S. Pat. Nos. 7,018,484, 6,734,453, 7,023,011, 6,858,864, 7,037,806, 7,135,699, and 7,199,015, all held by the same assignee, contain information relevant to the instant invention and are included herein in their entirety by reference. References, noted at the end, are included herein in their entirety by reference.

FIELD OF THE INVENTION

The present invention relates to energy generation and cooling devices, comprising new high efficiency thermoelectric materials and new electronic-thermal device configurations through the combination of rare-earth metal oxides, rare-earth metal nitrides, rare-earth metal phosphides, and/or combinations thereof, including ternary and higher alloys with silicon and/or germanium and/or bismuth and/or copper and Group IV, III-V, and II-VI semiconductors and alloys are disclosed.

BACKGROUND OF THE INVENTION

Thermoelectric power generation allows direct conversion of heat into electricity without moving parts and is inherently reliable. The heat source is not restricted to any type of fuel or process and must only provide input thermal energy to create the required temperature differential between hot and cold sides of the generator. Prior art techniques for implementing the well known Peltier and Seebeck effects have been able to demonstrate direct conversion of heat into electrical power. A disadvantage of prior art techniques is the low conversion efficiency. Since a proposal in 1958 for inter-metallic semiconductors in application to thermoelectric conversion, such as bismuth telluride ($Bi_2Te_3$), the efficiency has been limited to less than or equal to $\eta \sim 5\%$ up until the present time. This level of efficiency is useful only for niche applications in solid-state cooling and space flight power generation based on radioisotope heating. The current status of thermoelectric machines for direct conversion of heat energy into electricity conversion technology is briefly reviewed.

Seebeck and Peltier Effects

Mobile charge carriers in solids possess negative or positive charge and carry electric current under the influence of an electromotive force. The large numbers of electrons in a metal or electrons and/or holes in a semiconductor at thermal equilibrium can also carry heat and entropy. A temperature differential across a solid provides an energy gradient such that charge carriers flow from a hot side to a cold side so as to create an electric current. This implies a coupling between thermal and electrical phenomena, which is generally called a thermoelectric effect. The Seebeck effect and the Peltier effect are based on the above process and are well known to workers in the fields of semiconductors and physical sciences. Generally, the Seebeck effect is a phenomenon wherein a voltage, $\Delta V$, is induced in proportion to applied temperature gradient, $\Delta T$. The Peltier effect is a phenomenon wherein heat absorption/emission, Q, is induced at the junctions of an applied current. In the presence of the coupling between thermal and electrical phenomena, it is, in principle, possible to convert heat into electric energy, and vice versa. An immediate advantage of thermoelectric devices is the absence of physically moving friction loss parts. Furthermore, thermoelectric devices do not produce waste matter through the conversion process, which can be implemented at the micro ($10^{-6}$ m) and/or nano ($10^{-9}$ m) scale, and can therefore, for example, be implemented into electronic devices.

Thermoelectric Figure-of-merit & Applications

A figure-of-merit (FOM) for thermoelectric materials is given by $Z=S^2\sigma/\kappa_{th}$, where $S=\Delta V/\Delta T$ is the Seebeck co-efficient or thermoelectric power; $\sigma$ is the electrical conductivity and $\kappa_{th}$ is the thermal conductivity. Typically the dimensionless quantity ZT is used, where T is the operating temperature. The thermal to electrical conversion efficiency is defined as:

$$\eta=(T_H-T_C/T_H)[(1+ZT)^{0.5}-1]/[(1+ZT)^{0.5}+T_C/T_H] \quad (1)$$

where, $T_H$ ($T_C$) is the hot (cold) side junction temperature. The prefactor ($T_H-T_C/T_H$) is the Carnot efficiency reduced by the FOM factor in [ ] brackets. Therefore, $\eta$ can be considered the fraction of Carnot efficiency. To attain 50% Carnot efficiency using operating temperature gradients $T_C/T_H \gtrsim 0.3$ requires FOMs in the range $4<ZT<6$. Clearly, there is a need to improve thermoelectric FOM for power generation devices. Using the Peltier effect, the thermoelectric device can cool materials. It should be emphasized that thermoelectric cooling does not need the action of exchange media, such as a Freon gas, and is therefore an alternative for a Freon-gas refrigeration if thermoelectric efficiency can be increased beyond prior art. Another advantage is heating and cooling cycles can be quickly changed via the applied current direction. Thus thermoelectric refrigeration can also be used in closed loop temperature control providing hot and cold stimulus.

Using the Seebeck effect, thermal energy or heat can be converted into electric energy. FIG. 2 shows the schematic process of the thermoelectric power generation. When the left side of the sample is heated, a thermoelectric voltage is induced in proportion to the temperature difference. If a load is connected to the sample, the electric power is consumed at the load. For constant heat energy input a constant thermoelectric current is generated, capable of providing electrical power to an external load, R, such that $P_L=I^2R$; optionally, R may also be a complex impedance for inductive and capacitive loads). Alternating current can thus be produced via dc-to-ac conversion devices. Alternatively, a sinusoidal modulated thermal source can be input to a thermoelectric converter designed to have an appropriate temporal electrical response such that the input modulation is transferred upon the electrical output. If, the time response of the thermoelectric device is slower that the input thermal modulation, for example by the use of short time pulse and repetitive thermal energy source, then the thermoelectric device will filter the high frequency components so that the repetition frequency can approximate an alternating current. This concept may be of use in conjunction with pulsed fusion reactors for waste heat recovery.

Advantages of thermoelectric power generation are (i) electric power source without moving parts and maintenance, (ii) energy recovery from waist heat generated by conventional energy sources (e.g. fossil fueled plants), (iii) high efficiency direct thermoelectric conversion from non-fossil fuel driven energy sources (eg nuclear and geothermal plants), and (iv) long plant operating lifetimes. Recently, waste heat recovery and conversion to electricity is becoming practical for application to improving combustion engine efficiencies in smaller scale systems such as automotive engines. In general, a typical combustion engine develops only 25% useful shaft rotation power with as much as 40% waste heat energy via exhaust gas. The temperature rise of a typical exhaust gas manifold is capable of attaining extremely large temperature differential with reference to the ambient temperature. This heated manifold could be used as an appropriate temperature source for the present invention.

Similarly, electricity grid generation plants consume fossil or nuclear fission fuels to heat a suitable high thermal capacity fluid or medium so as to generate steam or pressure in the said medium thereby generating a means to drive a mechanical turbine or rotation device. The said turbine shaft is connected to a suitable electromechanical alternating and/or direct current generator. Typical conversion efficiencies from thermal to electrical energy in such systems are on the order of only ~35%. Therefore, there would be considerable cost, environmental and safety gains for direct energy conversion of waste heat from a thermal source into electricity.

BRIEF SUMMARY OF THE INVENTION

An aspect of the present invention is to improve the efficiency of thermoelectric generation devices beyond those of prior art devices by using new thermoelectric materials and device configurations. The improvement of thermoelectric conversion efficiency enables new applications for large scale electricity generation from thermal sources, be it from waste heat recovery, direct conversion of heat energy from the combustion of fossil fuel and/or nuclear fission and/or nuclear fusion and/or thermal energy from solar and/or geothermal sources.

Yet a further aspect of the present invention seeks to improve upon prior art radioisotope-driven direct thermoelectric power generation devices.

Yet a further aspect of the present invention also seeks to improve upon the implementation of proposed fourth generation nuclear fission reactors, (such as the high temperature gas turbine modular helium reactor and the high temperature pebble bed modular reactor), using the high efficiency thermoelectric power generation devices disclosed herein.

The present invention solves prior art thermoelectric deficiencies by introducing high temperature thermoelectric materials and scaleable device architectures. In one embodiment, materials composed of germanium-rare-earth-metal compounds and/or silicon-rare-earth-metal compounds are used to form band gap engineered electronic junctions capable of efficient thermoelectric conversion of thermal radiation into electrical energy.

Small scale waste heat recovery can also be accomplished in the field of silicon electronic ultra-large-scale-integrated-circuits (ULSICs). Present Silicon (Si) nanometer (nm) scale electronic devices are constructed using planar field-effect-transistor (FET) topologies. The FET control gate is composed of a gate dielectric, (usually an oxide and thus termed a 'gate-oxide'), and is typically silicon dioxide ($SiO_2$) or silicon oxy-nitride ($SiO_xN_y$) dielectric material(s) disposed upon a single crystal silicon active layer and/or substrate. Modern logic design is based on complementary-metal-oxide-semiconductor (CMOS) employing charge carrier transport behavior comprising both n-type and p-type CMOS-FETs and are characterized by transistor feature sizes in the ranges of 130 nm, 90 nm, 65 nm, 45 nm, 32 nm and ultimately approaching 20 nm. As the planar transistor geometry shrinks in accordance with new fabrication generations or technology nodes, the CMOS-FET gate oxide thickness and gate length must be reduced (or scaled) in accordance with well known scaling rules. The primary advantage of CMOS logic gates is the logic elements only draw significant current between logic state transitions, thereby allowing power consumption to be greatly minimized—due to negligible dissipation in the off-state. This is clearly an advantage for high densities of devices in ultra large scale integrated circuits, such as, microprocessors and mobile and/or portable devices. Unfortunately, sub-100 nm CMOS-FET channel length scaling requires the gate oxide insulator thickness to approach only a few atomic layers and is therefore causing a failing of the ideal insulator action of the gate oxide due to quantum mechanical tunneling processes. This gate oxide tunneling current adversely affects the off-state and on-state leakage and the mobility of the fundamental carriers, electrons (n-MOS) and holes (p-MOS). There are two types of leakage power in ULSICs: (i) active leakage power and (ii) standby leakage power. Active leakage power is defined as leakage power consumed by a nanoscale CMOS system when it is doing useful work and standby leakage power is consumed when the system is idle.

The 90 nm technology node has seen leakage power increasing to as much as 40% of the total power consumed. The waste heat and/or power dissipation situation degrades further with reduced channel length scaling to 65 nm and below. The leakage currents ultimately manifest as heat in ULSICs with waste heat power densities exceeding on-chip and off-chip conventional thermal management systems. Such large thermal loads result in reduced system reliability and place limits on the battery lifetime of portable devices. Ultimately, the thermal problem due to leakage places hard limits on further CMOS-FET feature size reduction and clock speeds. Therefore, waste heat energy dissipation by modern ULSICs presents a major impediment toward continued Moore's Law scaling of modern ULSICs. Unfortunately, replacing the gate oxide with a higher dielectric constant (that is, high-K) material with the suitable properties has not yet eventuated—despite much effort and research over the past decade. There is therefore a pressing need to solve this fundamental problem of heat energy management in modem and future ULSICs.

The present invention seeks to alleviate this heat problem in ULSICs and more particularly in portable ULSIC systems requiring prolonged battery life, by recovering wasted heat energy form dissipative processes in ULSICs via active and passive transistor leakage currents and converting the said microscopic and macroscopic heat energy dissipated back into useful electrical energy to power the same ULSICs. Such a regenerative process of heat conversion back into electrical power suitable for driving ULSICs would significantly aid in the prolong of battery lifetime of portable communications and computing devices and systems.

Yet a further aspect of the present invention is the construction of high efficiency thermo-power materials and devices that advantageously exploit the combination of the thermoelectric effect (typically using semiconductors, semimetal and metals) and the pyro-electric effect using the dielectric properties of substantially insulating materials, such as high dielectric constant crystalline oxides and the like.

Yet a further aspect of the present invention is the construction of high efficiency thermo-power materials and devices that advantageously exploit the combination of the thermoelectric effect (typically using semiconductors, semimetal and metals) and the ferroelectric effect using the dielectric properties of substantially insulating materials, such as high dielectric constant crystalline oxides and the like.

Yet a further aspect of the present invention is a combination of the thermoelectric effect (for example by the use of at least one of semiconductors, semimetal and metals) and the pyroelectric effect using the dielectric properties of substantially electrically insulating materials, such as high dielectric constant crystalline oxides and the like.

The present invention is generally classed as a direct means for conversion of thermal energy to electrical energy, and visa-versa, and is therefore not limited to the above sources of thermal energy.

BRIEF DESCRIPTION OF THE SEVERAL VIEWS OF THE DRAWING(S)

FIG. 1: Summary of disclosed embodiments.

FIG. 2: Schematic of thermoelectric process involving diffusion of charge carriers due to temperature gradient.

FIG. 3: Impact of thermoelectric semiconductor band structure.

Figure 4:
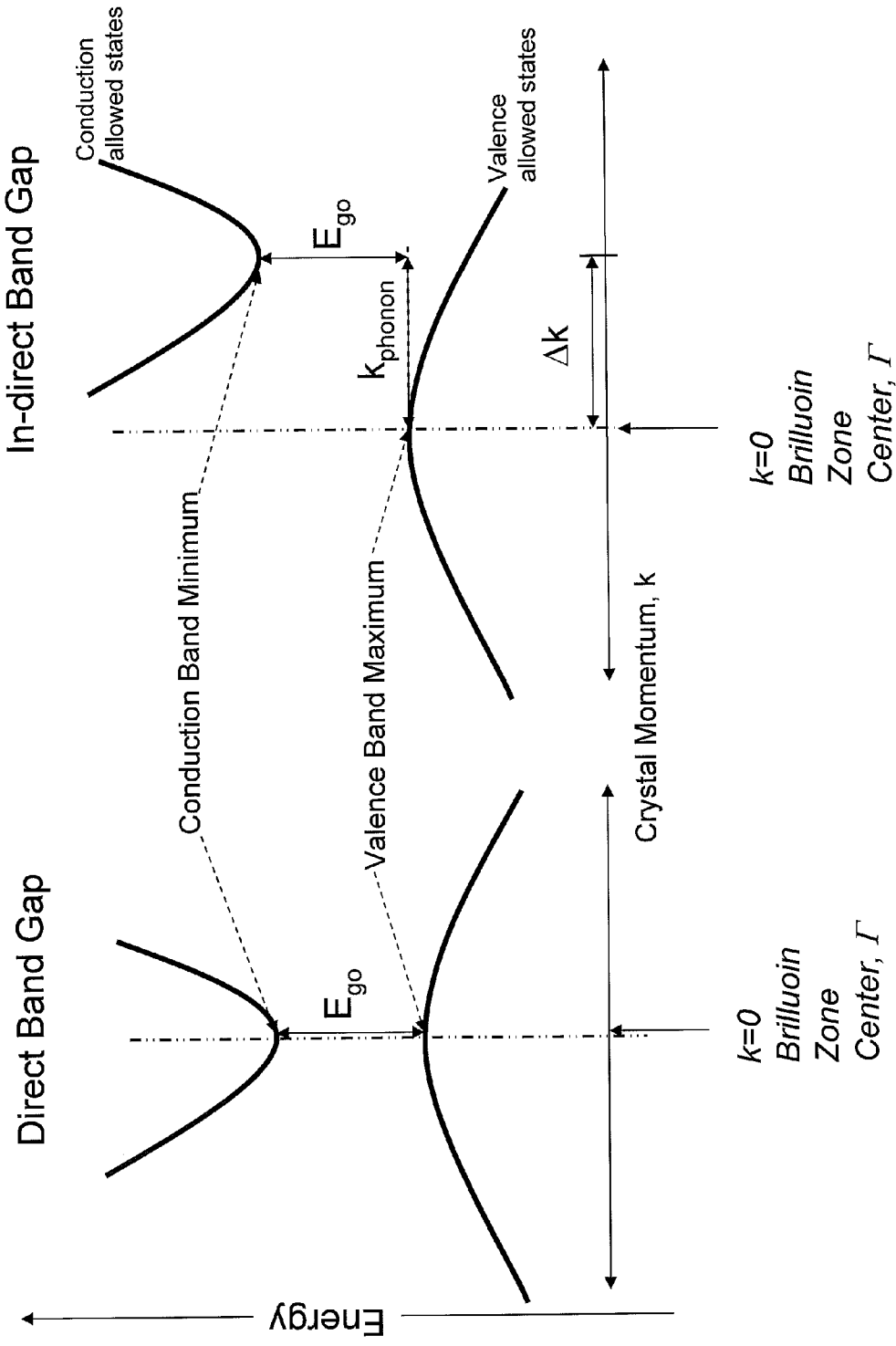

FIG. 4: Schematic comparison of simple conduction and valence band energy versus momentum dispersion for direct and indirect bandgap semiconductors.

Figure 5:
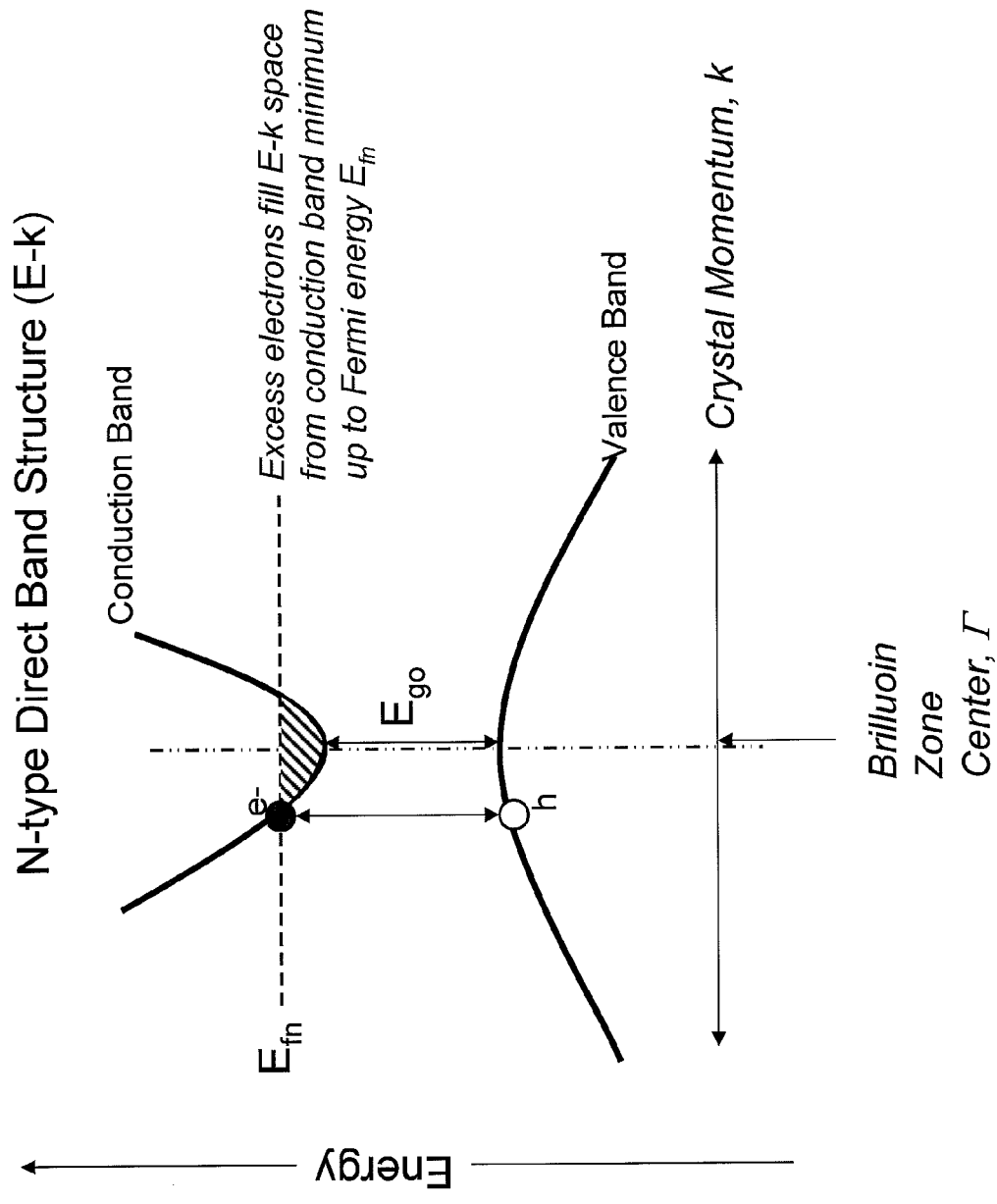

FIG. 5: Impurity doped direct bandgap semiconductor exhibiting degenerate n-type (excess electrons) character.

Figure 6:
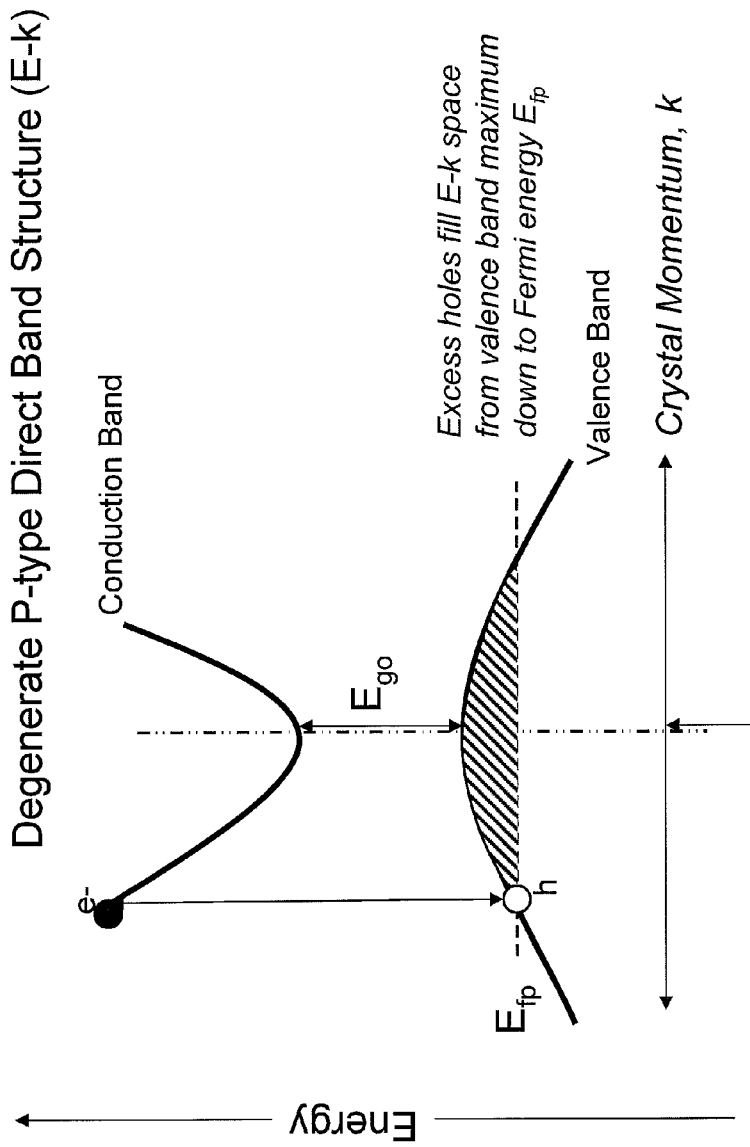

FIG. 6: Impurity doped direct bandgap semiconductor exhibiting degenerate p-type (excess holes) character.

Figure 7:
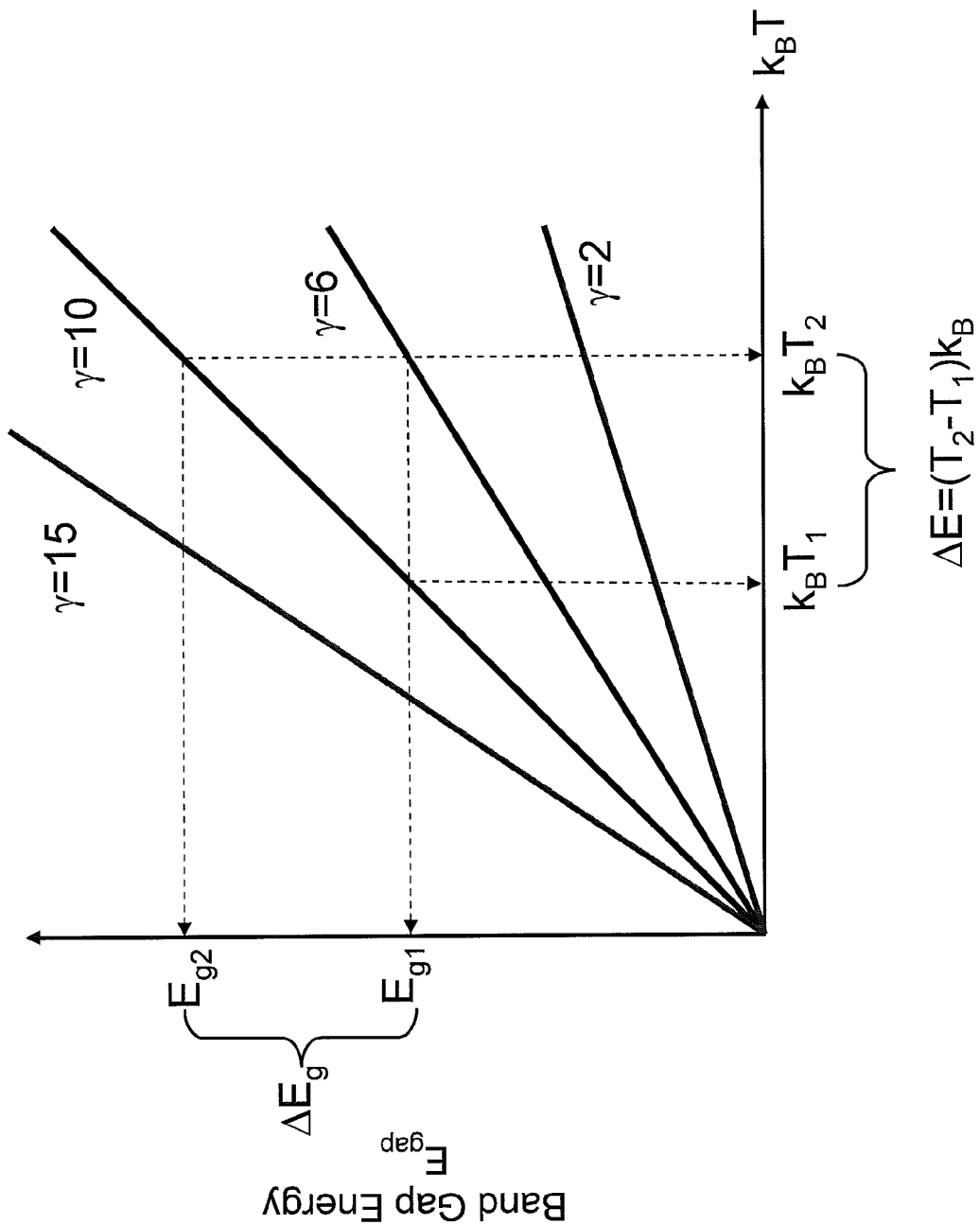

FIG. 7: Variation in bandgap energy versus temperature for $Eg=\gamma k_B T$. For given bandgap semiconductor (e.g.: $E_{g1}$), the optimum temperature performance varies by $\Delta E$, for values of $\gamma=6$ & 10.

Figure 8:
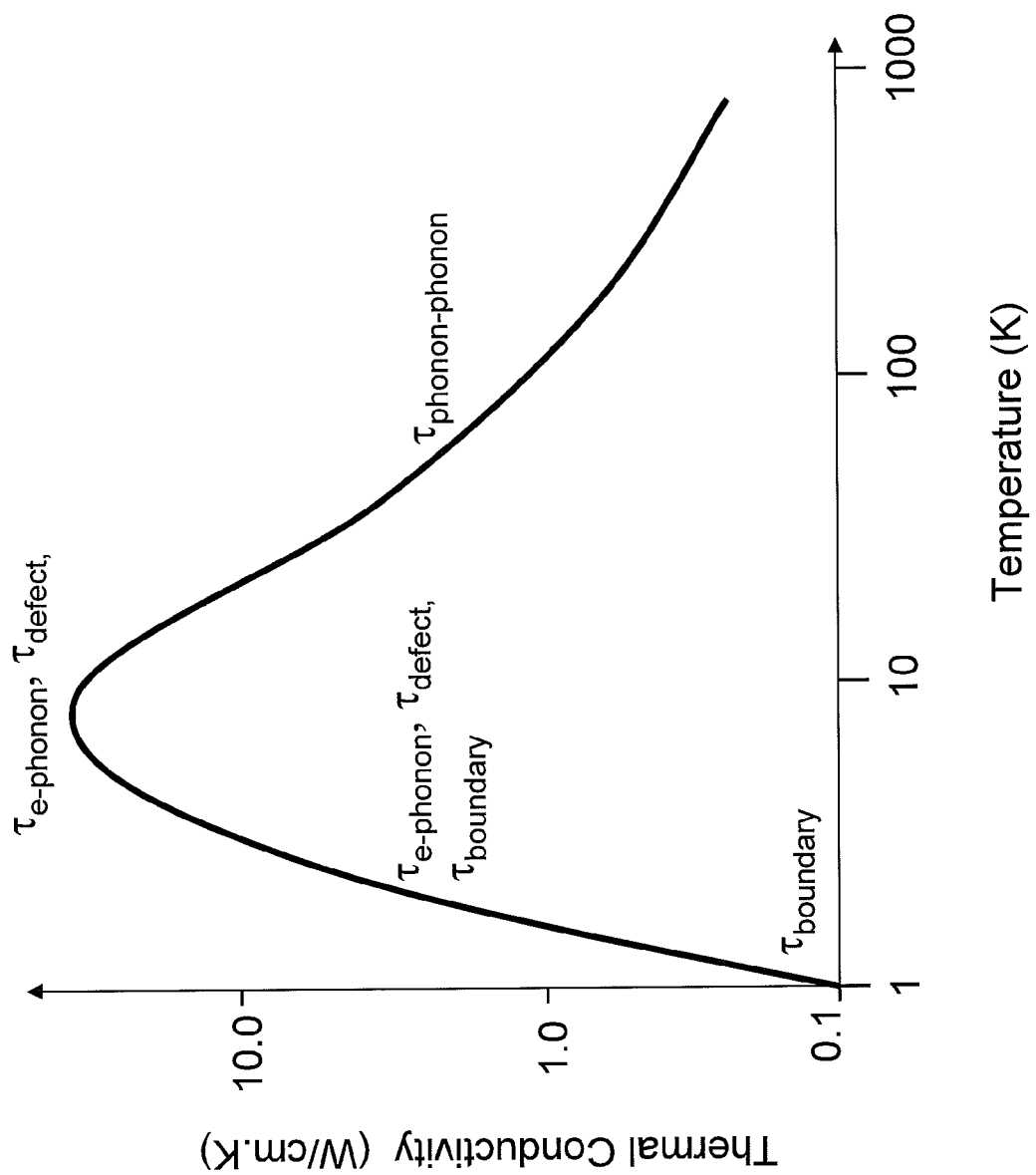

FIG. 8: Variation of thermoelectric semiconductor thermal conductivity as a function of temperature, showing regions of dominating scattering process.

FIG. 9: Schematic of thermoelectric device using n-type and p-type semiconductors. Series connected devices are also shown.

FIG. 10: Summary of requirements on thermoelectric material properties.

FIG. 11: Summary of problem in prior art thermoelectric semiconductors.

FIG. 12: Polycrystalline thermoelectric device showing charge carrier and phonon scattering process due to grain boundary.

Figure 13:
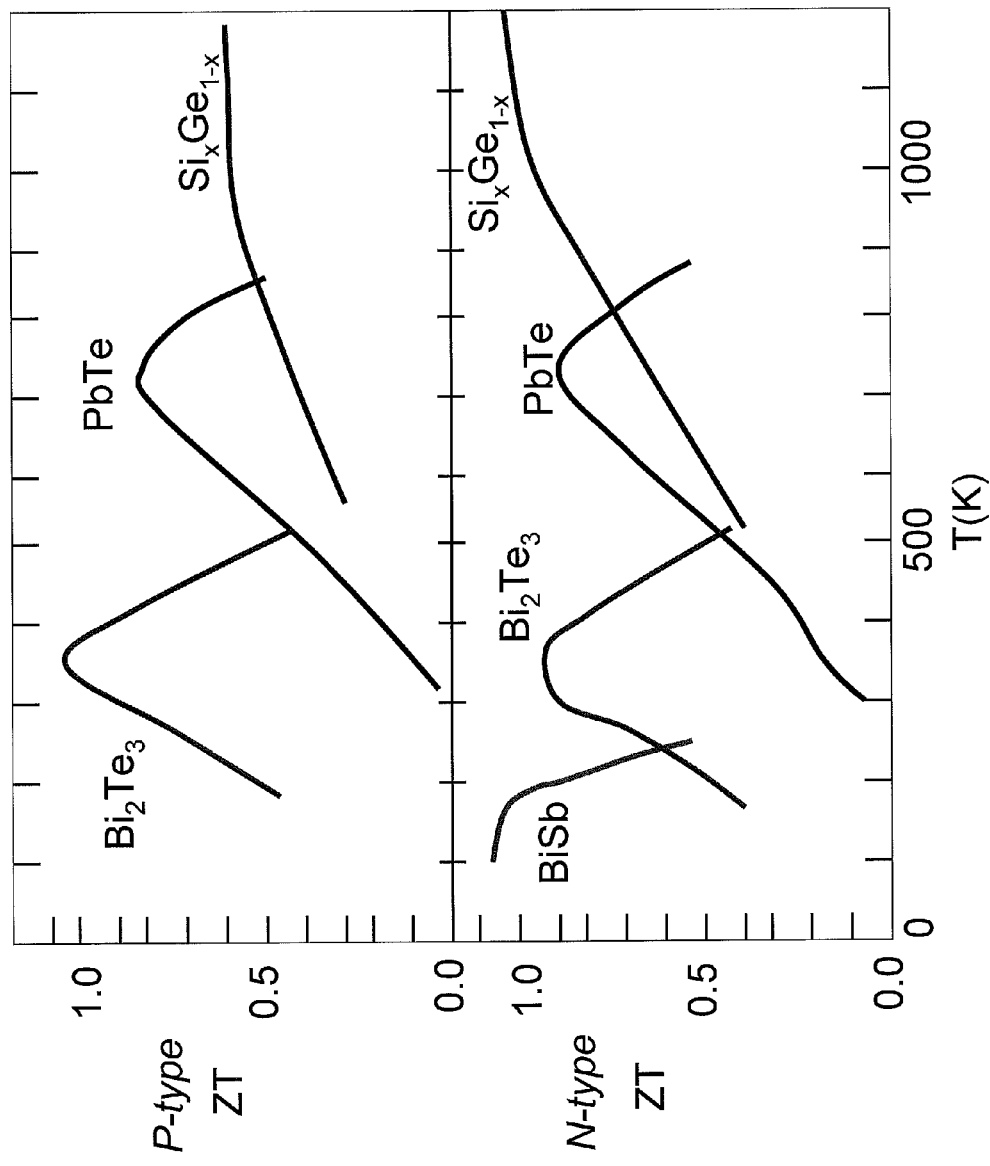

FIG. 13: Typical prior art thermoelectric performance ZT as a function of temperature.

Figure 14:
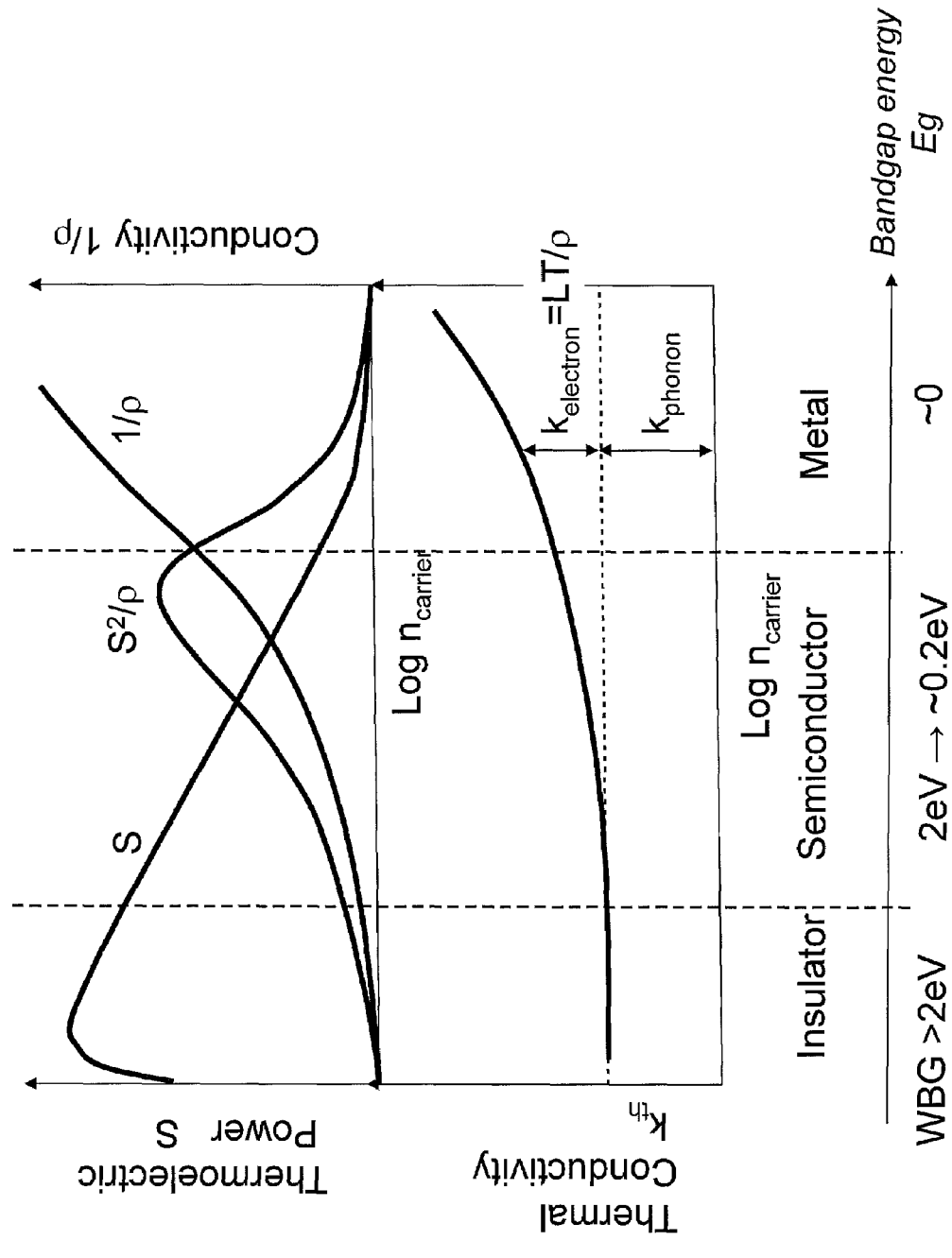

FIG. 14: General trends in prior art insulators, semiconductors and metals for thermal conductivity, electrical conductivity, and thermoelectric power as a function of temperature.

Figure 15:
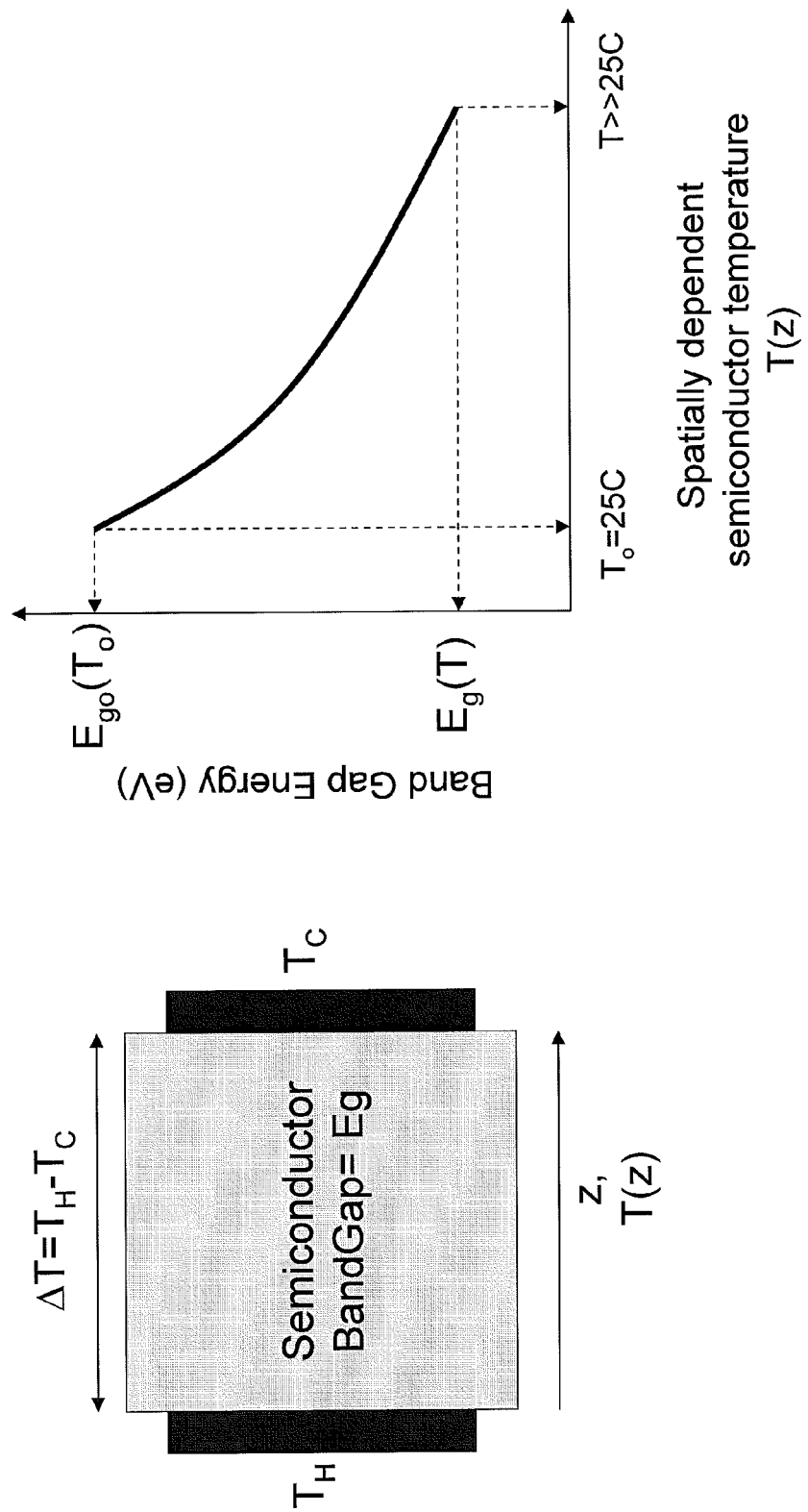

FIG. 15: Thermal bandgap narrowing process in semiconductors.

FIG. 16: Thermal bandgap narrowing process in semiconductor showing variation along temperature gradient.

Figure 17:
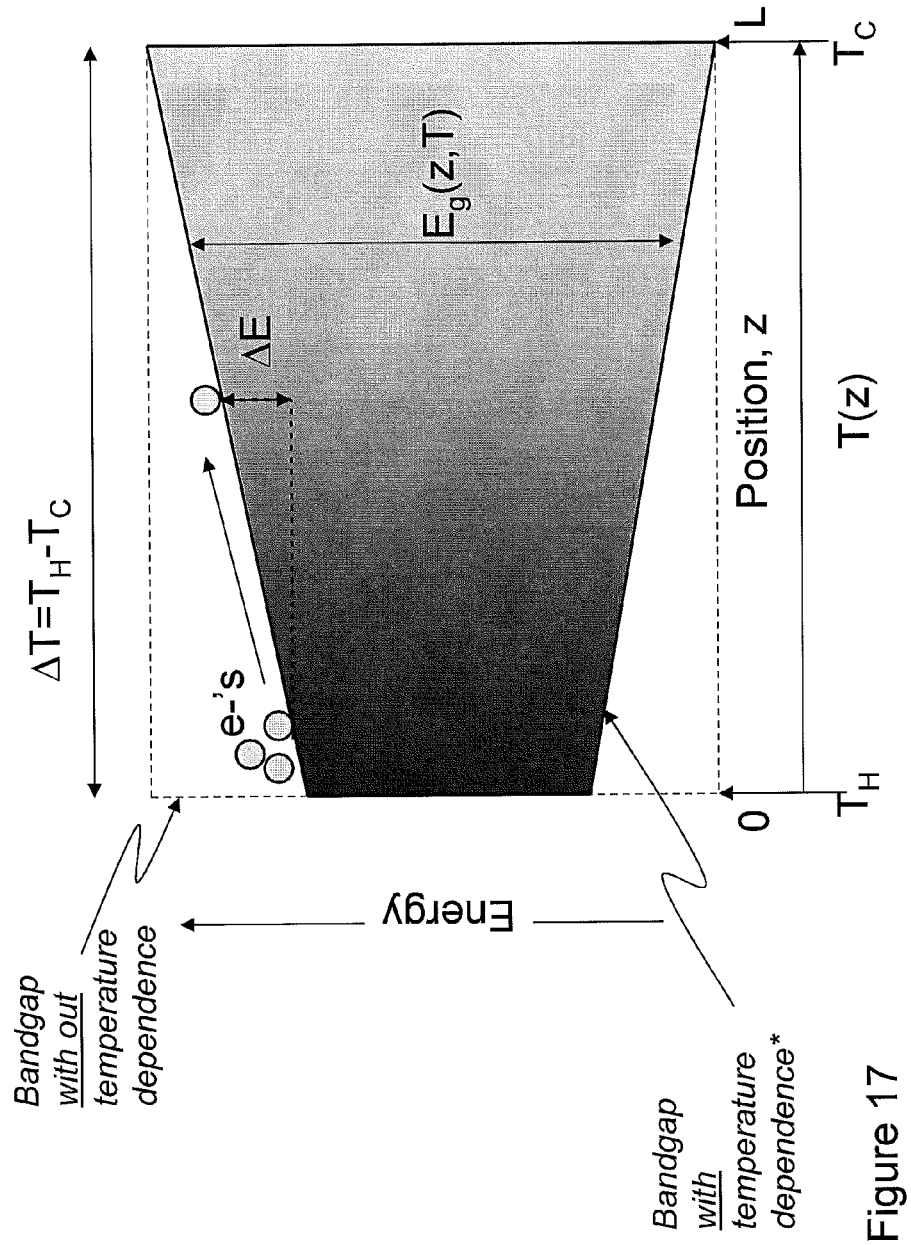

FIG. 17: Problem caused in bulk thermoelectric semiconductor on carrier diffusion due to band gap narrowing.

Figure 18:
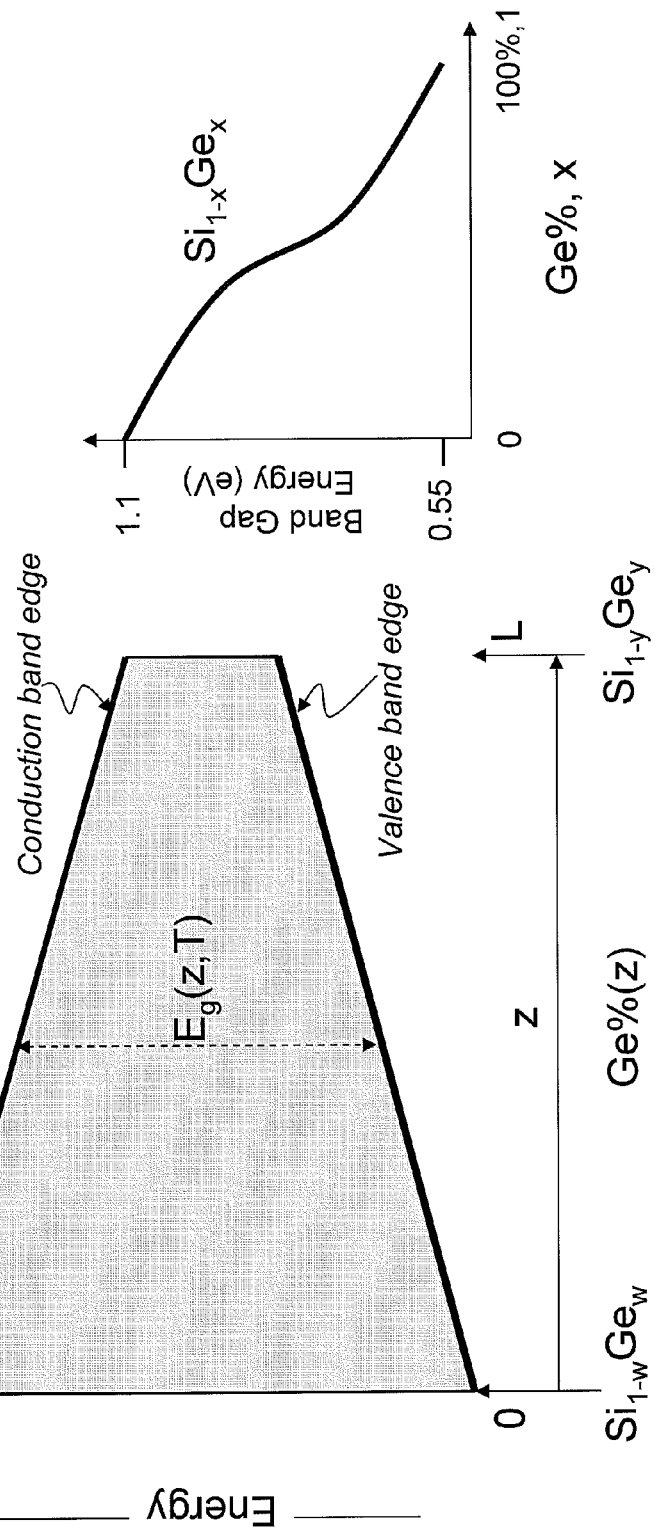

FIG. 18: Example solution to minimize deleterious bandgap narrowing behavior.

Figure 19:
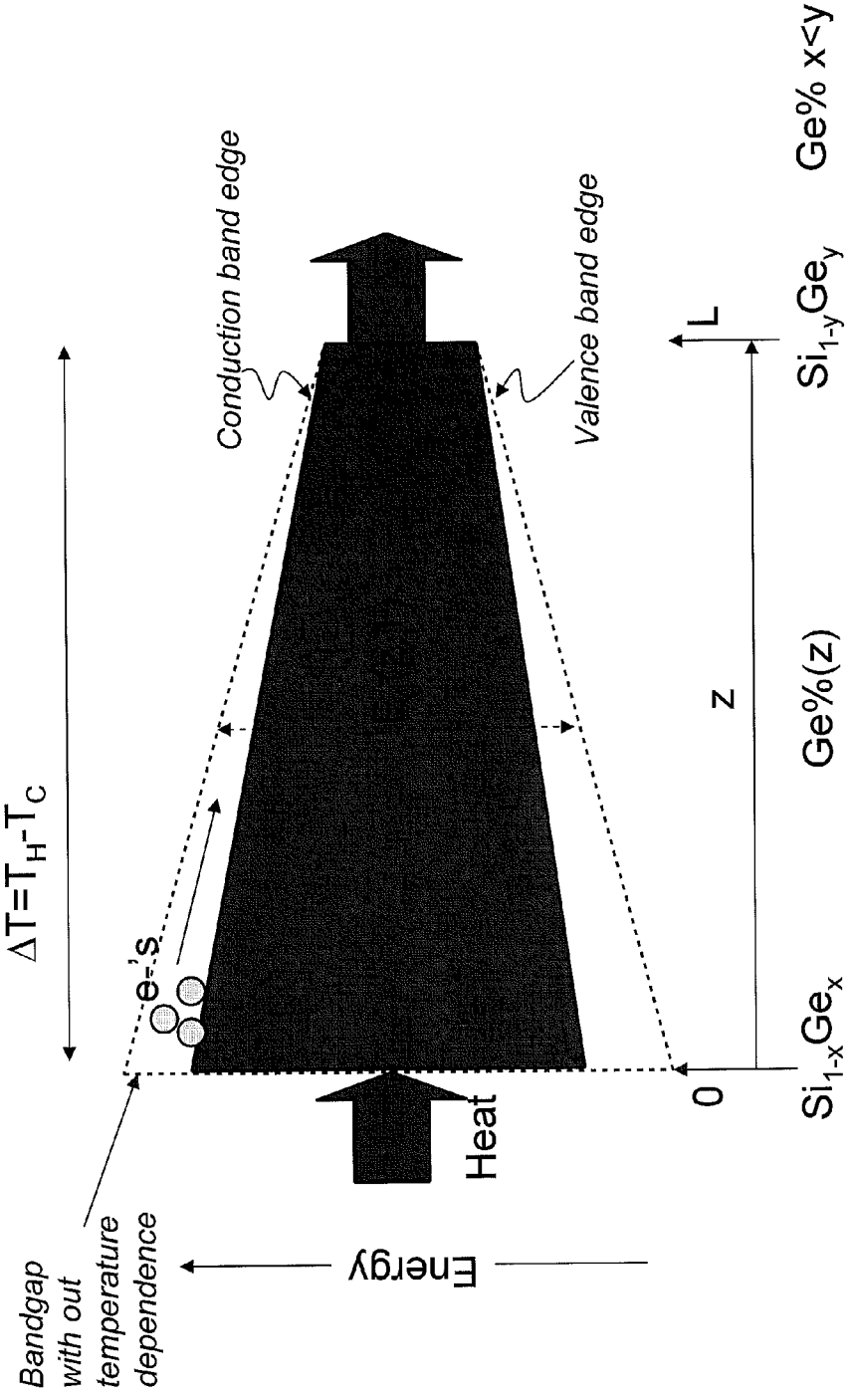

FIG. 19: Carrier diffusion process in graded band gap solution to bandgap narrowing in thermoelectric devices.

Figure 20:
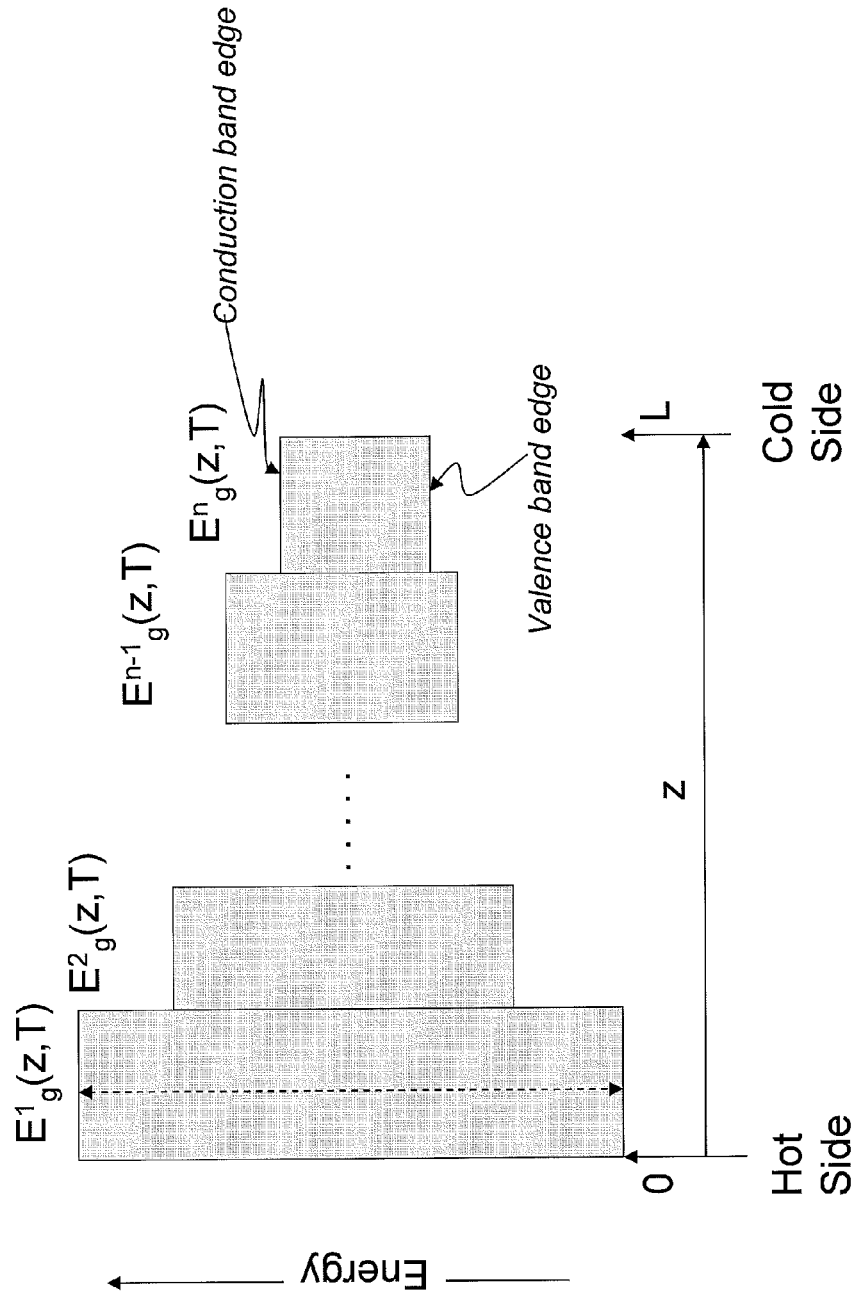

FIG. 20: General schematic of stepped bandgap layers forming a thermoelectric device exhibiting type-I conduction and valence band offset.

Figure 21:
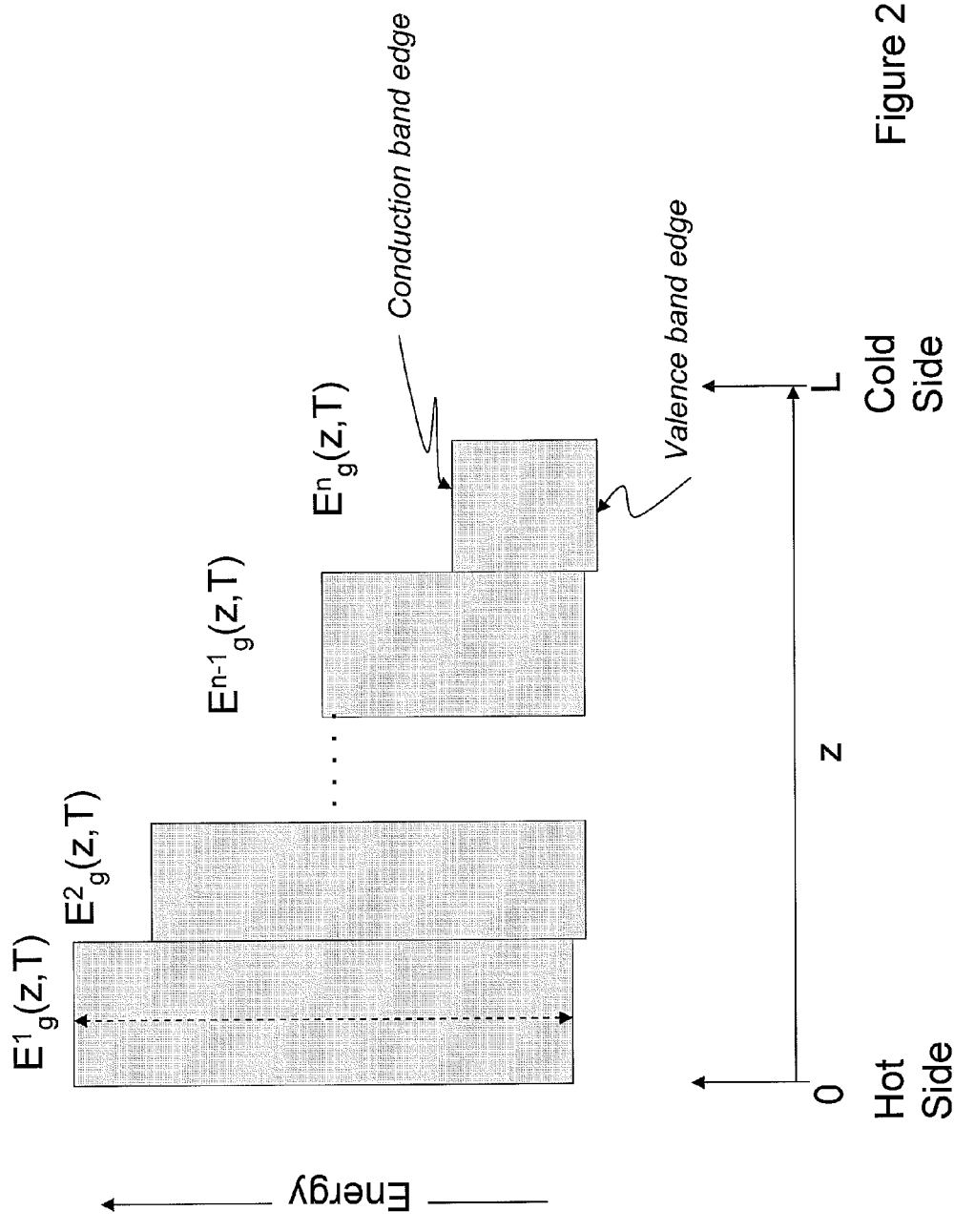

FIG. 21: General schematic of stepped bandgap layers forming a thermoelectric device exhibiting type-II conduction and valence band offset.

Figure 22:
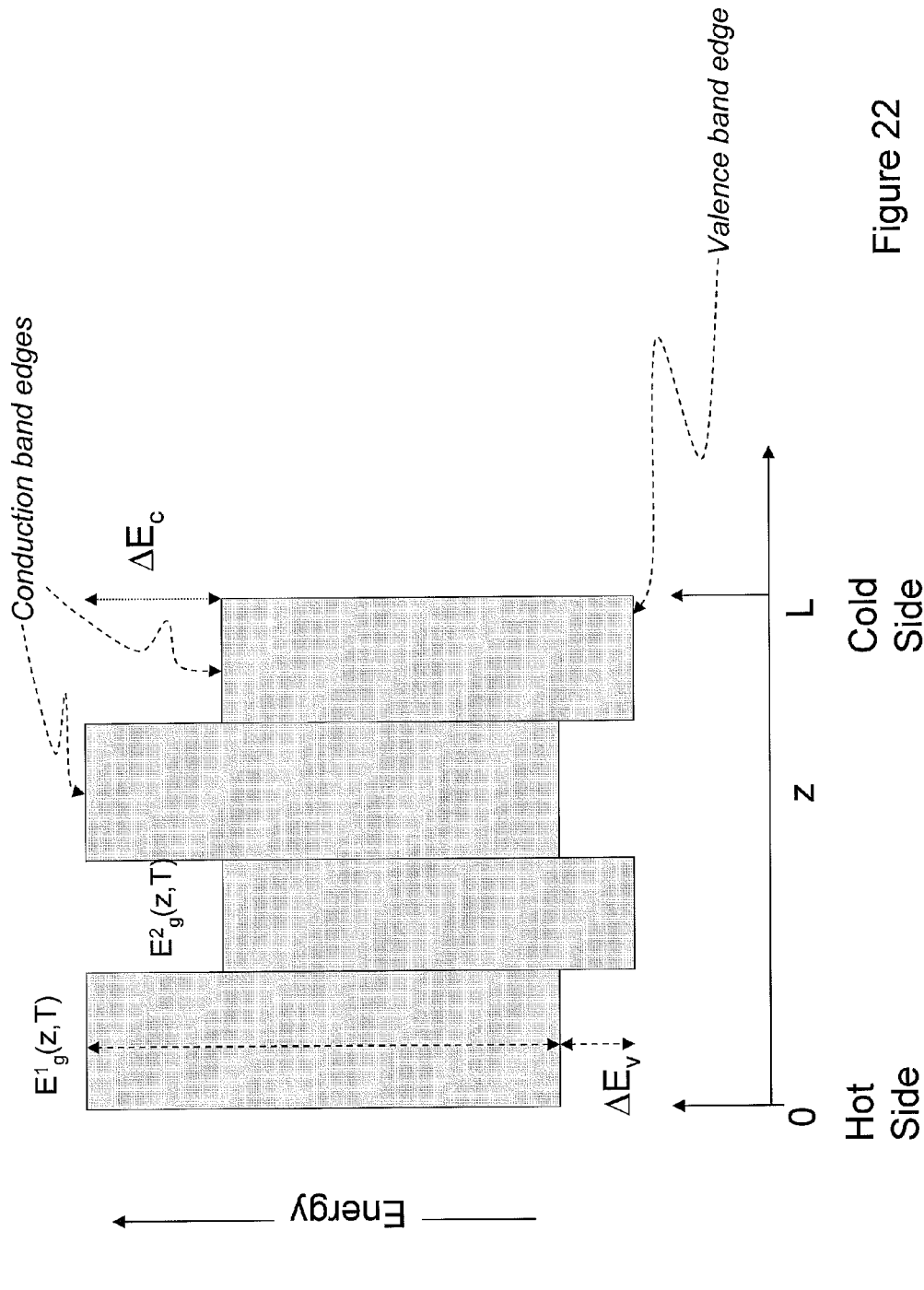

FIG. 22: General schematic of staggered bandgap layers forming a thermoelectric device exhibiting type-II conduction and valence band offset.

Figure 23:
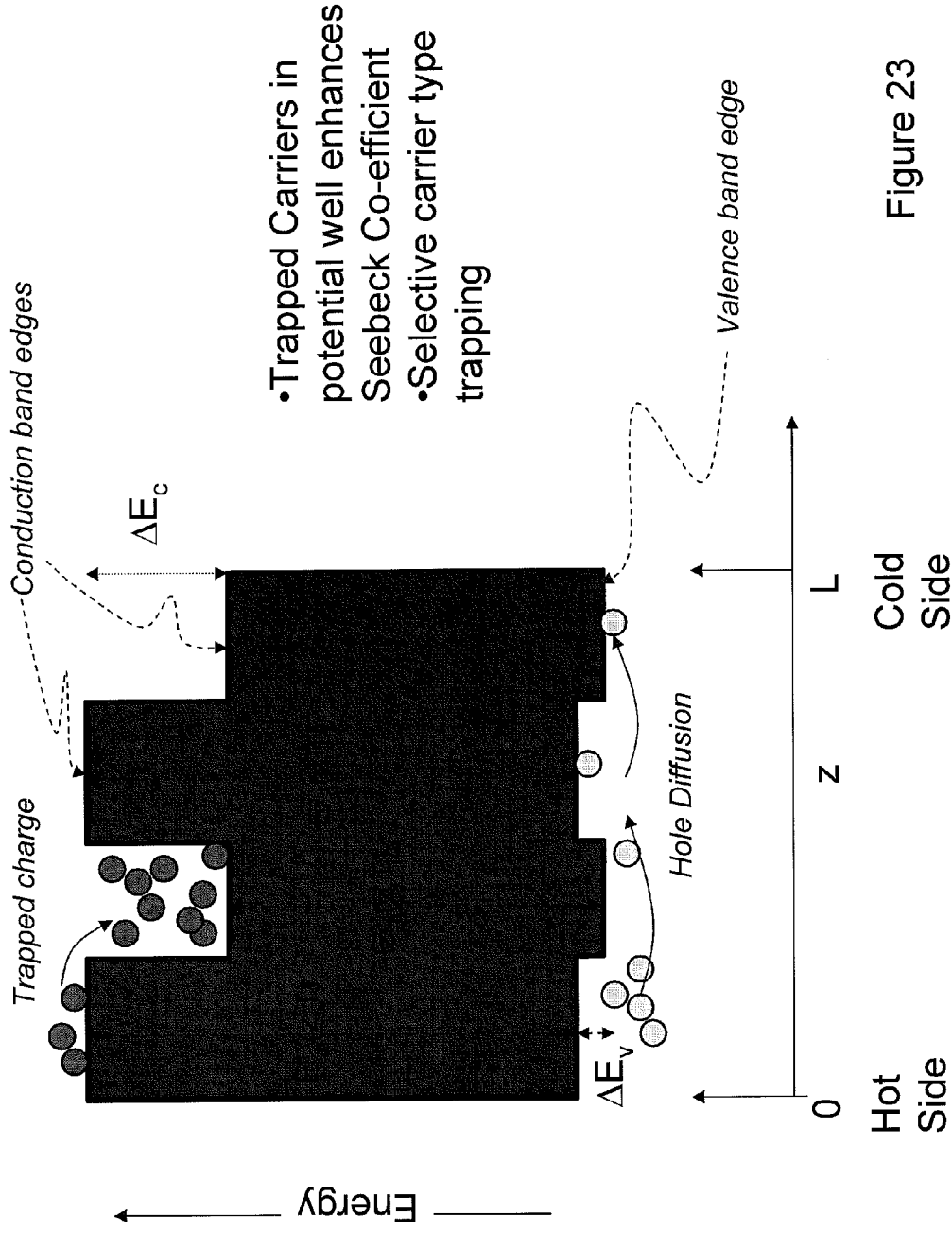

FIG. 23: Enhancement process of thermoelectric Seebeck effect using general schematic of staggered bandgap layers forming a thermoelectric device.

FIG. 24: Optional embodiment thermoelectric material using rare-earth metal oxides.

FIG. 25: Advantageous properties of optional embodiment thermoelectric materials using rare-earth metal oxides.

Figure 26:
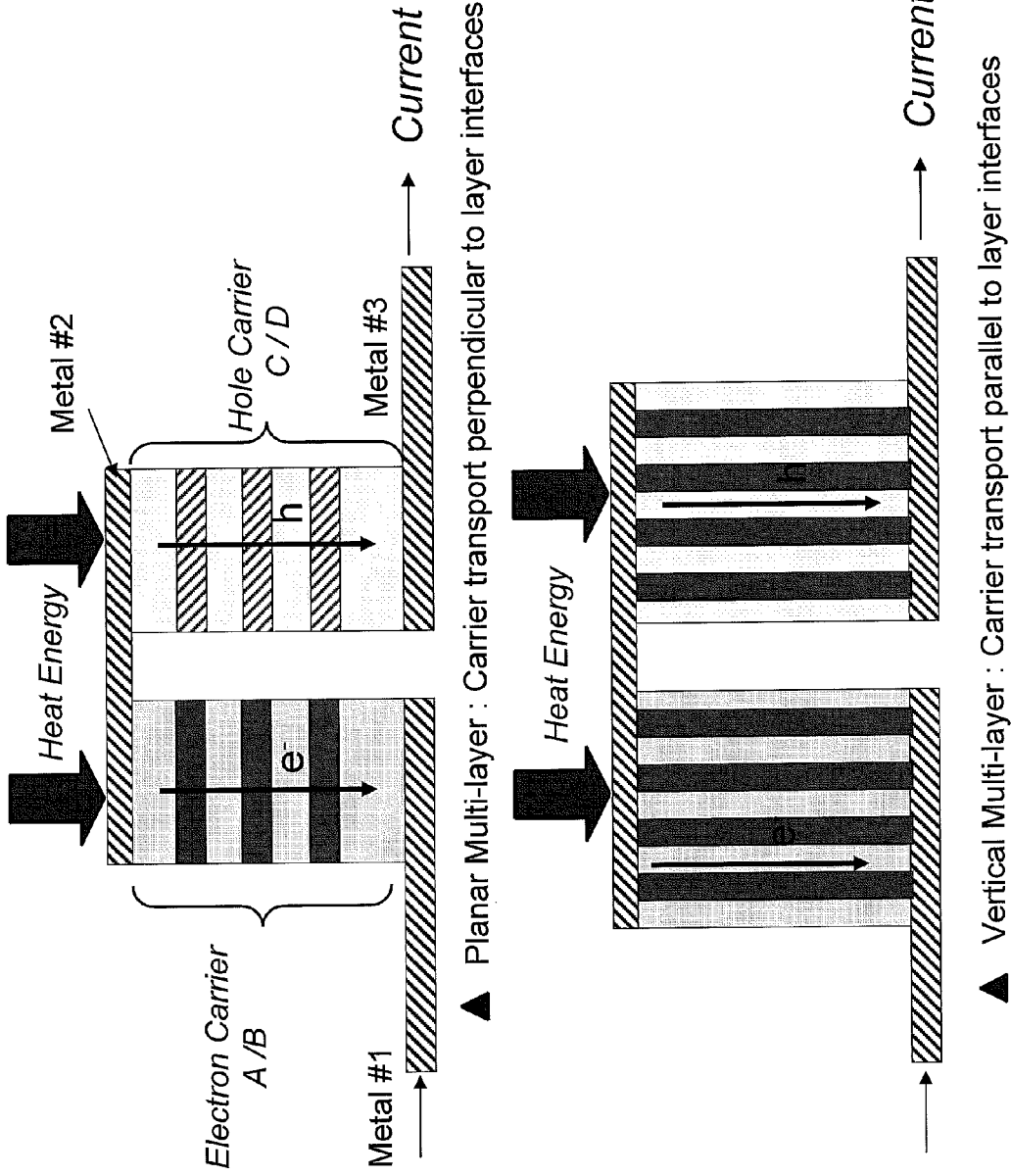

FIG. 26: Optional embodiment thermoelectric material using multilayer compositions oriented substantially horizontal and vertical with respect to charge carrier propagation directions.

Figure 27:
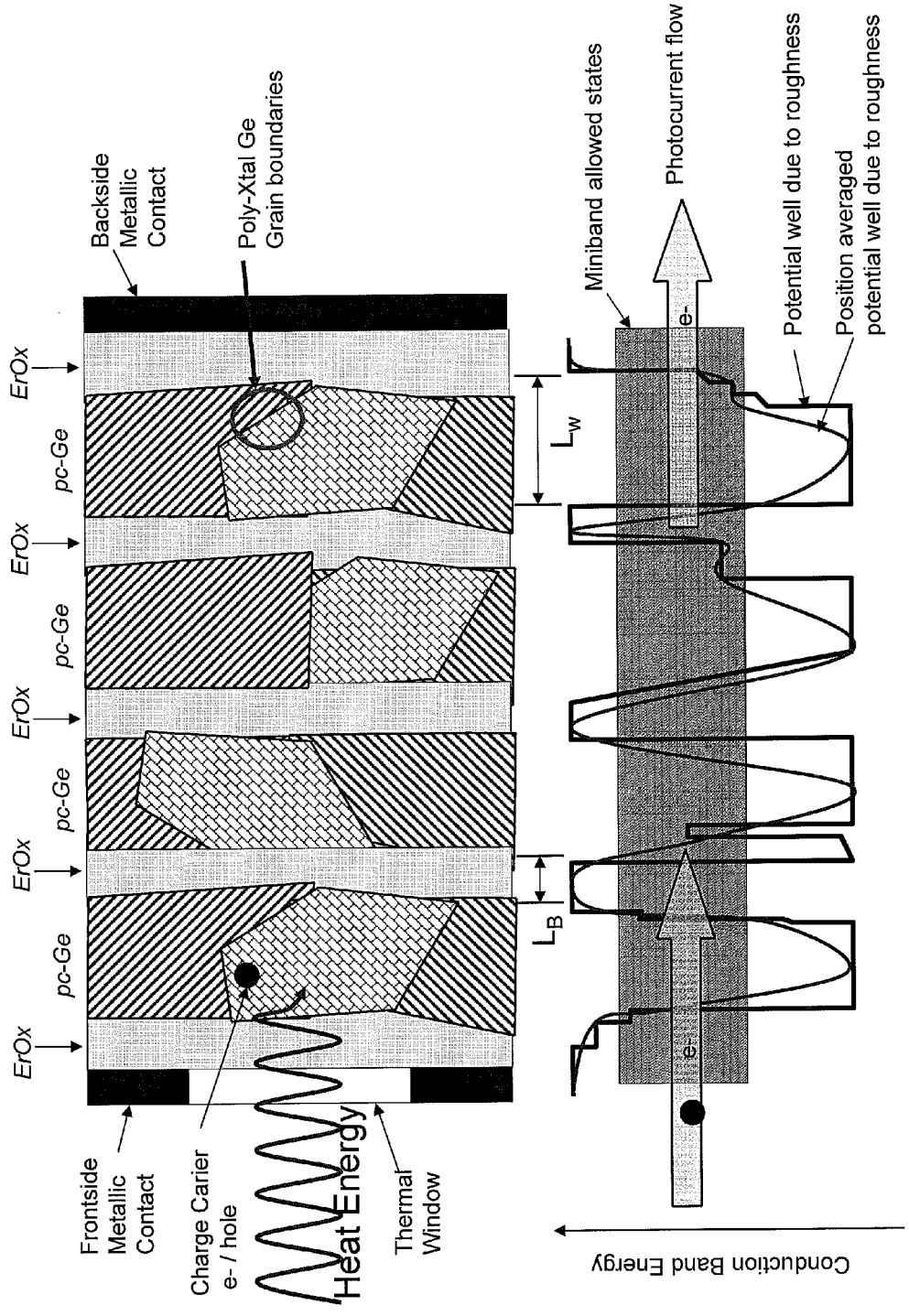

FIG. 27: Optional embodiment multilayer thermoelectric materials using rare-earth metal oxides and germanium.

Figure 28:
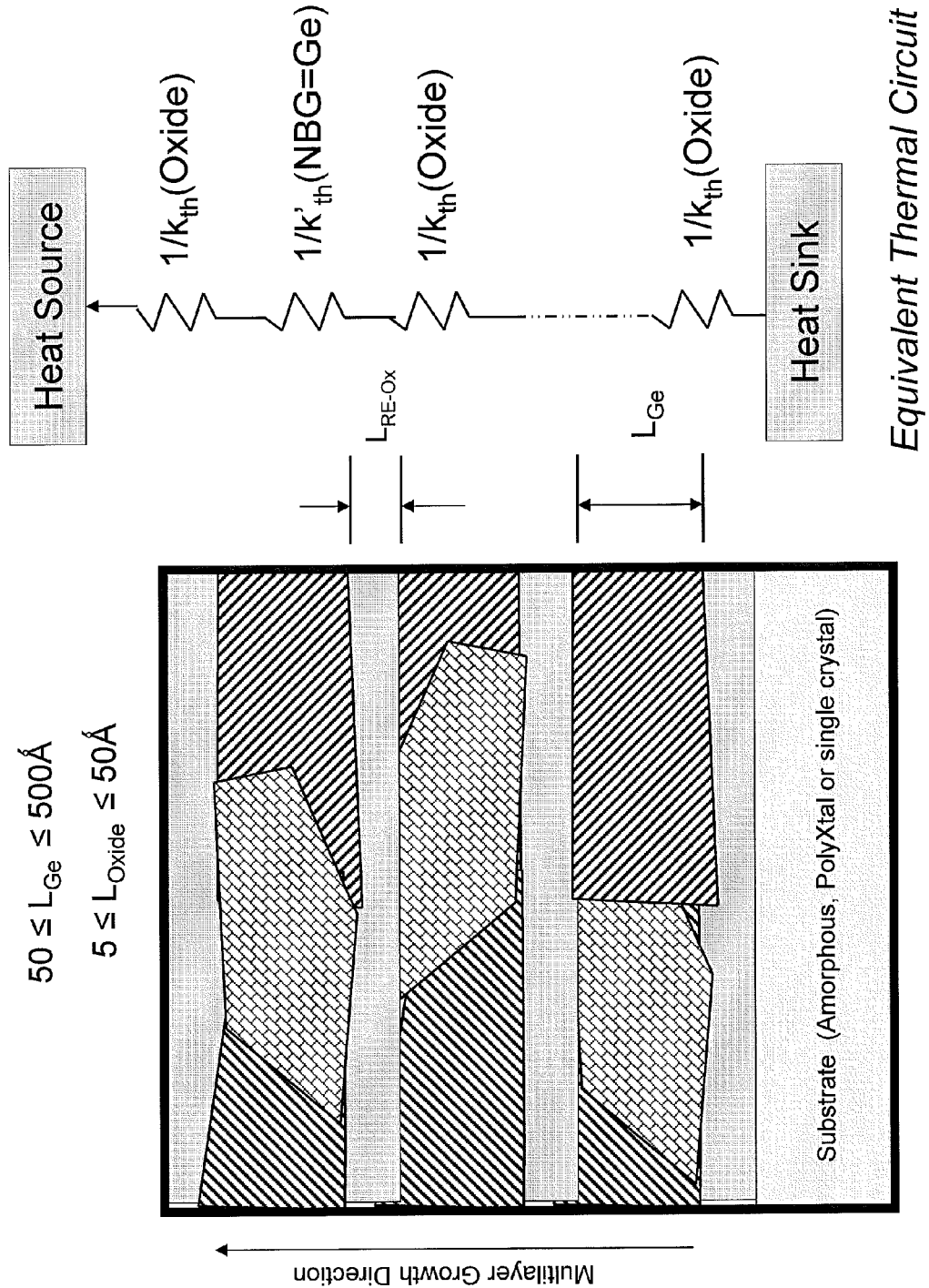

FIG. 28: An optional embodiment thermoelectric material using rare-earth metal oxides.

Figure 29:
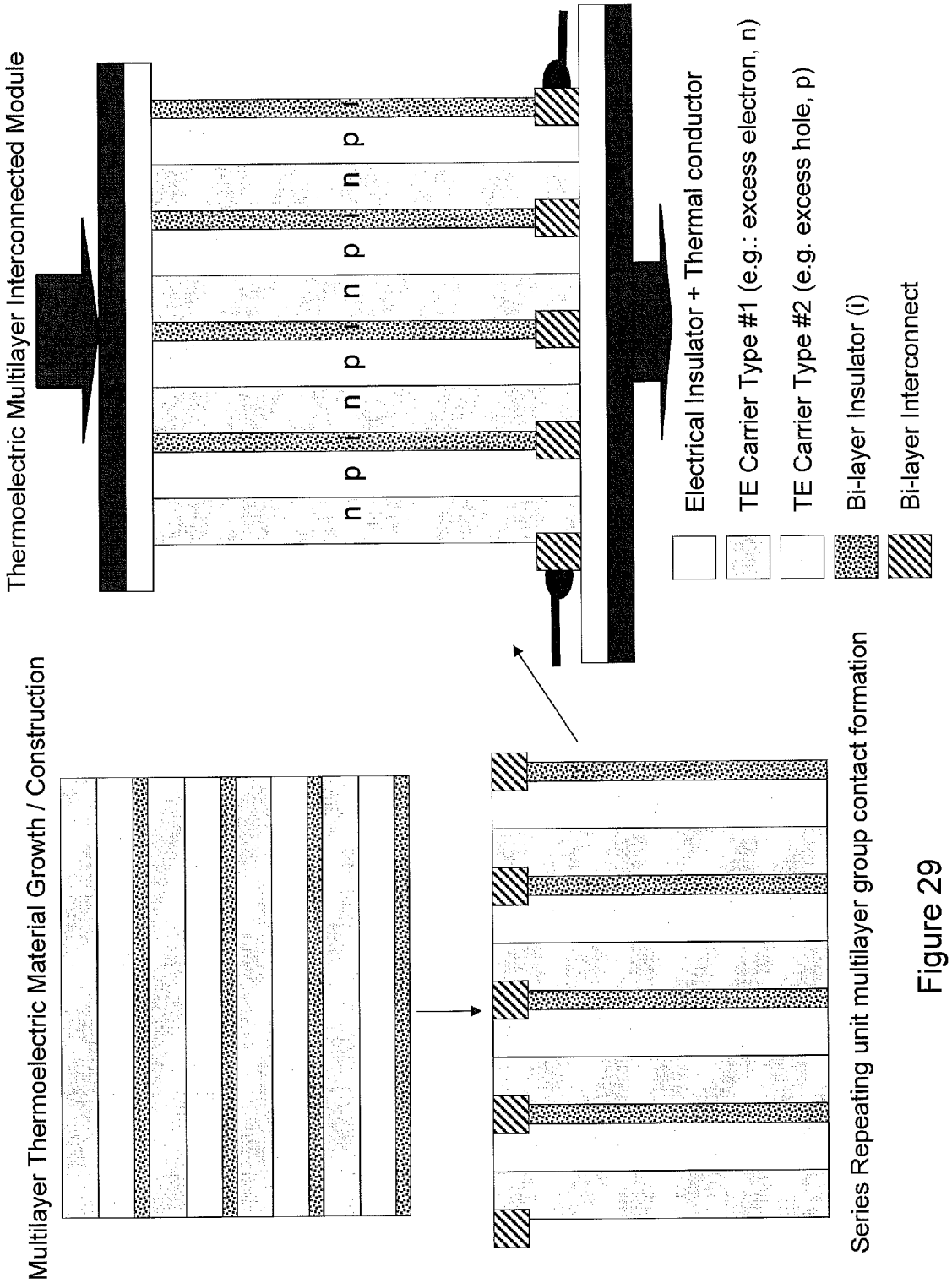

FIG. 29: An optional embodiment of thermoelectric material using multilayer n-type and p-type layer construct separated by an intrinsic and/or semi-insulating and/or insulating intermediate layer.

Figure 30:
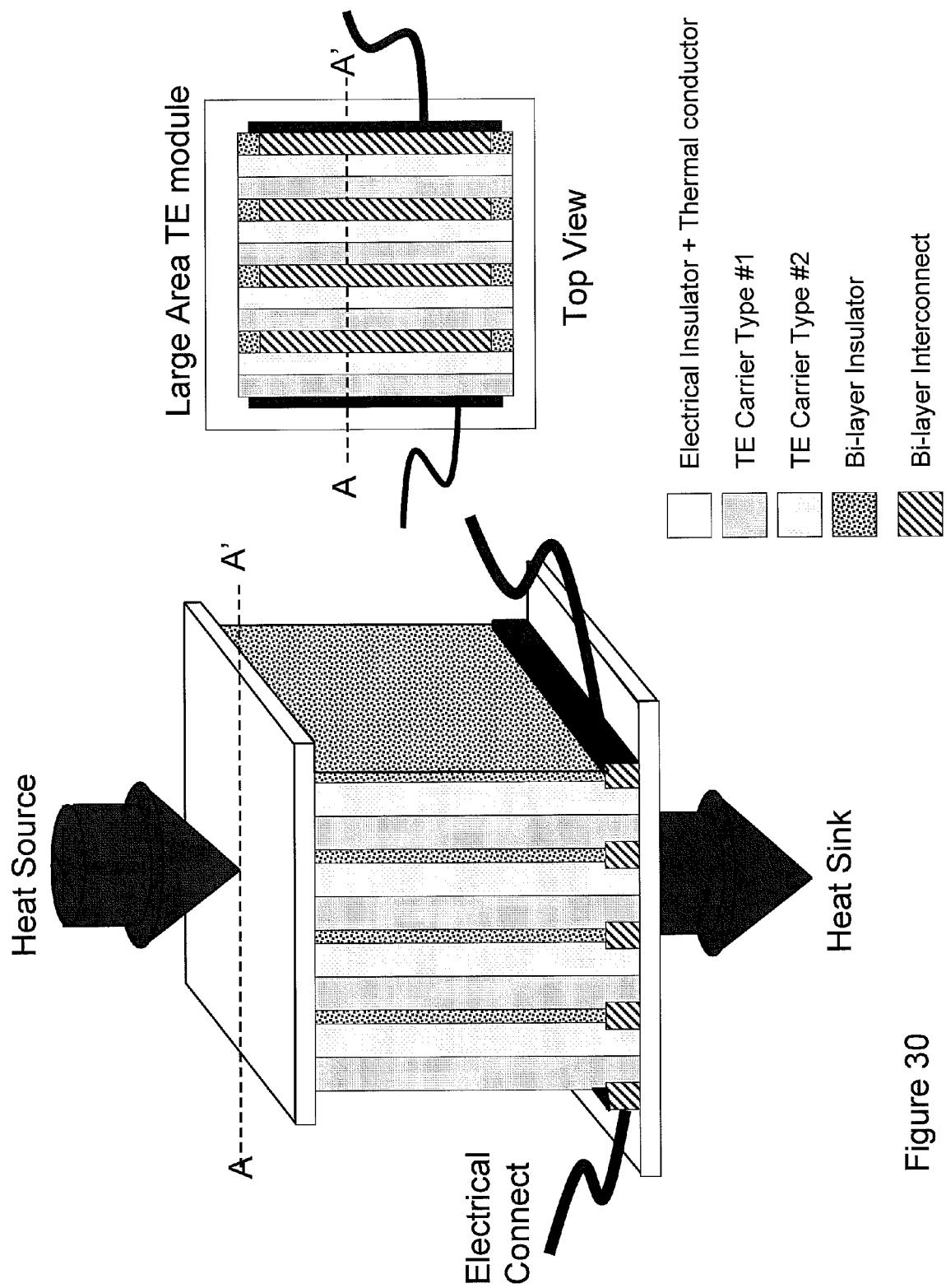

FIG. 30: Schematic example of the configuration of the multiple n/p/i unit cell in a thermoelectric device.

Figure 31:
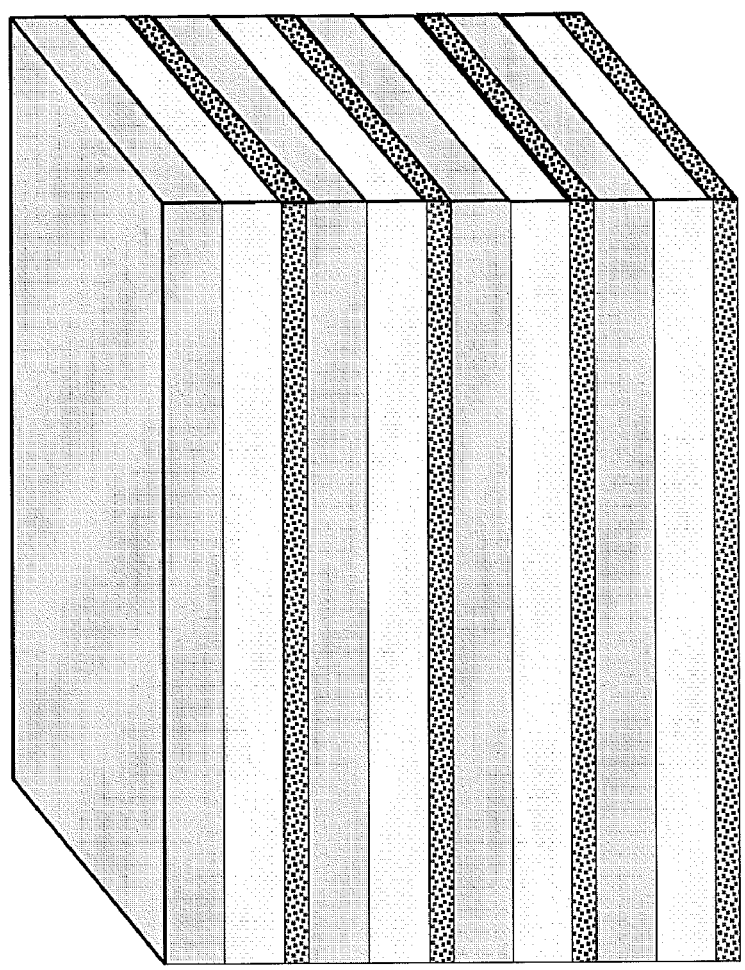

FIG. 31: Multilayer thermoelectric stack.

Figure 32:
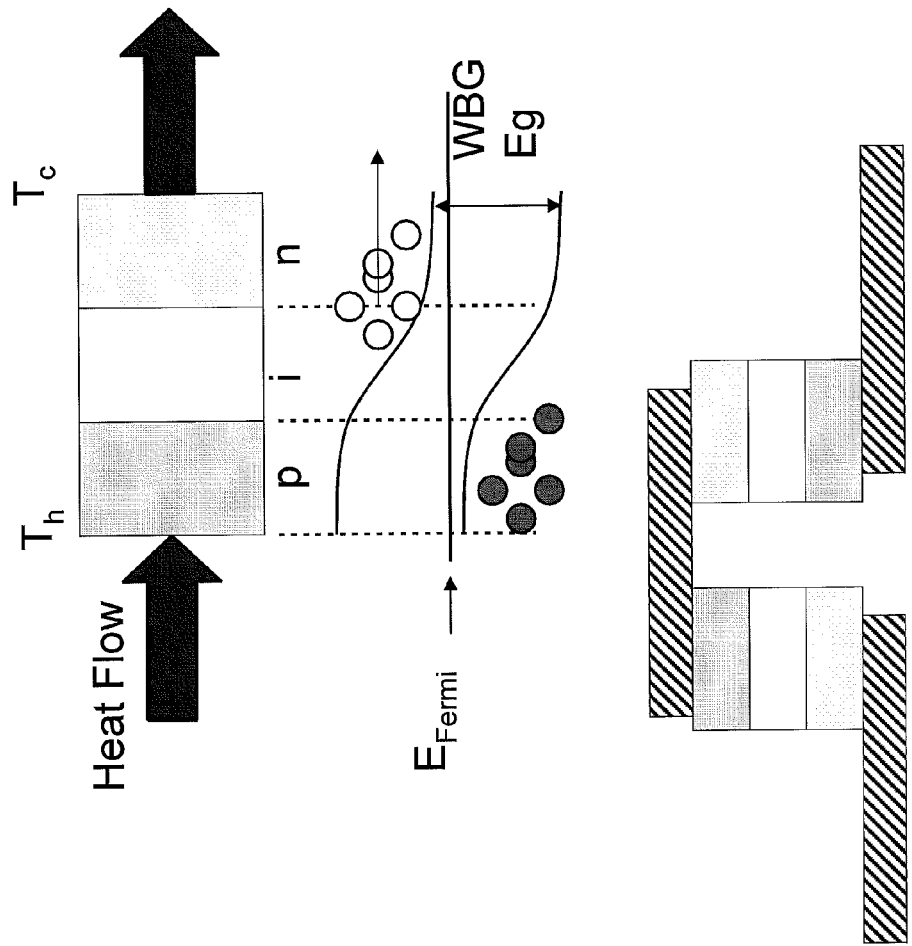

FIG. 32: Optional embodiment of single stage p-i-n multilayer thermoelectric stack.

Figure 33:
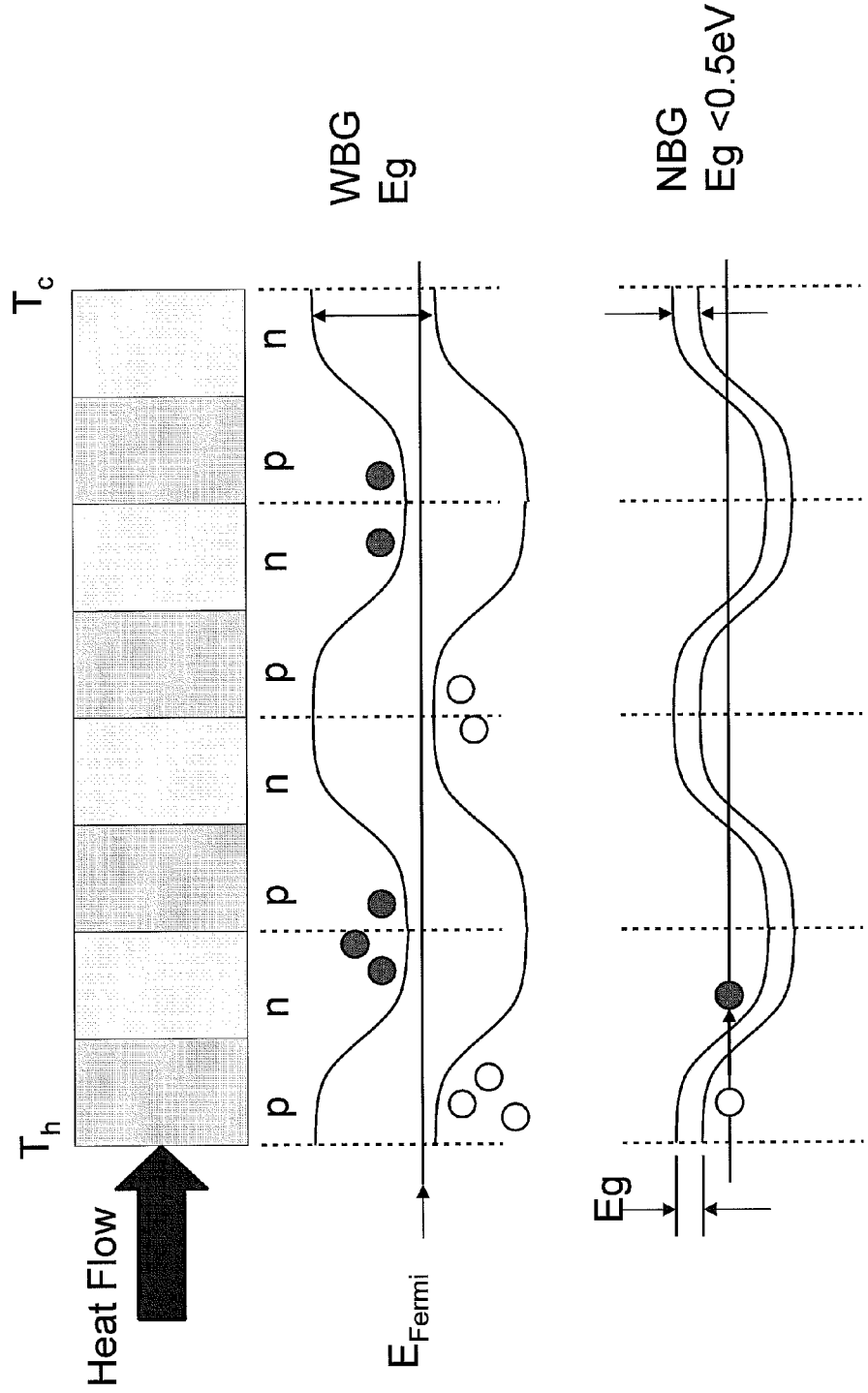

FIG. 33: Optional embodiment of multilayer p-type/n-type thermoelectric stack.

Figure 34:
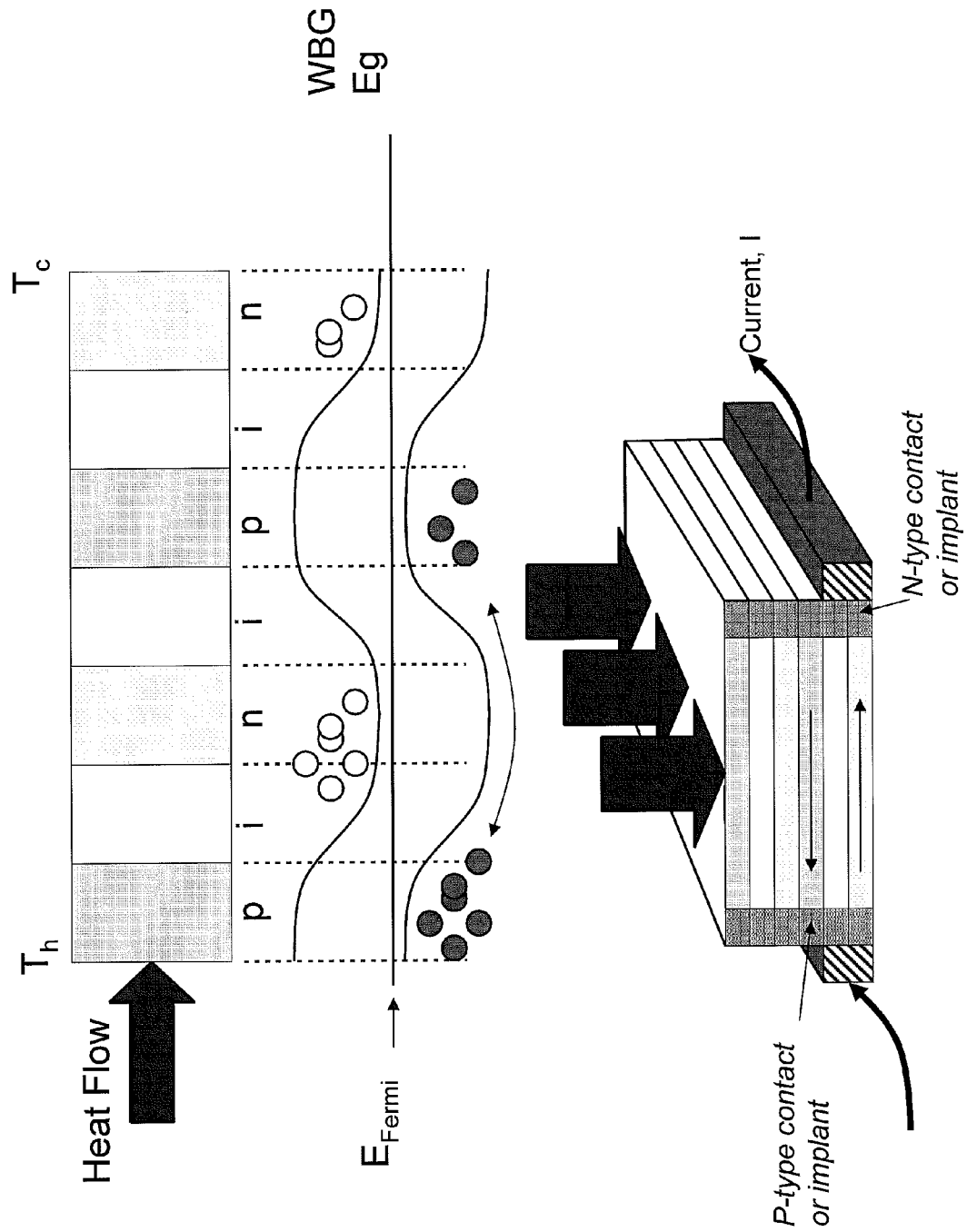

FIG. 34: Optional embodiment of multilayer p-type/i/n-type thermoelectric stack.

Figure 35:
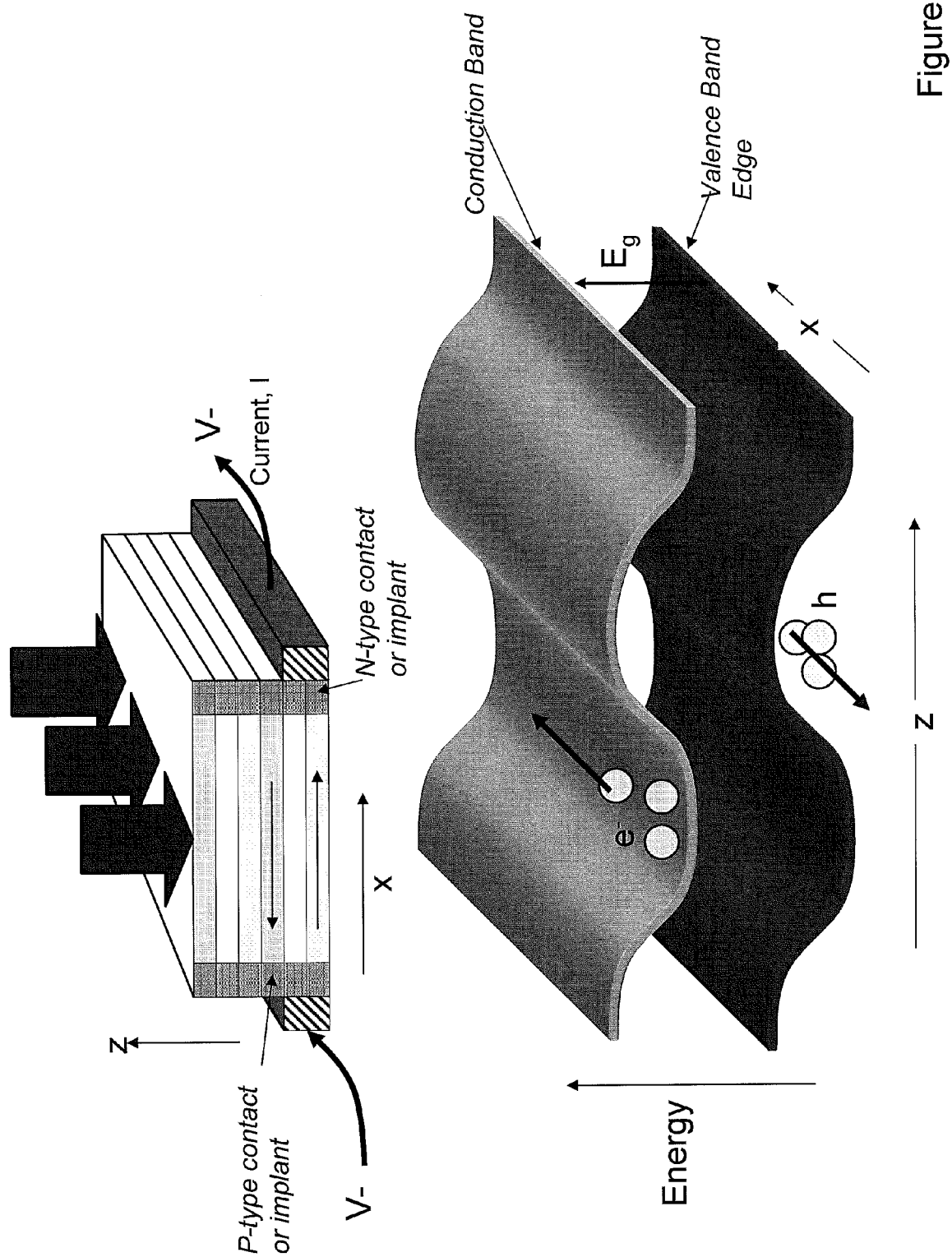

FIG. 35: Optional embodiment of multilayer p-type/i-type/n-type thermoelectric stack.

Figure 36:
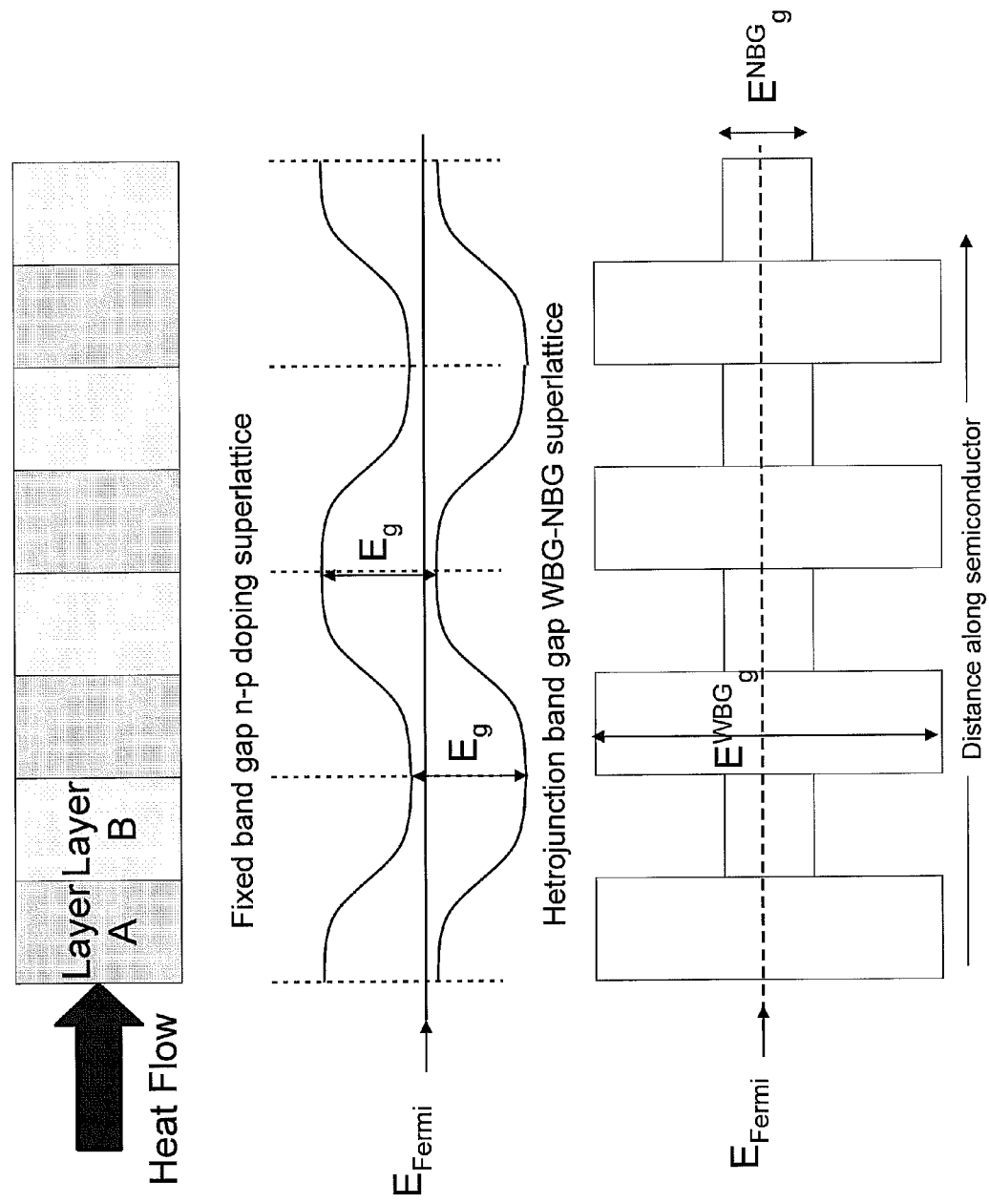

FIG. 36: Comparison of several embodiments of the instant invention utilizing: (i) modulation of impurity dopant type in homojunction (fixed bandgap) thermoelectric semiconductor device; and (ii) wide bandgap and narrow bandgap heterojunction (different bandgap) multilayer stack.

Figure 37:
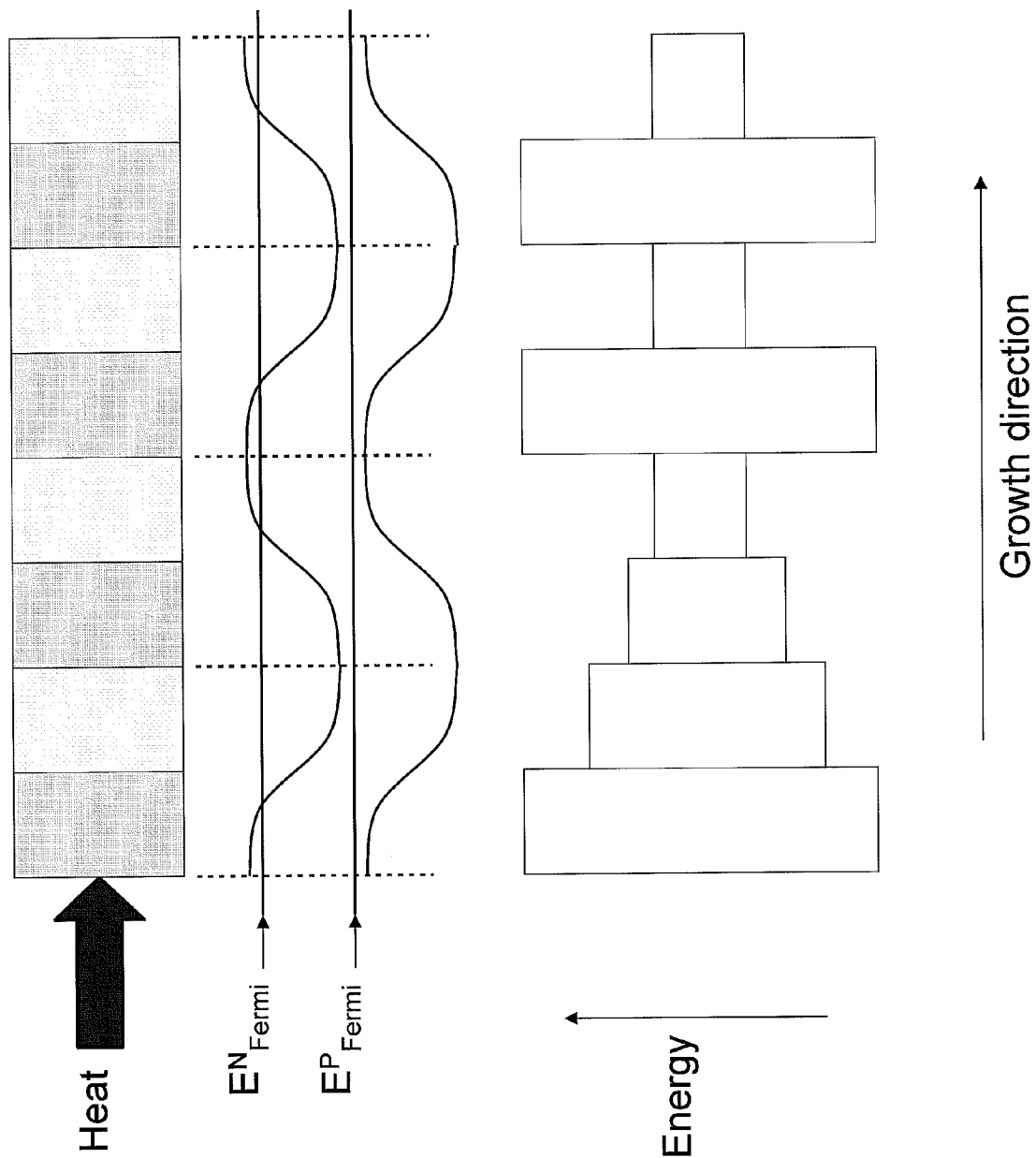

FIG. 37: Comparison of several embodiments of the instant invention utilizing: (i) modulation of impurity dopant type in homojunction (fixed bandgap) thermoelectric semiconductor device; and (ii) wide bandgap and narrow bandgap heterojunction (different bandgap) multilayer stack.

Figure 38:
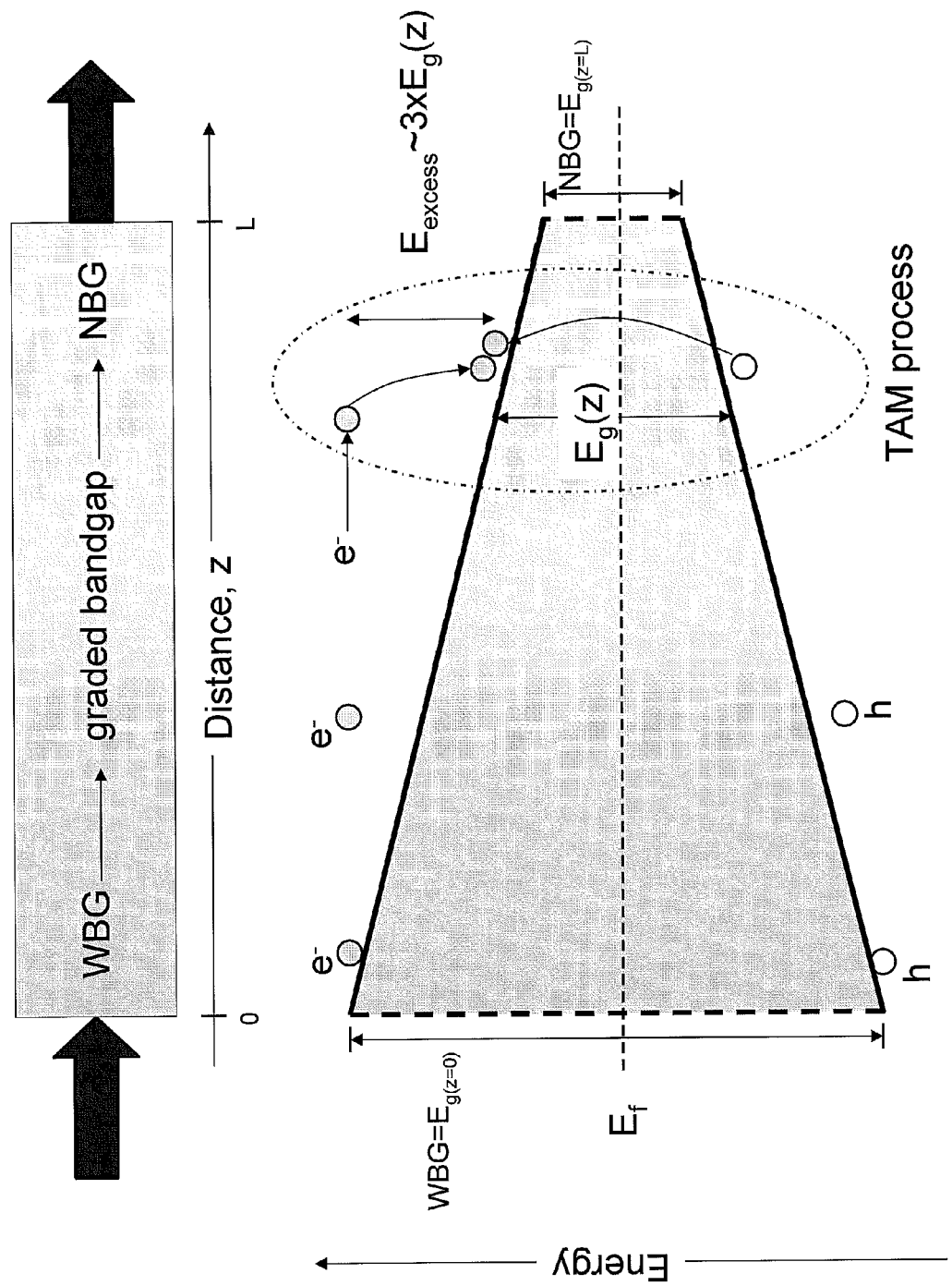

FIG. 38: An optional embodiment of a thermoelectric avalanche multiplication (TAM) generator/amplifier device.

FIG. 39: Schematic diagram of an optional embodiment of a thermoelectric multilayer device structure incorporating, wherein at least one metal layer and an oxide layer form the said thermoelectric device.

FIG. 40: Description of one embodiment of the instant invention utilizing rare-earth-copper-oxide $RE_xCu_yO_z$ thermoelectric materials.

FIG. 41: Description of one embodiment of the instant invention utilizing rare-earth-bismuth-oxide $RE_xBi_yO_z$ thermoelectric materials.

Figure 42:
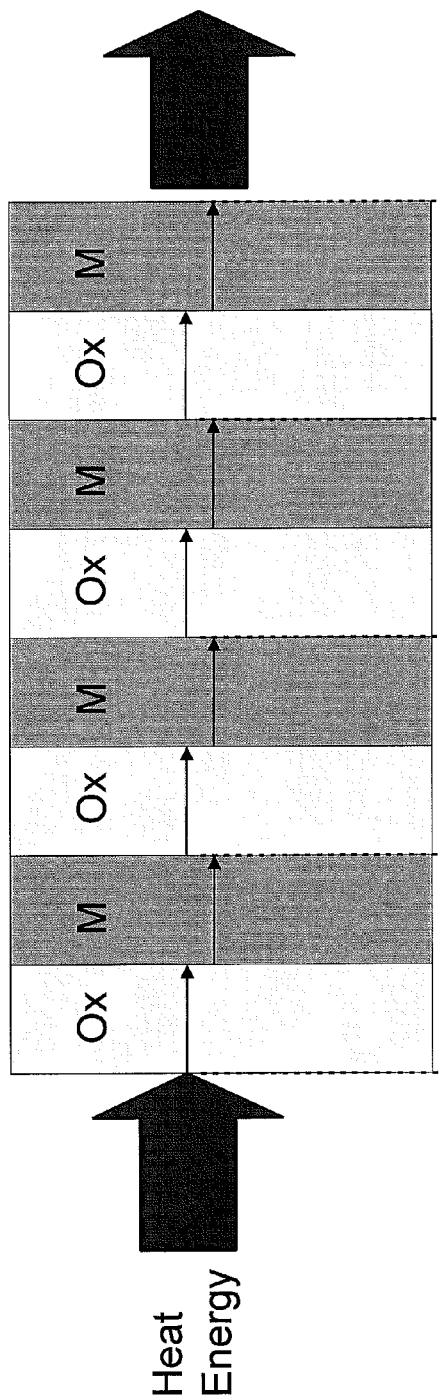

FIG. 42: Schematic diagram and description of one embodiment of the instant invention utilizing oxide and metallic thermoelectric materials.

FIG. 43: Description of one embodiment of the instant invention rare-earth-silicon-carbide $RE_xSi_yC_z$ thermoelectric materials.

FIG. 44: Description of one embodiment of the instant invention rare-earth-silicon-germanium $RE_xSi_yGe_z$ thermoelectric materials.

FIG. 45: Description of one embodiment of the instant invention utilizing rare-earth-silicon-germanium-bismuth, $RE_xSi_yGe_zBi_s$ thermoelectric materials.

Figure 46:
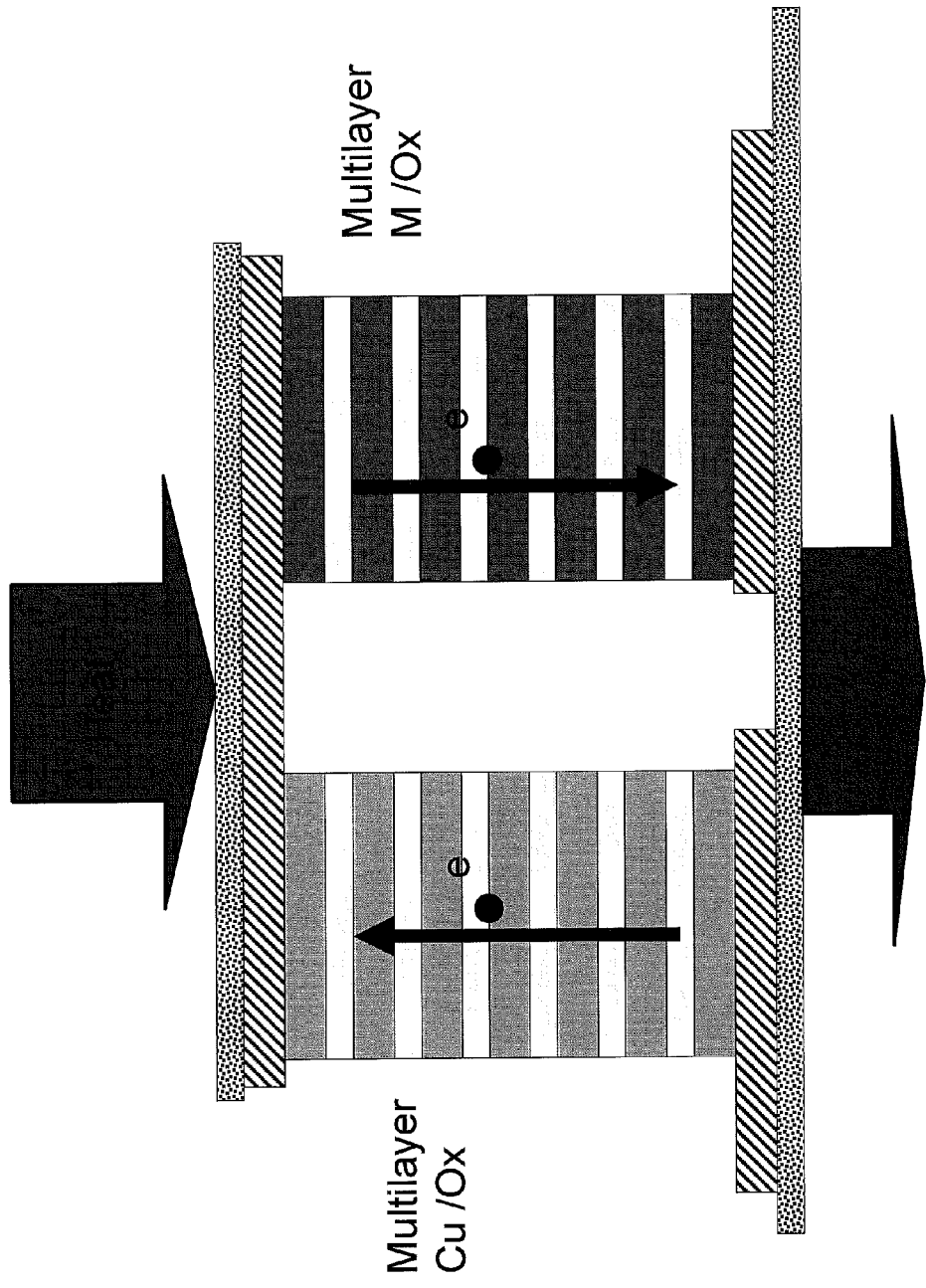

FIG. 46: Schematic diagram of multilayer thermoelectric device incorporating unipolar conducting metal oxide and metal thermoelectric superlattice and multilayer structure.

Figure 47:
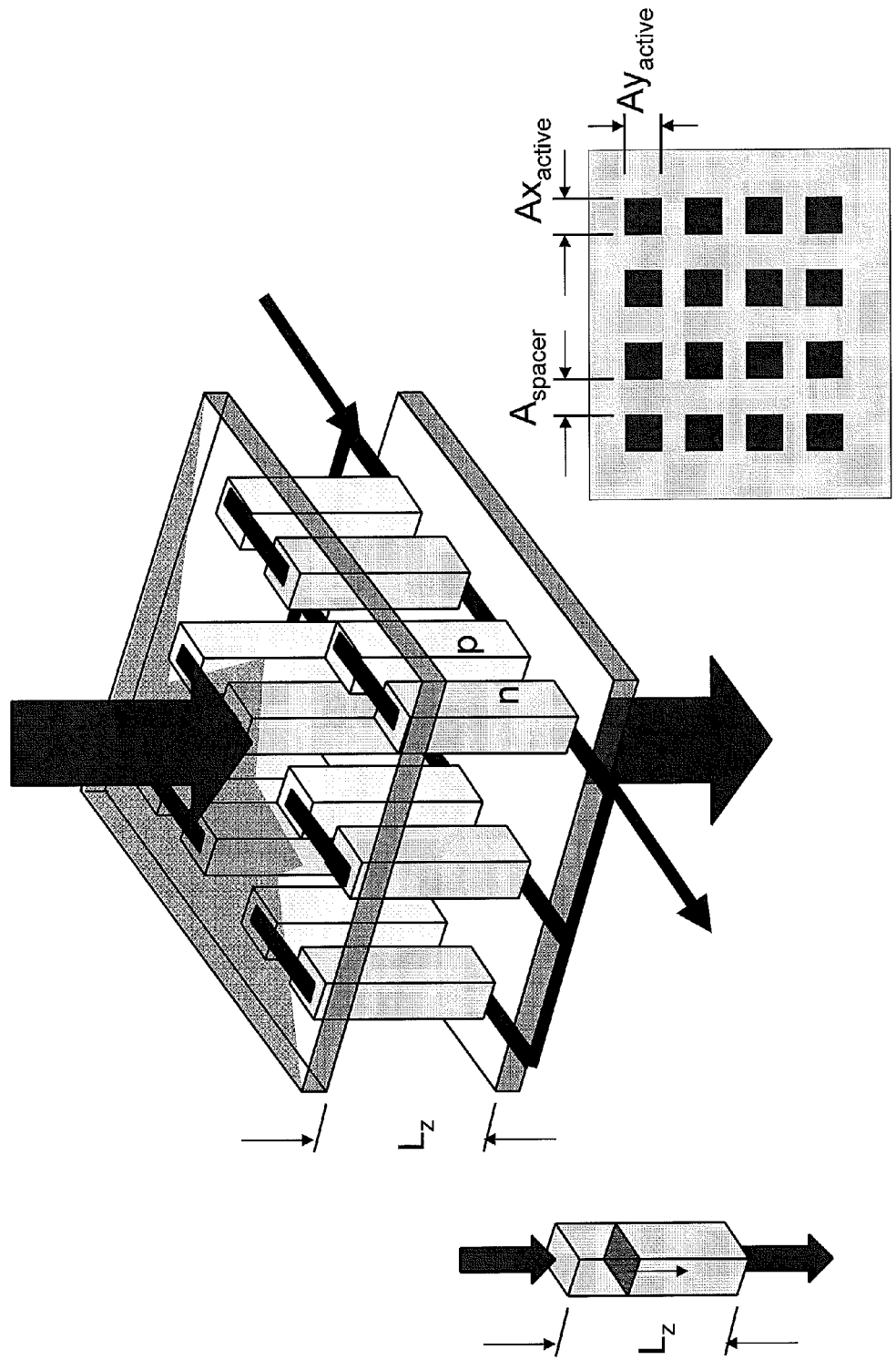

FIG. 47: Schematic 3-dimensional cut-away diagram and 2-dimensional top view of vertical-type thermoelectric generator incorporating pillar type thermoelectric cells.

Figure 48:
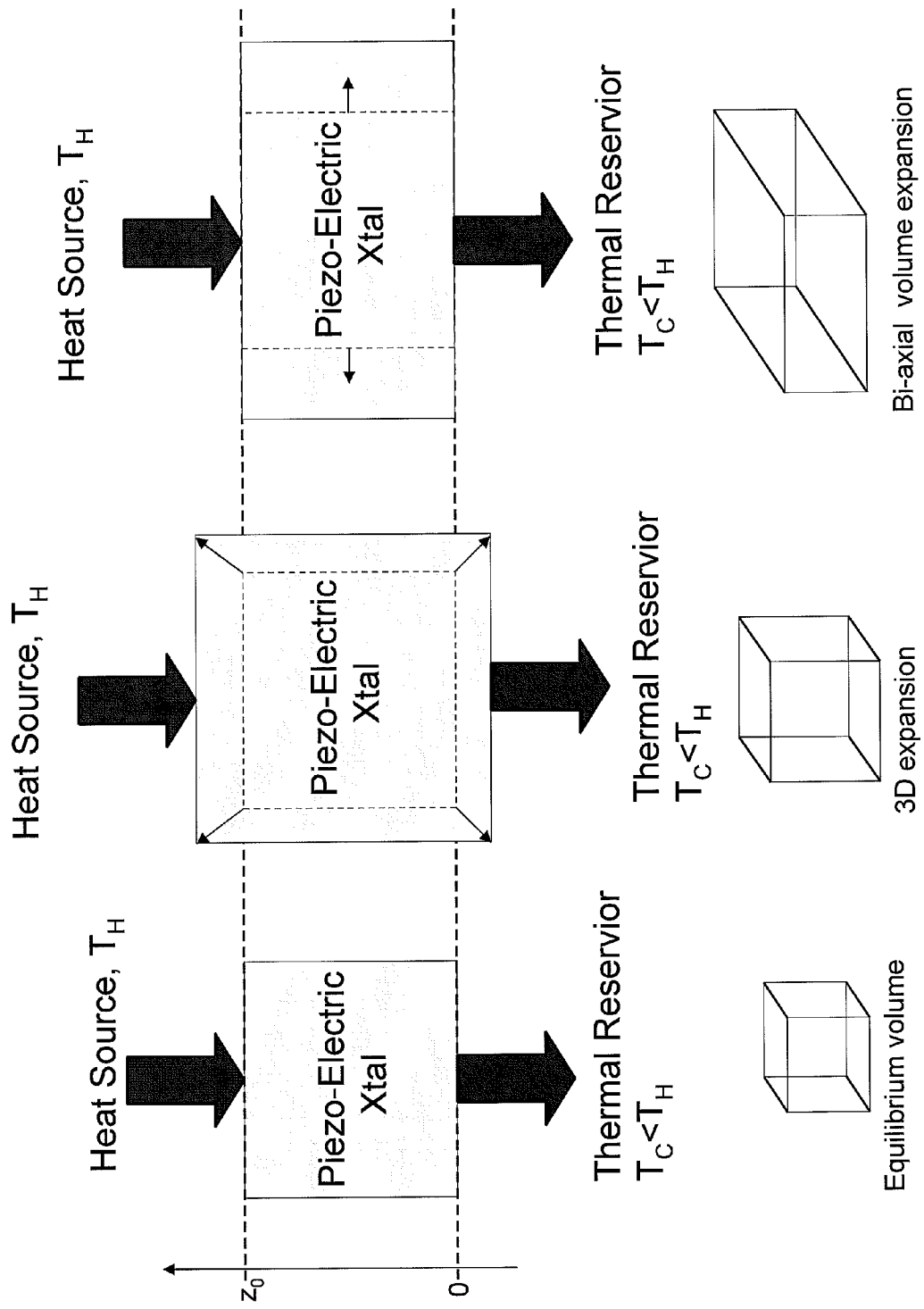

FIG. 48: Planar thermoelectric devices allow large surface area scalability and is termed the large area concept of the present invention.

Figure 49:
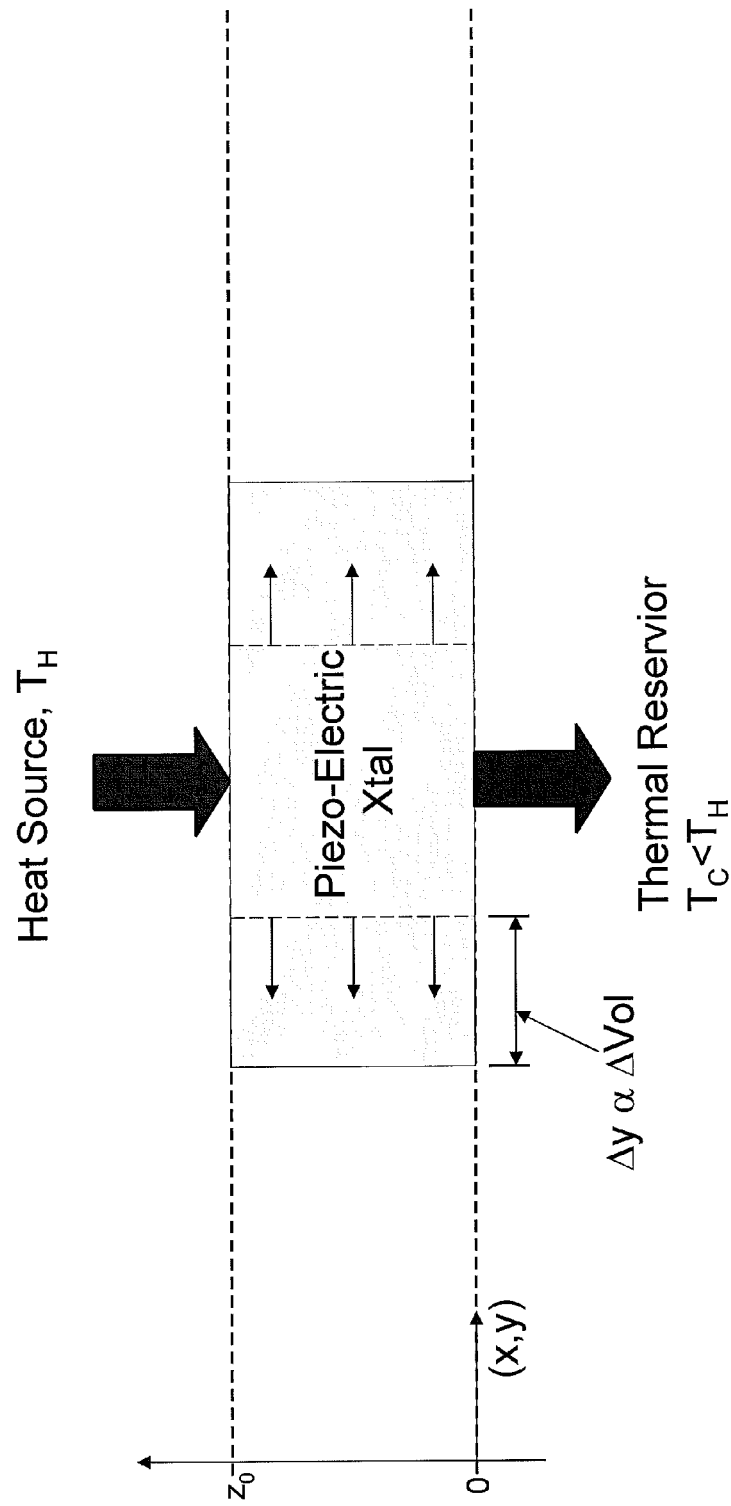

FIG. 49: An example implementation of large area thermoelectric devices using spatial deformation of thermoelectric material to introduce substantially non-parallel distortion of material structure.

Figure 50:
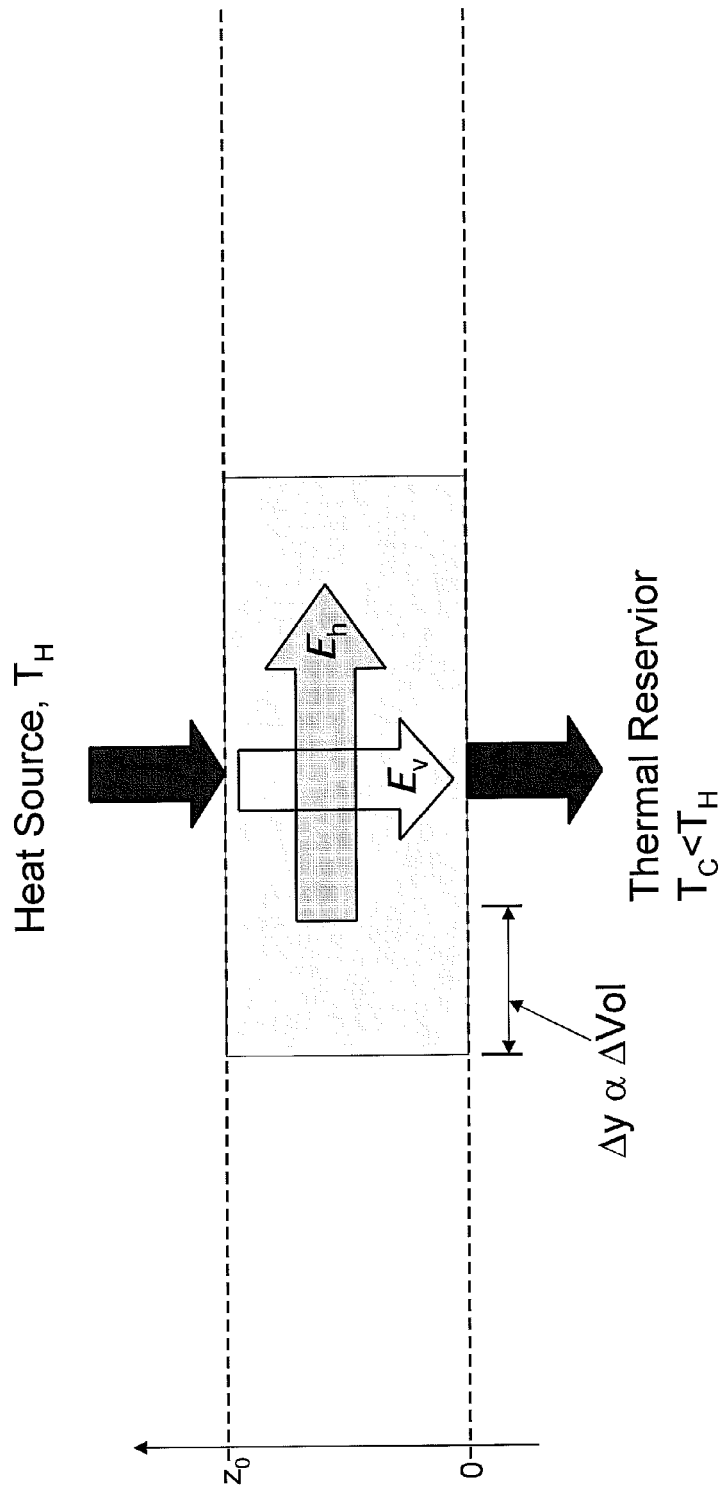

FIG. 50: Constrained volume expansion and the effect of geometry of piezoelectric and/or thermoelectric material due to applied thermal gradient.

Figure 51:
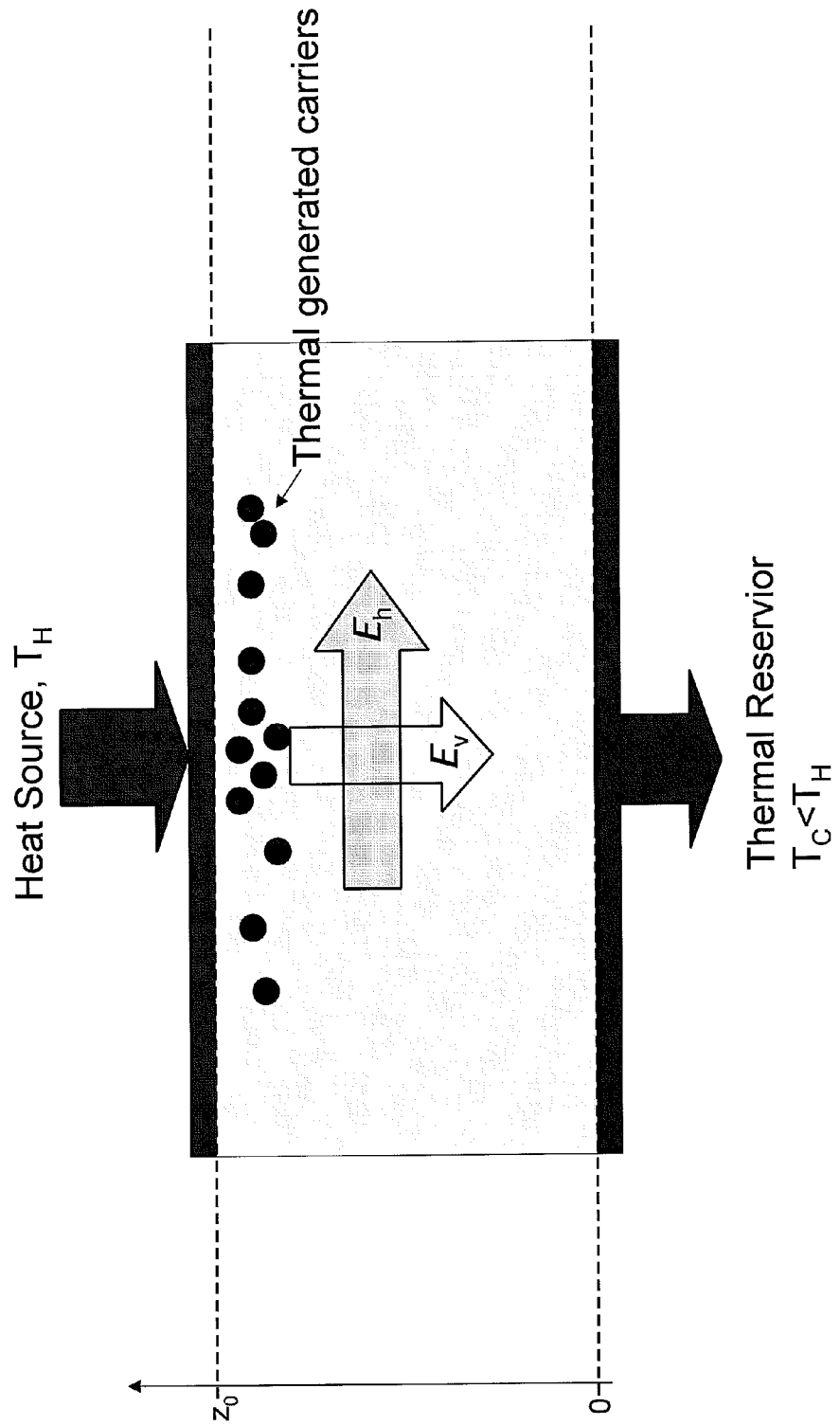

FIG. 51: Internal electric fields generated and/or enhanced due to constrained volume expansion and the effect of geometry of piezoelectric and/or and/or pyroelectric thermoelectric material due to applied thermal gradient.

Figure 52:
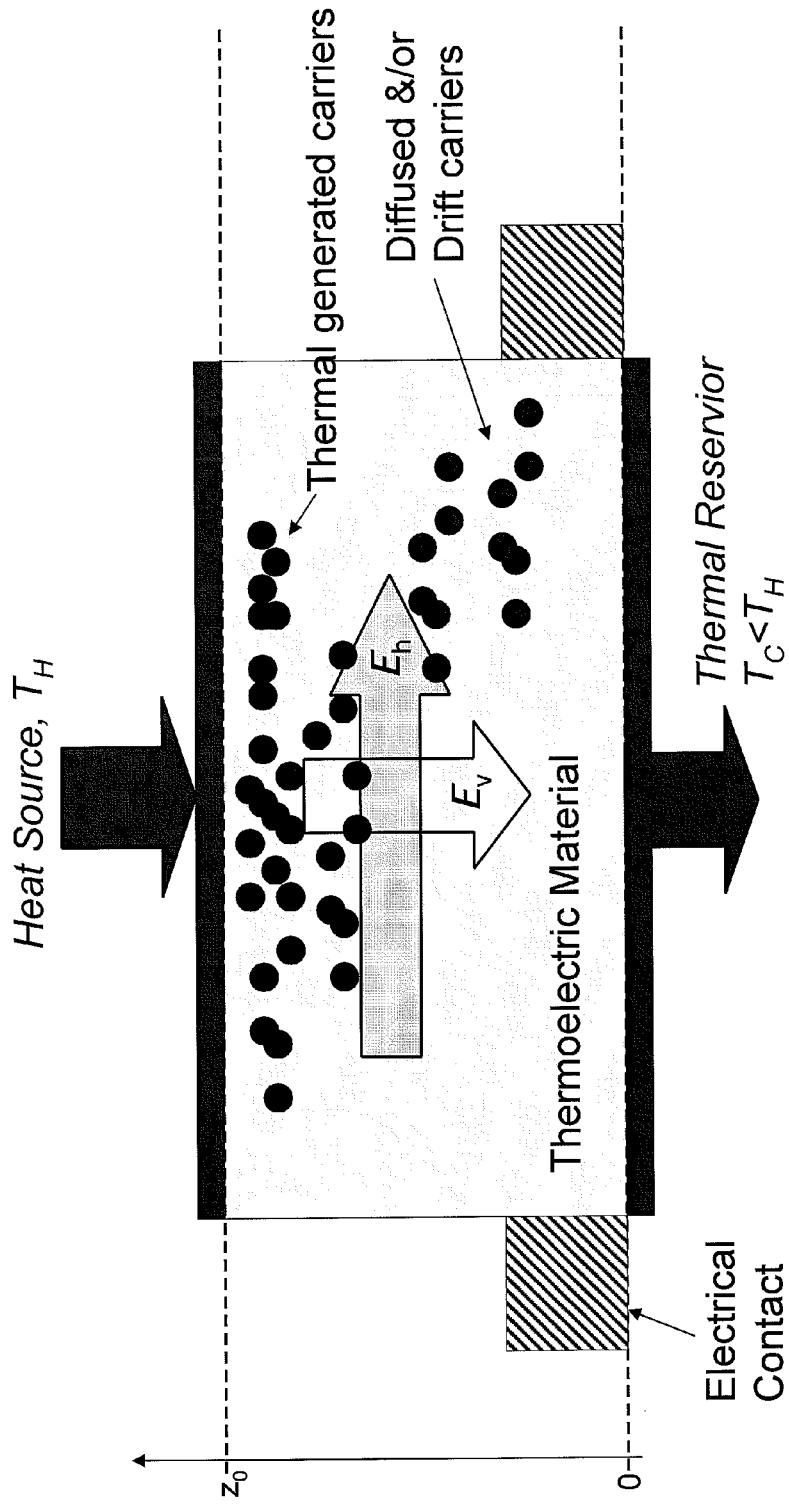

FIG. 52: Initial spatial position of thermally generated areal carrier concentration.

Figure 53:
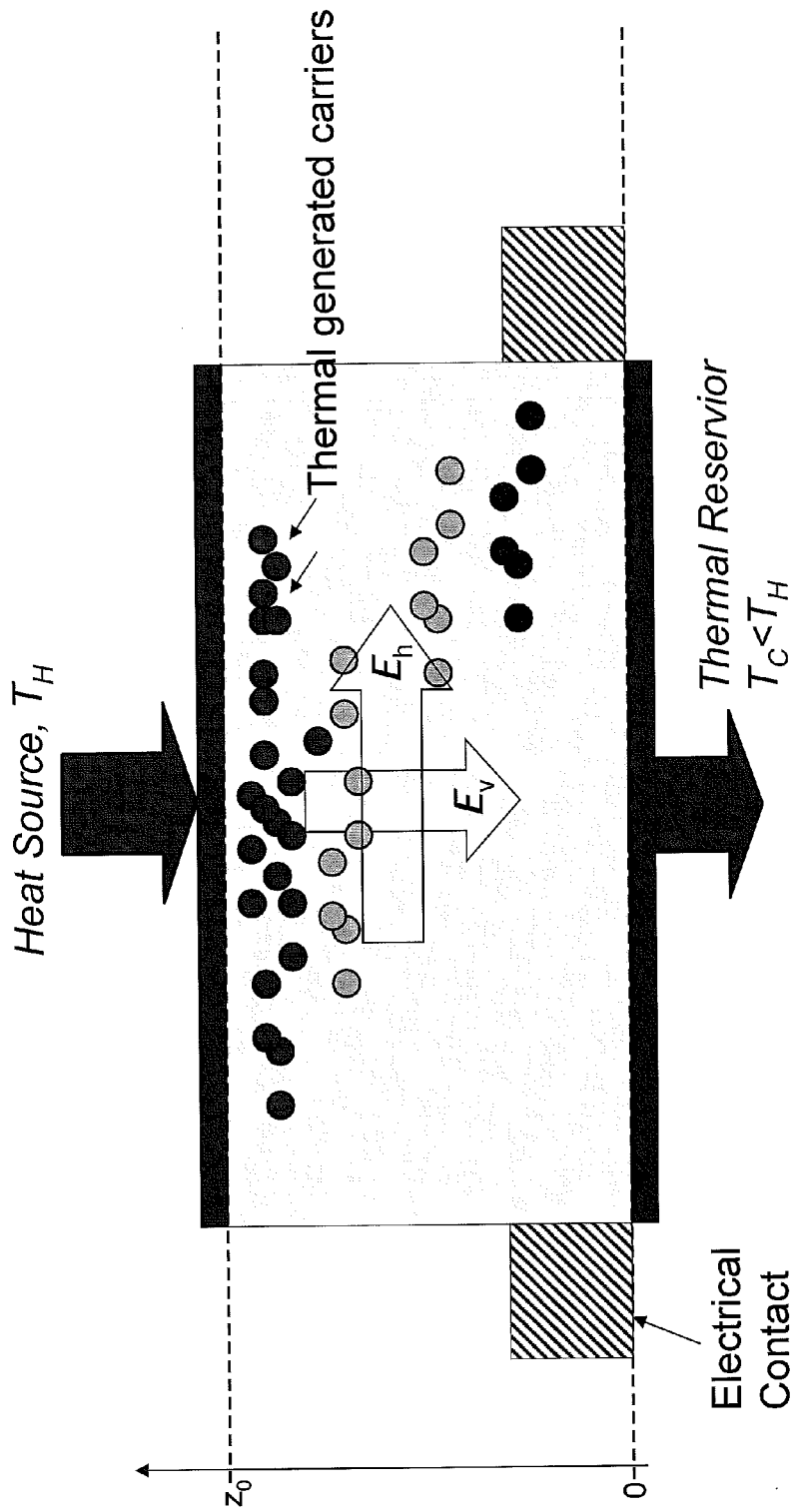

FIG. 53: Schematic diagram showing the evolution of the spatial positions of thermally generated charge carrier concentrations due to diffusion process and drift process.

Figure 54:
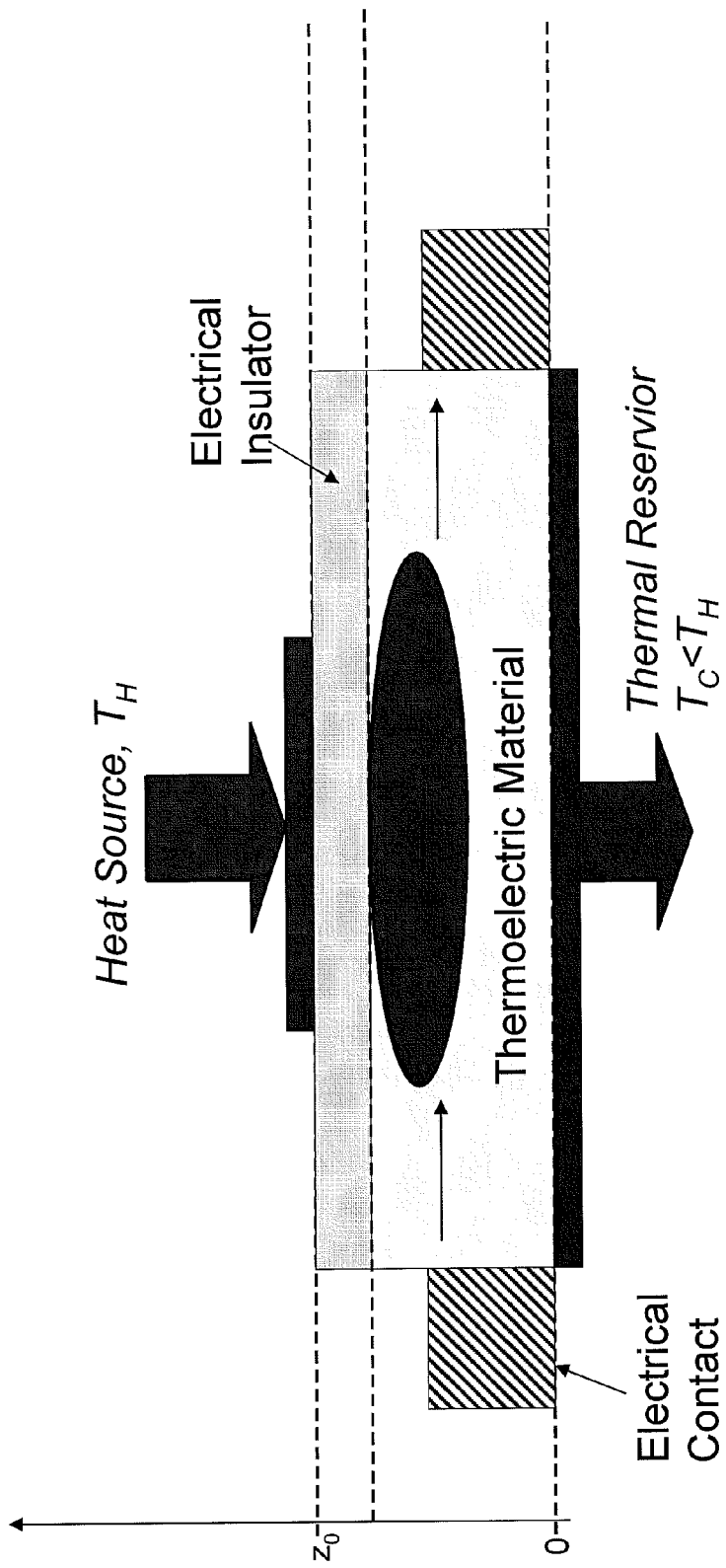

FIG. 54: Schematic diagram of an optional embodiment of the present invention showing a thermo-field-effect (TFE) device and generator.

Figure 55:
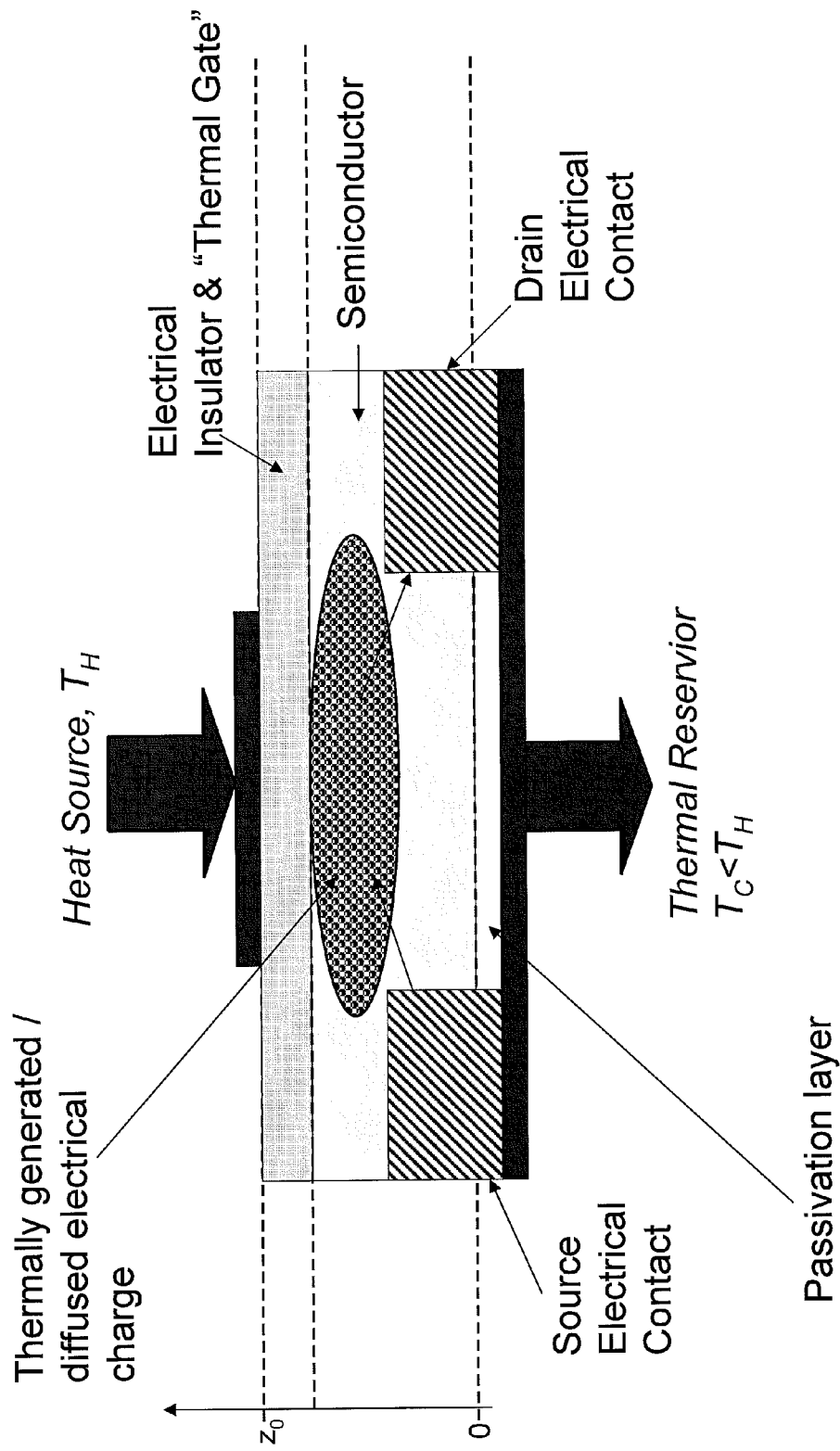

FIG. 55: Schematic diagram of an optional embodiment of the present invention showing a thermo-field-effect (TFE) device.

Figure 56:
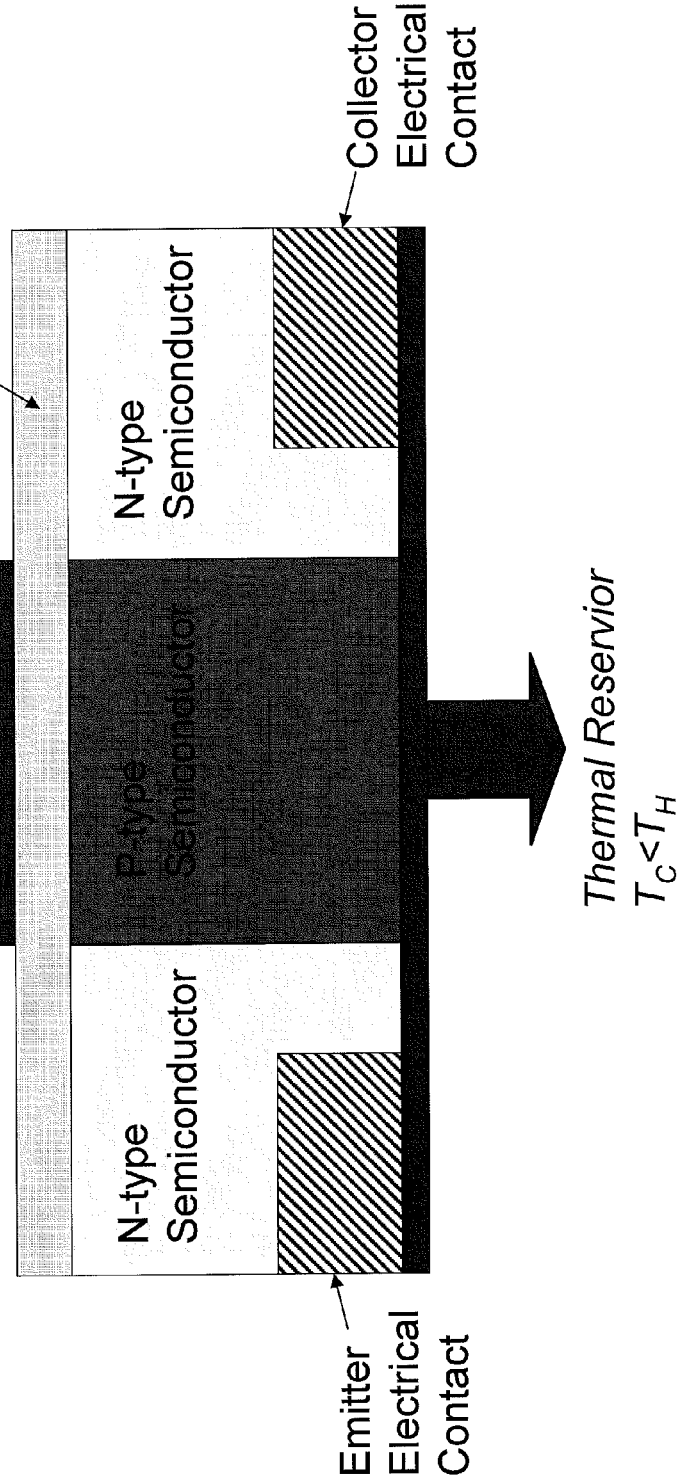

FIG. 56: Schematic description of an optional embodiment of the present invention for a lateral bipolar thermoelectric (LBT) device and generator.

Figure 57:
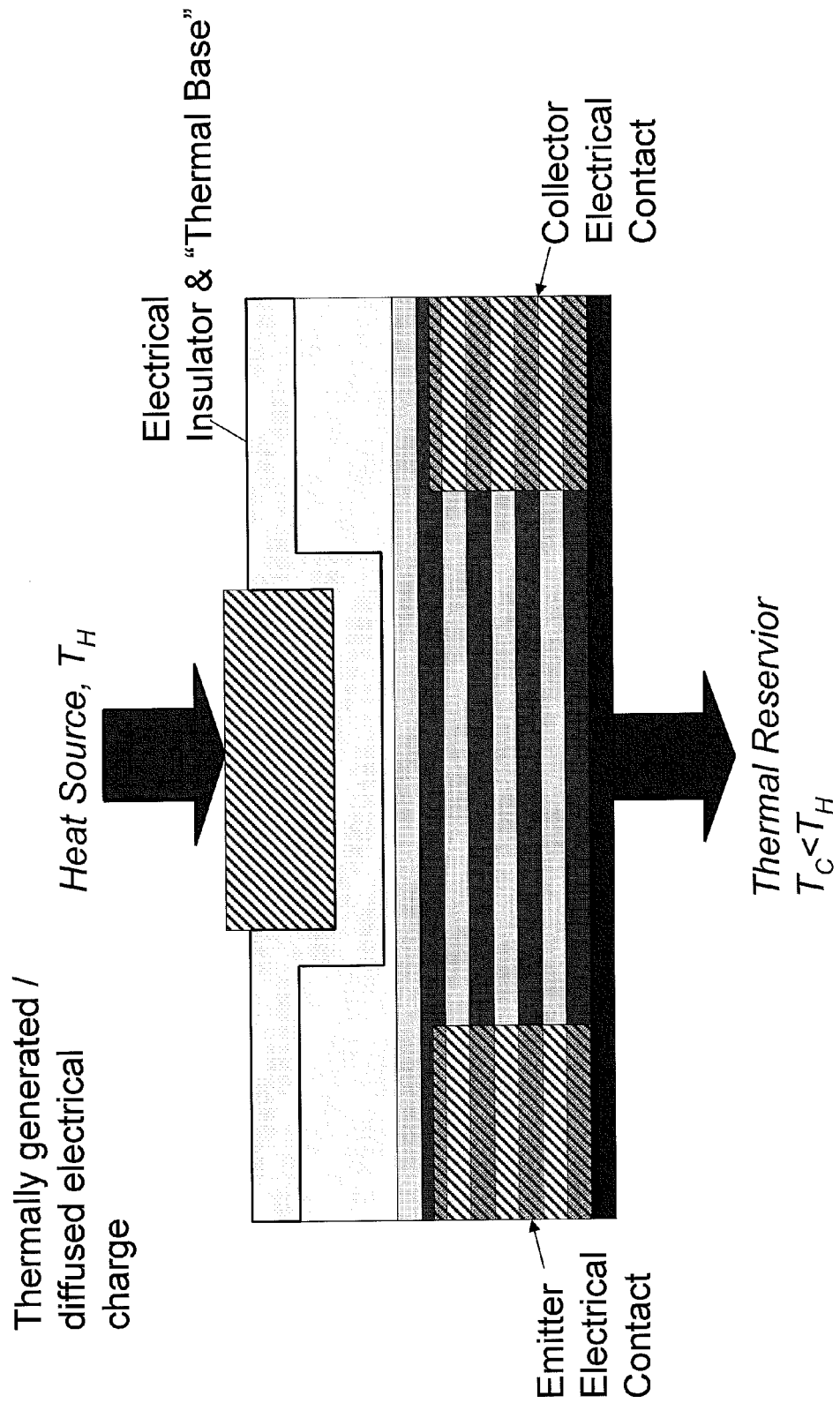

FIG. 57: A planar topology thermo-multilayer device and or generator is shown.

Figure 58:
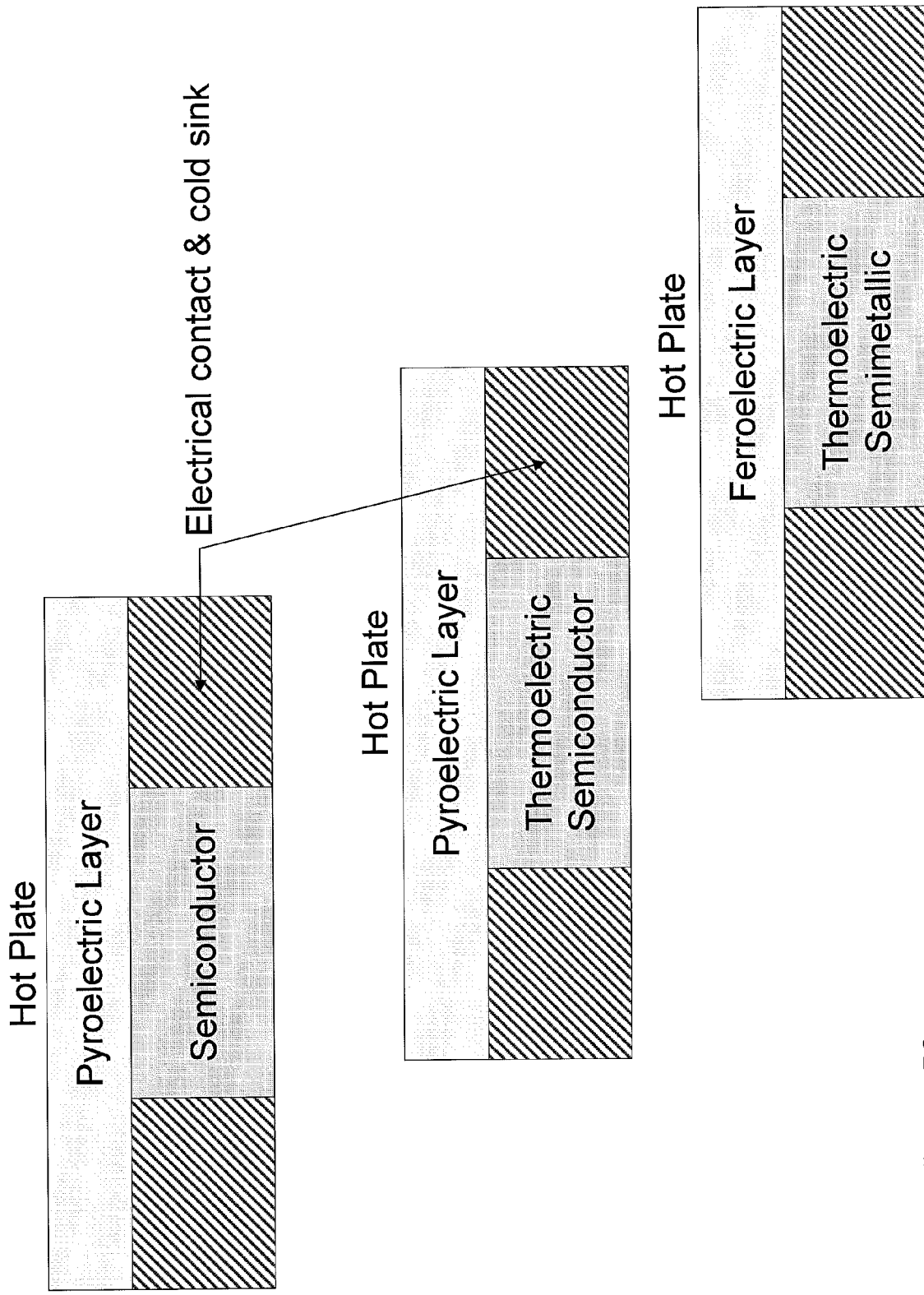

FIG. 58: Basic description of planar thermoelectric conversion devices disclosing functional layers.

Figure 59:
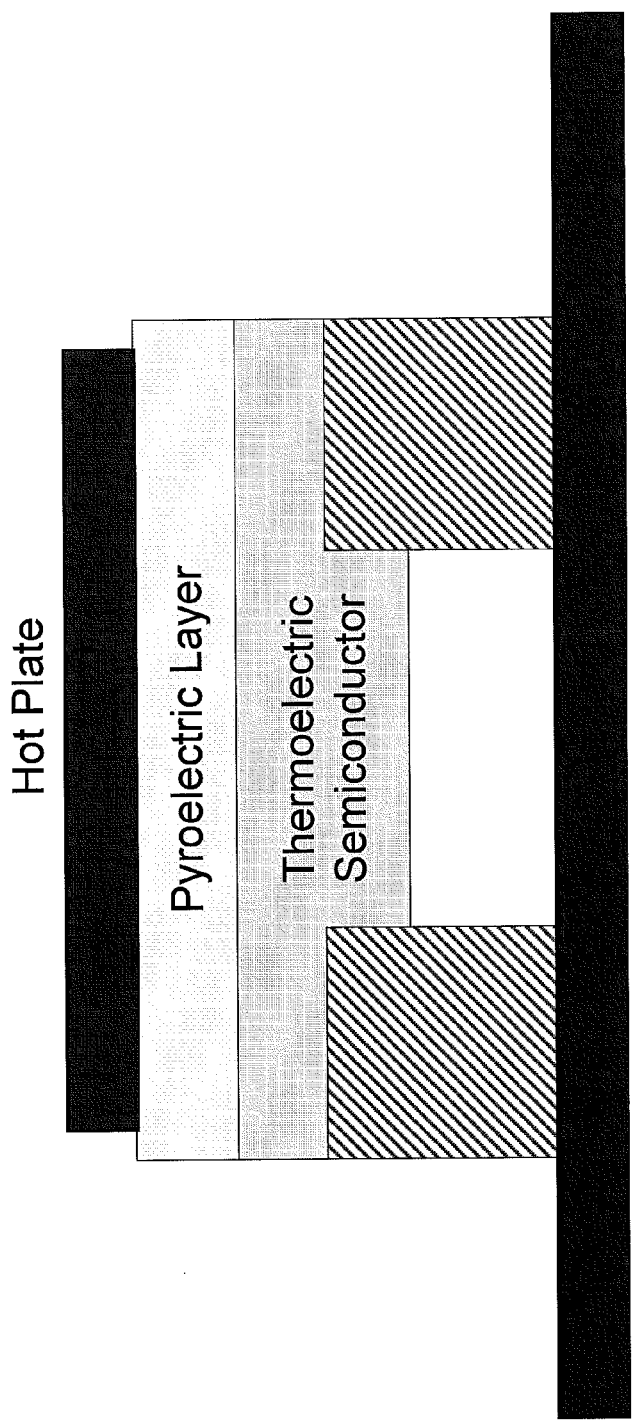

FIG. 59: Basic description of planar thermoelectric conversion device disclosing functional layers required for Pyroelectric-Thermoelectric/Semiconductor device.

Figure 60:
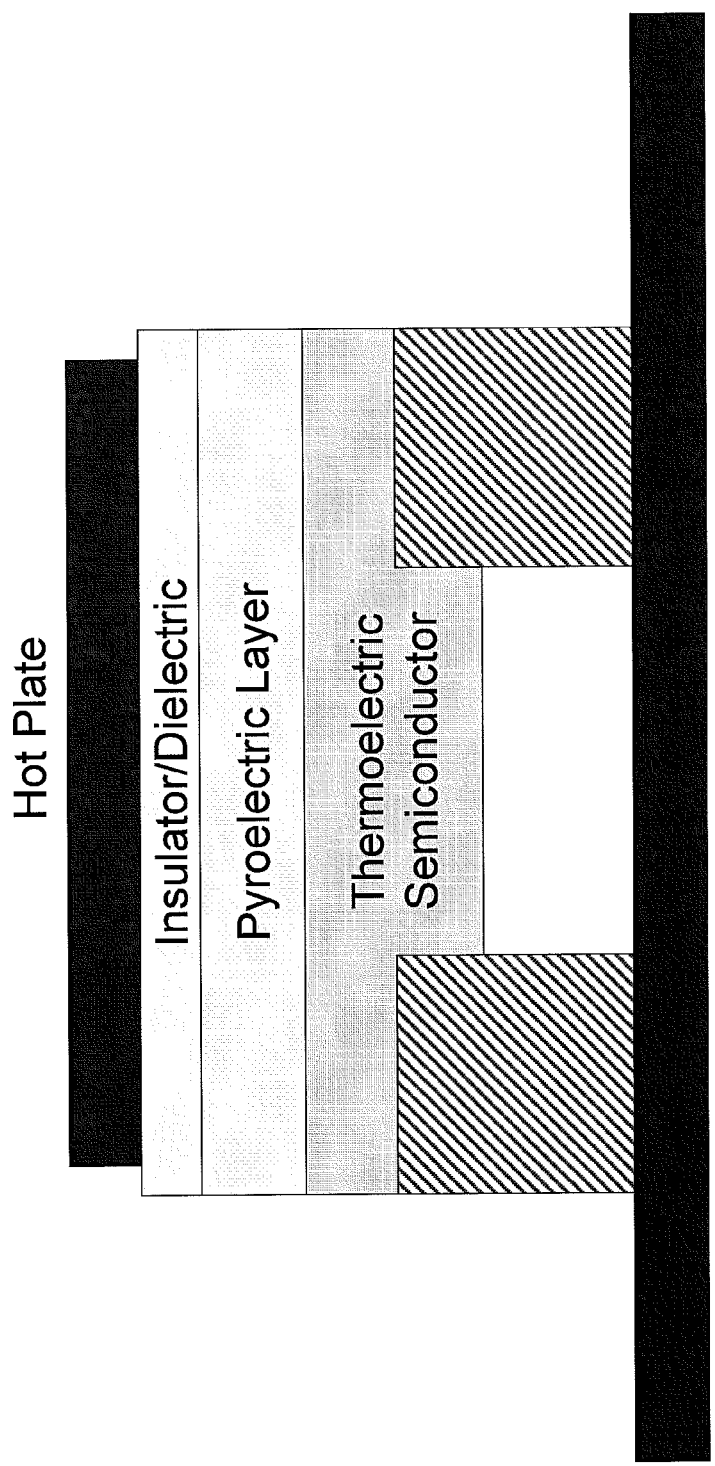

FIG. 60: Basic description of planar thermoelectric conversion device disclosing functional layers required for Pyroelectric-Thermoelectric/Semiconductor device.

Figure 61:
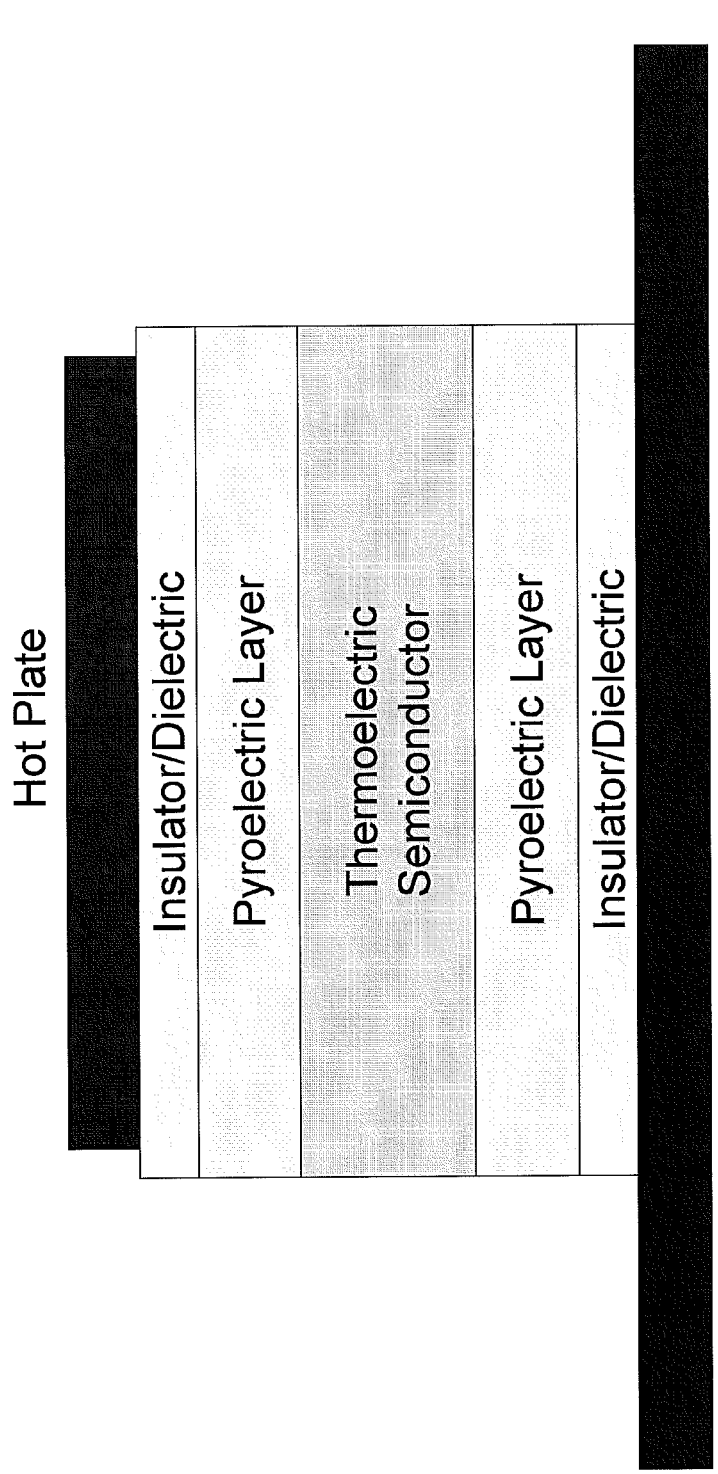

FIG. 61: Basic description of planar thermoelectric conversion device disclosing functional layers required for Pyroelectric-Thermoelectric/Semiconductor device.

Figure 62:
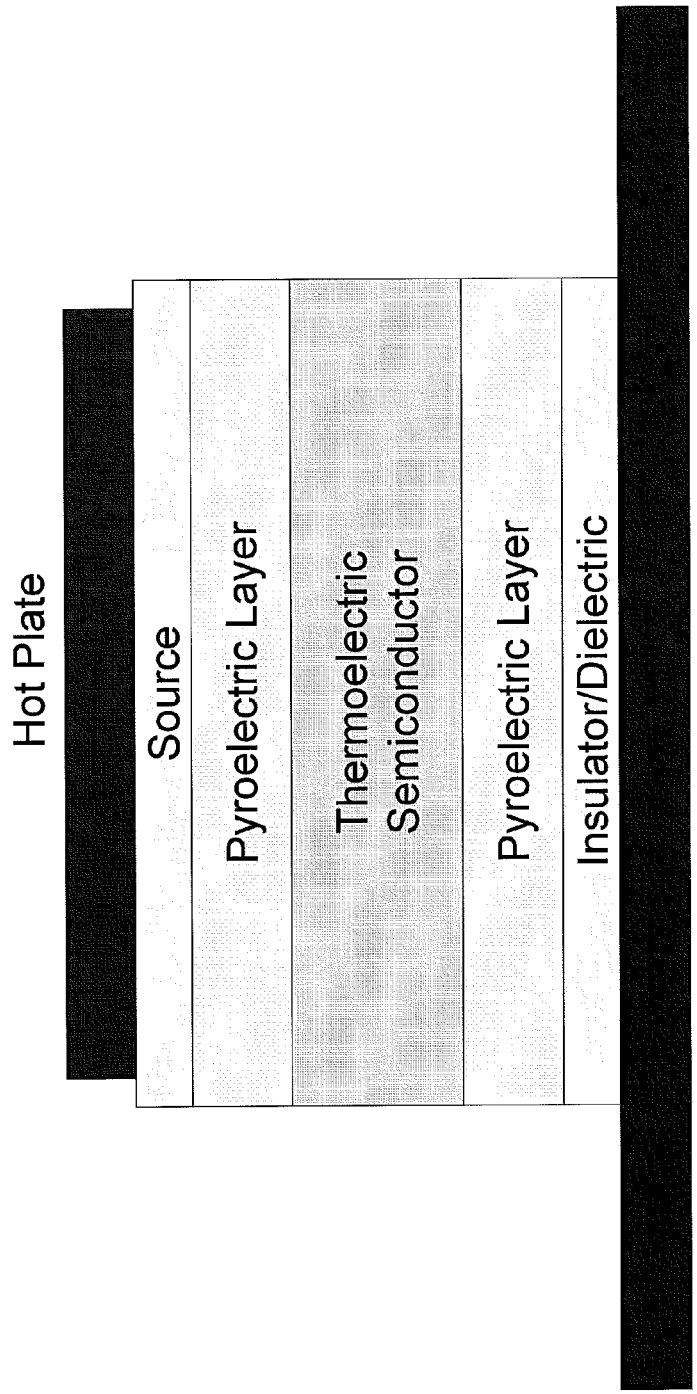

FIG. 62: Basic description of planar thermoelectric conversion device disclosing functional layers required for Pyroelectric-Thermoelectric/Semiconductor device.

Figure 63:
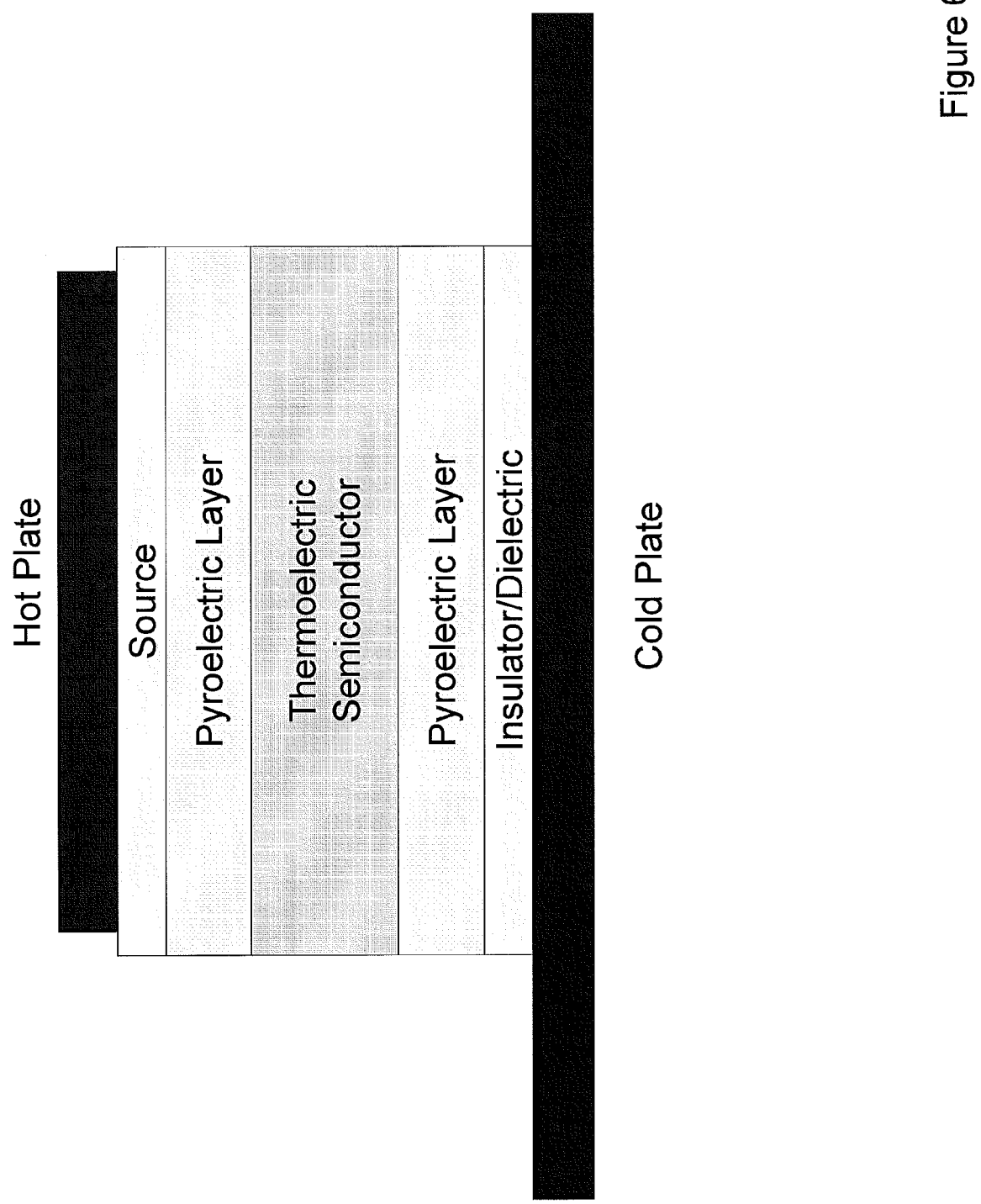

FIG. 63: Basic description of planar thermoelectric conversion device disclosing functional layers required for Pyroelectric-Thermoelectric/Semiconductor device.

Figure 64:
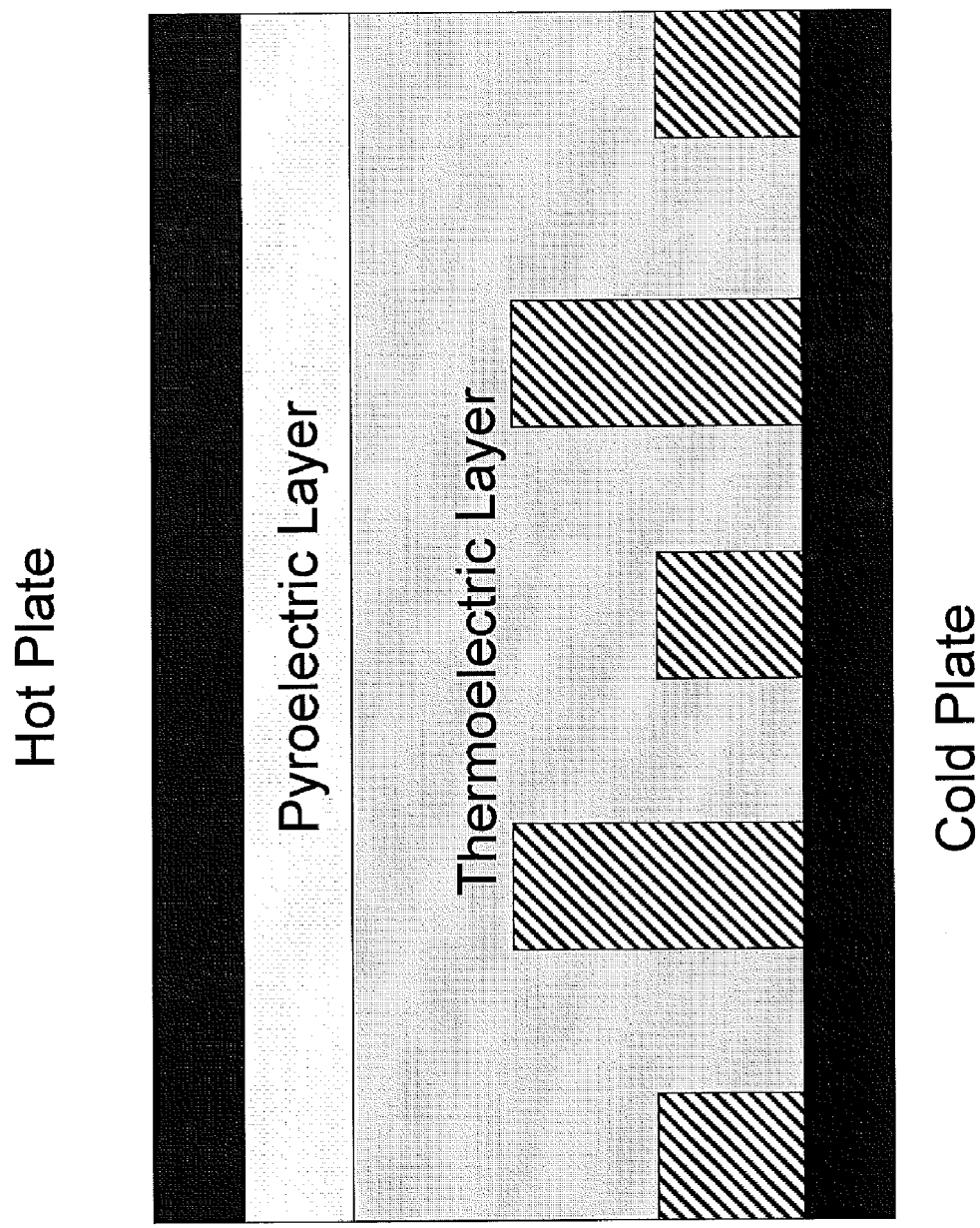

FIG. 64: Planar thermoelectric device showing non-uniform electrode placement within the thermoelectric layer(s).

Figure 65:
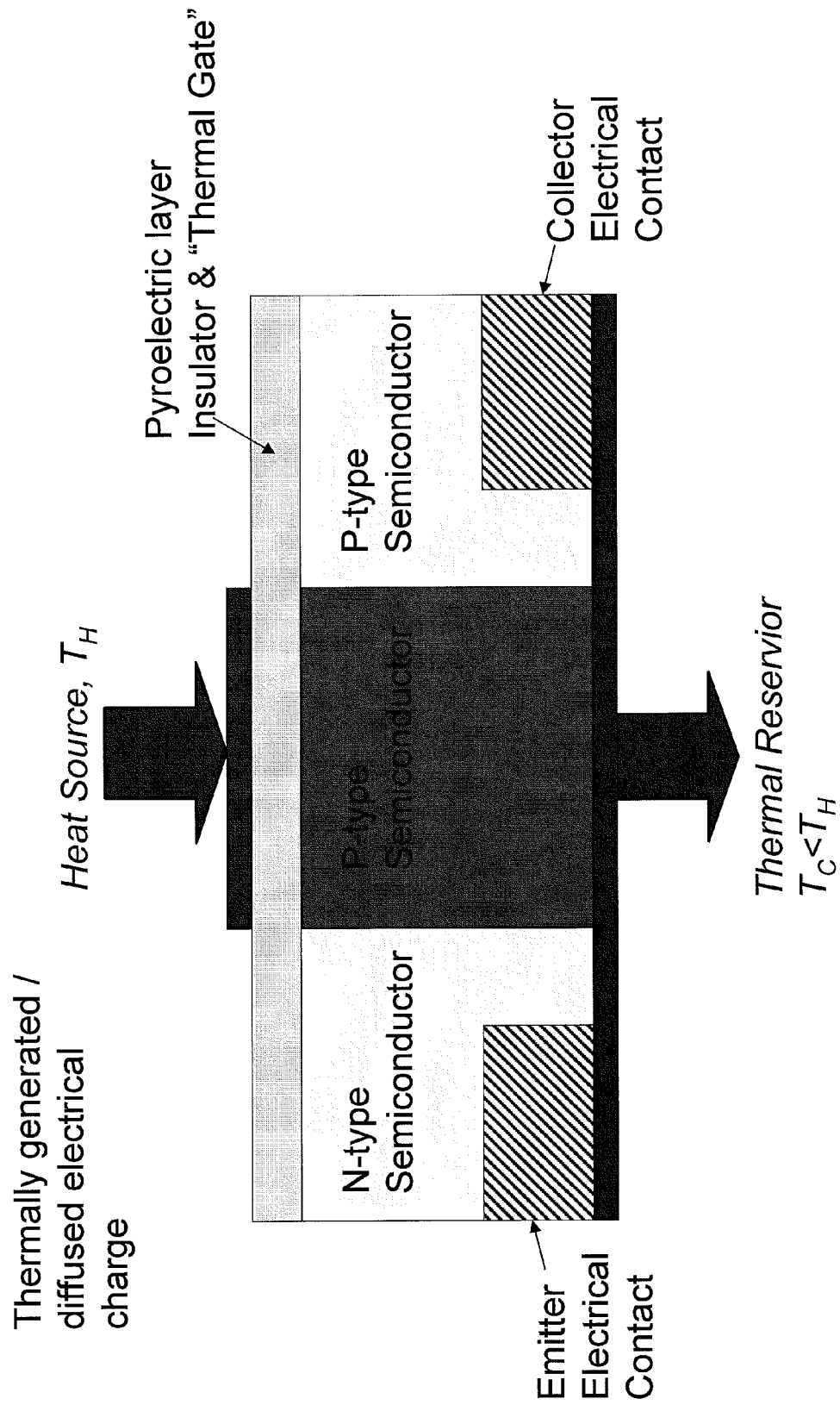

FIG. 65: Schematic description of an optional embodiment of the present invention for a lateral bipolar thermoelectric (LBT) device and generator.

Figure 66:
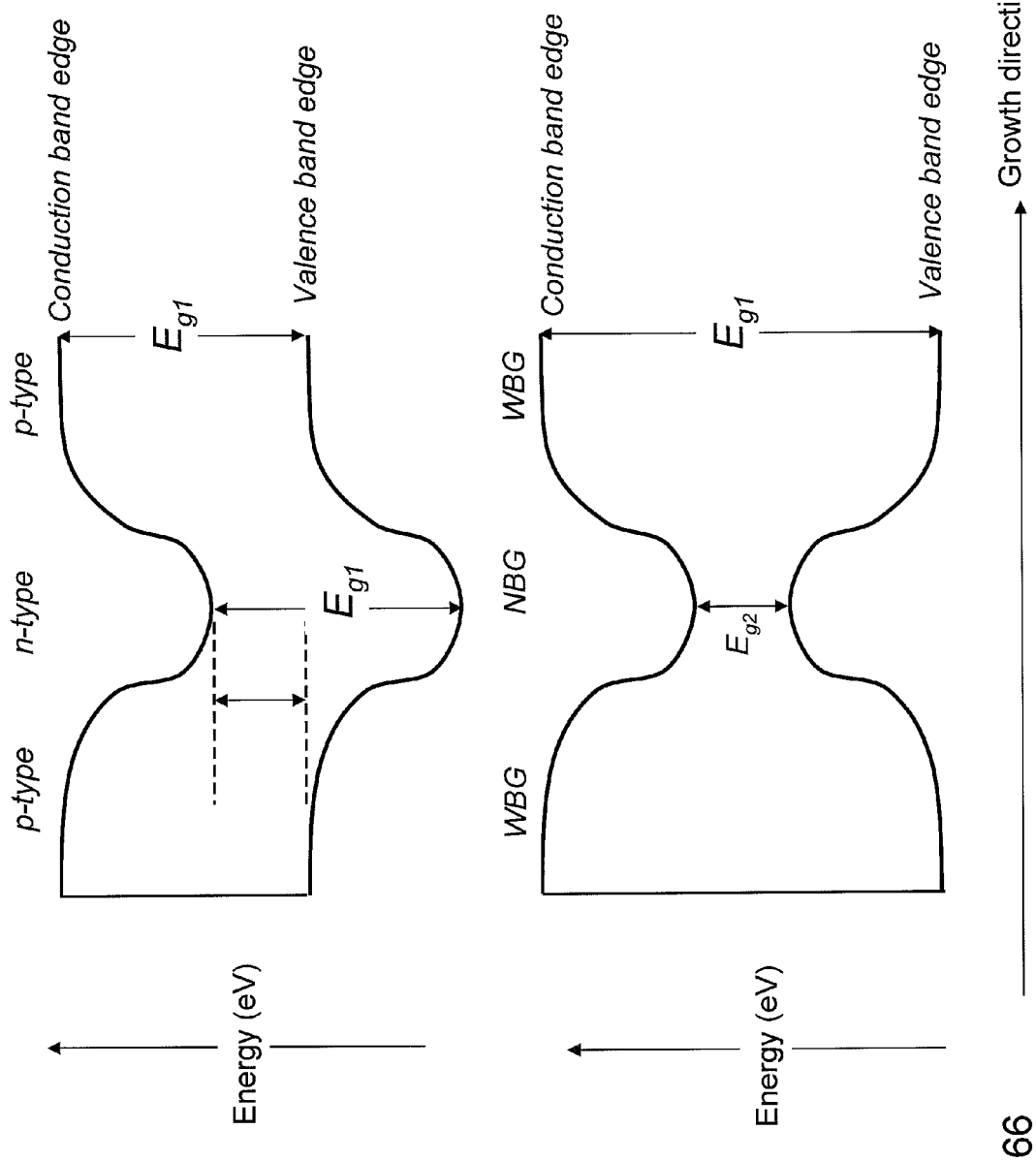

FIG. 66: Thermal generation of charge carriers a imputity doped p-n-p homojunction and a type-I WBG-NBG-WBG heterojunction as a function of growth direction.

Figure 67:
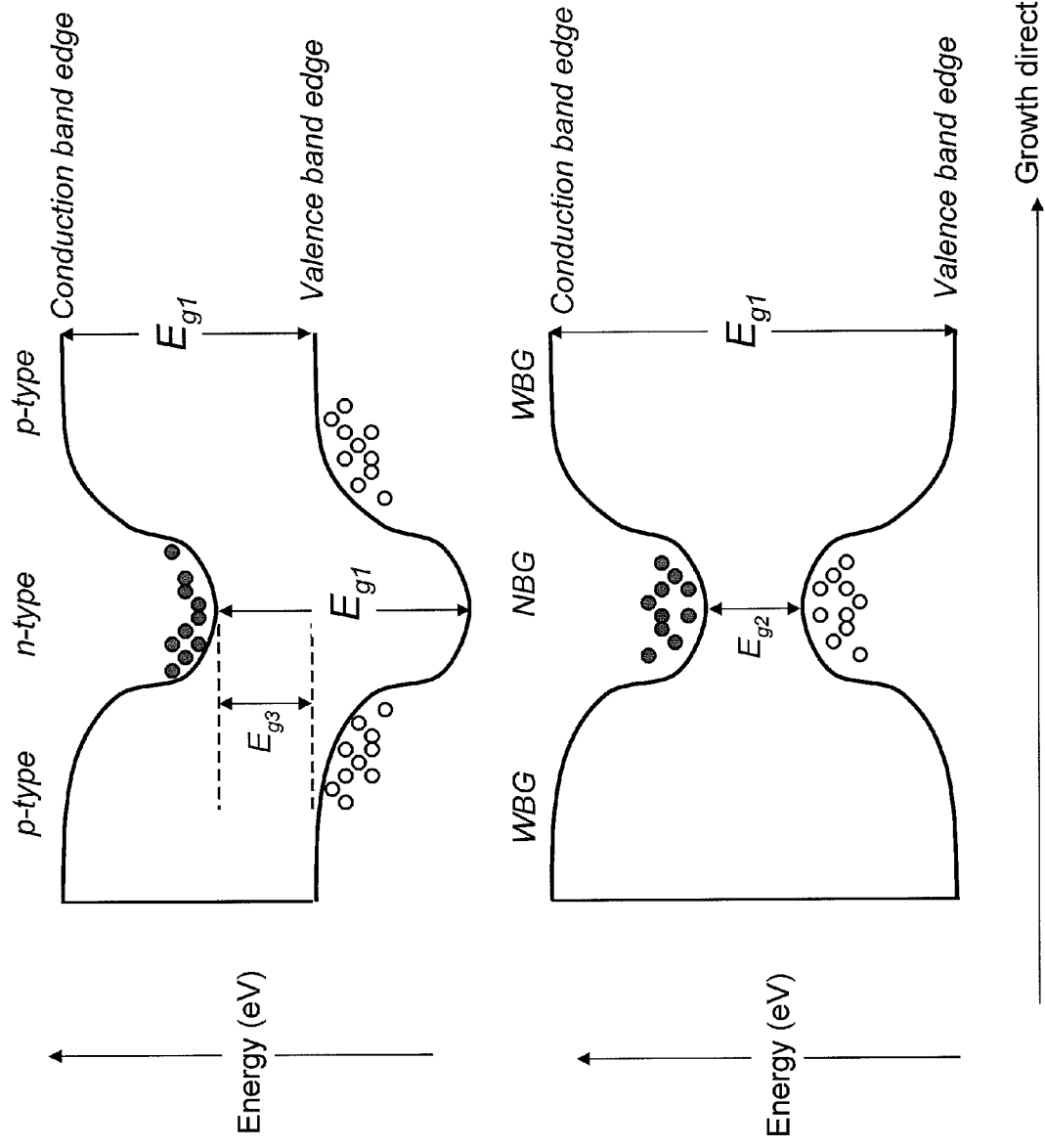

FIG. 67: Thermal generation of electrons and holes in doped homojunction occurs in different layers.

Figure 68:
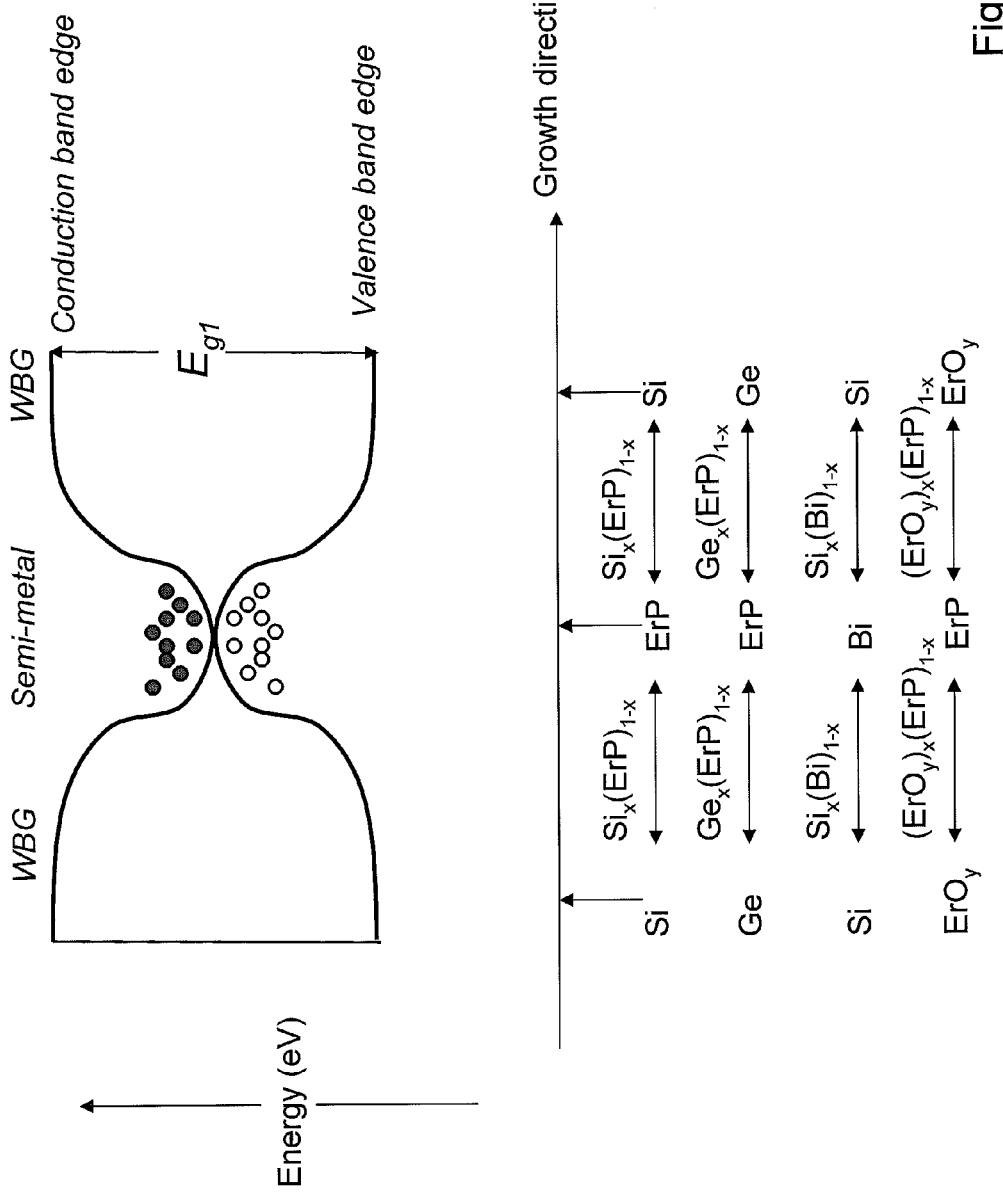

FIG. 68: Type-I heterojunction has thermal generation of charge carriers confined within a semi-metallic NBG layer.

Figure 69:
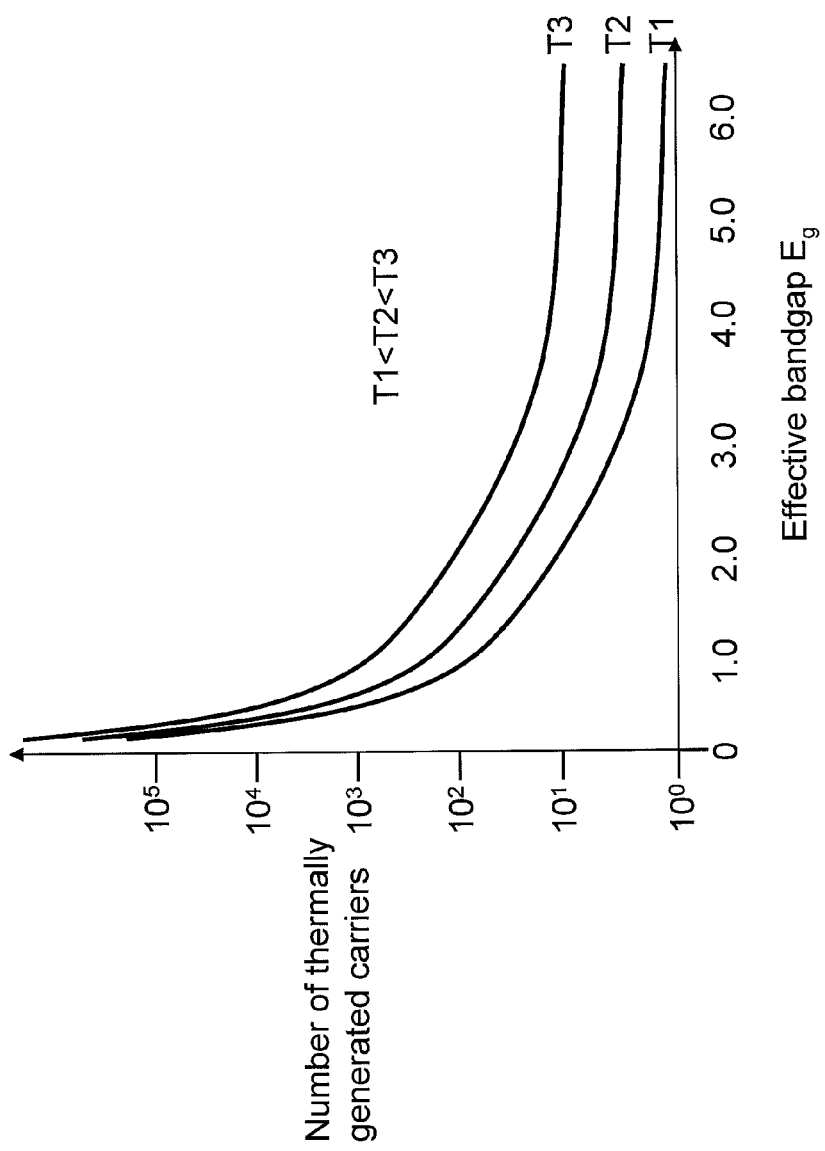

FIG. 69: Number of thermally generated carriers across the fundamental band gap of a material(s) as a function of effective band gap energy Eg.

Figure 70:
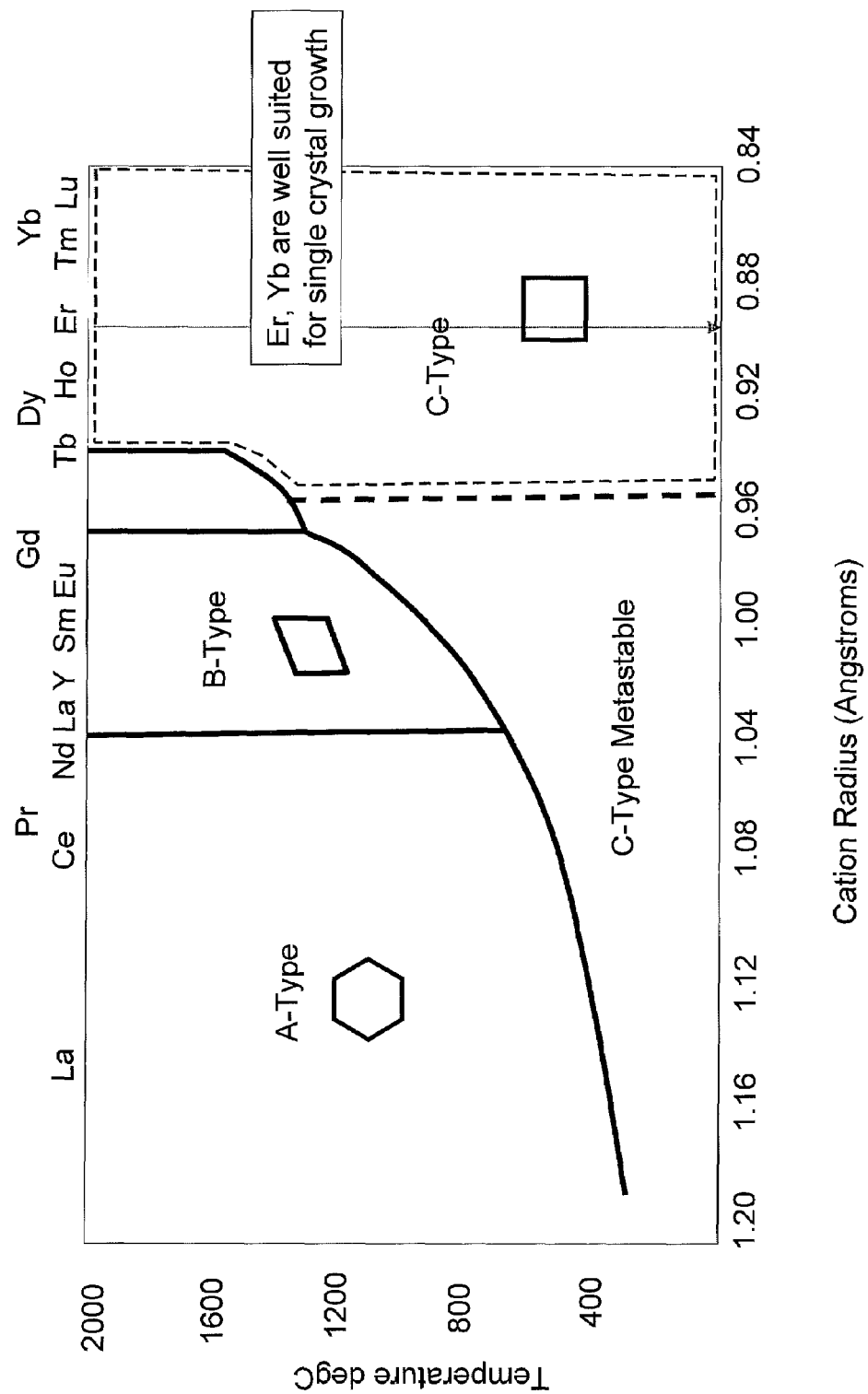

FIG. 70: Temperature stability and structural polymorphs of rare-earth oxide sesquioxides $RE_2O_3$, as a function of rare-earth atom, categorized via the effective cation radius.

Figure 71:
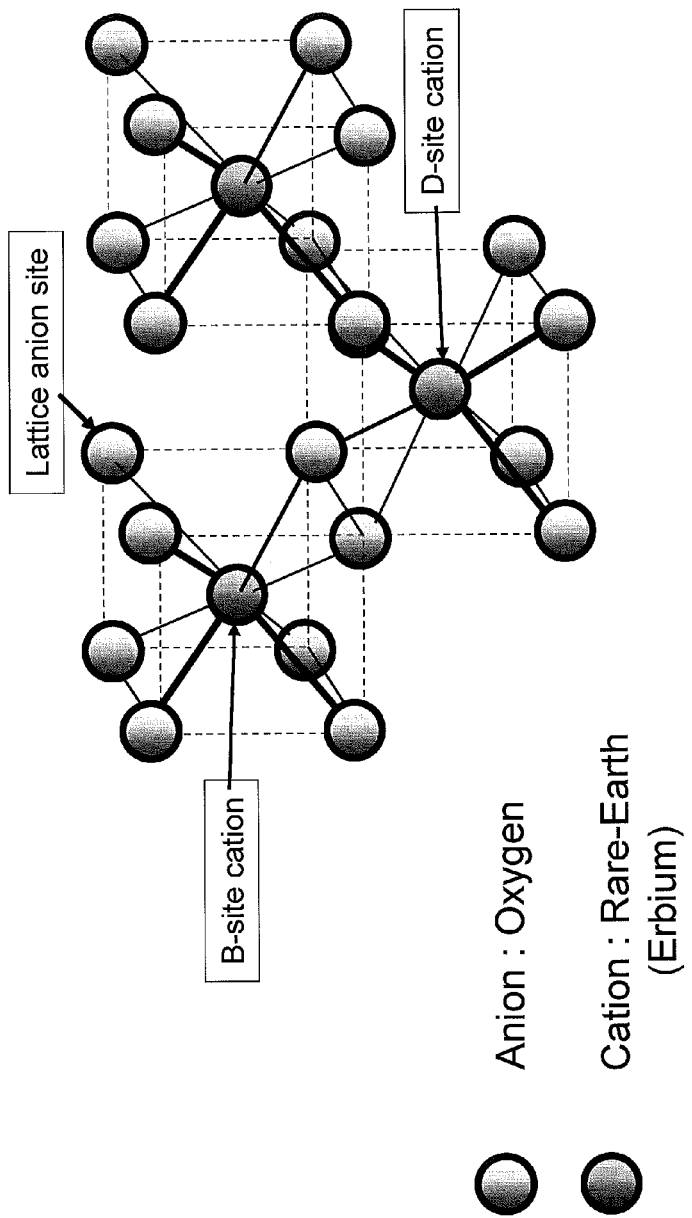

FIG. 71: Crystal structure of the diatomic rare-earth oxides $RE-O_2$, showing the cubic fluorite atomic cation and anion configurations.

Figure 72:
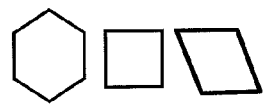

FIG. 72: Classification of rare-earth oxide crystal structures via the effect of coordination number, n, in $RE_nO_{2n-2}$.

Figure 73:
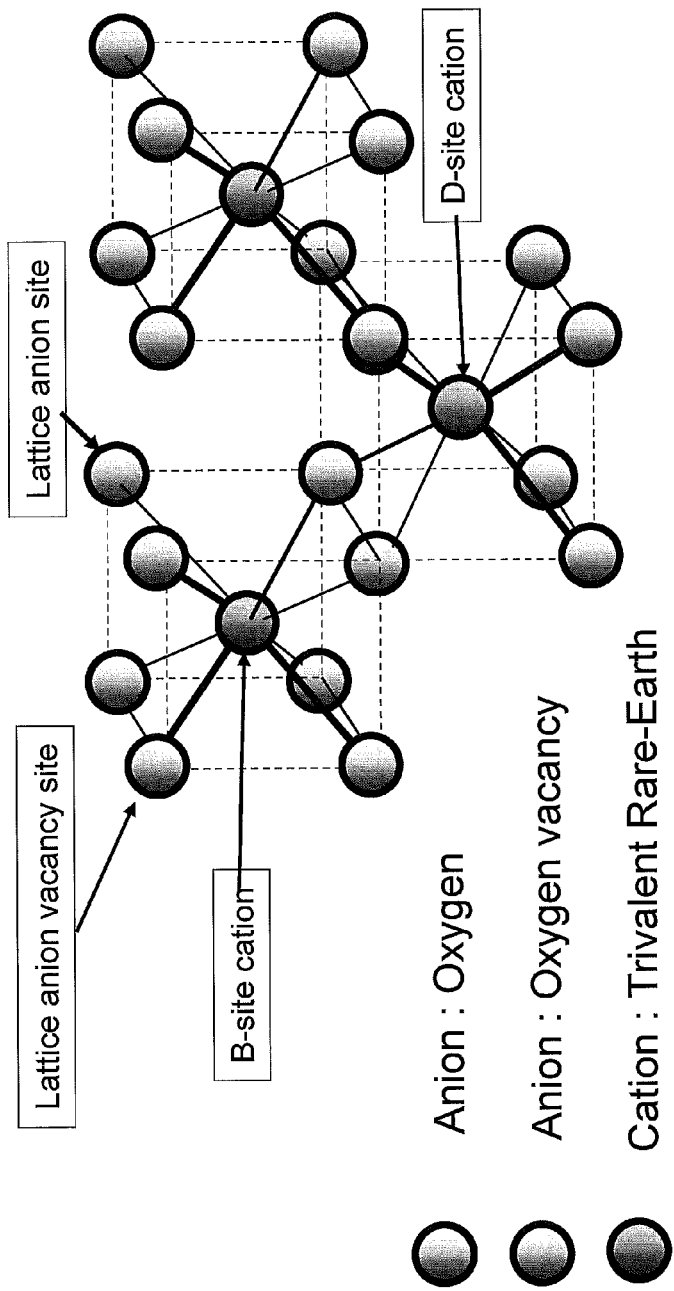

FIG. 73: Cubic flourite crystal with oxygen vacancies to form a $RE-O_6$ coordinated crystal.

Figure 74:
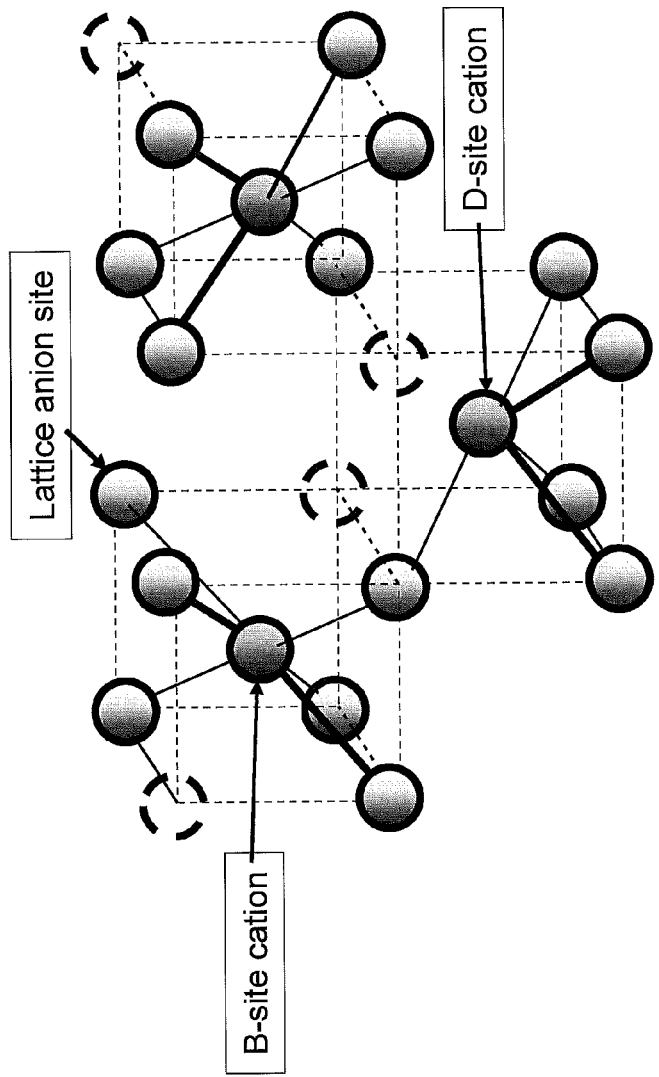

FIG. 74: Anion vacancy positions in the defective fluorite crystal describing rare-earth oxide crystal structure of bixbyite crystal.

Figure 75:
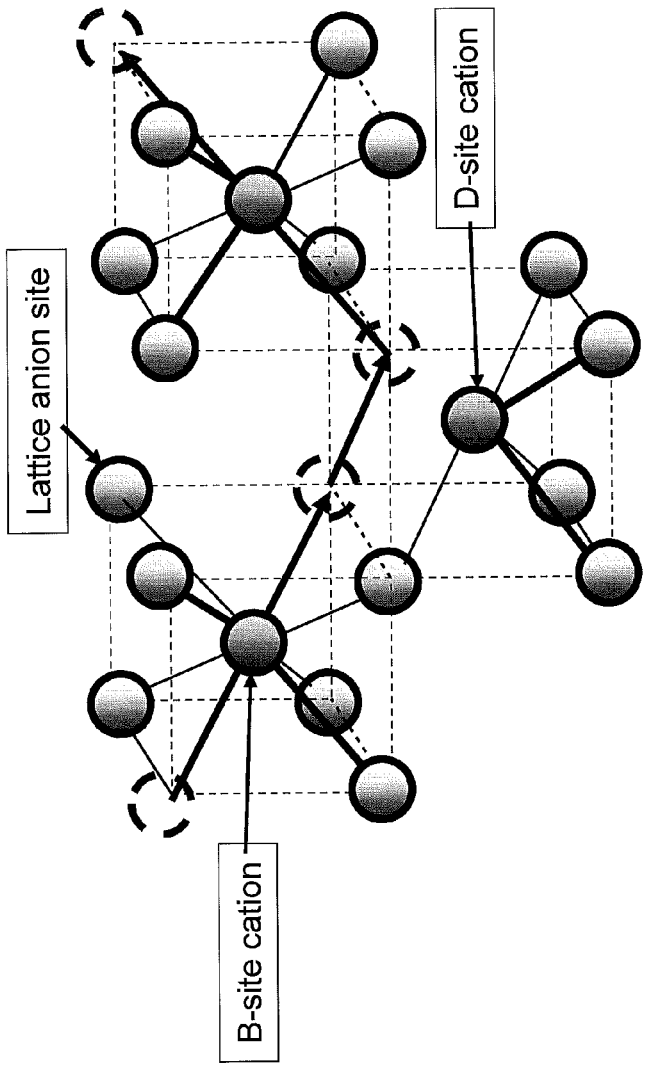
Figure 76:
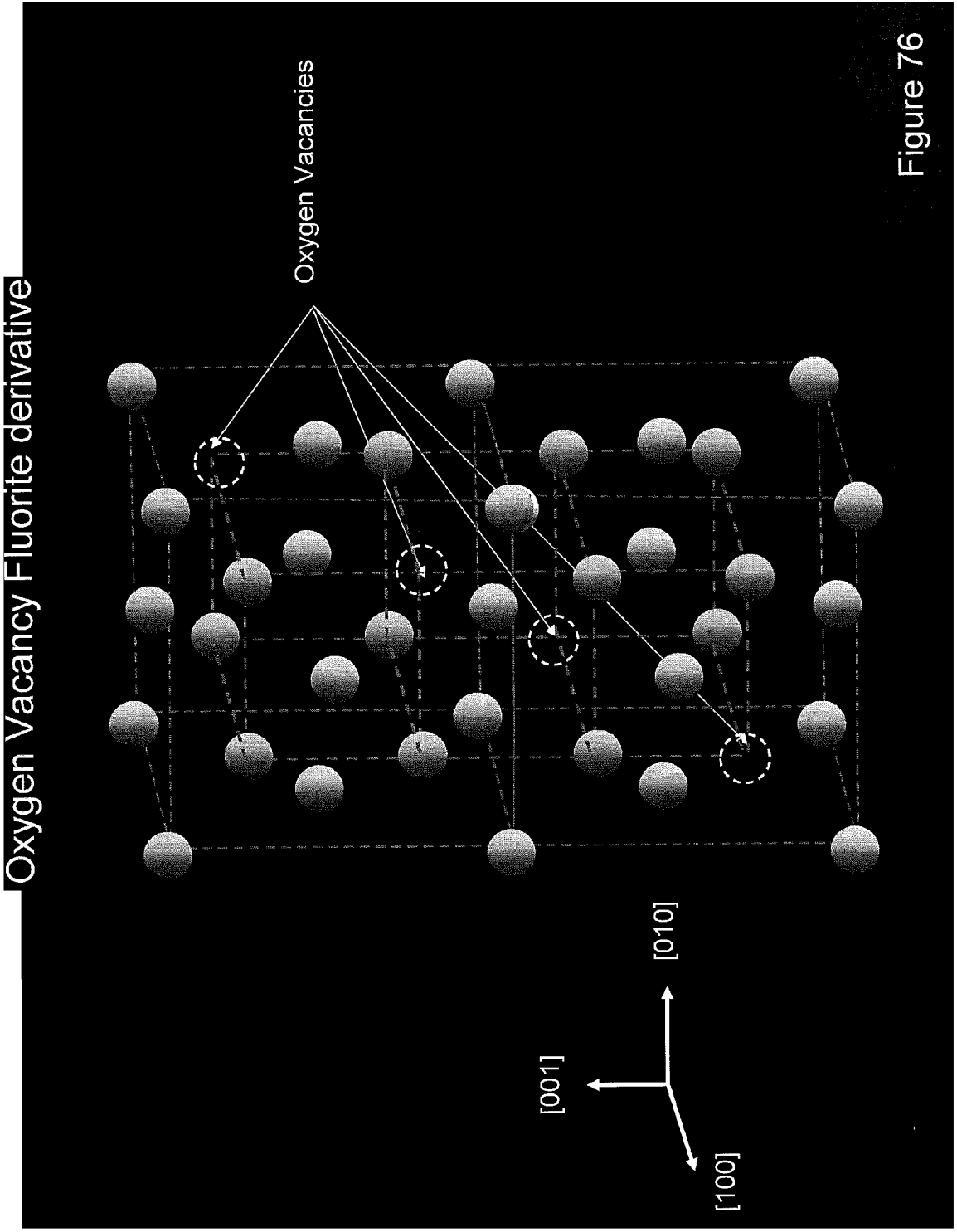
Figure 77:
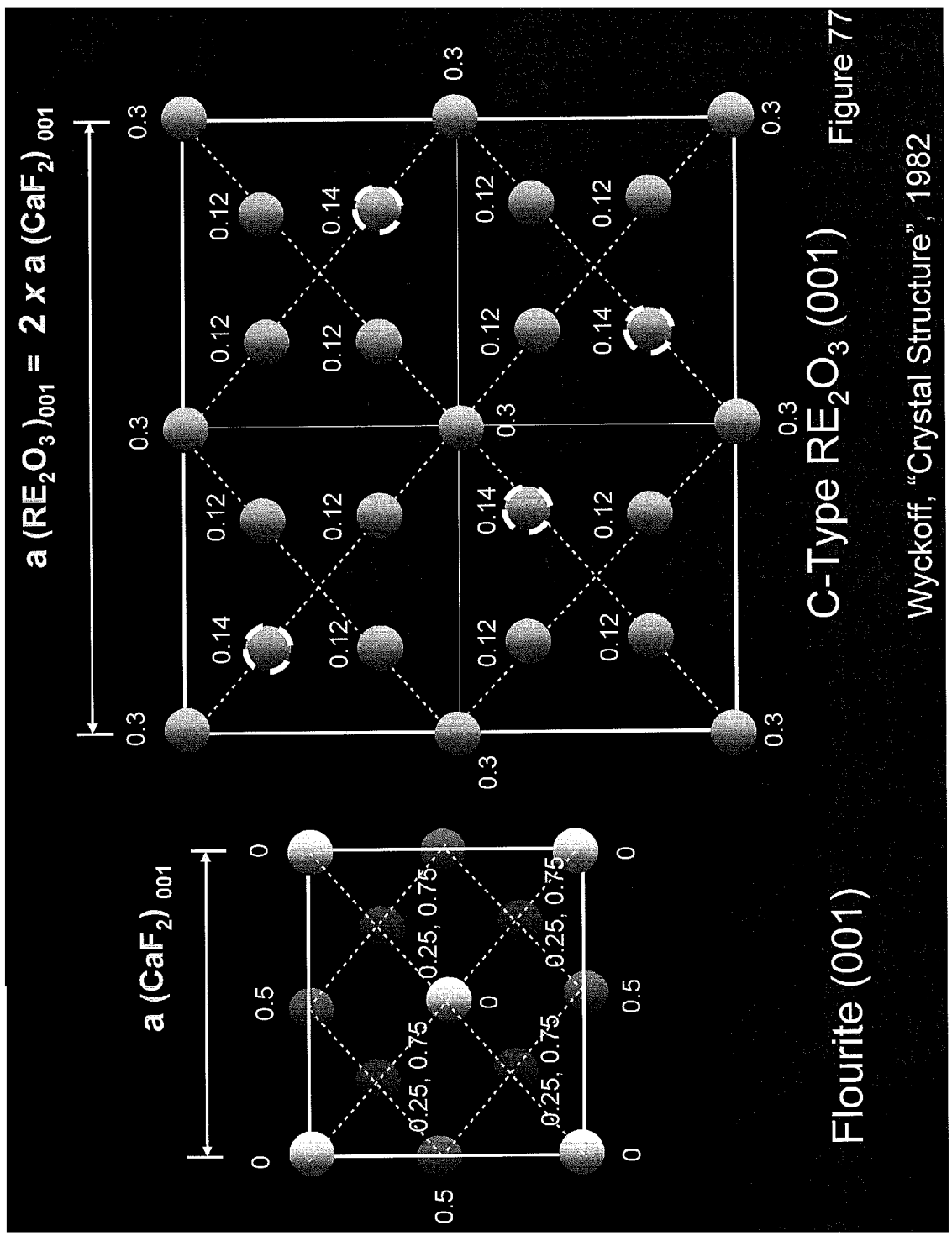
Figure 78:
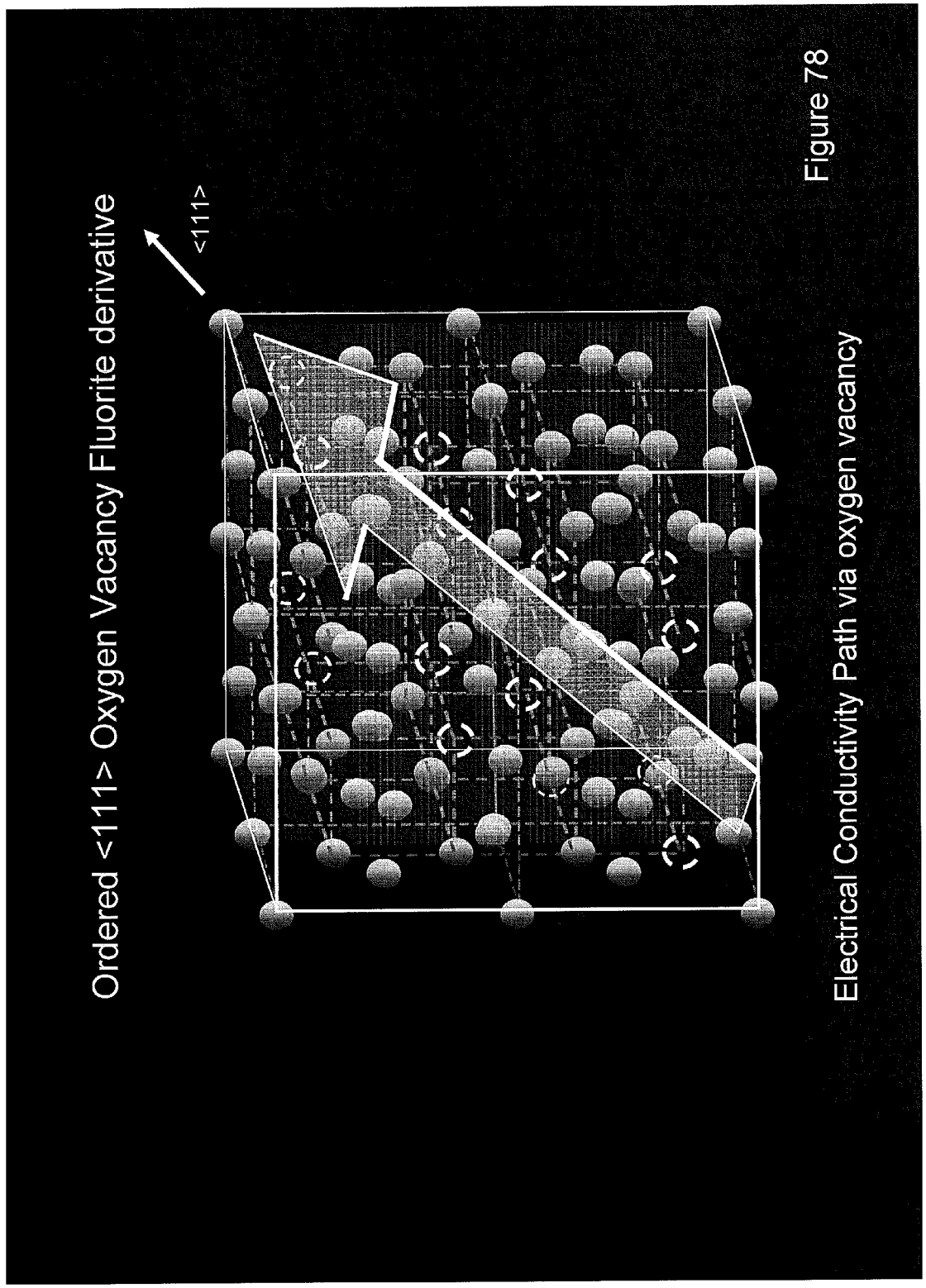
Figure 80:
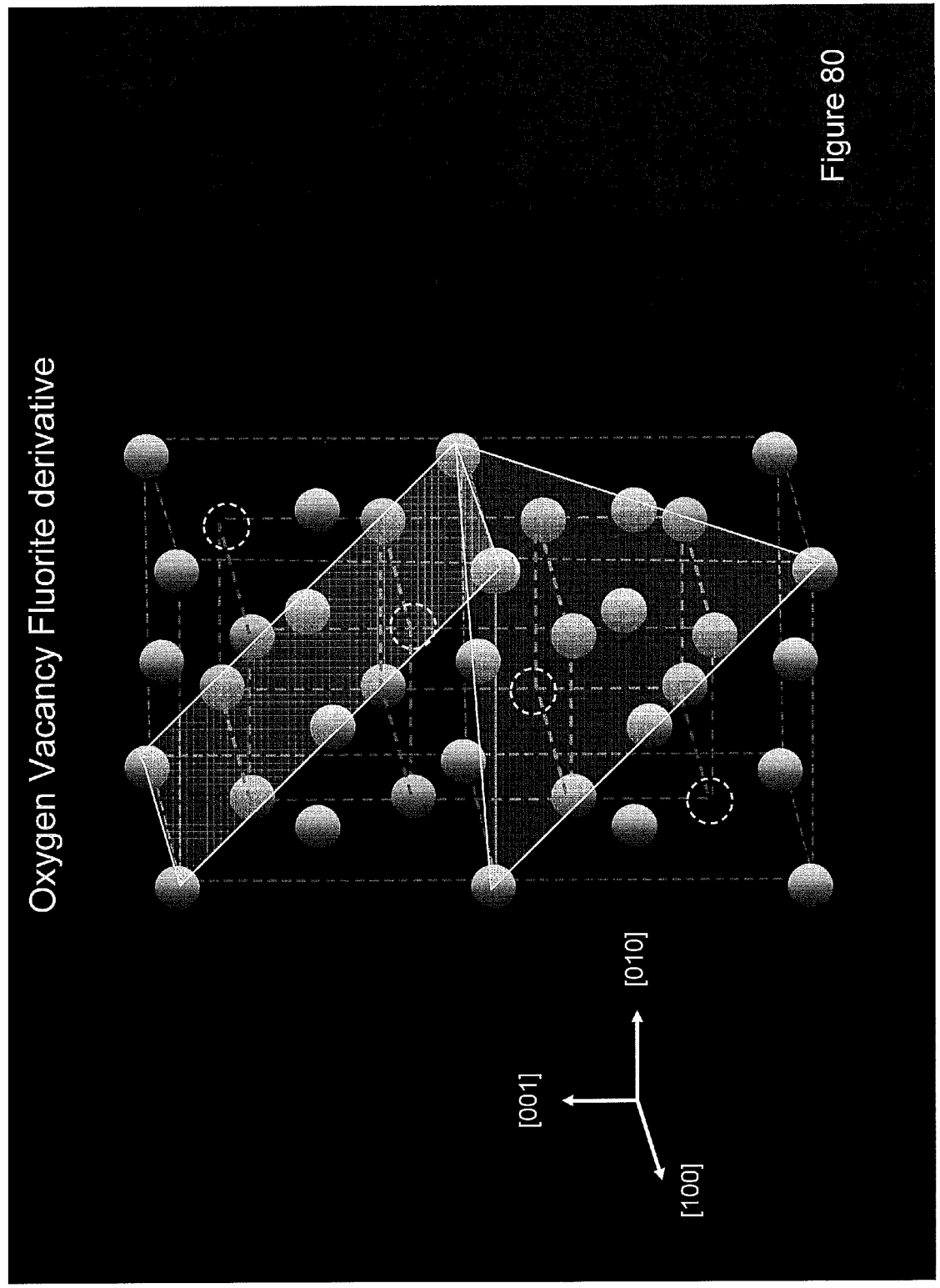
Figure 81:
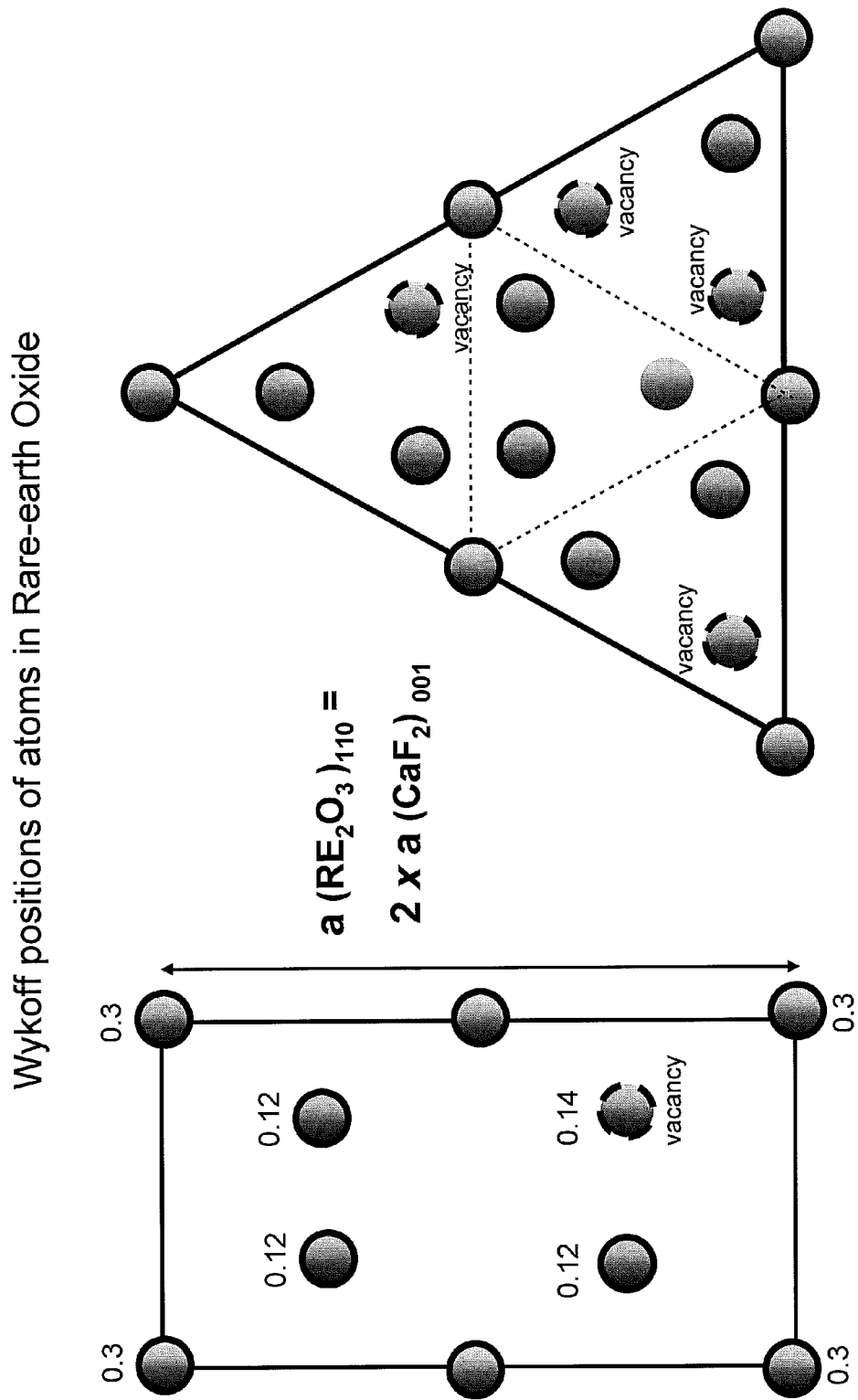
Figure 82:
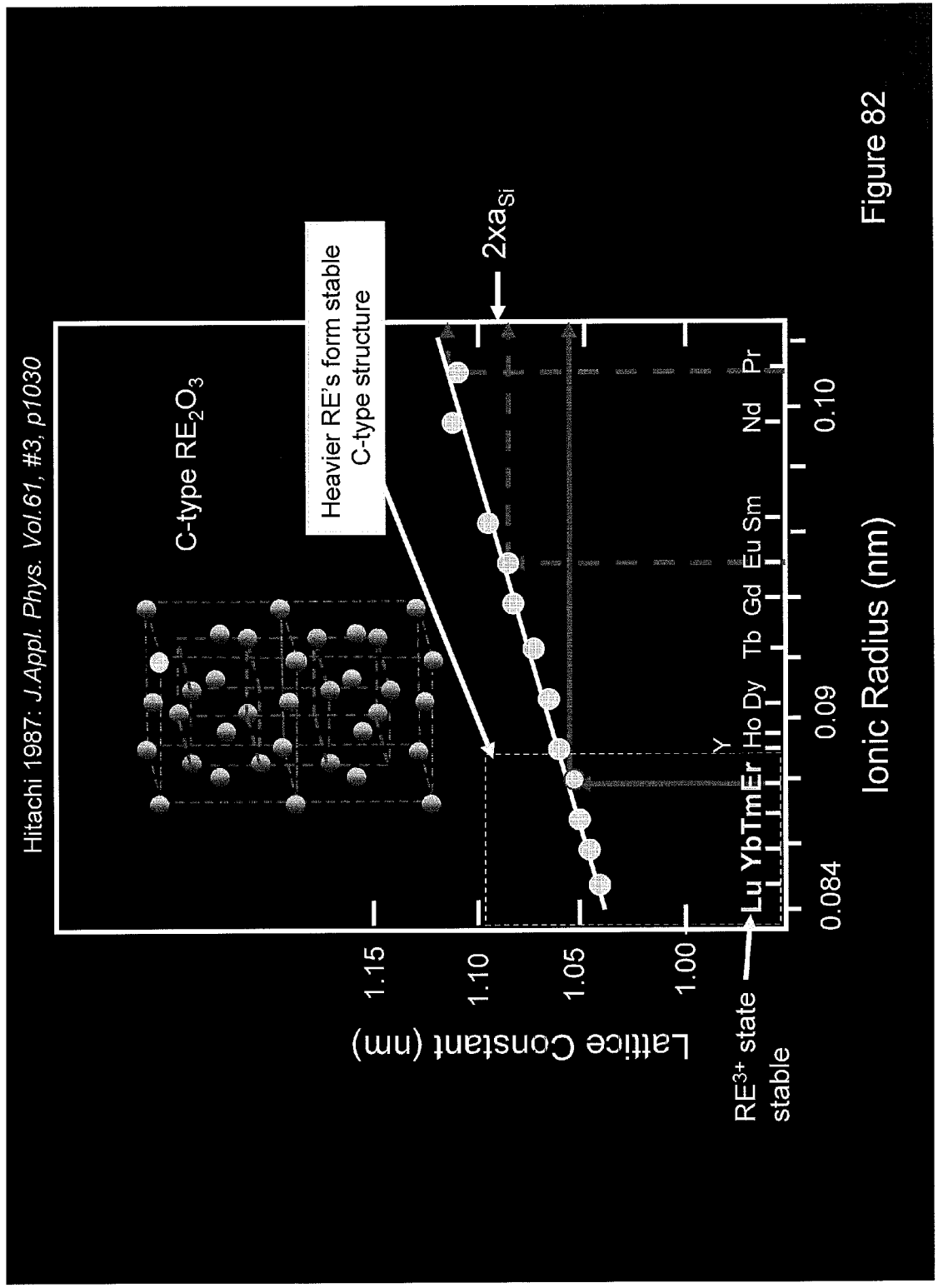
Figure 83:
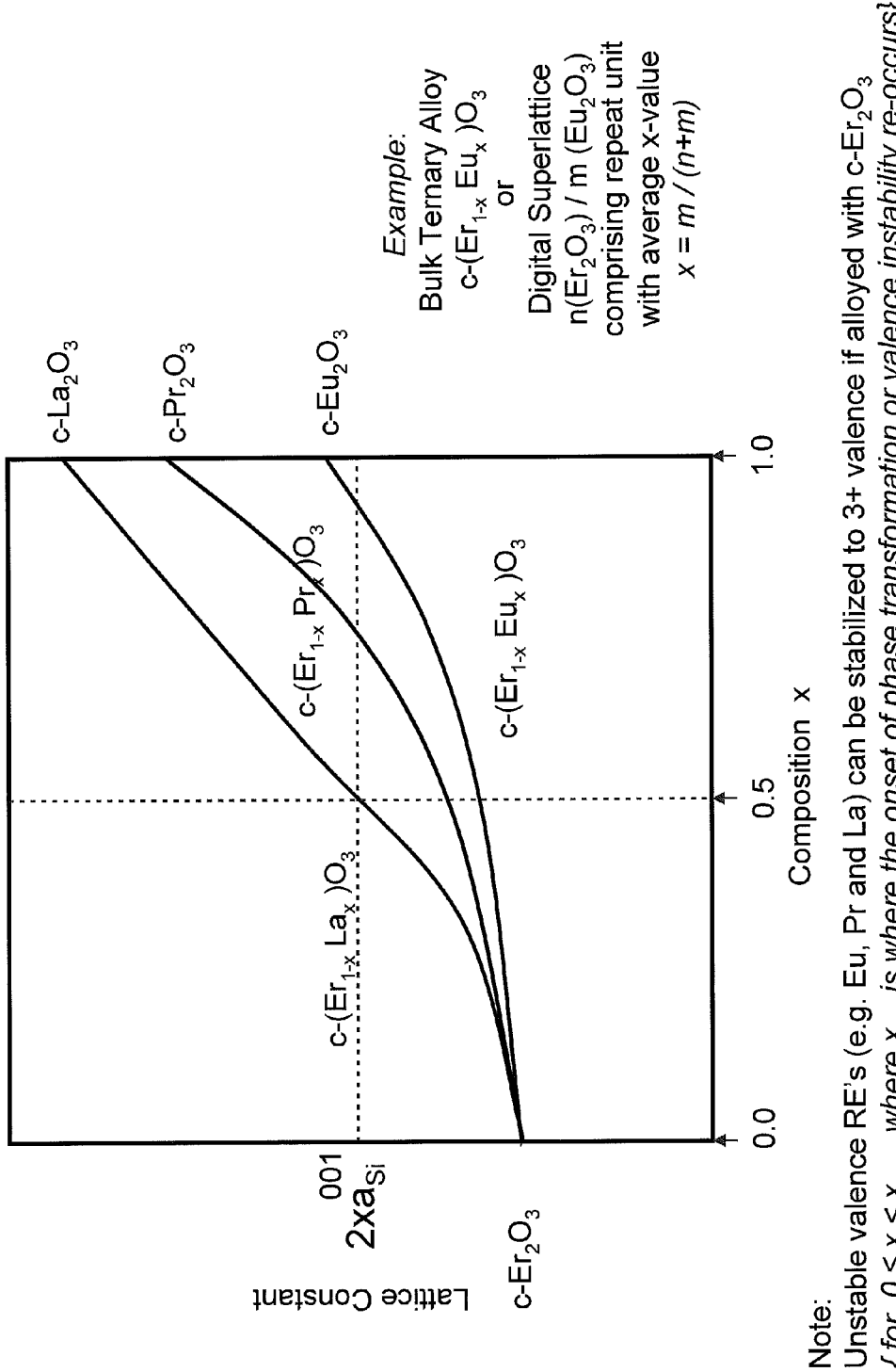
Figure 84:
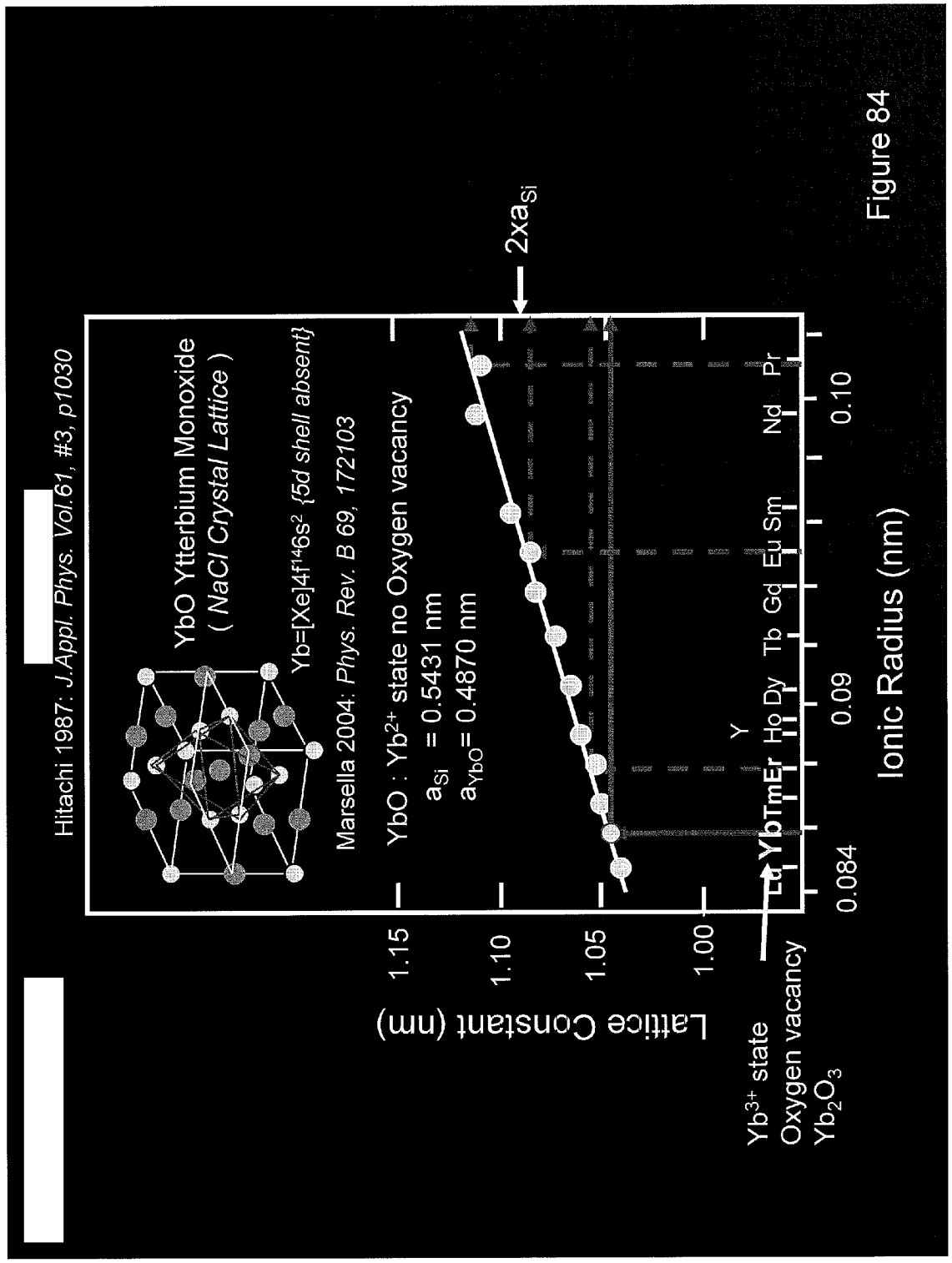
Figure 85:
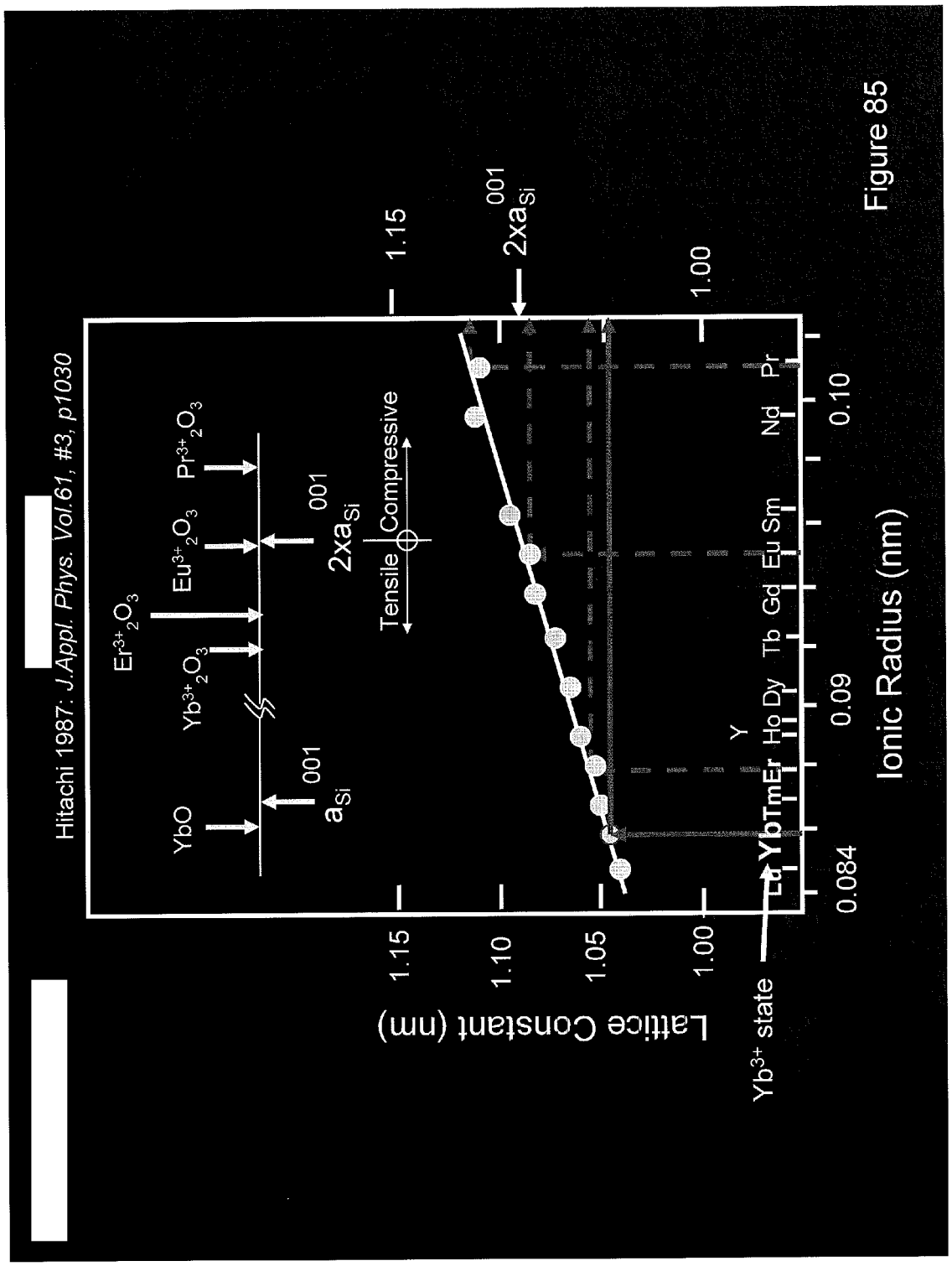

FIG. 75: Distribution of oxygen vacancies in bixbyite crystal.

FIGS. 76-81: The present invention discloses vacancy ordering techniques for rare-earth oxide bulk and multilayered thermoelectric materials.

FIGS. 82-85: Structural engineering curves for various c-type mixed rare-earth oxide ternary bulk materials.

Figure 86:
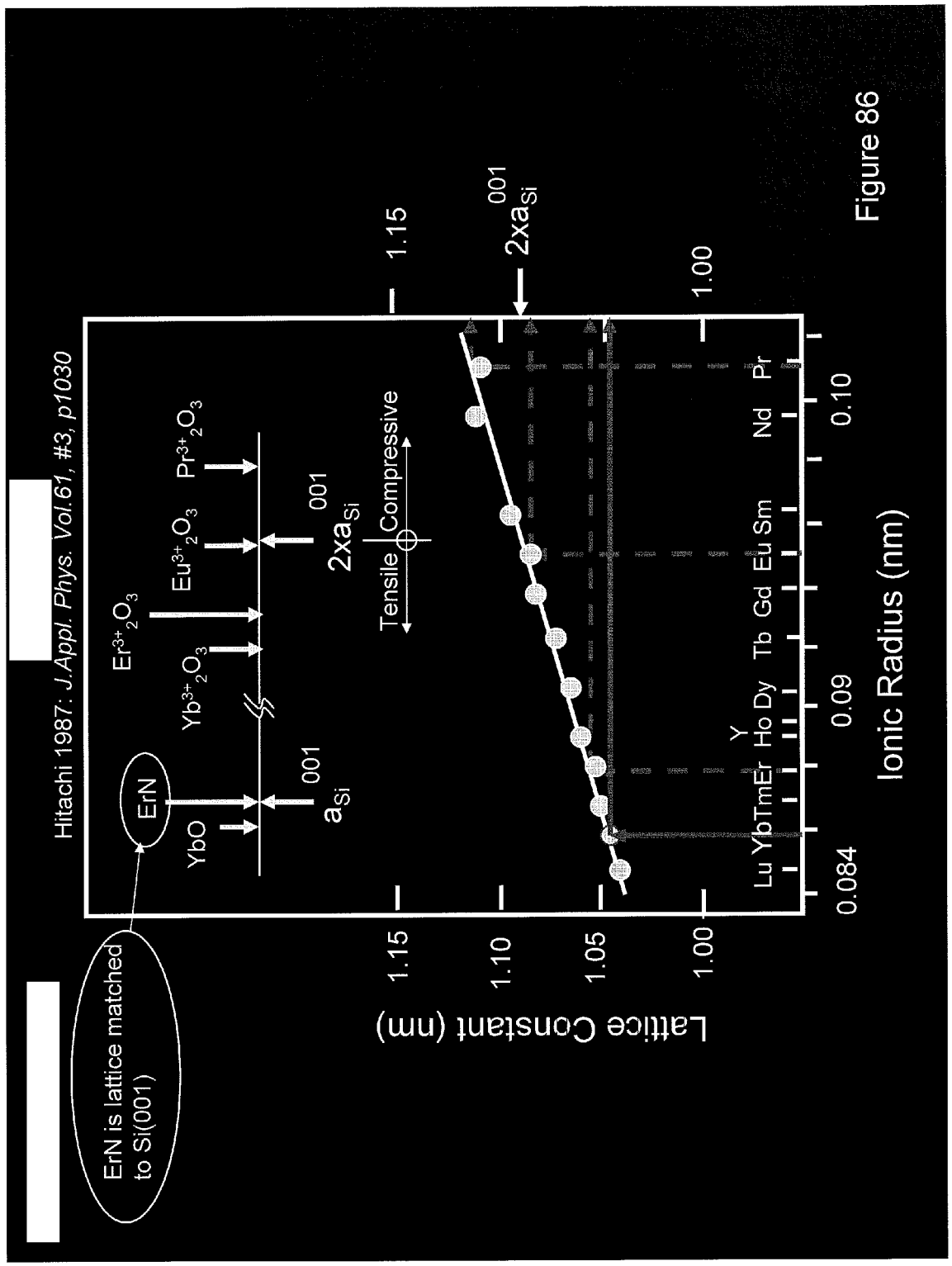
Figure 87:
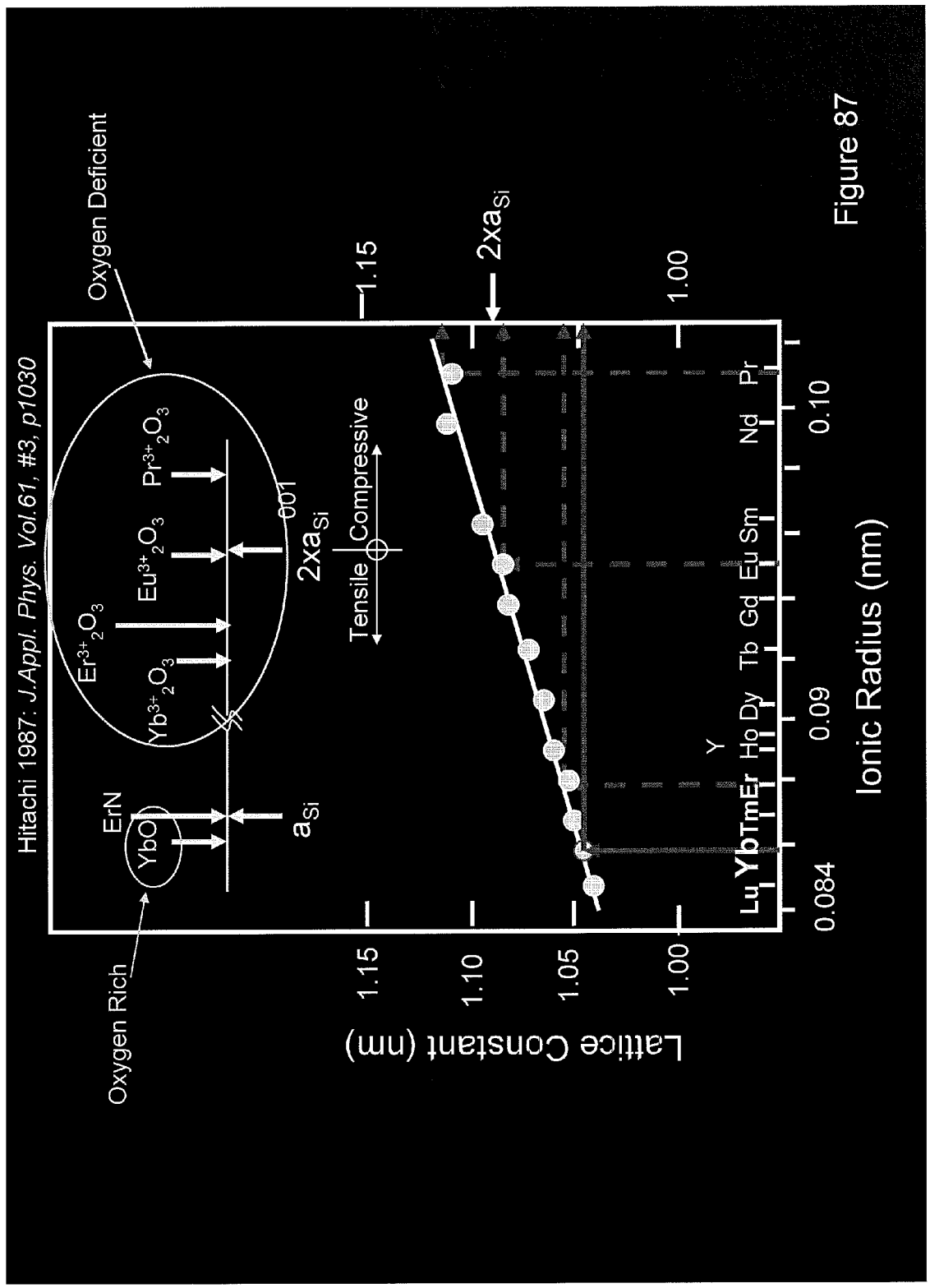
Figure 88:
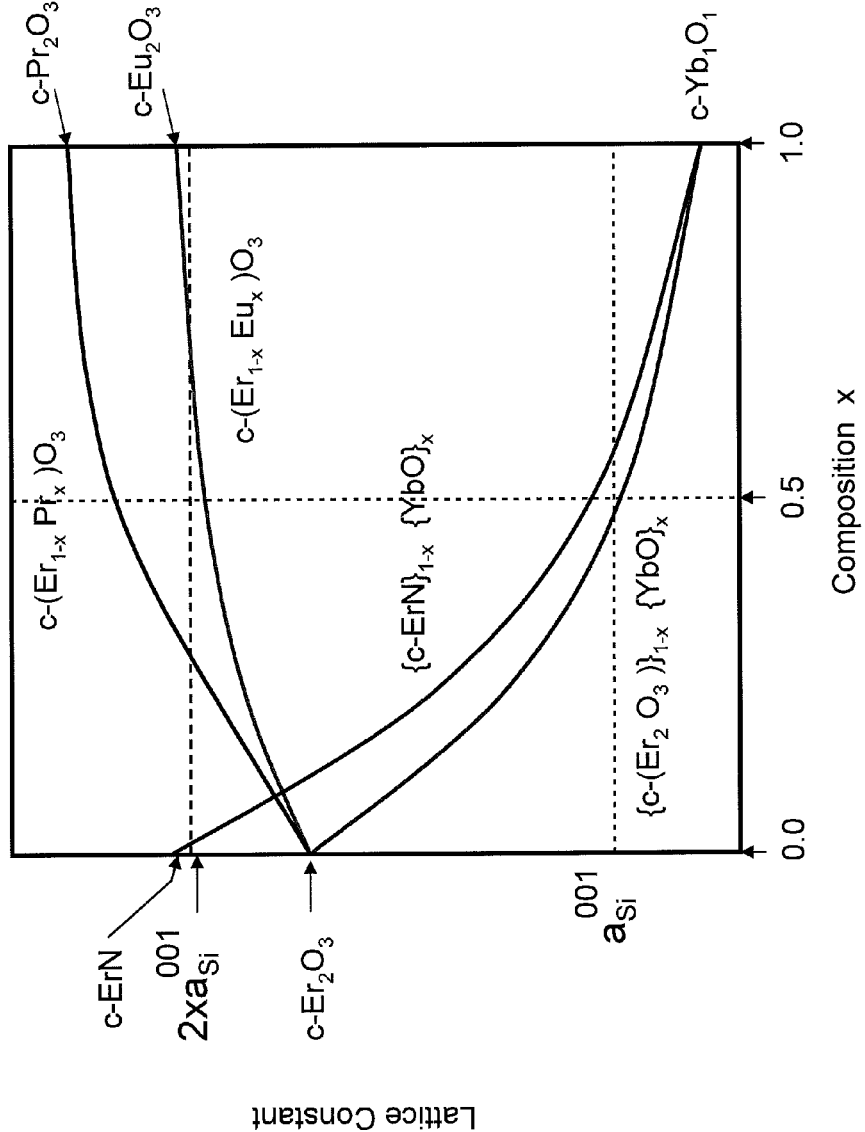

FIGS. 86-88: Structural engineering of lattice constant for rare-earth oxide and rare-earth oxy-nitride ternaries.

Figure 89:
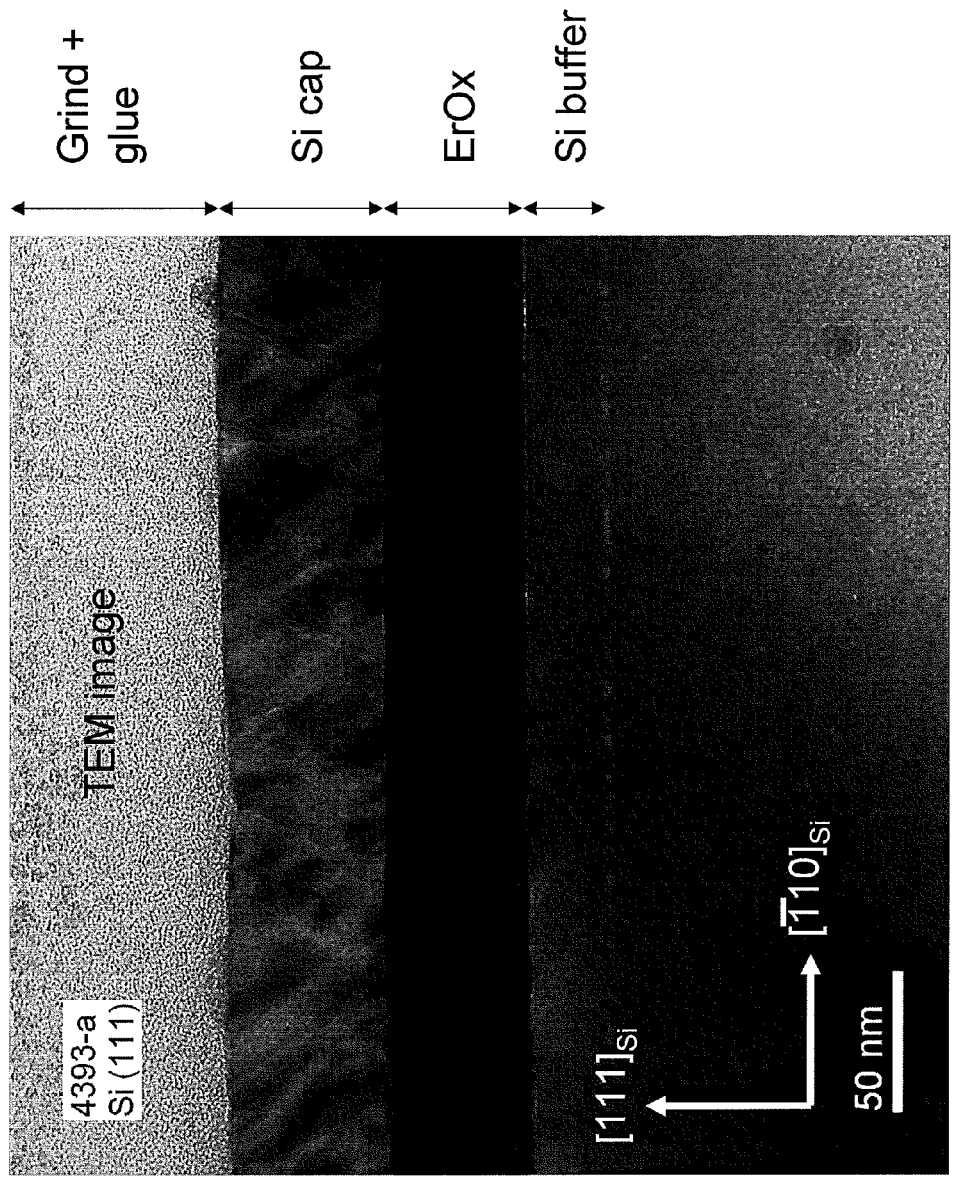

FIG. 89: High resolution transmission electron microscope (HR TEM) image of a 50 nm single crystal silicon epitaxially deposited on a 50 nm single crystal rare-earth oxide also deposited on single crystal silicon.

Figure 90:
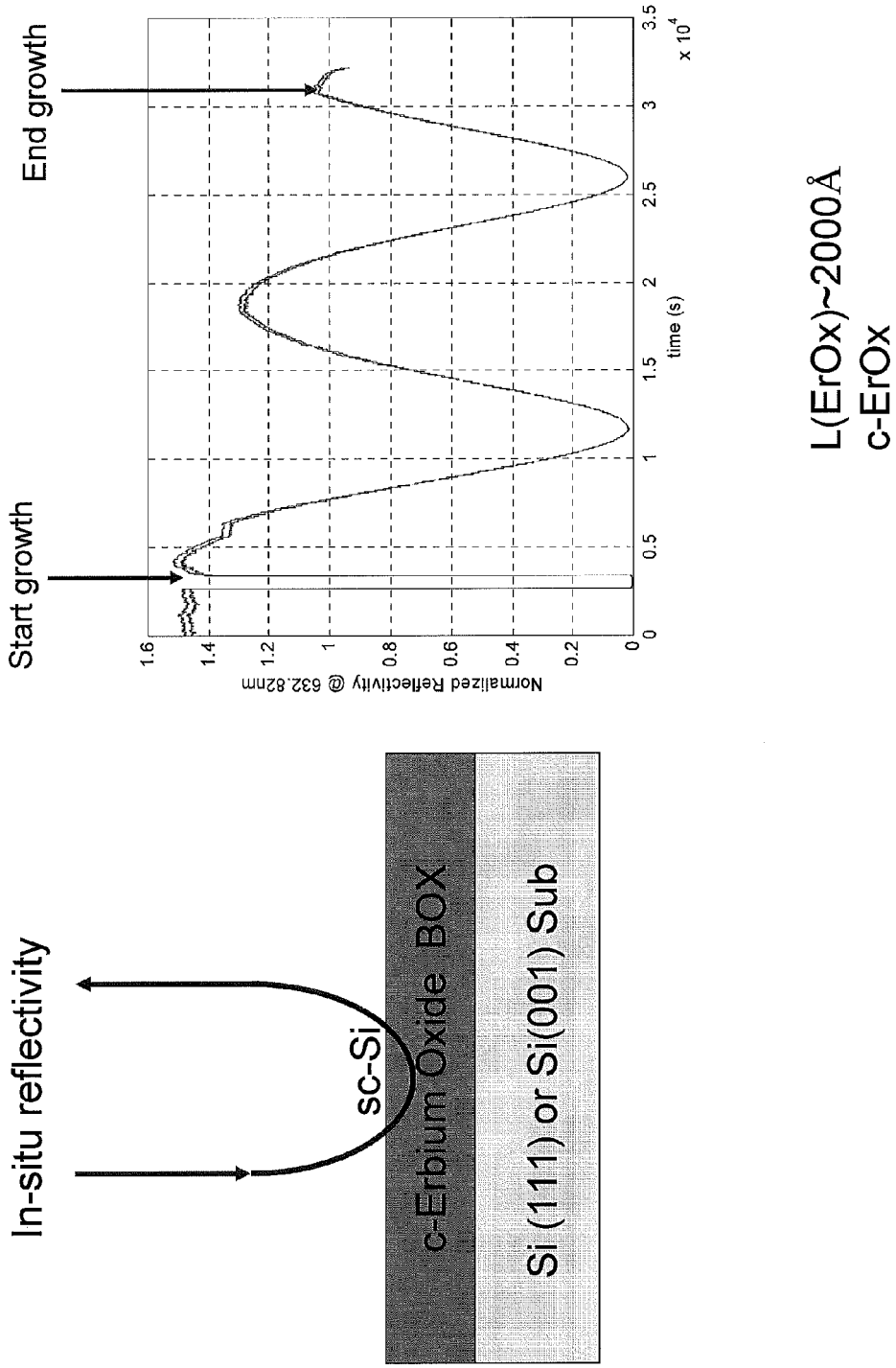

FIG. 90: In-situ growth measurement of single crystal rare-earth oxide thickness epitaxially deposited on a silicon substrate.

FIG. 91: Rare-earth oxide lattice phonon characterization using Raman spectroscopy of 500 Angstroms and 9000 Angstroms of oxide film on a silicon substrate.

FIG. 92: Silicon on Rare-earth oxide on silicon lattice phonon characterization using Raman spectroscopy of 500 Angstroms of Si cap and 200 Angstroms of oxide film on a silicon substrate.

Figure 93:
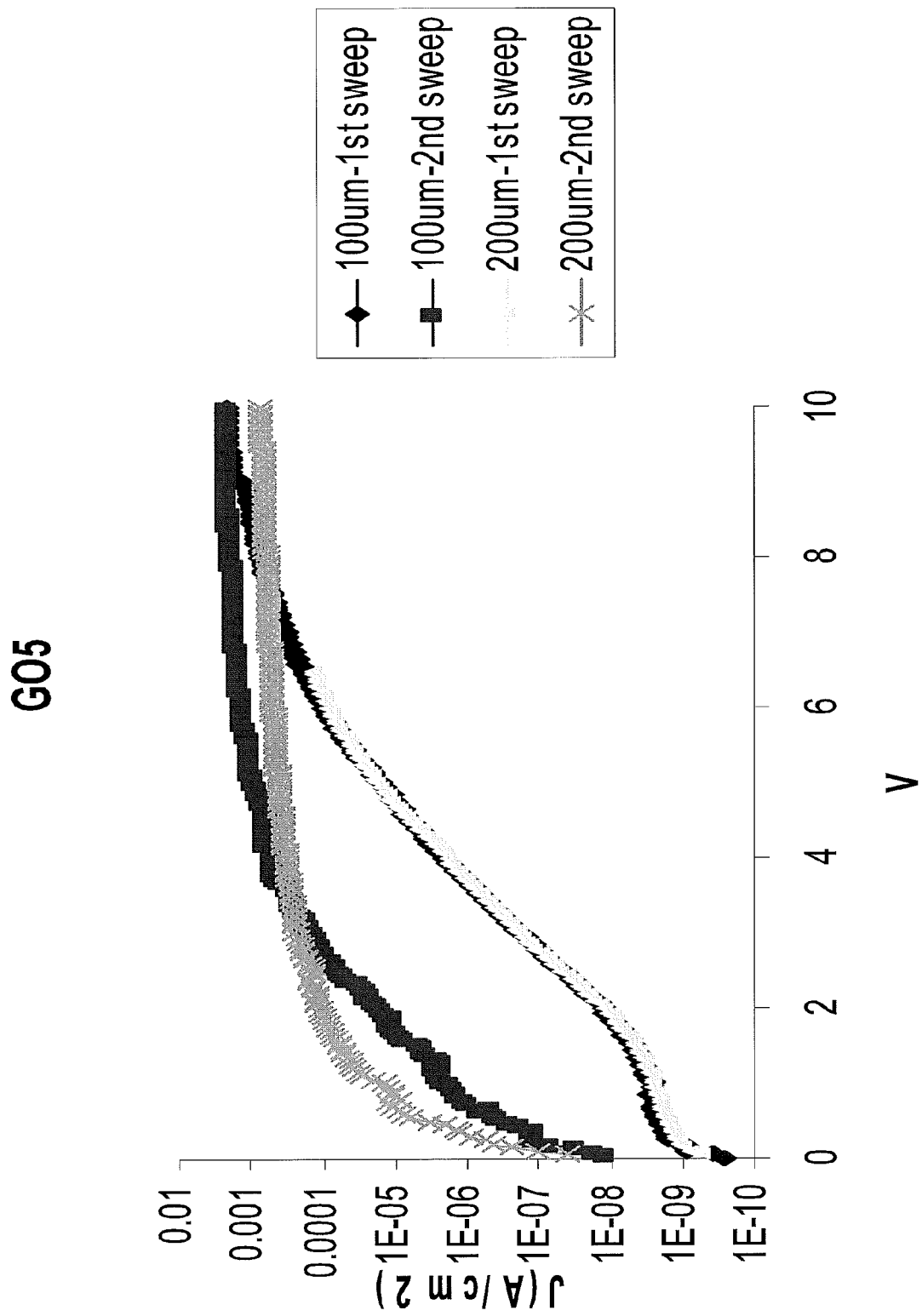

FIG. 93: Oxygen vacancy engineered rare-earth oxide film grown on silicon substrates.

Figure 94:
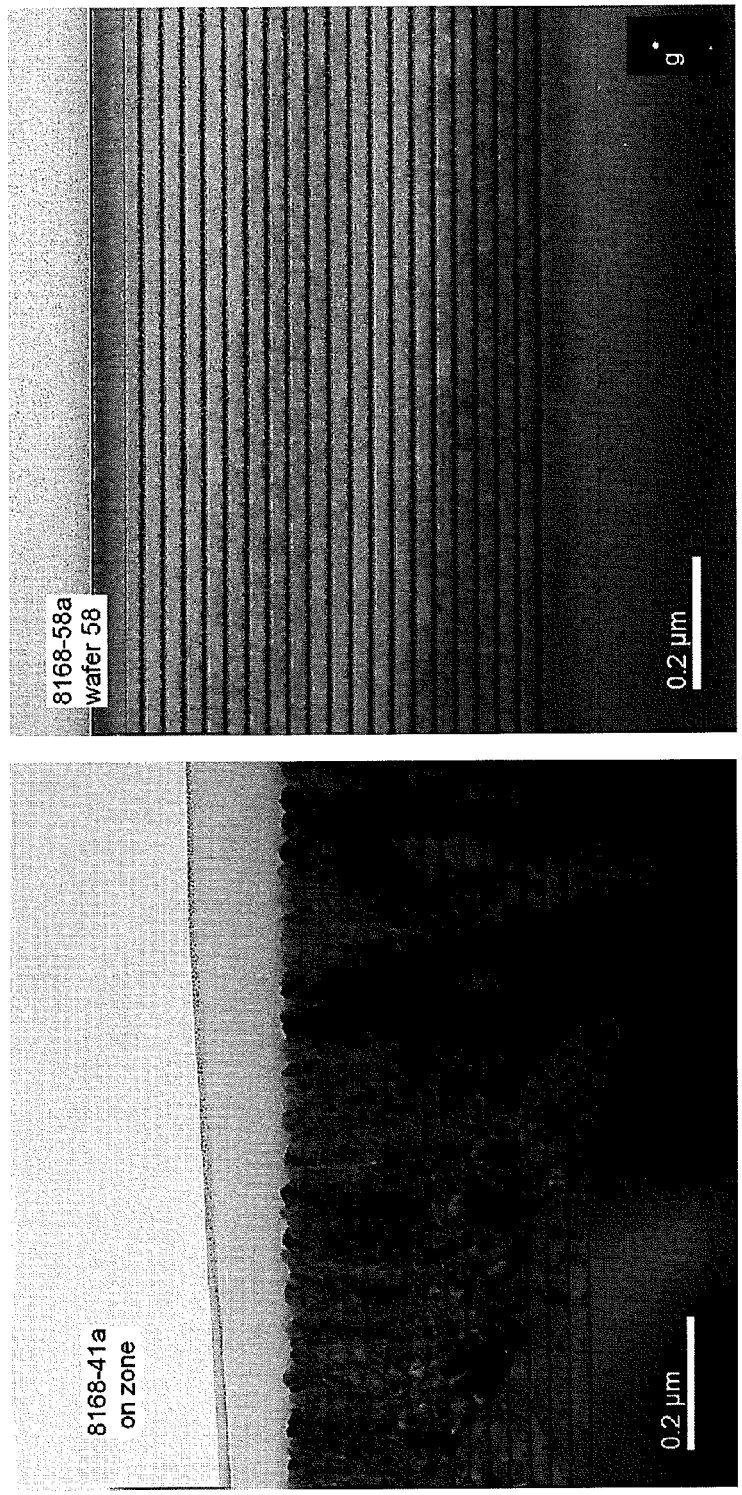

FIG. 94: High resolution transmission electron microscope image of another optional embodiment of rare-earth atom incorporated in silicon and/or silicon-germanium superlattices.

FIG. 95: Magnified high resolution transmission electron microscope image of another optional embodiment of rare-earth atom incorporated in silicon and/or silicon-germanium superlattices.

Figure 96:
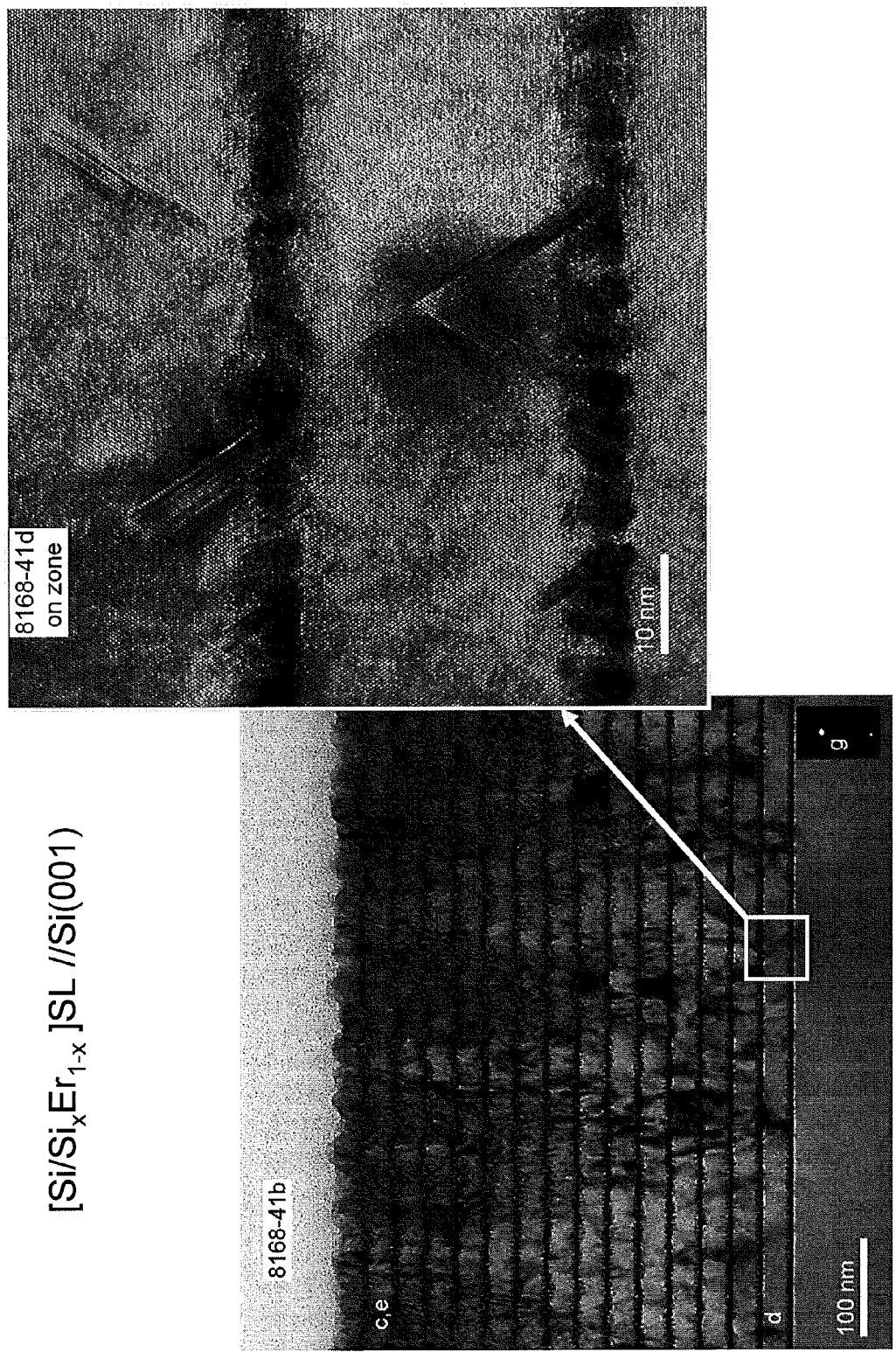

FIG. 96: Magnified high resolution transmission electronc microscope image of the silicon (Si) and erbium silicide ($ErSi_x$) bi-layers composing the multilayer $Si/ErSi_x$ superlattice.

Figure 97:
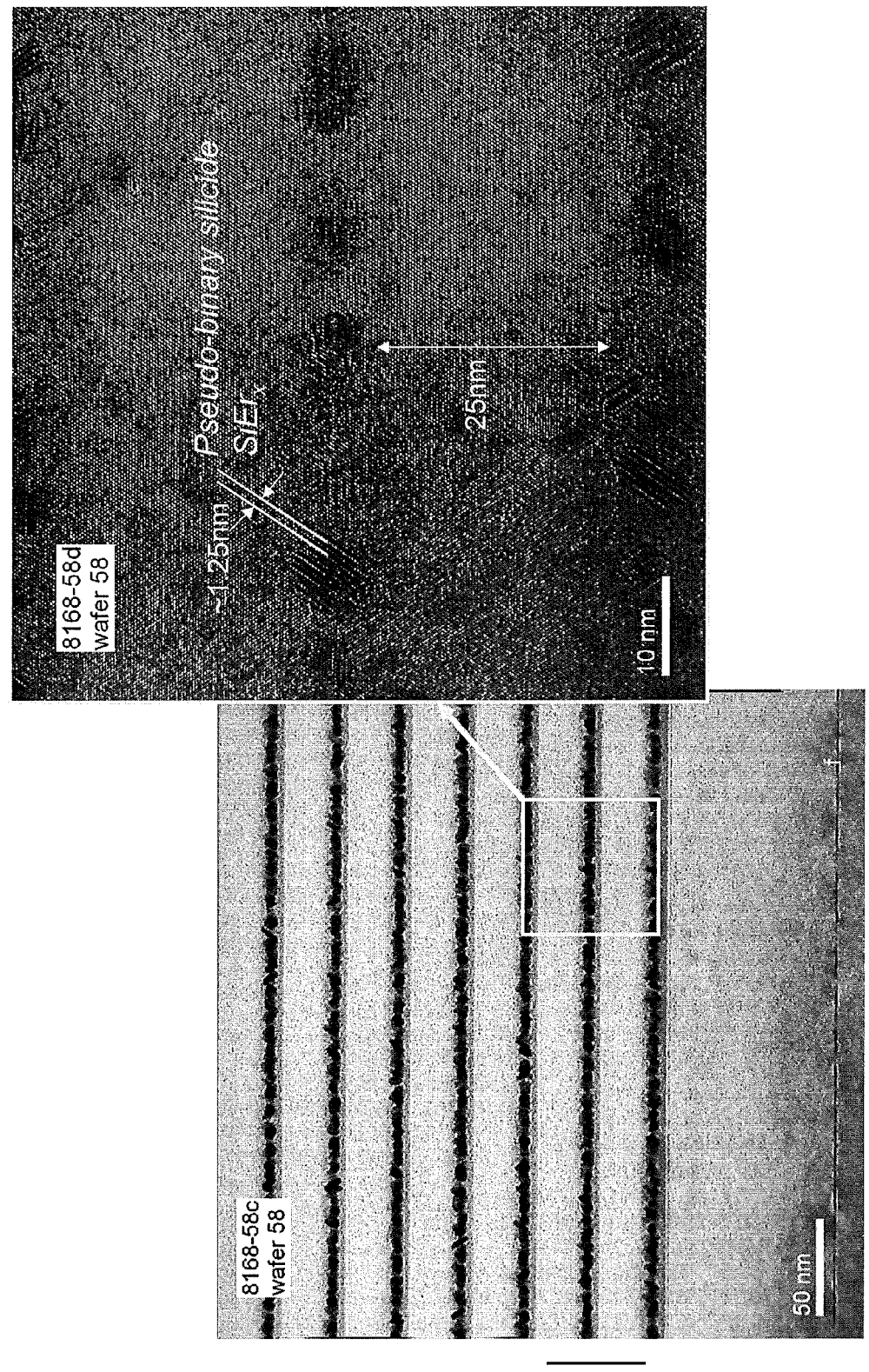

FIG. 97: Magnified high resolution transmission electronc microscope image of the silicon and erbium-germanium silicide ($Si_{1-x-y}Ge_xEr_y$) bi-layers composing the multilayer Si/($Si_{1-x-y}Ge_xEr_y$) superlattice.

Figure 98:
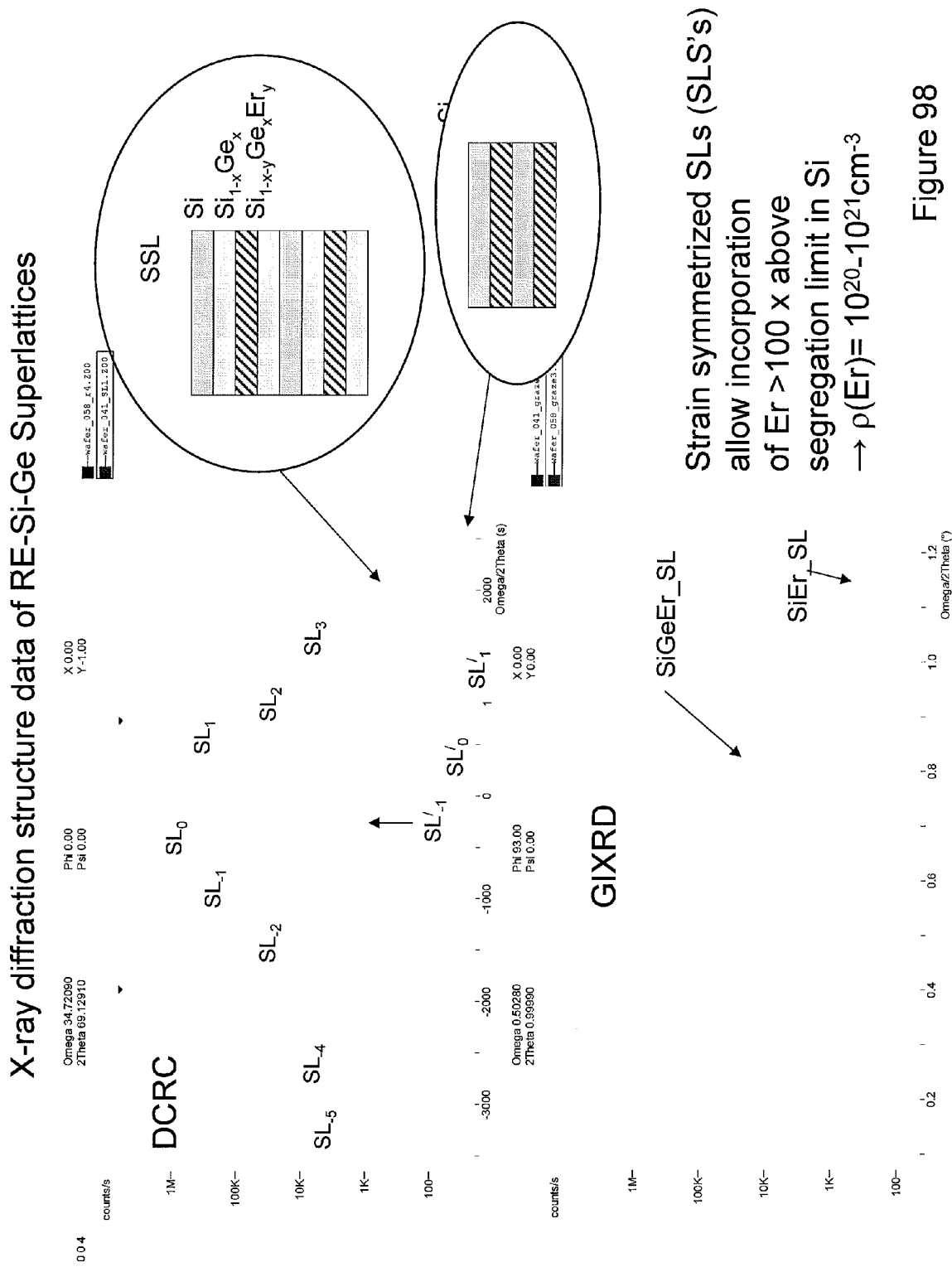

FIG. 98: High resolution x-ray diffraction of the Si/erbium silicide and silicon/erbium-germanium silicide superlattices grown on Si(100) substrates.

Figure 99:
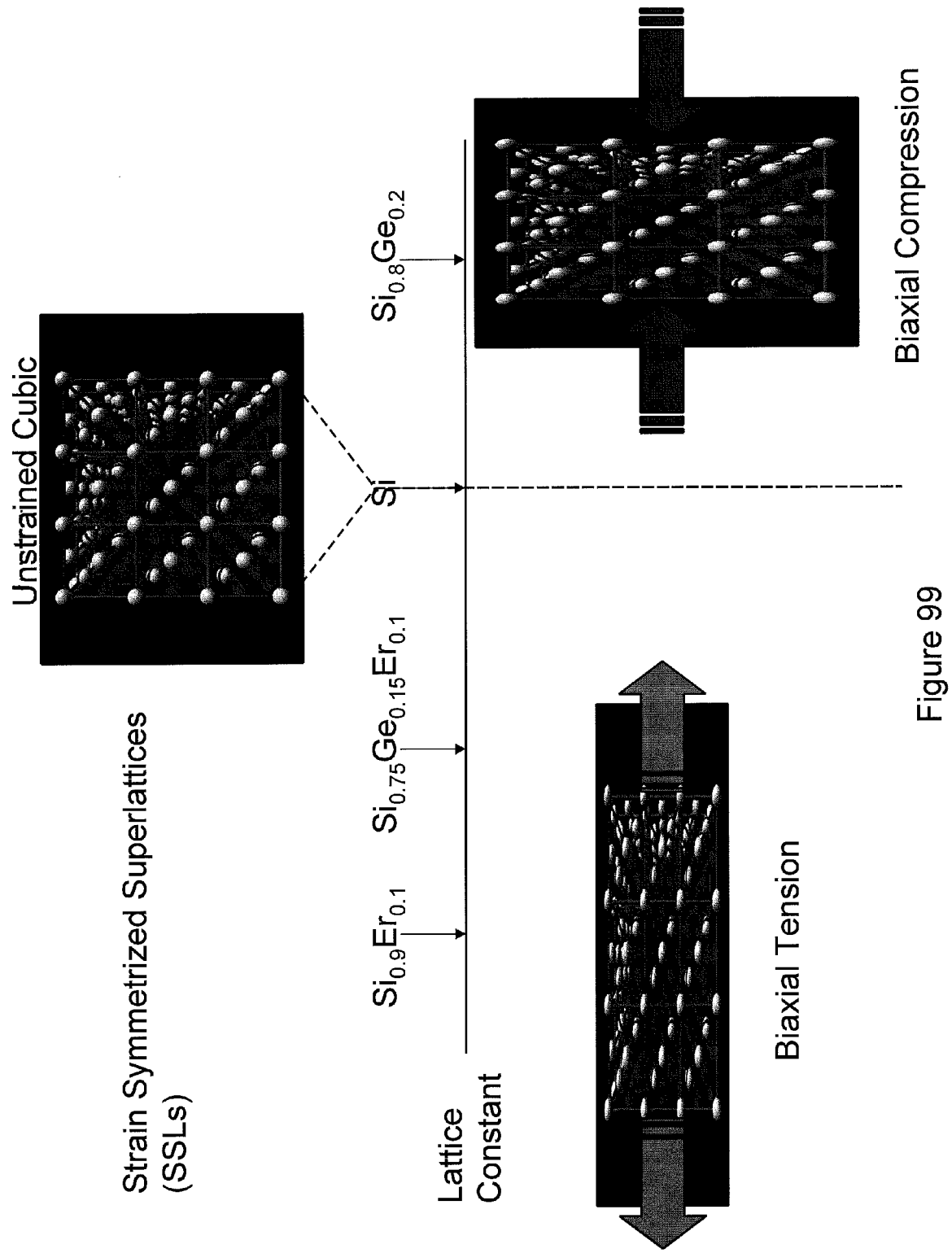

FIG. 99: Schematic diagram showing lattice constant tuning of silicon-germanium and erbium single crystal materials lattice matched to silicon.

FIG. 100: Description of the types of multilayer rare-earth structures to be used for band gap engineered thermoelectric materials.

Figure 101:
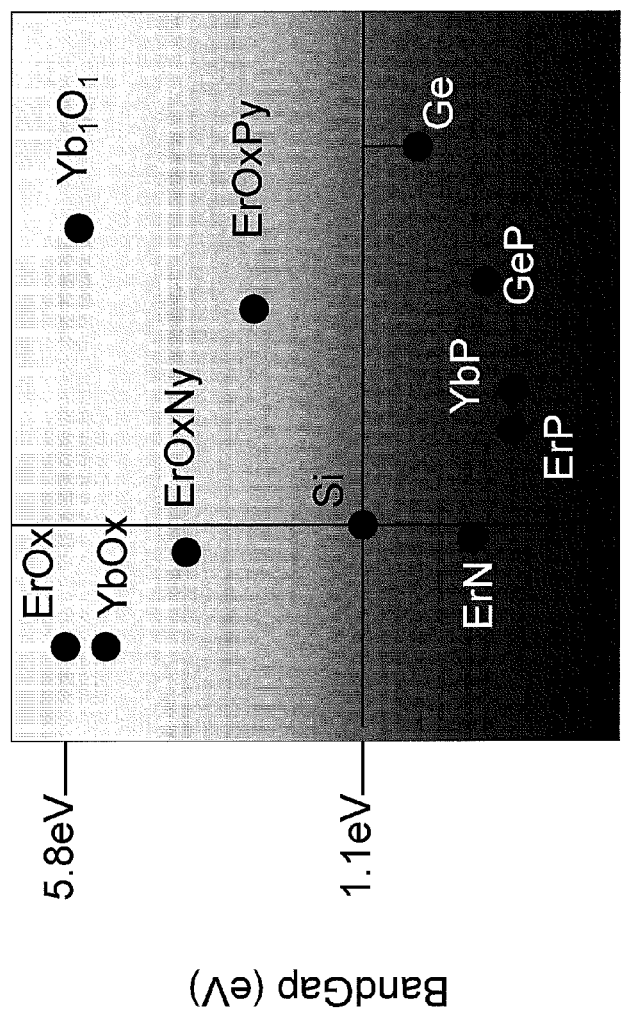

FIG. 101: The present invention discloses new insulator, semiconductor and semi-metallic materials.

Figure 102:
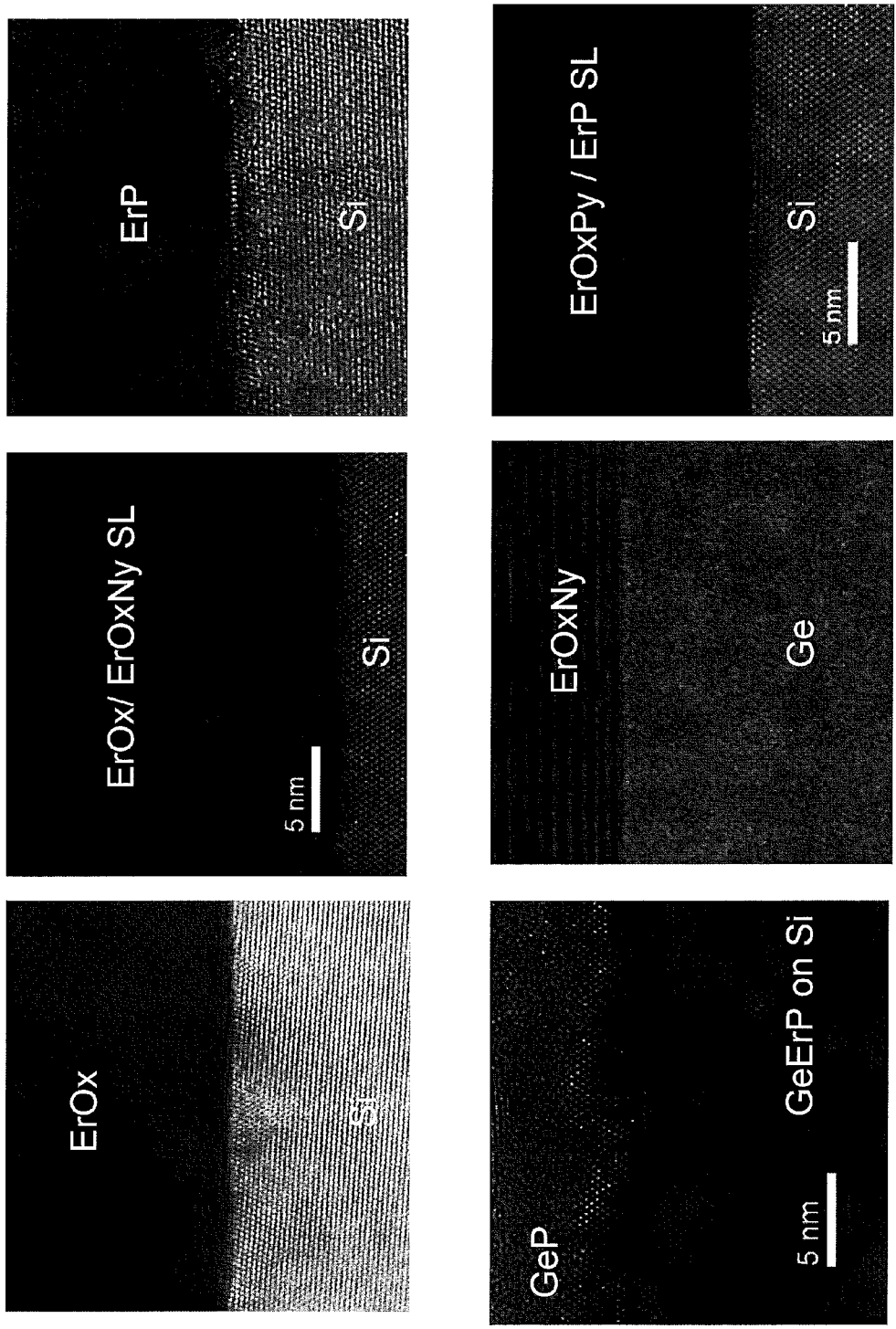

FIG. 102: High resolution transmission electron microscope image of disclosed new materials.

Figure 103:
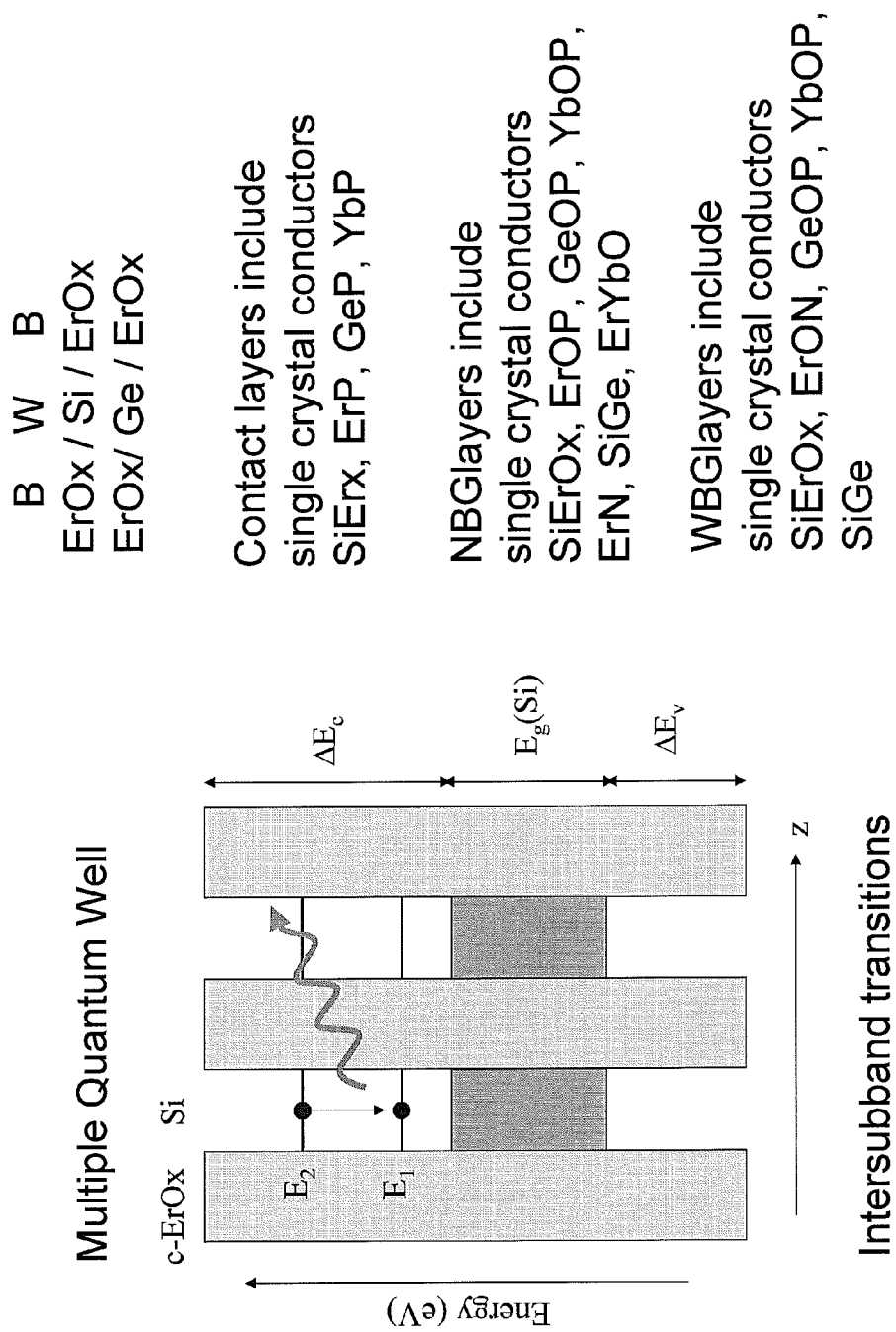

FIG. 103: Multiple quantum well materials using single crystal rare-earth oxide, rare-earth nitride and rare-earth phosphide, oxy-phosphides, oxy-nitrides and ternary alloys with silicon and germanium are disclosed in the present invention.

FIG. 104: Superlattice composed of the disclosed materials herein allow for efficient electronic wavefunction engineered structures.

FIG. 105: Example scenarios for implementation of thermoelectric power generation.

DETAILED DESCRIPTION OF THE INVENTION

Thermoelectric materials so far used for practical applications include $Bi_2Te_3$, PbTe, and $Si_{1-x}Ge_x$. Large scale application of these materials has not occurred due to one or more problems relating to poor ZT, low melting or decomposition temperature, harmful and/or scarce elements and/or cost. Bismuth telluride $Bi_2Te_3$ has the unique properties of complex hexagonal crystal structure, small bandgap energy $E_g=0.15$ eV, relatively high electron and hole mobilities ($\mu_e=800$ cm$^2$/Vs & $\mu_h=400$ cm$^2$/Vs) and low thermal conductivity ($\kappa_{th}\sim 1$-2 W/mK). N-type BiSb is superior at low temperatures, but does not have a p-type counterpart. $Bi_2Te_3$ exhibits the highest performance near room temperature, and is used for cooling applications such as commercially available Peltier coolers. PbTe shows the highest performance near 500-600° K., and $Si_{1-x}Ge_x$ is superior above 1000° K. The compound semiconductors BiSb, PbTe and $Si_{1-x}Ge_x$ all have a zinc-blende type crystal structure. It is noteworthy that single crystal Si has a relatively high thermal conductivity $\kappa_{th}\sim 140$ W/mK, decreasing rapidly with introduction of Ge as a $Si_{1-x}Ge_x$ alloy by an order of magnitude to $\kappa_{th}\sim 10$ W/mK at x=0.3 and remaining constant until x=0.8. The random SiGe alloy is therefore effective in scattering phonons and thus decreasing the lattice thermal conductivity. An empirical rule of thumb for determining suitable bulk semiconductor properties for thermoelectric applications has previously been determined. Present conventional thermoelectric bulk materials possess narrow electronic band gap ($E_{gap}$), and are degenerately doped semiconductors with relatively high free carrier mobility. For optimal thermoelectric performance it is believed that indirect band gap semiconductors should typically have $E_{gap}>6k_BT$, while direct band gap semiconductors should have $E_{gap}\sim 10k_BT$, where $k_B$ is the Boltzman constant and T is the operating temperature. Depending on the dominant scattering mechanism, direct band gap semiconductors may have an increase or decrease in thermoelectric performance with $E_{gap}>10k_BT$. The difference in band gap energies for direct and indirect semiconductors is due to the relative strength of electron and hole recombination processes and phonon scattering mechanisms. Narrow Band Gap (NBG) semiconductors have small phonon energies and are typically composed of ionic polar bonds. Therefore, polar optical phonon scattering is typically stronger in compound semiconductors (such as $Bi_xTe_y$, BiSb, PbTe, SiC, $B_4C$ etc.) compared to non-polar semiconductors (such as diamond, Si and/or Ge). Wide band gap (WBG) semiconductors and insulators typically have very large lattice phonon energies compared to their narrow band gap counterparts. In the present invention, crystalline rare-earth compounds, for example, oxides (c-$REO_x$), exhibiting very large phonon energies are used advantageously for low thermal conductivity, thermoelectric bulk and multilayer materials.

FIG. 14 depicts schematically the interplay of electrical conductivity $\rho$, thermoelectric power S, thermal conductivity $\kappa_{th}$ and the power factor $S^2\rho$ as a function of free carrier concentration $n_{carrier}$. FIGS. 4,5,6 show typical energy-momentum (E-k) band structures of direct and in-direct band gap semiconductors. Parabolic bands are shown, and the electron-electron and electron-phonon interactions are neglected. FIG. 14 describes how the thermoelectric power decreases with $n_{carrier}$, whereas the conductivity increases with $n_{carrier}$. Clearly, $S^2\rho$ takes a maximum at an optimal carrier concentration, $n_{carrier}=n_o$, below which the conductivity is too low, while above S is too small. Assuming a Boltzmann distribution instead of the Fermi-Dirac distribution, one can evaluate the optimum concentration is approximately in the range $n_o=10^{19}$-$10^{20}$ cm$^{-3}$, which is equivalent to $n_{carrier}$ of a degenerately doped semiconductor. Furthermore, the electrical conductivity is related to the carrier concentration and mobility as $\rho=q\cdot n_{carrier}\mu$. By fixing $n_{carrier}=n_o$ necessarily requires the mobility to increase for further increases in $\rho$ to occur. The total thermal conductivity $\kappa_{th}$ is composed of electronic $\kappa_E$ and lattice $\kappa_L$ contributions, such that $\kappa_{th}=\kappa_E+\kappa_L$. Near $n_{carrier}=n_o$, $\kappa_{th}$ is typically dominated by $\kappa_E$ for high $n_{carrier}$. The lattice contribution depends upon several types of phonon scattering mechanisms. FIG. 8 depicts the dependence of $\kappa_{th}$ as a function of lattice temperature for: (i) boundary scattering ($\tau_B$); (ii) electron-phonon scattering ($\tau_{electron-phonon}$); (iii) point defect scattering ($\tau_{defect}$); and (iv) phonon-phonon scattering ($\tau_{phonon-phonon}$). The total scattering rate can be expressed as $\tau^{-1}=\tau_B^{-1}+\tau_{Defect}^{-1}+\tau_{electron-phonon}^{-1}+\tau_{phonon-phonon}^{-1}$. For application to high temperature thermoelectric materials $\tau_{phonon-phonon}$ scattering dominates the behavior of $\kappa_{th}$. For low thermal conductivity materials, large intrinsic phonon energy is advantageous for minimizing the $\kappa_{th}$.

FIGS. 15 through 23 exhibit several embodiments of the instant invention wherein the bandgap of a thermoelectric device is deliberately modified from a higher temperature portion to a lower temperature portion. The reason for the modification is shown in FIG. 15, as the temperature of a material increases the band gap energy decreases. This effect is deleterious to the operation of a thermoelectric conversion device. The band gap may be engineered by modifying the composition of the material from a higher to lower band gap along the course of the device from higher temperature to lower. One embodiment is shown in FIGS. 18 and 19 using silicon and germanium; a higher percentage silicon results in a larger bandgap. Optionally, discrete bandgap steps may be employed as shown in FIGS. 20, 21, 22 and 23 wherein control of the bandgap and the location of the conduction band edge and valence band edge is disclosed.

FIG. 27: Optional embodiment multilayer thermoelectric materials using rare-earth metal oxides and germanium. The device depicts an example polycrystalline multilayer stack using thin oxide layers so as to allow quantum mechanical tunneling of charge carriers in a direction substantially perpendicular to the plane of the layers.

FIG. 28: An example of an optional embodiment thermoelectric materials using rare-earth metal oxides. The thermal impedance of the multilayer stack can be increased using the present invention by using alternate high and low thermal impedance materials.

FIG. 29: An example of an optional embodiment of thermoelectric material using multilayer n-type and p-type layer construct separated by an intrinsic and/or semiinsulating and/or insulating intermediate layer. Multiple n/p/i layers form a thermoelectric unit cell and can thus form an active thermoelectric material. Electrical contacts are made substantially at the cold junction and in such a manner so as to affect a serial connection between said thermoelectric unit cell.

FIG. 32: Optional embodiment of single stage p-i-n multilayer thermoelectric stack. This method is used to increase the thermoelectric efficiency.

FIG. 33: Optional embodiment of multilayer p-type/n-type thermoelectric stack. This method is used to increase the thermoelectric efficiency. Wide bandgap and narrow bandgap n-type/p-type stacks are shown.

FIG. 34: Optional embodiment of multilayer p-type/i/n-type thermoelectric stack. This method is used to increase the thermoelectric efficiency. Application of the p-i-n multilayer into thermoelectric device is shown.

FIG. 35: Optional embodiment of multilayer p-type/i-type/n-type thermoelectric stack. This method is used to increase the thermoelectric efficiency. Application of the p-i-n multilayer into thermoelectric device is shown. The separation of charge carriers in the energy band structure versus perpendicular and parallel directions is shown.

FIG. 36: Comparison of present inventions using: (i) modulation of impurity dopant type in homojunction (fixed bandgap) thermoelectric semiconductor device; and (ii) wide bandgap and narrow bandgap heterojunction (different bandgap) multilayer stack for use in high efficiency thermoelectric device.

FIG. 37: Comparison of several embodiments of the instant invention utilizing: (i) modulation of impurity dopant type in homojunction (fixed bandgap) thermoelectric semiconductor device; and (ii) wide bandgap and narrow bandgap heterojunction (different bandgap) multilayer stack configured to exhibit spatially dependent stepped and/or graded bandgap region near thermal heat source region followed by a stepped NBG and WBG region. The stepped and/or graded region operates so as to create a large concentration of charge carriers that once gaining sufficient thermal energy can surmount the potential energy barrier represented by the WBG and NBG region extending toward the cooler junction. The device is for use in high efficiency thermoelectric device.

FIG. 38: An optional embodiment of a thermoelectric avalanche multiplication (TAM) generator/amplifier device. Shown is a schematic representation of the electronic energy band gap versus growth direction and/or temperature gradient vector for a thermoelectric device exhibiting charge carrier multiplication and/or amplification. Charge carrier type generated and/or originating from the hot junction region substantially contained within a wide bandgap material substantially in excess of the narrow band gap region allows avalanche multiplication process to occur. The built in electric field generated by the graded bandgap semiconductor and/or semimetal and/or semi-insulating material(s) provides a dual role of also providing a drift component to the charge carrier propagation through the medium. Once the injected charge carrier from the said hot junction obtains close to or in excess of a multiple of approximately three times the spatially dependent band gap energy, avalanche multiplication effects may occur with high probability, thereby creating substantially two lower energy charge carriers similar in type to the energetic originating carrier type (herein example shown as electrons) along with an opposite charge carrier type (herein example shown as a hole). Optionally an electric field may be imposed externally upon a device to achieve or modulate the multiplication.

FIG. 39: Schematic diagram of an optional embodiment of a thermoelectric multilayer device structure incorporating, wherein atleast one metal layer and an oxide layer form the said thermoelectric device. The thermoelectric coefficient S, for n-type electron, p-type (hole) and copper materials are compared showing direction of propagation of charge due to thermal gradient.

FIG. 40: Description of present invention rare-earth-copper-oxide $RE_xCu_yO_z$ thermoelectric materials for use as bulk and multilayer and superlattice structures for high efficiency thermoelectric device.

FIG. 41: Description of present invention rare-earth-bismuth-oxide $RE_xBi_yO_z$ thermoelectric materials for use as bulk and multilayer and superlattice structures for high efficiency thermoelectric device.

FIG. 42: Schematic diagram and description of present invention oxide and metallic thermoelectric materials for use as bulk and multilayer and superlattice structures for high efficiency thermoelectric device. An example of the present invention incorporates a multilayer thermoelectric layer sequence composed of layers M, where M is chosen from at least one of metal and semimetal and semiconductor. OX is chosen from rare-earth oxide, rare-earth nitride, rare-earth phosphide and alloys composed of oxide/nitride/phosphide mixtures.

FIG. 43: Description of present invention rare-earth-silicon-carbide $RE_xSi_yC_z$ thermoelectric materials for use as bulk and multilayer and superlattice structures for high efficiency thermoelectric device.

FIG. 44: Description of present invention rare-earth-silicon-germanium $RE_xSi_yGe_z$ thermoelectric materials for use as bulk and multilayer and superlattice structures for high efficiency thermoelectric device.

FIG. 45: Description of an optional embodiment utilizing rare-earth-silicon-germanium-bismuth, $RE_xSi_yGe_zBi_s$ thermoelectric materials for use as bulk and multilayer and superlattice structures for high efficiency thermoelectric device.

FIG. 46: Schematic diagram of multilayer thermoelectric device incorporating unipolar conducting metal oxide and metal thermoelectric superlattice and multilayer structure.

FIG. 47: Schematic 3-dimensional cut-away diagram and 2-dimensional top view of vertical-type thermoelectric generator incorporating pillar type thermoelectric cells. The effective fill-factor of thermoelectric cell disposed so as to affect thermal energy coverage of the surface is shown. Opposite charge carrier cells are configured in electrical connections and current flow as shown.

FIG. 48: Planar thermoelectric devices allow large surface area scalability and is termed the large area concept of the present invention. An example using piezoelectric effect is disclosed.

FIG. 49: An example implementation of large area thermoelectric devices using spatial deformation of thermoelectric material to introduce substantially non-parallel distortion of material structure. Further incorporation of a piezoelectric material with crystal axes advantageously aligned to the constrained deformation and unconstrained deformation due to an applied thermal gradient is shown.

FIG. 51: Internal electric fields generated and/or enhanced due to constrained volume expansion and the effect of geometry of piezoelectric and/or and/or pyroelectric thermoelectric material due to applied thermal gradient. Non-parallel electric fields Eh and Ev substantially with vectors parallel and perpendicular to the applied thermal gradient are shown.

FIG. 52: Initial spatial position of thermally generated areal carrier concentration. Internal electric fields generated and/or enhanced due to constrained volume expansion and the effect of geometry of piezoelectric and/or thermoelectric material due to applied thermal gradient. Non-parallel electric fields Eh and Ev substantially with vectors parallel and perpendicular to the applied thermal gradient are shown.

FIG. 53: Schematic diagram showing the evolution of the spatial positions of thermally generated charge carrier concentrations due to diffusion process and drift process due to the thermal gradient and internal electric fields generated and/or enhanced due to constrained volume expansion and the effect of geometry of piezoelectric and/or thermoelectric material due to applied thermal gradient. Non-parallel electric fields Ev and Eh substantially with vectors parallel and perpendicular to the applied thermal gradient, respectively, are shown. Charge carriers can be preferentially moved in spatial direction substantially lateral in direction toward electrical contacts located on the cold side of the device. The device disclosed allows advantageously large area thermal source contact to said thermoelectric converter. Another advantage of disclosed large area device is the means by which electrical extraction and contact arrangement is disposed. The electrical contacts are connected to the said thermoelectric bulk and multilayer material(s) allowing single ended planar metallization on the cold junction side of the device.

FIG. 54: Schematic diagram of an optional embodiment of the present invention showing a thermo-field-effect (TFE) device and generator. The device invention enables substantially non-parallel heat vector and charge current extraction mechanism. The planar thermoelectric conversion device is composed of a means to transfer heat energy to an active region. The active region composed of the following functional layers: (i) a layer exhibiting the simultaneous dual properties of an electrical insulator and thermal conductor disposed between the regions of heat energy input and the thermoelectric conversion layer(s); (ii) thermoelectric conversion layer(s); and electrical contact regions for the means to extract charge carriers. The electrical contact disposed substantially toward the cooler region of the device either behaving as the thermal reservoir or independent to a thermal reservoir.

FIG. 55: Schematic diagram of an optional embodiment of the present invention showing a thermo-field-effect (TFE) device. The device invention enables substantially non-parallel heat vector and charge current extraction mechanism. The planar thermoelectric conversion device is composed of a means to transfer heat energy to an active region. The active region composed of the following functional layers: (i) a layer exhibiting the simultaneous dual properties of an electrical insulator and thermal conductor disposed between the regions of heat energy input and the thermoelectric conversion layer(s); (ii) thermoelectric conversion layer(s); and electrical contact regions for the means to extract charge carriers. The electrical contact disposed substantially toward the cooler region of the device either behaving as the thermal reservoir or independent to a thermal reservoir. An optional electrical passivation layer may be inserted on surface primarily in contact with the thermoelectric active region positioned between the thermal reservoir. The region substantially position between the thermal gate and the thermoelectric active region substantially beneath the area defined by the heat source input into the device behaves as a source of charge carriers.

FIG. 56: Schematic description of an optional embodiment of the present invention for a lateral bipolar thermoelectric (LBT) device and generator. The device is designed for conversion of thermal energy directly into electrical energy. At least three lateral regions of differing excess charge carrier type are defined in the thermoelectrical conversion active layer(s). Electrical contacts are disposed primarily on the outer lateral regions substantially positioned toward the cooler junction side of the device. The said thermoelectrical conversion active regions are in thermal contact with the input thermal energy region via a thermal gate. In one example, the LBT device generates thermal carriers substantially in the central lateral region and the said central region position primarily beneath the thermal energy input region.

FIG. 57: A planar topology thermo-multilayer device and or generator is shown. The device has a multilayer thermoelectric active layer with substantially planar electrical contacts disposed advantageous to extract thermally generated charge carriers due to the heat source at temperature T_H. The hear source is connected to the said thermoelectric layer(s) via an electrical insulator and thermal base region. The emitter and collector electrical contacts can be formed via alloy and diffusion process and or implantation process. Thermally generated carrier diffuse and or drift substantially in the plane of the multilayer interfaces. The thermal gate can be composed of insulator and dielectric and piezoelectric and or ferroelectric materials and/or multi-layers to affect the function of the device due to input thermal energy.

FIG. 58: Basic description of planar thermoelectric conversion devices disclosing functional layers required for: (i) Pyroelectric-Semiconductor device; (ii) Pyroelectric-Thermoelectric device; (iii) Pyroelectric-Thermoelectric/Semimetallic device. Lateral electrical contacts are shown.

FIG. 59: Basic description of planar thermoelectric conversion device disclosing functional layers required for Pyroelectric-Thermoelectric/Semiconductor device. Lateral electrical contacts are shown primarily disposed toward the cooler junction. The heat energy is input into the device through the top surface of the pyroelectric layer. The lower thermoelectric semiconductor surface positioned between the cooler thermal reservoir may optionally be isolated between the lateral electrical contacts.

FIG. 60: Basic description of planar thermoelectric conversion device disclosing functional layers required for Pyroelectric-Thermoelectric/Semiconductor device. Lateral electrical contacts are shown primarily disposed toward the cooler junction. The heat energy is input into the device through the top surface of an insulator/dielectric layer positioned above a pyroelectric layer. The lower thermoelectric semiconductor surface positioned between the cooler thermal reservoir may optionally be isolated between the lateral electrical contacts.

FIG. 61: Basic description of planar thermoelectric conversion device disclosing functional layers required for Pyroelectric-Thermoelectric/Semiconductor device. The heat energy is input into the device through the top surface of an insulator/dielectric layer positioned above a pyroelectric layer. The thermoelectric semiconductor surface positioned between the cooler thermal reservoir and heat source by pyroelectric and insulator/dielectric layers as shown.

FIG. 62: Basic description of planar thermoelectric conversion device disclosing functional layers required for Pyroelectric-Thermoelectric/Semiconductor device. The heat energy is input into the device through the top surface of an source layer. The said source layer acting so as to be a source of charge carriers. The source layer positioned above a pyroelectric layer. The thermoelectric semiconductor surface positioned between the cooler thermal reservoir and heat source by pyroelectric layers as shown. The insulator/dielectric layer positioned between the cold junction and the pyroelectric layer, as shown.

FIG. 63: Basic description of planar thermoelectric conversion device disclosing functional layers required for Pyroelectric-Thermoelectric/Semiconductor device. The heat energy is input into the device through the top surface of an source layer. The said source layer acting so as to be a source of charge carriers. The source layer positioned above a pyroelectric layer. The thermoelectric semiconductor surface positioned between the cooler thermal reservoir and heat source by pyroelectric layers as shown. The insulator/dielectric layer positioned between the cold junction and the pyroelectric layer, as shown.

FIG. 65: Schematic description of an optional embodiment of the present invention for a lateral bipolar thermoelectric (LBT) device and generator. The device is designed for conversion of thermal energy directly into electrical energy. At least three lateral regions of differing excess charge carrier type are defined in the thermoelectrical conversion active layer(s). Electrical contacts are disposed primarily on the outer lateral regions substantially positioned toward the cooler junction side of the device. The said thermoelectrical conversion active regions are in thermal contact with the input thermal energy region via a thermal gate. The thermal gate is composed of a pryoelectric functional material layer. The LBT device generates thermal carriers substantially in the central lateral region and the said central region position primarily beneath the thermal energy input region.

FIG. 67: Thermal generation of electrons and holes in doped homojunction occurs in different layers. Type-I heterojunction has thermal generation of charge carriers confined within the NBG layer.

FIG. 68: Type-I heterojunction has thermal generation of charge carriers confined within a semi-metallic NBG layer. The extreme condition of zero band gap energy is shown in the central portion of the NBG layer. Materials used in the present invention can be selected for example from, Si, ErP, Ge, Bi and ErOx and combinations thereof.

FIG. 69: Number of thermally generated carriers across the fundamental band gap of a material(s) as a function of effective band gap energy Eg. The parameter is the material temperature.

FIG. 70: Temperature stability and structural polymorphs of rare-earth oxide sesquioxides $RE_2O_3$, as a function of rare-earth atom, categorized via the effective cation radius. The structural crystal types are classed as hexagonal (A-type), Monoclinic (B-type), Cubic (c-type) and metastable C-type. Clearly the singular phase and/or structural stability of the C-type is preferred for high temperature range thermoelectric materials. The rare-earth atoms of heavy atomic mass, namely Dy, Ho, Er, Tm, Yb and Lu are preferred.

FIG. 71: Crystal structure of the diatomic rare-earth oxides $RE-O_2$, showing the cubic fluorite atomic cation and anion configurations. The unit cell can be classified as an eight-fold oxygen coordinated RE atom, namely $RE-O_8$ assemblages.

FIG. 75: Distribution of oxygen vacancies in bixbyite crystal, showing 75% of cations have oxygen vacancies on face diagonal, and 25% oxygen vacancies on the body diagonal.

FIGS. 76-81: The present invention discloses vacancy ordering techniques for rare-earth oxide bulk and multilayered thermoelectric materials.

FIGS. 82-85: Structural engineering curves for various c-type mixed rare-earth oxide ternary bulk materials. The lattice constant of the ternary oxide versus rare-earth composition relative to the primary rare-earth being that of erbium (Er). Rare-earths of particular interest are lanthanum La, presyodium Pr, and europium Eu. For optimal choice of composition lattice constant tuning to that of single crystal silicon is possible.

FIG. 89: High resolution transmission electron microscope (HR TEM) image of a 50 nm single crystal silicon epitaxially deposited on a 50 nm single crystal rare-earth oxide also deposited on single crystal silicon. This basic silicon-oxide bi-layer can be repeated to form a multilayer thermoelectric structure.

FIG. 90: In-situ growth measurement of single crystal rare-earth oxide thickness epitaxially deposited on a silicon substrate. The normal incidence optical reflectivity of the rare-earth oxide film oscillates in magnitude due to constructive and destructive interference.

FIG. 91: Rare-earth oxide lattice phonon characterization using Raman spectroscopy of 500 Angstroms and 9000 Angstroms of oxide film on a silicon substrate. The large erbium-oxide optical phonon ($Er-O^{TO}$) energy is shown relative to the $Si^{TO}$. The large value of $Er-O^{TO}$ allows the construction of high thermoelectric efficiency materials with low thermal conductivity.

FIG. 92: Silicon on Rare-earth oxide on silicon lattice phonon characterization using Raman spectroscopy of 500 Angstroms of Si cap and 200 Angstroms of oxide film on a silicon substrate. The Raman spectrum is indicative of high quality single crystal Si cap layer.

FIG. 93: Oxygen vacancy engineered rare-earth oxide film grown on silicon substrates. The rare-earth atom and oxygen atom stoichiometry can be used to control the electronic conductivity of the material. The current versus voltage curves show high conductivity materials can be produced for high efficiency thermoelectric material.

FIG. 94: High resolution transmission electron microscope image of another optional embodiment of rare-earth atom incorporated in silicon and/or silicon-germanium superlattices. The germanium and erbium fractions can be used to tune the strain in the material. The Si/SiEr and Si/SiGeEr superlattices demonstrate that Ge is effective in reducing dislocation and threading dislocations vertically through the superlattice along the growth direction.

FIG. 95: Magnified high resolution transmission electron microscope image of another optional embodiment of rare-earth atom incorporated in silicon and/or silicon-germanium superlattices. The germanium and erbium fractions can be used to tune the strain in the material. The Si/SiEr and Si/SiGeEr superlattices demonstrate that Ge is effective in reducing dislocation and threading dislocations vertically through the superlattice along the growth direction.

FIG. 96: Magnified high resolution transmission electronc microscope image of the silicon (Si) and erbium silicide ($ErSi_x$) bi-layers composing the multilayer $Si/ErSi_x$ superlattice. The critical layer thickness once exceeded generates considerable lattice defects. Below the critical layer thickness high quality single crystal material and interface quality occurs. The dark regions show the high density of erbium atoms localized in the erbium-silicide layer(s).

FIG. 97: Magnified high resolution transmission electronc microscope image of the silicon and erbium-germanium silicide ($Si_{1-x-y}Ge_xEr_y$) bi-layers composing the multilayer $Si/(Si_{1-x-y}Ge_xEr_y)$ superlattice. The supaerlattice structure is grown on a Si(001) substrate. The lattice constant tuning by the addition of germanium effectively tunes the lattice constant to that of bulk silicon. An indefinite number of Si/ (Si$_{1-x-y}$Ge$_x$Er$_y$) bilayers can thus be grown to form thick thermoelectric material. The dark regions show the high density of erbium atoms localized in the pseudo binary erbium-germanium silicide layer(s).

FIG. 98: High resolution x-ray diffraction of the Si/erbium silicide and silicon/erbium-germanium silicide superlattices grown on Si(100) substrates. The superlattice satellite peaks demonstrates high quality structural perfection. The grazing incidence x-ray diffraction demonstrates the atomic layer flatness of the superlattice structures and abrupt interface quality. These structures provide high erbium density for application to high efficiency thermoelectric material and devices.

FIG. 101: The present invention discloses new insulator, semiconductor and semi-metallic materials. The diagram shows the bandgap versus lattice constant of the disclosed rare-earth-oxide REOx, rare-earth-nitride REN, rare-earth-phosphide REP, germanium phosphide GeP and oxy-phosphides and oxynitrides.

FIG. 102: High resolution transmission electron microscope image of disclosed new materials. Shown is reduction to practice of single crystal heterojunctions disposed on silicon and/or germanium substrates. From left-to-right: Single crystal Rare-earth oxide/Si(111); single crystal rare-earth oxide and oxynitride on Si(100); Single crystal erbium phosphide on Si(100); single crystal germanium phosphide on germanium-rare-earth-phosphide ternary deposited on silicon(100); Rare-earth oxynitride on Germanium; rare-earth oxyphosphide on rare-earth phosphide composing a superlattice deposited on silicon. The selected images demonstrate the utility of the bandgap engineering and lattice constant engineering possible with the new material disclosed in the present invention.

FIG. 103: Multiple quantum well materials using single crystal rare-earth oxide, rare-earth nitride and rare-earth phosphide, oxy-phosphides, oxy-nitrides and ternary alloys with silicon and germanium are disclosed in the present invention. The electronic and structural properties of the said materials allow the construction of high efficiency thermoelectric materials and multilayer(s).

FIG. 104: Superlattice composed of the disclosed materials herein allow for efficient electronic wavefunction engineered structures. Short period superlattices allow crystal field engineering (CFE) to manipulate the 4f-shell energy manifold of the rare-earth atoms and thus manipulate the magnetic and/or optical and electronic properties of the materials. The new concept of CFE allows new thermoelectric materials to be developed.

FIG. 105: Example scenarios for implementation of thermoelectric power generation using: (a) conventional thermal power generation; (b) complementary thermal/thermoelectric power generation; (c) Direct thermoelectric power generation. The last scenario using direct thermoelectric generation has the advantage of reduced complexity and increased reliability.

Control of the band gap energy and conduction and/or valence band locations is done by the selection of alloy compositions chosen from a materials system described by [RE1]$_x$[RE2]$_y$[RE3]$_z$[Bi]$_m$[Si]$_n$[Ge]$_o$[C]$_p$[O]$_u$[N]$_v$[P]$_w$ wherein at least x and at least one of u, v, or w are greater than 0 and 0≦y, z, m, n, o, p, u, v, w≦5. Alternatively, a materials system is described by [RE1]$_x$[RE2]$_y$[RE3]$_z$[Bi]$_m$[Si]$_n$[Ge]$_o$[C]$_p$[O]$_u$[N]$_v$[P]$_w$ wherein at least n is greater than 0 and 0≦x, y, z, m, o, p, u, v, w≦5. Alternatively, a materials system is described by [RE1]$_x$[RE2]$_y$[RE3]$_z$[Cu]$_m$[Si]$_n$[Ge]$_o$[C]$_p$[O]$_u$[N]$_v$[P]$_w$ wherein at least n is greater than 0 and 0≦x, y, z, m, o, p, u, v, w≦5.

The present invention demonstrates that crystalline rare-earth oxide, in particular crystalline erbium oxide exhibits very large phonon energy as evidenced by the Raman spectrum in FIGS. 91 & 92. Conversely, all prior art activities have concentrated on a degenerate semiconductor with heavier effective mass (m*$_{i=e,h}$), higher mobility ($\mu_{i=e,h}$), and lower lattice thermal conductivity ($\kappa_{th}$). This has been based on an empirical model with the aim of maximizing the so called 'B-factor', which is proportional to the product B$\alpha$m$_i^{1.5}\mu_i$/$\kappa_{th}$. Such search criteria for material properties is generally not optimal as typically, direct band gap semiconductors with heavy effective masses result in lower mobility.

Non-polar semiconductors typically have scattering processes dominated by acoustic phonons and ionized impurities. This results in scattering which significantly affects mobility. Acoustic phonon scattering mobility behaves as $\mu_{ac} \sim m_i^{*5/2} T^{-3/2}$. The ionized impurity scattering limited mobility behaves as $\mu_{imp} \sim N_{imp}^{-1} m_i^{*-1/2} T^{3/2}$. The resulting non-polar mobility is therefore given by $\mu_{NP} = 1/(\mu_{ac}^{-1} + \mu_{imp}^{-1})$. For example, Si has low field drift mobilities $\mu_{e,h}$Si)$\alpha$T$^{-2.2}$ in the range 10<T<1000K. Polar semiconductors typically have scattering processes dominated by polar-optical phonons, where $\mu_{polar} \sim m_i^{*-3/2} T^{1/2}$. Clearly, the temperature dependence of non-polar and polar thermoelectric semiconductors is considerably different. Depending on the excess energy available to the carriers, intra-valley and inter-valley scattering mechanisms will also be important.

The E-k dispersion for direct band gap semiconductors can be described by parabolic bands and the thermal energies involved suggest that the free carriers have dynamics well described around the band extrema at the Brilluoin zone center. The thermoelectric parameters of the best conventional thermoelectric materials are generally in the range of $\rho \sim 0.01$ Ω·cm, S~150-200 μV/K, and 2-140 W/cm*K respectively (B-factor~0.3-0.4).

Since the discovery of Bi$_2$Te$_3$ in mid 1950's, thermoelectric materials were extensively investigated in binary systems. In fact, many promising materials were found, but the figure-of-merit ZT did not exceed unity. Recently, complex materials such as the filled skutterudite compounds of the form Ce$_x$Fe$_3$CoSb$_{12}$, have been the first unambiguous example whose ZT exceeded unity, and is understandably undergoing widespread investigation for thermoelectric power conversion devices. CoSb$_3$ exhibits crystal structure of the well known basic skutterudite structure, is CoSb$_3$ with crystal unit cell of cubic symmetry consisting of the eight sub cells—whose corners are occupied by Co atoms. Within this cubic unit cell, six sub cells out of the eight are filled with Sb, thereby forming the valence band. Electronic band calculations of CoSb$_3$ confirm it possesses a NBG energy of E$_g \sim 0.5$ eV. The energy-momentum dispersion is indirect which is believed by the present inventor a favorable property for a thermoelectric material. The hole mobility of CoSb$_3$ exceeds 2000 cm$^2$/Vs at 300 K, which is much higher than Bi$_2$Te$_3$.

An improvement to CoSb$_3$, is the crystal structure of the complex quaternary alloy skutterudite CeFe$_3$CoSb$_{12}$. It possesses two vacant sub cells filled by two cerium (Ce) ions. In order to compensate the charge valance, six Fe atoms are substituted for the eight Co sites, because Ce is believed to exist as trivalent. Empirically, it has been observed that the filler Ce ions reduce the lattice thermal conductivity several times lower than that for an unfilled skutterudite CoSb$_3$ crystal. Ce ions are weakly bound in an oversized atomic cage so that they will vibrate independently from the other atoms to cause large local vibrations. The vibration mode of Ce in the aforementioned confining atom cage allows "rattling" of the Ce atom—which is widely believed to result in the phonon mean free path of the material to be as short as the lattice parameters. That is, the filled skutterudite compounds exhibit poor thermal conductivity similar to a glass but retain good electric conduction like a crystalline semiconductor. This dual character of electron crystal and a phonon glass is advantageous with reference to the sought criteria described above. The Ce rattlers reduce the lattice thermal conductivity of $CoSb_3$ by one order of magnitude but still remains higher than $Bi_2Te_3$. Therefore, $Z(CoSb_3)<Z(Bi_2Te_3)$. However, the filled skutterudite has a lattice thermal conductivity similar to glass materials such as amorphous $SiO_2$. Such behavior is consistent with properties of a phonon glass, but remains to be fully explained.

The present inventor notes that cerium typically crystallizes in the 4+ state as an oxide compound of the form $Ce^{4+}O^{2-}_2$. An alternate theory may also explain the observed Z behavior that the filler Ce ions and compensating Fe ions induce a very high carrier density of the order of $10^{21}$ $cm^{-3}$, which would also seriously suppress the phonon mean free path through the electron-phonon interaction. It is interesting to note that the lowest $\kappa_{th}$ is realized in Ce deficient samples, and thus alloy disorder also significantly affects the reduction of $\kappa_{th}$. Nevertheless, the concepts of rattling and phonon glass have been a strong driving force for thermoelectric-material prior art investigations in recent years. Accordingly many promising materials based on such methodology has centered upon derivative materials such as $Sr_6Ga_{16}Ge_{30}$ and $CsBi_4Te_6$.

Clearly, prior art investigations for a solution for efficient bulk semiconductor materials have shown promising improvement in Z—but have not greatly increased Z from values attained using $Bi_2Te_3$. However, improving the Z value and/or thermoelectric efficiency is a necessary but not sufficient condition for the application to large scale deployment in an environmentally responsible method. The present invention solves the dual requirement of introducing bulk and multilayer material solutions that are non-toxic and provide high thermoelectric efficiency, Z. The present invention further discloses the use of rare-earth compounds with excellent match of required properties for construction of scaleable thermoelectric conversion devices. Furthermore, the present invention discloses new device structures implementing thermoelectric and/or pyroelectric and/or ferroelectric materials. Planar thermoelectric devices are disclosed for application as scalable in performance. Planar geometries afford scalable architectural nature and therefore are well suited to large scale thermoelectric power generation systems.

Yet another aspect of the present invention is the integration of the disclosed concepts for the thermoelectric generation of electricity from ultra-large-scale-integrated-circuits for the use of waste heat recovery and prolonged portable battery life.

Thermoelectric Oxides

Conventional state-of-the-art thermoelectric materials are $Bi_2Te_3$, PbTe, and $Si_{1-x}Ge_x$, all of which are degenerate semiconductors of high mobility. Since Te is scarce in the earths crust, by nature highly toxic, and volatile at high temperature, the commercial development of $Bi_2Te_3$ and PbTe has been limited. By contrast, oxide materials are chemically stable at high temperature and in air, and thus oxide thermoelectrics have expected use in much wider areas. However, most of the conventional choices of oxide semiconductors (such as $SiO_2$ and transitional metal oxides) show very low mobility by virtue of being wide bandgap and insulating. Therefore, oxides as a class of materials have been widely dismissed as useful for thermoelectrics.

Contrary to popular thought, recent works have shown adequate Seebeck coefficients and low resistivity in sodium cobalt oxides, namely crystalline $NaCo_2O_4$. The thermal conductivity of a $NaCo_2O_4$ single crystal is relatively low and ZT exceeded unity at 800° K. Related cobalt-based complex oxide compounds such as $Ca_3Co_4O_9$, $(Bi, Pb)_2Sr_2Co_2O_8$, $TiSr_2Co_2O_y$, $(Hg, Pb)Sr_2Co_2O_y$ have all been found to show good thermoelectric performance. Some single crystal species also exhibit ZT~1 at 1,000° K. To explain this phenomenon, a $CdI_2$-type hexagonal $CoO_2$ layer is common to these cobalt oxides, reminiscent of the layered copper oxide $CuO_2$ plane in high-$T_c$ superconductors. In comparison, the inventor also notes the hexagonal $CoO_2$ layer analogously plays an important role toward the thermoelectric performance of the layered Co oxides. Therefore, contrary to popular belief, some transition-metal oxides also exhibit thermoelectric properties.

Layered transition-metal oxides, such as layered cobalt oxide (cobalites), as contained in $NaCo_2O_4$, exhibit relatively low resistivity similar to the layered Cu oxides. Indium-tin-oxide also exhibits very low resistivity and is also a wide band gap semiconductor. In particular, prior art oxide embodiments disclose layered cobalt oxide-based thermoelectric materials as preferable for pursuit of high thermopower materials. For a neutral compound, singly ionized $Na^+$ cations and $O^{2-}$ anions in $NaCo_2O_4$, requires that the Co ions participate in the ratio $Co^{3+}:Co^{4+}=1:1$. It is believed by workers familiar with the art, that electronic conduction occurs by exchanging $Co^{3+}$ and $Co^{4+}$ with a positive charged hole on $Co^{4+}$. Note, that free carriers in degenerate semiconductors can only carry entropy due to their kinetic energy. Similarly, holes on $Co^{4+}$ in $NaCo_2O_4$ can transport entropy—however, potentially larger amounts than typical degenerate semiconductors. This may be a process for increasing thermoelectric performance.

Therefore, defects in otherwise idealized perfect crystals are responsible for ionic conductivity, electronic conductivity, and diffusion. All depend on the presence of local deviations from perfect crystalline order. Lattice disorder and Frenkel defects are an essential part of engineering high performance thermoelectric solid-state materials. Point defects involve normally occupied lattice sites that are empty, termed herein vacancies, and/or atoms that occupy and substitute at the wrong atomic site and/or interstitial lattice sites when referred to a perfect crystal structure. For the case of substitution of an impurity atom, any electron that is not in its lowest energy state is also a defect, as is a missing electron which is called a hole.

Prior art thermoelectric material alternatives are generally complex alloys based solely upon metallic elements, such as Ni, Pd, Al and Pt. Narrow bandgap formation occurs in these metallic alloys; however, such behavior is subtle and not well understood. Unfortunately, these prior art metallic alloys do not achieve ZT improvement beyond $Bi_2Te_3$, PbTe, and $Si_{1-x}Ge_x$. Metallic compounds which contain rare-earth metals have been introduced in relatively small concentration to fine tune the thermoelectric properties or have been combined with Pd, Al or Sn. Yet again, these prior art rare-earth metallic alloys do not achieve ZT improvement beyond $Bi_2Te_3$ and PbTe.

The present invention discloses thermoelectric materials with structures comprising compositions of rare-earth oxide-based, rare-earth phosphide based and rare-earth-nitride based compounds and mixtures thereof; optionally additional semiconductor materials are added comprising members of the Group IV, Groups III-V and Groups II-VI. Of particular importance in the present invention are crystal structures exhibiting the major forms of rock-salt NaCl-type, fluorite $CaF_2$-type and particularly the defective fluorite crystals known Io commonly as the bixbyite crystal structure exhibited by the rare-earth oxide binary compounds. Rare-earth phosphide (RE-P) and rare-earth-nitride (RE-N) compounds typically exhibit semi-metallic properties with narrow band gap energy and exhibit cubic rock-salt crystal structure. Combining the aforementioned rare-earth compounds, (for example, $RE-O_xN_y$, $RE-O_xP_y$, $RE-P_xN_y$, etc.) with each other as impurity concentrations or substitutional alloys and/or with conventional semiconductors such as Si and/or Ge and other conventional thermoelectric materials is also covered by the present inventions. That is, zinc-blende and rutile crystal structures can also be exploited in the present invention in order to engineer the thermoelectric properties of the compound materials.

Yet another aspect of the present invention is the use of bismuth compounds (from the commonly known Pnictogen or nitrogen group) for thermoelectric devices. Bismuth is a white, crystalline and brittle semimetal. Bismuth is the most diamagnetic of all metals, and has the lowest thermal conductivity of all known metals, with the only exception of mercury. It has a high electrical resistance, and has the highest increase in electrical resistance when placed in a magnetic field (that is, the commonly understood Hall Effect) of all metals. Thermoelectric compounds such as BiSb and $Bi_2Te_3$ are well characterized.

Crystals of zinc-blende (ZB) and wurtzite (W) structures are the most common crystal forms of binary III-V compounds. Column III-nitrides typically adopt the W structure, and other heavier III-anions prefer the zinc-blende structure. In particular, group III-Bi compounds are potentially useful thermoelectric materials. Bismuth and Antimony (Sb) have been used widely in prior art thermoelectric devices in the form of BiSb, $Bi_2Te_3$, $Sb_2Te_3$. For implementation in high volume large area application Sb and Te are to be discouraged due to high toxicity. Bismuth metal has a melting point of ~270° C. and forms compounds in the 3+ and 5+ oxidation states, wherein the 3+ state is the more stable of the two. The low toxicity of ordinary bismuth salts permits use in pharmaceutical industries. The ground state (i.e.; lowest energy) structure of III-Bi compounds are of the form of ZB, W, and tetragonal PbO-type phases. Generally, group III-Bi has the PbO-type phase as the most stable for the heavier III-V compounds.

Yet another aspect of the present invention is the use of Bi-VI compounds, particularly VI=oxygen. The present invention exploits bismuth in the forms of stoichiometric di-bismuth-trioxide $Bi_2O_3$ (Bismite) and non-stoichiometric $Bi_yO_x$, where $0<x, y \leq 2.5$.

Furthermore, lanthanide or rare-earth bismuth (RE-Bi) compounds are disclosed as advantageous for thermoelectric application. Rare-earth-bismuth (RE-Bi) compounds, particularly, the heavier rare-earth metals are preferred (such as, erbium, thulium and ytterbium) are disclosed in the forms of the semimetals Er—Bi, Tm—Bi and Yb—Bi.

Yet another aspect of the present invention is the use of Bi-rare-earth-oxide. The present invention exploits bismuth in the forms of stoichiometric di-bismuth-trioxide $Bi_2O_3$ (Bismite) and non-stoichiometric $Bi_yO_x$, where $0<x, y \leq 2.5$, combined with stoichiometric di-rare-earth-trioxide $RE_2O_3$ and non-stoichiometric $RE_yO_x$, where $x=1.5\pm y$, $0 \leq y<1$, to form complex oxides of the form $(Bi_yO_x)_z(ErO_w)_{1-z}$ where x and $w=1.5\pm v$, $0<v<1$, and $0<z\leq 1$.

Yet another aspect of the present invention are the compounds of the form of bismuth-phosphide (Bi—P) and bismuth-nitride (Bi—N). The Bi—P and Bi—N form bulk and thin film crystal structures predominately in the ZB structure. This is advantageous for deposition of the said Bi—P and Bi—N compounds on cubic and/or diamond and/or rock-salt type crystalline substrates. Crystalline substrates such as single crystal silicon are preferred.

Yet another aspect of the present invention is the use of Bi-rare-earth-nitride. The present invention exploits bismuth in the forms of stoichiometric bismuth-nitride BiN and non-stoichiometric $BiN_x$, where $x=1.0\pm y$, $0 \leq y<1$, combined with stoichiometric rare-earth nitride RE-N and non-stoichiometric $REN_x$, where $x=1.0\pm y$, $0 \leq y<1$, to form complex nitrides of the form $(BiN_x)_z(ErN_w)_{1-z}$ where x and $w=1.0\pm v$, $0 \leq v<1$, $0 \leq z \leq 1$.

Yet another aspect of the present invention is the use of Bi-rare-earth-phosphide. The present invention exploits bismuth in the forms of stoichiometric bismuth-phosphide BiP and non-stoichiometric $BiP_x$, where $x=1.0\pm y$, $0 \leq y<1$, combined with stoichiometric rare-earth phosphide RE-P and non-stoichiometric $REP_x$, where $x=1.0\pm y$, $0 \leq y<1$, to form complex phosphides of the form $(BiP_x)_z(ErP_w)_{1-z}$ where x and $w=1.0\pm v$, $0 \leq v<1$, $0 \leq z \leq 1$.

Combinations of the aforementioned compounds are also included as part of the present invention wherein compositions of the form $[RE1]_x[RE2]_y[RE3]_z[Bi]_m[O]_u[N]_v[P]_w[Cu]_s$ and where at least x and at least one of u, v, or w are greater than 0 and $0 \leq y, z, m, u, v, w, s \leq 5$.

The aforementioned Bi-compounds disclosed herein can be incorporated advantageously in bulk or multilayer form for application to, but not limited to, high efficiency thermoelectric conversion devices.

Yet a further aspect of the present invention is the construct of substantially 2-dimensional layered materials engineered to exhibit high electrical conductivity, low thermal conductivity and high thermoelectric power.

Pyroelectrics

Pyroelectricity can be understood as yet another combination of effects between energy states in a crystal structure, namely: (i) kinetic; (ii) electrical; and (iii) thermal energy. The exclusive relation between electrical and thermal energy manifests in the pyroelectric effect which does not produce kinetic energy. The relation between kinetic and electrical processes represents the piezoelectric effect which does not produce heat. Pyroelectric materials such as quartz and tourmaline and other ionic crystals are known. Pyroelectricty also occurs in organic materials such as bone and tendon. Pyroelectric charge in crystals develops on substantially opposite faces and/or planes of a crystal slab, the said crystal exhibiting asymmetric crystal structure. The vector in which the propagation of the charge tends towards is usually constant throughout a pyroelectric material. The charge propagation direction may be advantageously changed by application of a local electric field. Such materials are said to exhibit ferroelectricity.

Crystal structures can be categorized and divided into 32 classes, or point groups, according to the number of rotational axes and reflection planes they exhibit that leave the crystal structure unchanged. Of the 32 crystal classes, 21 are non-centro-symmetric (i.e.: not having a centre of symmetry), and of these, 20 exhibit direct piezoelectricity. The remaining one is the cubic class 432. Ten of these classes are polar (i.e.: spontaneously polarize), containing a dipole in the unit cell, and exhibit pyroelectricity. If the said dipole can be reversed by the application of an electric field, the material is said to be ferroelectric. The 20 piezoelectric classes are distinguished by the lack of a center of symmetry materials develop a dielectric polarization when an electric field is applied, but a substance which has a natural charge separation even in the absence of a field is called a polar material. Whether or not a material is polar is determined solely by its crystal structure. Only 10 of the 32 point groups are polar. All polar crystals are pyroelectric, so the 10 polar crystal classes may also be referred to as the pyroelectric classes.

Using popular crystallographic notation, the Piezoelectric Crystal Classes are: 1, 2, m, 222, mm2, 4, −4, 422, 4 mm, −42 m, 3, 32, 3 m, 6, −6, 622, 6 mm, −62 m, 23, −43 m; and the Pyroelectric crystal Classes: 1, 2, m, mm2, 4, 4 mm, 3, 3 m, 6, 6 mm.

The observable property of pyroelectricity is generally measured by the change in net polarization proportional to a change in temperature. The total pyroelectric coefficient measured at constant stress is the sum of the pyroelectric coefficients at constant strain and lo the piezoelectric contribution from thermal expansion (i.e. a secondary pyroelectric effect). As a consequence there are no electric dipole equivalents of bar magnets because the intrinsic dipole moment is neutralized by free electric charge that builds up on the surface by internal conduction or from the ambient atmosphere or surrounding interfaces. Polar crystals only reveal their nature when perturbed in some fashion that momentarily upsets the balance with the compensating surface charge. Piezoelectricity is the ability of certain crystalline materials to develop an electrical charge proportional to a mechanical stress. Piezoelectric materials also show a converse effect, where a geometric strain (deformation) is produced on the application of a voltage. The direct and converse piezoelectric effects can be expressed in tensor notation as, $P_i=d_{ijk}s_{jk}$ (direct) and $e_{ij}=d_{kij}E_k$ (inverse), where $P_i$ is the polarization generated along the i-axis in response to the applied stress $s_{jk}$, and $d_{kij}$ is the piezoelectric coefficient. For the converse effect, $e_{ij}$ is the strain generated in a particular orientation of the crystal on the application of electric field $E_i$ along the i-axis. Out of the 20 point groups which show the piezoelectric effect, ten point groups (including 1, 2, m, mm2, 4, 4 mm, 3, 3 m, 6, and 6 mm) have only one unique direction axis. Such crystals are called polar crystals as they show spontaneous polarization.

Prior art has demonstrated artificial thin film pyroelectric materials in diverse forms, such as, gallium nitride (GaN), zinc-oxide (ZnO), cesium nitrate ($CsNO_3$), polyvinyl fluorides, and cobalt phthalocyanine are possible. Of particular noteworthiness, is lithium tantalate ($LiTaO_3$), a crystal that exhibits both piezoelectric and pyroelectric properties.

The present invention discloses that rare-earth oxides, nitrides and phosphides and ternary or higher alloys with Si and Ge can be engineered to exhibit polar crystal structures and piezoelectric and pyroelectric properties wherein compositions of the form $[RE1]_x[RE2]_y[RE3]_z[Bi]_m[Si]_n[Ge]_o[O]_u[N]_v[P]_w[Cu]_s$ and where at least x and at least one of u, v, or w are greater than 0 and $0 \leq y, z, m, n, o, u, v, w, s \leq 5$. RE is chosen from at least one of the rare earth or lanthanide series La, ..., Lu, and we include yttrium, Y as well. As used herein the lanthanide series consists of $\{^{57}La, ^{58}Ce, ^{59}Pr, ^{60}Nd, ^{61}Pm, ^{62}Sm, ^{63}Eu, ^{64}Gd, ^{65}Tb, ^{66}Dy, ^{67}Ho, ^{68}Er, ^{69}Tm, ^{70}Yb$ and $^{71}Lu\}$ and yttrium $^{39}y$ is included.

Perovskite crystals of the chemical formula $ABO_3$ are typically useful as piezoelectric materials. Of particular interest in the present invention is the use of $ABO_3$ materials comprising titanium (Ti) for [B], for example, of rare-earth-titanates (e.g. $CeTiO_3, YbTiO_3$ and/or $BaTiO_3$ and/or $SrTiO_3$. Furthermore, also of particular interest in the present invention is the use of $ABO_3$ materials comprising B=tantalum (Ta), for example, rare-earth-tantalum oxides (e.g., $CeTaO_3, YbTaO_3$) and/or $BaTaO_3$ and/or $LiTaO_3$, and the like. These polar crystals exhibit spontaneous polarization parallel to polar axis. The present invention claims the use of new materials rare-earth-titanium-oxide ($RETiO_3$) and rare-earth-tantalum-oxide ($RETaO_3$). It is known, $BaTiO_3$ can exhibit a cubic phase and a tetragonal phase. The tetragonal phase lacks a center of inversion and the cubic phase has an inversion center around the Ti atom and is therefore inhibited from spontaneous polarization. Therefore, only with the occurrence of a tetragonal deformation are the positive charge A & B atoms displaced from the oxygen ions. The present invention takes this concept further and discloses a method to tailor the piezoelectric and/or pyroelectric properties via the use of tetragonally deformed, strained layer heterostructures. For example, Si-ErOx-Si strained multilayers exhibit tetragonal distortion and have a preferred axis for polarization along and perpendicular to the growth axis. Therefore, the present invention claims use of strained layer oxide and semiconductor in the form of superlattice and/or multilayer materials to tailor the piezoelectric and/or pyroelectric properties via superstructure symmetry control.

The present invention also teaches the advantageous use of nitrogen and/or phosphorus in the said oxide classes and is therefore also covered by the present invention. The gallium-nitride GaN hexagonal wurtzite crystal structure also has tendency toward piezoelectric function. It is noted by the present inventor that substantially hexagonal crystal and/or 6-fold symmetry structure is possible in REOx using Si(111) oriented epitaxy. Therefore, piezoelectric functions in REOx can be exploited fully in the present invention.

The present invention, therefore, claims the use of general piezoelectric and/or pyroelectric materials for use in thermo-electric devices as described herein.

Spontaneous polarization is understood as the value of the charge per unit area on the surface perpendicular to the axis of spontaneous polarization. The axis of spontaneous polarization is usually along a given crystal axis. Although a crystal with polar axes exhibit the piezoelectric effect, it does not necessarily have a spontaneous polarization vector. Generally, only crystals with a unique polar axis (10 out of the 21 non-centrosymmetric point groups) show a spontaneous polarization vector PS along this axis. The value of the spontaneous polarization depends on the temperature. This is called the pyroelectric effect, described in terms of the pyroelectric coefficient p. A small change in the temperature $\Delta T$, induces a change in the spontaneous polarization vector $\Delta P_s$ given by, $\Delta P_s = p\Delta T$. Note, $BaTiO_3$ has a negative pyroelectric coefficient. If the magnitude and direction of $P_s$ can be reversed by an external electric field, then such crystals are said to show ferroelectric behavior. Hence, all single crystals and successfully poled ceramics which show ferroelectric behavior are pyroelectric, but not vice versa. Ferroelectric crystals possess regions with uniform polarization called ferroelectric domains. Within a domain, all the electric dipoles are aligned in the same direction. A single domain can be obtained by domain wall motion made possible by the application of an appropriate electric field. A very strong field could lead to the reversal of the polarization in the domain. Ferroelectric material examples are $BaTiO_3$, $PbTiO_3$, and lead zirconate titanate (PZT).

The main difference between pyroelectric and ferroelectric materials is the direction of the spontaneous polarization in ferroelectrics can be switched by an applied electric field. The polarization reversal can be observed by measuring the ferroelectric hysteresis. Typically, ferroelectric materials have an intrinsic transition temperature called the Curie point, $T_c$.

For temperatures $T>T_c$ the crystal does not exhibit ferroelectricity, while for $T<T_c$ it is ferroelectric. Ferroelectric oxide crystals typically contain corner sharing octahedra of $O^{2-}$ ions. The formation of dipoles by the displacement of ions will not lead to spontaneous polarization if a compensation pattern of dipoles are formed which give zero net dipole moment. Corner sharing oxygen octahedral include perovskite type compounds, bismuth oxide layer structured compounds, and lithium niobate and tantalate. Perovskite group of materials have a structure of the type $ABO_3$. PLZT is a transparent ferroelectric ceramic formed by doping $La^{3+}$ ions in lead zirconate titanate (PZT). The PLZT ceramics have the same perovskite structure as $BaTiO_3$ and PZT. The general formula for PLZT is given by $(Pb_{1-x}La_x)(Zr_{1-y}Ti_y)_{1-x/4}O_3V^B_{0.25x}O_3$ and $(Pb_{1-x}La_x)_{1-0.5x}(Zr_{1-y}Ti_y)V^A_{0.5x}O_3$. The first formula assumes that $La^{3+}$ ions go to the A site and vacancies ($V^B$) are created on the B site to maintain charge balance. The second formula assumes that vacancies are created on the A site. The actual structure may be due to the combination of A and B site vacancies. Note, the vacancy, V, contribution is specifically called out; this is done to emphasize the critical role a vacancy, the relative concentration thereof, plays in the novel "composition-of-matter" in achieving desired material properties. Interstitials, $I^A$ and $I^B$ are also critical in some embodiments of the instant invention.

In some embodiments comprising Rare-earth Oxides, the density of rare-earth atoms and or oxygen atoms in single crystal and or polycrystal and or amorphous rare-earth oxide (REOx) is from about $\sim 10^{21}$ to $10^{23}$ cm$^{-3}$. In some embodiments comprising oxygen vacancies, the density of oxygen vacancies is from about $\sim 10^{15}$ to $10^{22}$ cm$^{-3}$; and more preferable in single crystal material $\sim 10^{15}$ to $10^{21}$ cm$^{-3}$. In some embodiments comprising oxygen interstitials, the density of oxygen interstitials is from about $\sim 10^{15}$ to $10^{22}$ cm$^{-3}$; and more preferable in single crystal material $\sim 10^{15}$ to $10^{21}$ cm$^{-3}$. Note, oxygen vacancies or interstitials may also comprise nitrogen or phosphorus or combinations thereof as well as molecular species thereof. Furthermore, oxide crystal defects such as vacancies and or interstitials may also comprise other types of atoms so as to affect advantageously the electrical conductivity, thermal conductivity, thermoelectric Seebeck co-efficient, conductivity type. The use of vacancy and interstitial engineering of rare-earth oxide, nitrides and phosphides is therefore claimed as means to affect the structural and or electrical, and or magnetic and or optical and or thermal properties of the material.

An aspect of the present invention is the use of a-type and/or b-type and/or c-type rare-oxide bixbyite structures. In some embodiments the c-type rare-earth oxides are composed of rare-earth atoms chosen from the heavy rare-earths, for example chosen from at least one of Ho, Er, Tm, Yb and Lu; optionally other rare-earths are used. The bixbyite crystal structure is based upon a defective fluorite type crystal, of the form of $(Fe,Mn)_2O_3$-type structure with crystallographic space group #206 (Tetrahedral group Th7 or Ia3)

Thermoelectric Rare Earth-oxides, -nitrides, & -phosphides & Ternary Alloys with Si & Ge Rare-Earth Oxide, Nitride & Phosphide Thermoelectric Materials The thermoelectric properties of metallic compounds which contain rare-earth atoms in prior art are cerium-palladium $CePd_3$ (ZT~0.4) and ytterbium-aluminum $YbAl_3$. These RE-metal materials have generally inferior values of ZT compared to that attained by $Bi_2Te_3$. Rare-earth metallic materials deleteriously exhibit large thermal conductivity due to efficient thermal conduction by electrons.

The present invention utilizes the potentially large Seebeck coefficient of RE-compounds by utilizing a resonance in the density of states of the 4f-shell conduction electrons at energies very near to the chemical potential. RE metals are defined by the unique 4f-shell configurations and a magnetic moment due to the partially occupied f-shell. Conduction electrons scattering from the RE ion flip both their spins and the moment of the f-electrons. Spin-flip scattering induces an energy resonance near to the chemical potential. The conduction electrons interacting with the spin fluctuations increase the effective Seebeck coefficient. The stability of rare-earth ions is governed by the tendency to form specific valence states and the temperature stability of the respective compound crystal structure. The ground state degeneracy of a rare-earth ions is given according to Hund's rule, which is well known. Mixed valence occurs when the number of f-electrons can fluctuate and is in principle the origin for the spin fluctuations. The largest Seebeck value is potentially for the half-filled 4f-shell configuration, suggesting Ce, Pr and Yb will potentially have the largest values among all of the rare-earth compounds having this effect.

The present invention solves the long standing deficiency in prior art rare-earth metallic thermoelectric materials by utilizing rare-earth metals in compounds with oxygen to form rare-earth oxides (RE-Ox). Unlike prior art thermoelectric materials the rare-earth oxides exhibit wide band gap Eg~6 eV, large phonon energy, low thermal conductivity and large dielectric constant. The structural stability of RE-Ox covers all the requirements of low and high temperature operation for thermoelectric conversion applications. Most important is the discovery in the present invention that RE-Ox can be artificially grown as substantially single crystal oxides. Furthermore, these single crystal RE-Oxides can be practically and cost effectively deposited epitaxially on single crystal substrates. RE-Ox can be deposited in a multilayer fashion with other semiconductors (e.g.; Si and Ge) and semimetals (e.g.; RE-P, RE-N and BiSb) as substantially single crystal multiple layers.

Yet another aspect of the present invention is the deposition of RE-Oxides layers as part of a multilayer and/or bulk form with copper, Cu, and bismuth, Bi.

The present invention further solves the long standing deficiency in prior art rare-earth metallic thermoelectric materials by utilizing rare-earth metals in compounds with nitrogen to form semi-metallic rare-earth nitrides (RE-N). Semi-metallic RE-N have band gaps Eg≦0.6 eV, low thermal conductivity and large dielectric constant. The structural stability of the RE-N covers all the requirements of low and high temperature operation for thermoelectric conversion applications. Most important is the discovery in the present invention that RE-N can be artificially grown as substantially single crystal nitrides. Furthermore, these single crystal RE-N can be practically and cost effectively deposited epitaxially on single crystal substrates. The RE-N can be deposited in a multilayer fashion with other semiconductors (e.g.; Si and Ge) and semi-metals (e.g. RE-P and BiSb) and insulators (e.g.; $REO_x$, $Si_3N_4$, $SiO_2$) as substantially single crystal multilayers.

Yet another aspect of the present invention is the deposition of RE-N layers as part of a multilayer and/or bulk form with copper, Cu, and bismuth, Bi.

The present invention further solves the long standing deficiency in prior art rare-earth metallic thermoelectric materials by utilizing rare-earth metals in compounds with phosphorus to form semi-metallic rare-earth phosphides (RE-P). Semi-metallic RE-P have band gaps Eg≦0.6 eV, low thermal conductivity and large dielectric constant. The structural stability of the RE-P covers all the requirements of low and high temperature operation for thermoelectric conversion applications. Most important is the discovery in the present invention that RE-P can be artificially grown as substantially single crystal phosphides. Furthermore, these single crystal RE-P can be practically and effectively deposited epitaxially on single crystal substrates. The RE-P can be deposited in a multilayer fashion with other semiconductors (e.g.; Si and Ge) and semimetals (e.g.; RE-N and BiSb) and insulators (e.g.; RE-Ox, $Si_3N_4$, $SiO_2$) as substantially single crystal multilayers.

Yet another aspect of the present invention is the deposition of RE-N layers as part of a multilayer and/or bulk form with copper, Cu, and bismuth, Bi.

Yet another aspect of the present invention is the deposition of $RE-O_x$, RE-N and RE-P layers as part of a multilayer and/or bulk form with copper-oxide, $CuO_x$, and bismuth-oxide, $BiO_x$.

Yet a further solution to prior art deficiency is the use of rare-earth silicon and germanium alloys as efficient thermoelectric materials.

Electronic transport characteristics in these magnetic rare-earth metal oxides include high- and low-conductivity, high Seebeck effect, and low thermal conductivity. Among different families of semiconducting and insulating compounds rare-earth metal oxides, nitrides, phosphides and mixtures thereof are preferred in some embodiments of the present invention.

Central to enhancing ZT is the requirement for optimizing the electronic conduction and/or transport properties. Thermoelectric rare-earth oxides have a unique physical chemistry, electronic energy states and relation between the transport properties and the crystal structure, magnetic ordering and non-stoichiometry. Coupling strength of electrons to optical phonons is considerably different in rare-earth metal oxides compared to classic semiconductors, such as Si and GaAs. A basic criteria of thermoelectric materials is for high carrier mobility at high temperature. Semiconductors may exhibit impressive low temperature carrier mobility of the order of $100 \leq \mu \leq 10^4$ cm$^2$/V-sec in the range $100 \leq T \leq 1,000°$ K., but this is rapidly reduced at high temperatures to values of $0.1 \leq \mu \leq 1$ cm$^2$/V-sec. This behavior is determined by the electronic energy states and the dominant scattering mechanisms in different temperature ranges.

Prior art analysis of the properties of rare-earth metal thermoelectric materials at high temperatures is encumbered by the fact that the material compositions were not constant, consisted of unstable light rare-earth ions and were typically amorphous. Rapid ionic diffusion or ionic conductivity at temperatures above 500 to 1200° C. (depending on the compound) are typically observed. The electronic diffusivity and mobility in the oxides is considerably larger than the ions, however, mixed conduction occurs readily. In most semiconducting oxides both the resistivity and the Hall effect increase rapidly with decreasing temperature. In fact, in most cases this characteristic rise is so steep that the material becomes an insulator at temperatures of the order of 100° K. At these temperatures oxides like $CuO_2$ and $CoO_2$ become highly resistive in spite of heavy doping or considerable non-stoichiometry. Oxides can also contain large numbers of donors and acceptors, either shallow or deep within the bandgap. Low carrier mobility in polar semiconductors can be described by the mean free path of the electron (or hole) having the same order as the cell dimension and thus the carrier will not experience the translational symmetry of the lattice. Hence the Bloch function and energy-band concepts are invalid for describing the electronic states in this case. At low temperatures, the charge carrier will tunnel from site to site, which is equivalent to a band description. At higher temperatures the transport is via activated hopping and diffusion mechanism. Due to the high dielectric constant of rare-earth oxides, the electrons are not bound to shallow donors, but move in a conduction band over a very wide temperature range $10^{-2} \leq T \leq 10^{3°}$ K. The dominant scattering mechanism above room temperature is via optical mode scattering.

The present invention overcomes deficiencies of prior art thermoelectric oxides by utilizing (In some embodiments) single epitaxial crystal rare-earth oxides, nitrides and phosphides. These single crystalline materials exhibit unique ferromagnetic and anti-ferromagnetic behavior. Antiferromagnetic oxides can behave as insulators or semiconductors; and can exhibit a transition to the metallic state at the Neel point. Typically rare-earth ions are doped into host materials as impurities either as interstitial or substitional positions. The degeneracy of the isolated rare-earth 4f-shell has a complex energy manifold that is Stark split by the surrounding host crystal field. As discussed above, the prior art rare-earth metal and oxide materials are amorphous and thus exhibit no long range order. The local effects of crystal field are random on a long range and therefore any enhancement in thermoelectronic property is averaged out and can be canceled in prior art amorphous rare-earth metal and oxides.

Conversely, the present invention discloses single crystalline rare-earth oxide with definite crystal structure and long range order. In these rare-earth oxides, the rare-earth metal ion itself forms the crystal structure and in turn generates its own crystal field. Tailor made rare-earth ion 4f-manifold crystal field splittings are further possible using superlattices and/or multilayer structures wherein the rare-earth ion experiences a spatially dependent yet periodic crystal field due to the single crystal structure.

The present invention discloses single crystal rare-earth oxide, nitride and phosphide and ternary alloys with silicon and/or germanium.

Conduction in magnetic rare-earth oxides, nitrides and phoshides occurs via semimetal, semiconductor and insulator behavior. Europium and ytterbium form monoxides of the form $Eu_1O_1$ and $Yb_1O_1$. In rare-earth oxide crystals the metal-semiconductor transition can occur by the generation of an energy gap at the Fermi level, $E_F$. Above the critical temperature, 4f and 5d bands overlap and are half-filled, that is become metallic. Below the critical temperature a pairing of the rare-earth ions can take place and the size of the Brilloumn zone is thus halved and the energy band is split in two with a small energy gap in between. One assumes that the lower band is entirely filled and the higher one empty, producing a semiconductor. Band doubling takes place in antiferromagnetic materials (e.g., YbO). Doubling of the energy bands will cause no important change in the distribution of electrons and the conductivity is typically minimally affected.

Single crystal and single phase rare-earth oxides can be realized with high structural perfection using prior art methods, for example, U.S. pat. appl. "Rare-earth oxides, rare-earth nitrides, and rare-earth phosphides and ternary alloys with Silicon".

Binary rare-earth oxides with the pyrochlore and bixbyite crystal structures are vacancy-ordered derivatives of the fluorite structure and exhibit lattice parameters approximately twice that of Si. Therefore, a close lattice match with Si and other elemental and/or compound semiconductors can be achieved by alloying various rare-earth metal oxides. Extended defects, such as planar faults can be engineered in the oxide/Si heterostructure for thermoelectric devices. Defects, such as misfit dislocations, at the Si/oxide dielectric interface influence the mobility of charge carriers in the underlying semiconductor layer. Extended defects in bixbyite/Si epitaxy such as ErOx films grown on Si(111) and Si(001) may also be used advantageously in the present invention for electrical conductivity optimization. Rare-earth oxides typically exhibit the cubic bixbyite structure with point group 4m-32/m and space group Ia3$^-$d. REOx in bixbyite form has a lattice mismatch with Si, in particular, given by defined as $\Delta a/a=[2a(Si)-a(ErO_x)]/(aErO_x)$, is less than or equal to 10%, where $a(Si)=5.431$ Angstroms and $a(REOx)$ ranging from 10.2 to 11.2 Angstroms depending upon the rare-earth atom used. RE-oxides also exhibit relatively high dielectric constant $\in=10-25$ and have a large bandgap $Eg\sim6$ eV. The thermodynamic stability of REOx in contact with Si is shown by the present invention to be suitable for high temperature thermoelectric devices. Despite the large lattice mismatch, x-ray and electron diffraction show single-variant, epitaxial growth with a cube-on-cube orientation relationship. Cross-sectional high resolution transmission electron microscopy (HRTEM), demonstrates the present invention exhibit single crystal and single phase epitaxial structure and the ErOx/Si(111) interface is atomically abrupt, free of reaction phases. Furthermore, single crystal silicon epilayers upon the said single crystal oxide can be grown epitaxially. Multilayer repetitions of the Si/ErOx bi-layers can also be constructed. The REOx bixbyite structure can be described as a vacancy ordered fluorite with two oxygen vacancies per fluorite unit cell, causing the bixbyite unit cell parameter to be twice that of fluorite in all three dimensions. Epitaxial growth of REOx on a Si surface begins by mono-atomic islands of a bixbyite oxide which nucleate laterally and grow in a substantially layer-by-layer growth mode. The germane islands inherently do not have unique or energetically preferred arrangement of these ordered oxygen vacancies relative to the Si surface. As the 2-D islands coalese, antiphase domains (APBs) may form between islands and oxygen vacancy sublattices within the domains may be shifted relative to each other. APBs represent a defective area of the film, and dislocations may reduce their strain energy if located in these junctions.

In summary, the present invention demonstrats that multilayer thermoelectric materials based upon single crystal REOx and Si can be grown epitaxially on Si substrates with the same epitaxial orientation between the Si epilayer and the substrate even though separated by a bixbyite rare-earth oxide of different crystal structure.

Atomic and molecular interstitial defects and oxygen vacancies in single crystal rare-earth oxide $(REO_x)$ can also be advantageously engineered via non-stoichiometric growth conditions. The atomic structure of singly and doubly positively charged oxygen vacancies $(O_v^+, O_v^{2+})$, and singly and doubly negatively charged interstitial oxygen atoms $(O_i^-, O_i^{2-})$ and molecules $(O_{2i}^-, O_{2i}^{2-})$ can be engineered in defective single crystals of $REO_{x=1.5\pm y}, 0\leq y\leq 1$). Singly and doubly negatively charged oxygen vacancies $(O_v^-, O_v^{2-})$ are also possible. Rare-earth metal ion vacancies and substitutional species may also occur and an oxygen vacancy paired with substitutional rare-earth atom may also occur. However, atomic oxygen incorporation is generally energetically favored over molecular incorporation, with charged defect species being more stable than neutral species when electrons are available from the rare-earth conduction band.

The present invention discloses that single crystal rare-earth oxide can be epitaxially deposited on single crystal silicon substrates and furthermore single crystal silicon can be disposed upon the said oxide layer. Such structures form the basis of a one period multilayer silicon-rare-earth-oxide silicon structure. Multiple periods of arbitrary thickness silicon and oxide layers are possible. The thermoelectric silicon-rare-earth oxide structure is advantageous for high efficiency thermoelectric application. Single crystal silicon has a high Seebeck co-efficient, narrow band gap $E_g=1.1$ eV, high electrical conductivity, high melting point $(T_m(Si)\sim1420C)$ but exhibits the highest thermal conductivity of conventional semiconductors $(\kappa_{th}\sim140$ W/mK). The high $\kappa_{th}(Si)$ disadvantageously impacts ZT. Rare-earth oxide exhibits very low thermal conductivity, high dielectric constant and possess a wide band gap $Eg\sim6$ eV. Furthermore, the structure of rare-earth oxides can be engineered to exhibit insulating (low leakage) and/or ionic conduction (high conduction) properties. The energy positions of the aforementioned defect levels with respect to the bottom of the silicon conduction band demonstrate that interstitial oxygen atoms and molecules and positively charged oxygen vacancies can trap electrons from silicon.

In particular, the heavy rare-earth oxides, (RE=Er, Tm, Yb) are hard materials and exhibit stable crystal phases with temperature in the range $200\leq T\leq 1800K$. FIG. 70 shows comparison of rare-earth oxide phases and/or polymorphs (cubic, monoclinic, tetragonal and hexagonal) as a function of temperature. The high thermal stability of heavy rare-earth oxide materials is disclosed as highly advantageous for thermoelectric energy generation using high temperature heat sources. Conversely, all the lighter rare-earth metal materials exhibit stable phases for low temperature cooling applications.

Structure and properties of point defects in rare-earth oxides can be used advantageously to determine the electrical properties of the rare-earth oxide. To the inventor's knowledge the aforementioned technology is absent in prior art and is claimed in the present invention in its entirety.

The present invention discloses that rare-earth atoms and oxygen can be combined on the surface of a crystalline, polycrystalline and/or amorphous substrate at substrate temperatures of $200\leq T_g\leq 1800°$ C. forming single crystalline, polycrystalline and/or amorphous rare-earth oxides. At least one species of rare-earth atom can be used and multiple rare-earth atoms can be co-deposited so as to form a mixed composition rare-earth oxide thermoelectric material. The dissimilar rare-earth atoms allow for the introduction of specific electronic and structural properties, such as high conduction.

The electronic performance of rare-earth oxide films is affected by various lattice defects as described above. In particular, film annealing involves oxygen diffusion through the already grown oxide and the formation of interstitial oxygen occurs. Oxygen incorporates from the surface and diffuses inside the oxide in substantially atomic form. Oxygen stoichiometry and formation of oxygen vacancies can be engineered via oxygen-rich and/or oxygen-deficient conditions relative to the rare-earth element concentration impinging upon the growth film. Oxygen and rare-earth stoichiometry can also be affected by co-deposition of competing species such as nitrogen and/or phosphorus and/or silicon and/or germanium. The present invention discloses that oxide and/or compound layer(s) can be as-grown with considerable non-stoichiometry which can be corrected by high-temperature annealing in various ambient. This technique is advantageous for formation of multilayer structure and followed by post growth activation of thermoelectric property. Typically, the concentration oxygen vacancies can be controlled and the formation of intermixing interfacial regions, particularly at the oxide-silicon interface is known to occur. This effect can be used advantageously to introduce thin insulating interfacial regions such as silicon-oxides. Such interfacial regions will form electronic potential energy barriers and may be controlled to impede current flow perpendicular to plane of the layers via thick silicon-oxide, and/or allow quantum mechanical tunneling via thin interfacial oxide. The problem of thermionic efficiency reduction due to electron and hole trapping by interstitial oxygen and oxygen vacancies affects current transport through the oxide and/or multilayer stack. The trapping efficiency of vacancies and interstitials can form charged defects thereby generating strong local electric fields. Diffusion in the said electric field is equivalent to electrolysis of ions and is therefore an import component in determining overall thermionic device efficiency.

The structure and electronic properties of the three major stable phases of crystalline rare-earth oxides, and of oxygen vacancy and interstitial defects in single crystal rare-earth oxide are used advantageously in the present invention for the intentional formation of high efficiency and high operating temperature thermoelectric devices.

Furthermore, neutral oxygen vacancies and interstitial oxygen atoms and molecules in the oxide bulk can be changed by electron transfer from/to the silicon substrate.

The electron density of states (DOS) for ideal single crystal rare-earth oxide for the cubic phase is very similar to the DOS for the monoclinic and tetragonal phases. The present invention notes that substantial increases in DOS occurs for charge carrier confinement structures using defect engineered structures via impurity doping for carrier type modification, vacancy, interstitial, substitutional, trap and heterostructures described explicitly or anticipated herein.

Incorporation of oxygen species in REOx as defect species can be charged by electrons or holes tunneling from adjacent layers, for example Si. The incorporation energy of atomic oxygen into the oxide lattice can be achieved using various gas oxygen species during and post-growth of the said oxide including but not limited to neutral molecular and/or metastable molecular oxygen, neutral and/or charge atomic oxygen and/or ozone. Molecular oxygen species may incorporate into the oxide lattice from the gas phase or form due to the interaction of atomic oxygen species already existing inside the lattice. The incorporation of the neutral molecule produces several defect states due to the covalent bonds between the oxygen atoms within the molecule and the lattice oxygen. Vacancies can be generated in REOx films and bulk due to growth, deposition, and doping processes. Besides thermal processes and doping, they can be generated in thin films by electron and hole trapping. Once generated, they can take part in other electronic processes and serve as electron traps.

There are two main types of oxygen vacancies in REOx structure threefold- and fourfold-coordinated vacancies. The lattice relaxation around them involves small displacements of the nearest-neighbor rare-earth ions and is a source of the piezoelectric nature of the material. Neutral RE vacancy results in the formation of RE clusters in the bulk or at the surface of the uncompensated oxide. The presence of the RE vacancy generally does not introduce any defect levels within the otherwise perfect crystal rare-earth oxide gap. Substitution of one of the RE atoms by another type of RE atom in small concentrations creates a substitutional defect. For example, doping of light rare-earth atoms into the otherwise bulk heavy rare-earth oxide lattice produces a relaxation of the oxygen atoms, owing to the larger radius of the lighter rare-earth atom (i.e., lanthanide contraction). Substitutional Ge defects in $REO_x$ and $Ge_y(REO_x)_{1-y}$ alloys can also be produced to engineer the electronic and thermal properties of the thermoelectric material. Similarly, Si may be used.

Atomic and molecular oxygen species in REOx generally prefer to stay diamagnetic in preference to paramagnetic configurations. Molecular species also demonstrate a tendency for charge transfer between the vacancies and interstitial molecules. Intuitively, doubly charged molecule and vacancy pairs are expected to be lower in energy than a neutral pair. The type of crystal defect, species and the charge state are used advantageously to enhance thermoelectric properties of rare-earth oxides, nitrides and phosphides.

Independent defects may also combine to form a different defect, wherein the energy of the perfect lattice is altered. For example, energetically favorable oxygen molecules may separate into two interstitial atoms. Conversely, two singly ionized and/or charged interstitial oxygen ions may also recombine to form a doubly ionized and/or charged interstitial molecule. Furthermore, combinations of molecule and vacancy defect pairs may also substantially annihilate thereby resulting in the end product of neutral interstitial oxygen. Large electron affinities for the species considered generally result in interstitial oxygen species and charged vacancies behaving as energy traps for electrons from the REOx conduction band. Note, thin rare-earth oxide films of the order of 10-100 Angstroms allow quantum mechanical tunneling processes to occur.

Band gap engineered multilayer thermoelectric materials are also possible and indeed implemented herein, using single crystal erbium oxide and silicon heterojunctions. The valence band offset at the interface oxide-semiconductor interface is in excess of 2.2 eV. Compared to the band gap of Si~1.1 eV, this is an extremely large potential energy barrier and typically is reflected in the conduction band resulting in a Type-I heterojunction. Oxygen vacancy and interstitial defects in REOx can be used to engineer the conductivity and can also trap electrons and holes from the conduction and valence bands. In particular, oxygen vacancies in these materials have the structure and properties similar to those of F centers in cubic oxides. Incorporation of atomic oxygen species is more favorable than molecular ones. In analogy with silica, charged atomic and molecular oxygen species tend to be more stable than neutral species when electrons are available from the bottom of the conduction band of REOx.

Charge transfer from adjacent NBG semiconductor layer, (e.g., silicon) into interstitial oxygen atoms generally creates charged oxygen ions. These charged oxygen ions become attracted to or repelled from the oxide-semiconductor interface via image charge interaction. The higher dielectric constant oxide will therefore directly influence this process. This may affect diffusion of charged species and thus the kinetics of thermoelectric processes. The existence of charged defects also creates large internal electric fields, that shift band offsets, and produce drift components to the charge carriers. The specific mechanism(s) of diffusion of charged and neutral oxygen species in REOx is not completely understood, however the process can be exploited herein for the production of efficient thermoelectric materials in bulk and/or multilayer form for the present invention.

The present invention discloses the specific use of nitrogen and/or phosphorus for creation for modifying of the electronic and thermal properties of REOx material. The present invention also covers the converse use of oxygen introduction into an otherwise bulk rare-earth phosphide and/or rare-earth nitride thermoelectric material.

Nitrogen-containing defects can be formed during growth of rare-earth-oxide using nitrogen and nitrogen containing precursors (e.g., $N_2$, atomic N, $NH_3$, NO, and $N_2O$). The role of such defects using nitrogen in oxides leads to an effective immobilization of native defects such as oxygen vacancies and interstitial oxygen ions and significantly reduce the fixed charge in the dielectric. Non-stoichiometric REOx films can be engineered to contain oxygen interstitials, (e.g., using oxygen excess and/or activated oxygen $O_2^*$, $O^*$) and/or oxygen vacancies (e.g., using oxygen deficient environment).

Nitrogenous species can diffuse into the bulk rare-earth oxide and can (i) incorporate in lattice interstitials; (ii) replace lattice oxygen ions; (iii) dissociate into other species both in interstitial and in regular lattice sites; and (iv) react with existing oxygen vacancies and interstitial oxygen species. The nitrogen defects are substantially neutral or form fixed charges or generate charge trap centers. Electrically active defects in the oxide layer are classified by the position of their levels with respect to the silicon band edges. Defects whose levels are resonant with the Si conduction band are typically effective as traps. Under zero electric field and in the thermodynamic equilibrium, these levels are empty. However, such states are available for resonant tunneling at nonzero gate voltage, and thus may serve as electron traps. Defects whose levels fall into the silicon band gap. The electron occupancy of such defects depends on the position of the Fermi level. These deep defects are responsible for the Fermi-level pinning. Also they may contribute into the threshold potential instability and, to some extent, to a fixed charge problem, since the charge relaxation time on such defects may be macroscopically slow. Defect states resonant with the silicon valence band are expected to be occupied, and, depending on their charge with respect to the lattice, they may become a major source of the fixed charge. The desired effect of the resultant nitrogen doped: rare-earth-oxide and/or rare-earth oxynitride is primarily on the bulk charge trap density and on the mobility of oxygen via the vacancy or interstitial mechanisms.

Vacancy and interstitial interactions involving atomic nitrogen may accept the charge states +2, +1, 0, and −1, the anion vacancy +2, +1, and 0, and the atomic nitrogen substitution +1, 0, and −1. The nitrogen and/or phosphorus interstitial is substantially more electronegative than the vacancy, so the relevant reactions involve nitrogen in a charge state not more positive than that of the vacancy. Both the nitrogen and/or phosphorus atom and molecule incorporated in an oxygen site can exist in the negative charge state. This is advantageous for conductivity type production in the present invention using rare-earth oxide thermoelectric material. This allows the oxygen vacancy to accommodate up to three electrons. These negatively charged centers are possible due to the large electron affinity of nitrogen and/or phosphorus species. Interstitial nitrogen species can also behave as deep electron traps and be responsible for the negative oxide charging for pyroelectric application.

Use of nitrogen and oxygen precursors during growth of thin film REOx, using for example but not limited to, NO and $N_2O$ molecules, can interact with anion vacancies by incorporating with their oxygen end into the vacancy. The structure of the resulting defects is equivalent to that of atomic and molecular nitrogen interstitials. Stable nitrogen-contained byproducts as well as intrinsic defects introduce the option of introducing multiple charge states depending on the availability of the electrons in the system.

The process of vacancy passivation by molecular nitrogen is also possible. Atomic nitrogen is highly reactive and mobile once trapped in the oxide structure resulting in the more effective passivation of oxygen vacancies. The REOx materials generate positive fixed charge via protons and anion vacancies and can be effectively reduced by introduction of atomic nitrogen and/or molecular nitrogen RE-oxynitride and/or RE-oxyphosphide (RE-phosphate) have certain advantages over RE-oxide as a thermoelectric material due to the multiplicity of the NO and/or PO oxidation states.

Thermoelectronic Generators

Novel configuration of thermoelectronic materials into scaleable high-efficiency electronic devices is disclosed. Prior art electronic devices can be described as limited to small thermal contact area, bulk semiconductors. Individual positive (p-type) and negative (n-type) semiconductor volumes are structured in a pillar or columnar arrangement. To the best of the present inventor's knowledge, no attempt has been made in prior art to advance electronic device configurations beyond the aforementioned approach. Therefore, there is a need to advance the device architecture of thermoelectric generators so that the intrinsic properties of thermoelectronic materials can be exploited in dimensionally higher efficiency electronic device architectures. For example, the present invention discloses a planar device geometry based upon lateral bipolar thermoelectric (LBT) effect and thermoelectric field effect (TFE). These planar geometries generally allow planar fabrication technologies and therefore allow economies of scale and large-scale area operation. The concept is most easily understood by considering a volume V configured in a manner so as to dispose a thin film thermoelectric layer or multilayers upon a substrate and/or thermal contact region and the electrical contacts primarily disposed in a planar manner substantially on a surface.

Thermal Carrier Generation

Consider an uniaxial temperature gradient applied to a semiconductor in addition to an applied electric filed, the total 1-dimensional current density is given by: $J = \rho[q^{-1}(\partial E_F/\partial x) - S(\partial T/\partial x)]$, where x is the position along the semiconductor, $E_F$ the Fermi energy, and S the differential thermoelectric power. For a non-degenerate semiconductor with mean free time between collisions $\tau \sim E^{-\beta}$, the thermoelectric power can be calculated as:

$$S = -k_B q^{-1} \{[5/2 - \beta + \ln(N_C/n)] n \mu_n - [5/2 - \beta - \ln(N_V/p)] p \mu_p\}/(n \mu_n + p \mu_p) \quad (2)$$

where q is the electron charge, $N_C$ and $N_v$ are the density of states in the conduction and valence bands, respectively. Thermoelectric power for n-type (p-type) semiconductors. For example, for p-type Si, typical values are S=1 mV/K for r=0.1Ω-cm and S=1.7 mV/K for r=100Ω-cm. Clearly, increasing the density of states in the thermoelectric material will have a significant impact on increasing S. Carrier confinement structures through the use of electronic potential manipulation as shown in FIGS. 20-23, 26, 27, 29, 32-39, 42, 66-68, 89, 92, 94, 100, 102-104 allow such a scenario beyond values available in bulk materials. For the case of degenerately doped materials, the impurity atom concentration is typically very high thereby causing significant reduction in carrier mobility due to ionized impurity scatter and structural defect scatter. A method used to circumvent this fundamental dichotomy is the use of 2-dimensional (2D) electron and hole gases via physical separation of the free carrier from the impurity atoms. This is typically accomplished via the use of a not intentional doped (NID) wide band gap and narrow bandgap heterojunctions. The WBG layer is heavily doped with a relatively thin sheet of impurity atoms. The continuity of the Fermi energy causes the free electrons from the WBG layer to spill over into the NID NBG region. If the conduction (valence) band heterojunction offset is such that the WBG material is a potential energy barrier then band edge bending in the immediate vicinity of the heterojunction interface occurs thereby forming a single quantum well (SQW) of width along the growth direction of ~100 Angstroms. The free carriers can therefore spill over into the SQW and form a 2D charge sheet with allowed energy governed by the SQW quantization. This effect allows the free carriers to be spatially separated from the mobility limiting impurity ions. The mobility along the heterojunction interface is now primarily determined by the interface roughness scattering. The caveat for construction of such 2D high mobility devices is that high crystalline perfection is required and thus single crystal NBG materials are required with high interface perfection. Such materials are typically costly to produce using conventional materials and techniques. The present invention overcomes the difficulties in constructing such 2D high mobility devices, and teaches and discloses planar geometry thermoelectric devices which are well suited for use of high mobility layered materials.

In the present invention, the inventor teaches thermal gradients substantially perpendicular to the plane of the interfaces of the multilayered thermoelectric materials. This method allows low thermal conductivity materials to be utilized within the said thermoelectric multilayered materials.

Phonon Scattering & Thermal Conductivity

Thermal conductivity of a non-degenerate bulk semiconductor using a simple model can be expressed as:

$$\kappa_{th} = \kappa_L + q^{-2}k_B^2 \rho T(5/2-\beta) + q^{-2}k_B^2 \rho T(5-2\beta+E_g/k_B T) \frac{np\mu_n\mu_p}{(n\mu_n+p\mu_p)^2} \quad (3)$$

where $\kappa_L$ is the lattice contribution, the second term is the electronic contribution and the third term is related to the mixed conduction. Note, $\tau \sim E^{-\beta}$ has been assumed again. The contribution of thermal conduction due to carriers is generally small relative to the magnitude of $\kappa_L$. For the case of $E_g \gg k_B T$, mixed conduction can be large and play an important role on $\kappa_{th}$. Generally, most semiconductors and semimetals exhibit a thermal conductivity behavior increasing in magnitude from low temperatures, peaking at a singular maximum, typically in the vicinity of $10 < T < 100°$ K., and thereon decreasing rapidly with temperature. The thermal conductivity including various scattering processes is shown in FIGS. 8 & 14. The lattice contribution is therefore an important component and limiting value for typical materials.

There is a need to improve upon the thermal conductivity of prior art thermoelectric materials.

The present invention discloses the use of multilayered dissimilar materials for use as phonon scrambler action so as to drastically reduce $\kappa_L$. Prior art techniques have demonstrated that single crystalline and polycrystalline thermoelectric materials are preferred compared to amorphous materials. Single crystal materials typically have superior electronic transport properties but suffer increased thermal conductivity. Polycrystalline materials typically exhibit reduced electronic transport performance and reduced thermal conductivity, due to boundary scattering. There is therefore a need for substantially single crystal thermoelectric materials with low thermal conductivity.

A phonon scrambler is disclosed using at least two dissimilar crystalline materials exhibiting different crystal structure and/or intrinsic phonon energy. The dissimilar phonon energy materials disposed using substantially 2-D layers forms large impedance for phonons propagating in a direction substantially perpendicular to the plane of the layers and interfaces.

Generally, wide bandgap oxide materials exhibit very large lattice vibration phonon energy. Use of oxide materials and semiconductors as the dissimilar phonon energy materials are disclosed in the present invention to produce phonon scrambler action along the temperature gradient. Depending on the implemented device geometry, namely vertical or planar type, the electronic conduction direction can be utilized advantageously by appropriate design of dissimilar layer thickness. The large discontinuity of phonon energy in the dissimilar materials, for example erbium oxide, (ErO$_x$, x=1.5±y, 0≦y≦1), with E$_g$~6 eV and $\omega_{LO}$~900 cm$^{-1}$, and germanium (Ge) with Eg=0.55 eV and $\omega_{LO}$(Ge)≪$\omega_{LO}$ (ErOx) is reduced to practice for application to thermoelectric conversion devices. Typically, E$_g$ and $\omega_{LO}$ of conventional thermoelectric materials are both relatively small. Simplistically, the Kronig-Penny model of a crystalline semiconductor exhibits a tendency for large lattice constant semiconductor to generate narrow electronic band gap energy.

Furthermore, high selectivity phonon energy and type filters are possible using multilayer structures constructed of substantially multiple or fractional multiples of the phonon wavelength in each materials so as to affect an interference device. Such a method is an efficient means to alter the thermal conductivity in directions substantially perpendicular and parallel to the plane of the layers. This method is most advantageous using substantially single crystal materials and is therefore claimed by the present invention.

Substantially single crystal multilayer structure allows the formation of low dislocation density material with low structure defects. Electronic propagation parallel and perpendicular to the plane of the layers is therefore improved compared to polycrystalline material.

A key feature of the present invention is the utility of multilayer materials engineered to exhibit high mobility substantially in the plane of the layers and exhibiting high thermal impedance perpendicular to plane of the layers. This multilayer structure can be disposed primarily in a planar thermoelectric device wherein the heat gradient is perpendicular to the plane of the layers and the electronic propagation is substantially parallel to the plane of the said layers. Electrical contact can be disposed advantageously on substantially the cold side of the device to contact the and extract charge carriers generated in the plane of the layers.

Thermoelectric Device Topologies

Temperature Dependence

Thermoelectric materials have been incorporated in all prior art devices in essentially vertical pillar configurations. This design requirement is imposed due to the use of carrier diffusion by opposite carrier types, namely p-type (holes) and n-type (electrons) materials. The p-type and n-type materials are not in intimate contact and thus do not form a depletion region as commonly observed in p-n junction devices such as diodes. Instead, the n-type and p-type thermoelectric devices are connected via electrical contacts as described in FIG. 9.

The sign of S is typically the same for both conductivity types of thermoelectric materials and the temperature gradient causes the flow of charge carriers substantially along the length of the columnar pillars. This device topology, yet useful, is limited in application for large area deployment and requires complex manufacturing. Therefore, there is a need to reduce manufacturing cost and improve thermoelectric device topology beyond vertical pillar type. The present invention teaches thermoelectric devices utilizing thermoelectric multilayer materials exhibiting the property of S>0 and S<0. Note, copper is an example of a S<0 material and can be used advantageously in the present invention with oxide materials.

The present invention solves the above mentioned deficiencies of prior art by utilizing multilayer materials disposed in vertical and/or planar configurations relative to the direction of the thermal gradient.

Yet another aspect of the present invention is the use of planar device geometry wherein the electrical contacts to the thermoelectric bulk and/or mutilayered materials is substantially disposed upon a surface. Furthermore, the electrical contacts are disposed upon the cold junction side.

Prior art thermoelectric devices are also generally uniform composition bulk thermoelectric materials. Typically, these thermoelectric bulk materials are semiconductors. The said semiconductors are characterized by an electronic bandgap energy. Unfortunately, the band gap energy is highly temperature dependent, and the bandgap energy typically decreases in magnitude with increasing temperature. Therefore, a severe problem exists in prior art semiconductors applied to thermoelectric application. The thermoelectric effect is reliant primarily on diffusion of charge carriers in a direction parallel to an applied thermal gradient. The thermal gradient also induces a bandgap energy contraction toward the hotter end of the semiconductor slab. Positive Seebeck co-efficient materials are characterized by carriers diffusing away from the hot junction toward the cold junction. Simultaneously, the decrease in $E_g$ at the hot end relative to the cold causes a built in electronic potential energy that inhibits carrier flow due to diffusion process. This severe limitation in prior art device topology therefore suffers reduced thermoelectric conversion efficiency.

The present invention solves this bandgap energy contraction problem in prior art by the utility of variable bandgap semiconductor configured advantageously to counteract the temperature dependence of the semiconductor along a direction of the thermal gradient. The thermoelectric material can be constructed to exhibit a variable bandgap along the length of the slab parallel to the thermal gradient. The slab can be constructed to exhibit a monotonically continuous variation and/or step wise change in band gap energy along a direction of the slab. If the slab is oriented such that the larger energy bandgap end of the slab is position toward the hot junction end and the lower band gap energy composition is positioned toward the cold junction, then the temperature influence on the band gap energy will not impede carrier diffusion due to the spatially varying potential energy. A simple implementation of the variable band gap material described above can be via a compound semiconductor alloy composition such as silicon-germanium ($Si_{1-x}Ge_x$) with variable Ge %. Other compound semiconductors can be used in a similar manner to reduce, cancel or enhance carrier diffusion impediment by temperature dependent bandgap energy.

Yet a further aspect of the present invention is the use of graded band gap materials based on rare-earth oxides, nitrides and phosphides and ternary alloys with silicon and germanium. Either continuous alloys can be constructed or stepwise digital alloys for example ErOx/Si, ErOx/Ge and SiGeEr/Si multilayers can be used.

The limited value of Seebeck co-efficient is typically an intrinsic property of prior art bulk thermoelectric materials. The present invention solves this limitation by the use of bandgap engineering of multilayer materials via the use of spatially dependent doping profiles in a homogeneous band gap energy material and/or the use of dissimilar bandgap materials disposed in a multilayer fashion. Depending on the nature of the heterojunction energy offsets in the conduction and valence bands between the dissimilar bandgap materials, electron and hole charge carriers can be confined spatially in the same or different materials in order to reduce and/or enhance carrier type thermoelectric efficiency. The new thermoelectric bulk and multilayer materials disclosed herein can be used advantageously for the said band gap engineering described above, and is therefore claimed by the present invention.

A new aspect of the present invention is the use of WBG and NBG graded or stepwise bandgap thermoelectric materials. Carriers generated or initially positioned at or close to the hot junction substantially within a WBG region will diffuse and drift toward the cold junction, due to thermoelectric effect and built-in electric potential of graded bandgap. If the carriers propagating toward the cold junction attain sufficient energy due to the increased energy difference relative to the conduction and/or valence band edge, a process known as avalanche multiplication (AM) can occur. The present invention claims a process called herein the thermoelectric avalanche multiplication (TAM) process. This mechanism generates and amplifies carriers in a direction substantially along the thermal gradient. The induced current is therefore amplified beyond those possible in prior art and is therefore a high-efficiency thermal energy to charge carrier number generator. The disclosed graded bandgap material can be implemented for example by the use of ErOx as the WBG material and germanium as the NBG. Alloys compositions of the form $Ge_y(ErOx)_{1-y}$ can be used to advantageously modify the band gap energy of the material.

Prior art thermoelectric devices have been applied generally to cooling application due to the limitation in: (i) operating temperature; (ii) low and fixed values of bandgap energy; and (iii) low melting points of conventional semiconductors. The present invention solves these fundamental limitations by using high temperature materials such as rare-earth oxides and respective compounds disclosed herein.

Planar Topology for Scalable Power Generation

The vertical pillar configuration is limited in two main areas, namely, manufacturability and scalability.

The present invention solves these limitations by utility of device topology generally described as having a thermal gradient substantially perpendicular to the plane of charge carrier extraction. The disclosed devices are well adapted to electrical connections disposed upon a substantially single planar surface, and preferably disposed upon the cold junction side for high temperature thermoelectric power generation.

Conversely, the thermoelectric device can be configured such that the electrical contacts can be disposed primarily on the cold junction side of a thermoelectric cooler and thus make use of superconducting contacts.

All prior art thermoelectric devices are vertical pillar type and are designed to exploit the thermal diffusion of charge carriers in thermoelectric material parallel to a direction substantially along a 1-D thermal gradient.

The present invention improves upon prior art devices and discloses the use of simultaneous charge carrier diffusion and drift processes within the thermoelectric material and/or device so as to increase the thermoelectric current generated by a thermal gradient and input thermal energy.

The introduction of a built-in electric field into the thermoelectric device is claimed in the present invention. A built-in electric field can be introduced through the use of: (i) bandgap engineered material as a function physical position within the said thermoelectric material; (ii) use of at least one period of p-type and n-type modulation doping of homogenous band gap material in a lateral and/or layered fashion; (iii) use of heterojunction materials via use of dissimilar bandgap semiconductors; (iv) use of pyroelectric materials; (v) use of ferroelectric materials; and (vi) use of high dielectric material.

An optional embodiment of advantageous design of thermoelectric material incorporating built-in electric fields for the purpose of guiding charge carriers via diffusion and drift processes in thermoelectric materials is via the use of a substantially piezoelectric thermoelectric material. An example of such a functioning device is disclosed as having the properties (i) piezoelectric active material with preferred crystallographic axes; (ii) spatially confining the said piezoelectric material along an axis parallel to a thermal gradient; and (iii) disposing electrical contact in manner so that the charge carriers can be extracted in a substantially lateral means. FIG. 48-53 describes schematically examples of the said device. The constrained piezoelectric material is allowed to deform in directions substantially perpendicular to the thermal gradient axis. All materials are known to structurally deform with temperature due to either expansion or contraction, resulting in a volume change. For example, if the volume expansion results from temperature increase then the constrained piezoelectric material will generate substantially perpendicular and parallel electric fields within the said material. These internal electric fields can be used advantageously to provide force to the charge carriers to propagate to defined regions of the material and/or device.

Yet another example of built-in electric field is via the use of multiple functional materials chosen from at least two of the group of: (i) thermoelectric; (ii) pyroelectric and (iii) ferroelectric. FIGS. 19-68 describe the functional layer configurations used to provide built-in electric field to enhance the extraction of thermal charge carriers in a substantially lateral topology and substantially perpendicular to an applied thermal gradient. The use of a pyroelectric thermal gate function is in effect to control the number and type of charge carriers in thermoelectric layer(s). This has the advantage of controlling the carrier type in the designated thermoelectric layer(s) via the use of charge inversion and/or accumulation at the pyroelectric-thermoelectric interface. The heat energy input to the thermal gate controls the number of charge carriers available for action in the thermoelectric layer(s). Clearly bulk and/or multilayer and superlattice materiels can be utilized and chosen from the disclosed materials previously described herein.

Another example of high efficiency thermoelectric material is shown in FIGS. 66, 67, 68 & 69, where a narrow band gap, NBG, material is sandwiched between a relatively wide band gap, WBG, material. If the NBG material is chosen such that $E_g \sim k_B T$, then a large probability exists for the thermal generation of carriers. Incorporating this effect in a bipolar laterally doped thermoelectric device is shown in FIGS. 66-69. Consider the application of thermal energy to the central conductivity type region through a thermal gate layer. The heat energy input generates electron-hole pairs efficiently in the said NBG region. Upon advantageous potential energy configuration of the surrounding regions current will flow laterally through the device. The thermally generated current will thus be substantially proportional to the input thermal energy. Yet a further advantage of the device configuration is the electrical contacts can be disposed advantageously without disadvantageous effect on the thermal gate and/or thermal gradient. Clearly, other conductivity type configurations and other bandgap configurations can be used.

Several embodiments are shown in FIG. 68 wherein in one example a silicon-rare-earth phosphide-silicon structure is proposed; alternatively a germanium-rare-earth phosphide-germanium structure is shown; alternatively a silicon-bismuth-silicon structure is utilized; alternatively a rare-earth oxide-rare-earth phosphide-rare-earth oxide structure is shown. In this embodiment a thermoelectric device comprises a narrow band gap material separating two wide band gap material regions wherein the composition of all regions is described by $[RE1]_x[RE2]_y[RE3]_z[Bi]_m[Si]_n[Ge]_o[C]_p[O]_u[N]_v[P]_w$ wherein at least x and at least one of u, v, or w are greater than 0 and $0 \leq y, z, m, n, o, p, u, v, w \leq 5$; alternatively, a materials system is described by $[RE1]_x[RE2]_y[RE3]_z[Bi]_m[Si]_n[Ge]_o[C]_p[O]_u[N]_v[P]_w$ wherein at least n or o is greater than 0 and $0 \leq x, y, z, m, (o \text{ or } n), p, u, v, w \leq 5$.

In one embodiment a thermoelectric device wherein the composition of all regions is described by $[RE1]_x[RE2]_y[RE3]_z[Bi]_m[Si]_n[Ge]_o[C]_p[O]_u[N]_v[P]_w[Cu]_s$ wherein at least n or o is greater than 0 and $0 \leq x, y, z, m, (o \text{ or } n), p, u, v, w, s \leq 5$.

In one embodiment a thermoelectric device comprising a planer configuration wherein, the electrodes are disposed substantially in the same plane and perpendicular to the thermal gradient across the device.

In one embodiment a piezoelectric device comprises a composition described by $[RE1]_x[RE2]_y[RE3]_z[Bi]_m[Si]_n[Ge]_o[C]_p[O]_u[N]_v[P]_w[Cu]_s$ wherein at least x and at least one of u, v, or w are greater than 0 and $0 \leq y, z, m, n, o, p, u, v, w, s \leq 5$.

In one embodiment a pyroelectric device comprises a composition described by $[RE1]_x[RE2]_y[RE3]_z[Bi]_m[Si]_n[Ge]_o[C]_p[O]_u[N]_v[P]_w[Cu]_s$ wherein at least x and at least one of u, v, or w are greater than 0 and $0 \leq y, z, m, n, o, p, u, v, w, s \leq 5$.

In one embodiment a ferroelectric device comprises a composition described by $[RE1]_x[RE2]_y[RE3]_z[Bi]_m[Si]_n[Ge]_o[C]_p[O]_u[N]_v[P]_w[Cu]_s$ wherein at least x and at least one of u, v, or w are greater than 0 and $0 \leq y, z, m, n, o, p, u, v, w, s \leq 5$.

In one embodiment a thermoelectric device comprises a composition described by $[RE1]_x[RE2]_y[RE3]_z[Bi]_m[Si]_n[Ge]_o[C]_p[O]_u[N]_v[P]_w[Cu]_s$ wherein at least x and at least one of u, v, or w are greater than 0 and $0 \leq y, z, m, n, o, p, u, v, w, s \leq 5$.

In one embodiment a thermoelectric device comprises at least a first and a second portion wherein the first portion exhibits a negative Seebeck co-efficient and the second portion exhibits a positive Seebeck co-efficient wherein the first portion comprises a composition described by $[RE1]_x[RE2]_y[RE3]_z[Bi]_m[Si]_n[Ge]_o[C]_p[O]_u[N]_v[P]_w[Cu]_s$ wherein at least x and at least one of u, v, or w are greater than 0 and $0 \leq y, z, m, n, o, p, u, v, w, s \leq 5$ and in the second portion comprises a composition described by $[RE1]_x[RE2]_y[RE3]_z[Bi]_m[Si]_n[Ge]_o[C]_p[O]_u[N]_v[P]_w[Cu]_s$ wherein at least x and at least one of u, v, or w are greater than 0 and $0 \leq y, z, m, n, o, p, u, v, w, s \leq 5$ such that said first portion composition is different than said second portion composition.

Foregoing described embodiments of the invention are provided as illustrations and descriptions. They are not intended to limit the invention to precise form described. In particular, it is contemplated that functional implementation of invention described herein may be implemented equivalently. Alternative construction techniques and processes are apparent to one knowledgeable with integrated circuit, thermoelectric, flexible circuit and MEMS technologies. Other variations and embodiments are possible in light of above teachings, and it is thus intended that the scope of invention not be limited by this Detailed Description, but rather by Claims following.

I claim:

1. A thermoelectric device comprising:
   a narrow band gap material region; and
   two wide band gap material regions separated by and in contact with the narrow band gap region in a multilayer, thin film structure wherein the composition of all regions is described by $[RE1]_x[RE2]_y[RE3]_z[Bi]_m[Si]_n[Ge]_o[C]_p[O]_u[N]_v[P]_w[Cu]_s$ wherein at least x and at least one of u, v, or w are greater than 0 and at least one of n or o are greater than 0 and $0 \leq y, z, m, (o \text{ or } n), p, u, v, w, s \leq 5$ and [RE1], [RE2] and [RE3] are different rare earth elements.

2. The thermoelectric device of claim 1 wherein, electrodes are disposed substantially in the same plane and perpendicular to a thermal gradient across said thermoelectric device.

* * * * *